(12) United States Patent
Or-Bach et al.

(10) Patent No.: US 12,362,330 B2
(45) Date of Patent: Jul. 15, 2025

(54) 3D SEMICONDUCTOR DEVICE AND STRUCTURE WITH CONNECTION PATHS

(71) Applicant: Monolithic 3D Inc., Klamath Falls, OR (US)

(72) Inventors: Zvi Or-Bach, Haifa (IL); Brian Cronquist, Klamath Falls, OR (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

(21) Appl. No.: 18/779,059

(22) Filed: Jul. 21, 2024

(65) Prior Publication Data

US 2024/0379624 A1  Nov. 14, 2024

Related U.S. Application Data

(63) Continuation-in-part of application No. 17/384,796, filed on Jul. 25, 2021, now Pat. No. 12,094,829, which is a continuation-in-part of application No. 17/246,612, filed on May 1, 2021, now Pat. No. 11,107,808, which is a continuation-in-part of application No. 17/169,511, filed on Feb. 7, 2021, now Pat. No. 11,031,394, which is a continuation-in-part of application No. 17/064,504, filed on Oct. 6, 2020, now Pat. No. 10,950,599, which
(Continued)

(51) Int. Cl.
| | |
|---|---|
| *H01L 25/065* | (2023.01) |
| *H01L 23/00* | (2006.01) |
| *H01L 23/48* | (2006.01) |
| *H01L 23/50* | (2006.01) |
| *H01L 25/00* | (2006.01) |
| *H10D 88/00* | (2025.01) |

(52) U.S. Cl.
CPC ........ *H01L 25/0657* (2013.01); *H01L 23/481* (2013.01); *H01L 23/50* (2013.01); *H01L 24/08* (2013.01); *H01L 25/50* (2013.01); *H10D 88/00* (2025.01); *H01L 2224/08501* (2013.01)

(58) Field of Classification Search
CPC ... H01L 25/0657; H01L 25/50; H01L 23/481; H01L 23/50; H01L 24/08; H01L 2224/08501; H10D 88/00
USPC ....................................................... 257/499
See application file for complete search history.

(56) References Cited

U.S. PATENT DOCUMENTS

| | | | | |
|---|---|---|---|---|
| 8,154,910 B2 * | 4/2012 | Park | ...................... | G11C 11/412 |
| | | | | 365/156 |
| 11,502,091 B1 * | 11/2022 | Vimercati | ............. | G11C 11/221 |

* cited by examiner

*Primary Examiner* — Tu-Tu V Ho
(74) *Attorney, Agent, or Firm* — PatentPC/PowerPatent; Bao Tran

(57) ABSTRACT

A 3D semiconductor device, the device including: a first level, where the first level includes a first layer, the first layer including first transistors, and where the first level includes a second layer, the second layer including first interconnections; a second level overlaying the first level, where the second level includes a plurality of second transistors, where the second level includes a third layer, the third layer including first conductive lines; a third level overlaying the second level, where the third level includes a plurality of third transistors, where the third level includes a fourth layer, the fourth layer including second conductive lines; and a plurality of connection paths, where the plurality of connection paths provides electrical connections at least from a plurality of the first transistors to the plurality of third transistors, and where the first level includes at least one voltage regulator.

20 Claims, 70 Drawing Sheets

Related U.S. Application Data is a continuation-in-part of application No. 16/846,298, filed on Apr. 11, 2020, now Pat. No. 10,840,222, which is a continuation-in-part of application No. 16/252,825, filed on Jan. 21, 2019, now Pat. No. 10,658,358, which is a continuation-in-part of application No. 15/990,626, filed on May 26, 2018, now Pat. No. 10,297,586, said application No. 17/064,504 is a continuation-in-part of application No. 15/482,787, filed on Apr. 9, 2017, now Pat. No. 10,840,239, said application No. 15/990,626 is a continuation-in-part of application No. 15/477,106, filed on Apr. 2, 2017, now Pat. No. 10,014,292, which is a continuation-in-part of application No. 14/642,724, filed on Mar. 9, 2015, now abandoned, said application No. 15/482,787 is a continuation-in-part of application No. 14/607,077, filed on Jan. 28, 2015, now Pat. No. 9,640,531.

(60) Provisional application No. 62/042,229, filed on Aug. 26, 2014, provisional application No. 62/035,565, filed on Aug. 11, 2014, provisional application No. 62/022,498, filed on Jul. 9, 2014, provisional application No. 61/932,617, filed on Jan. 28, 2014.

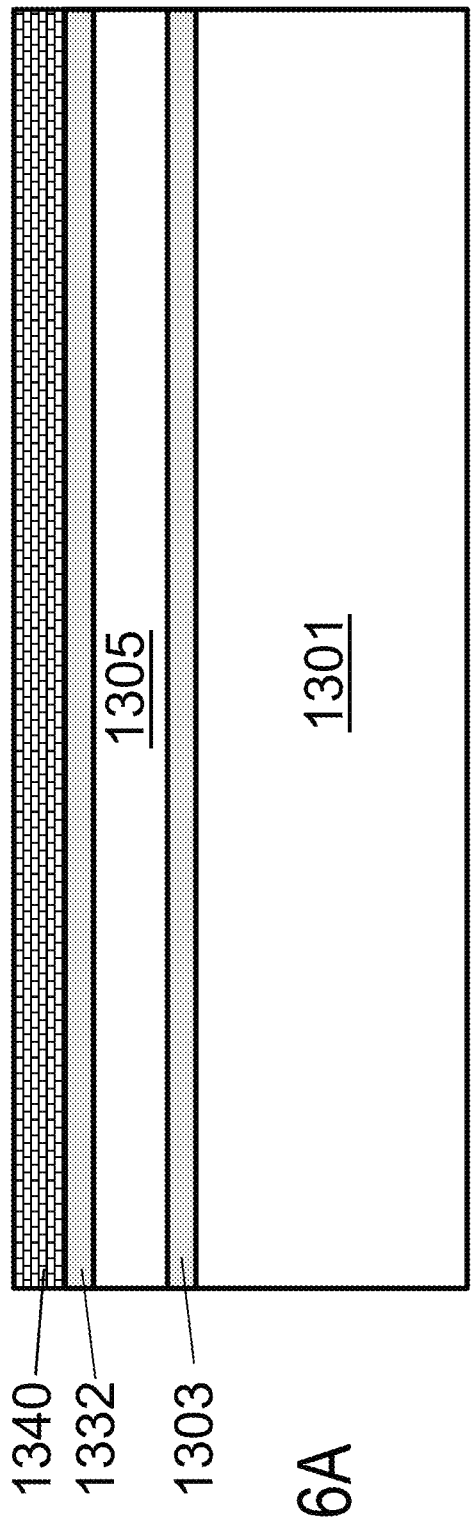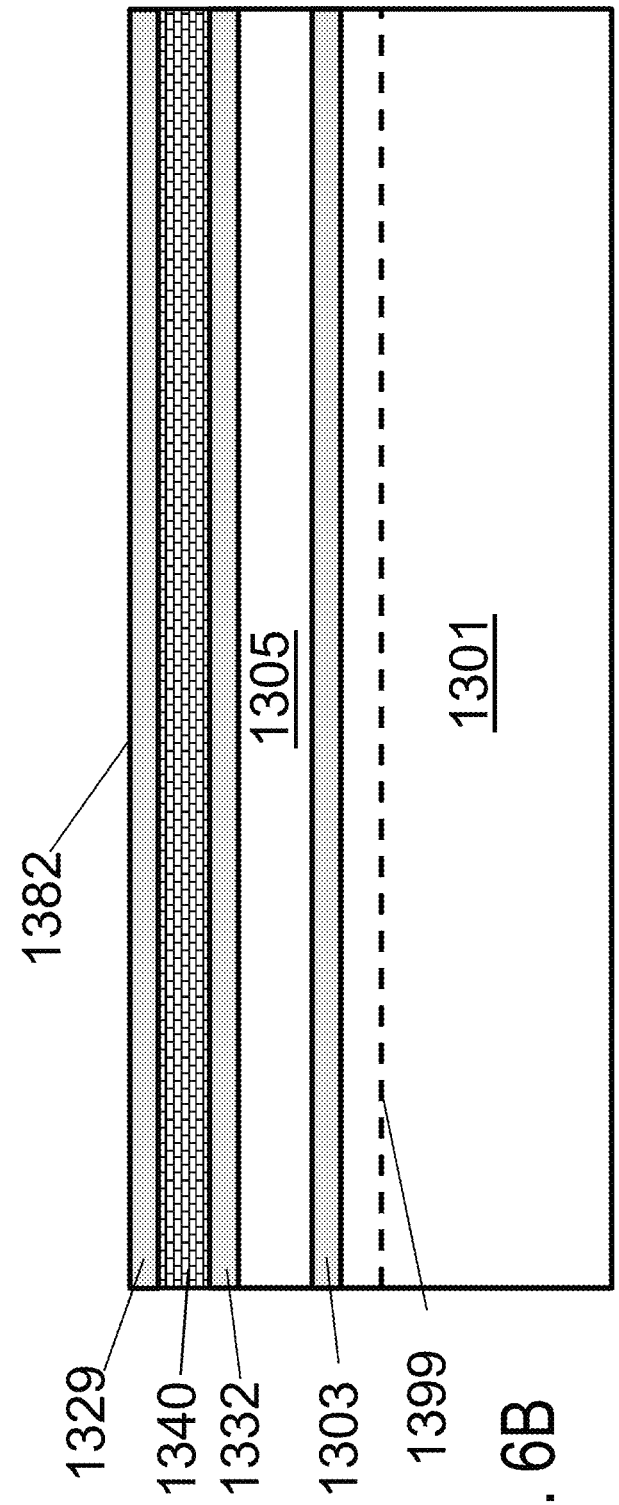

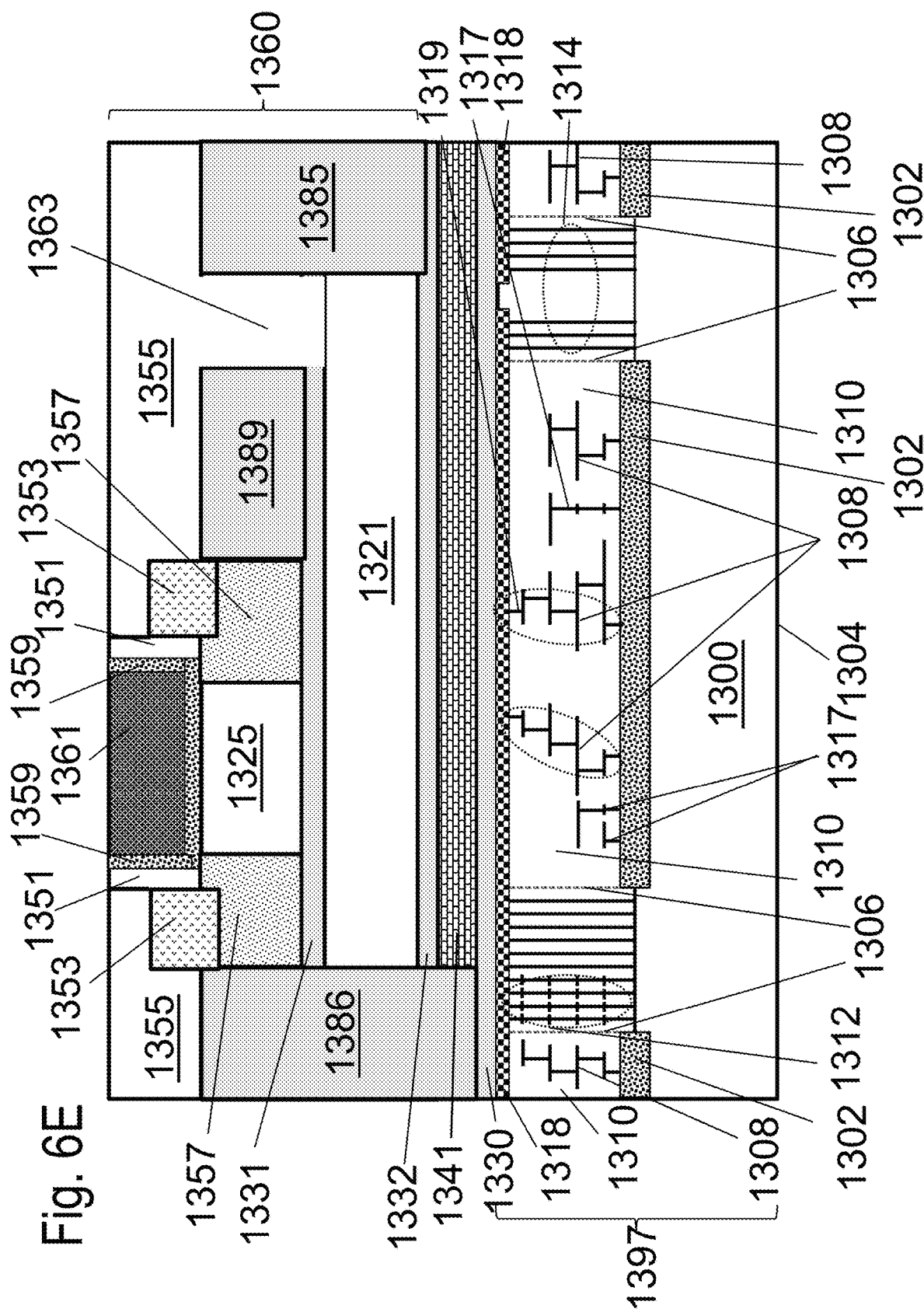

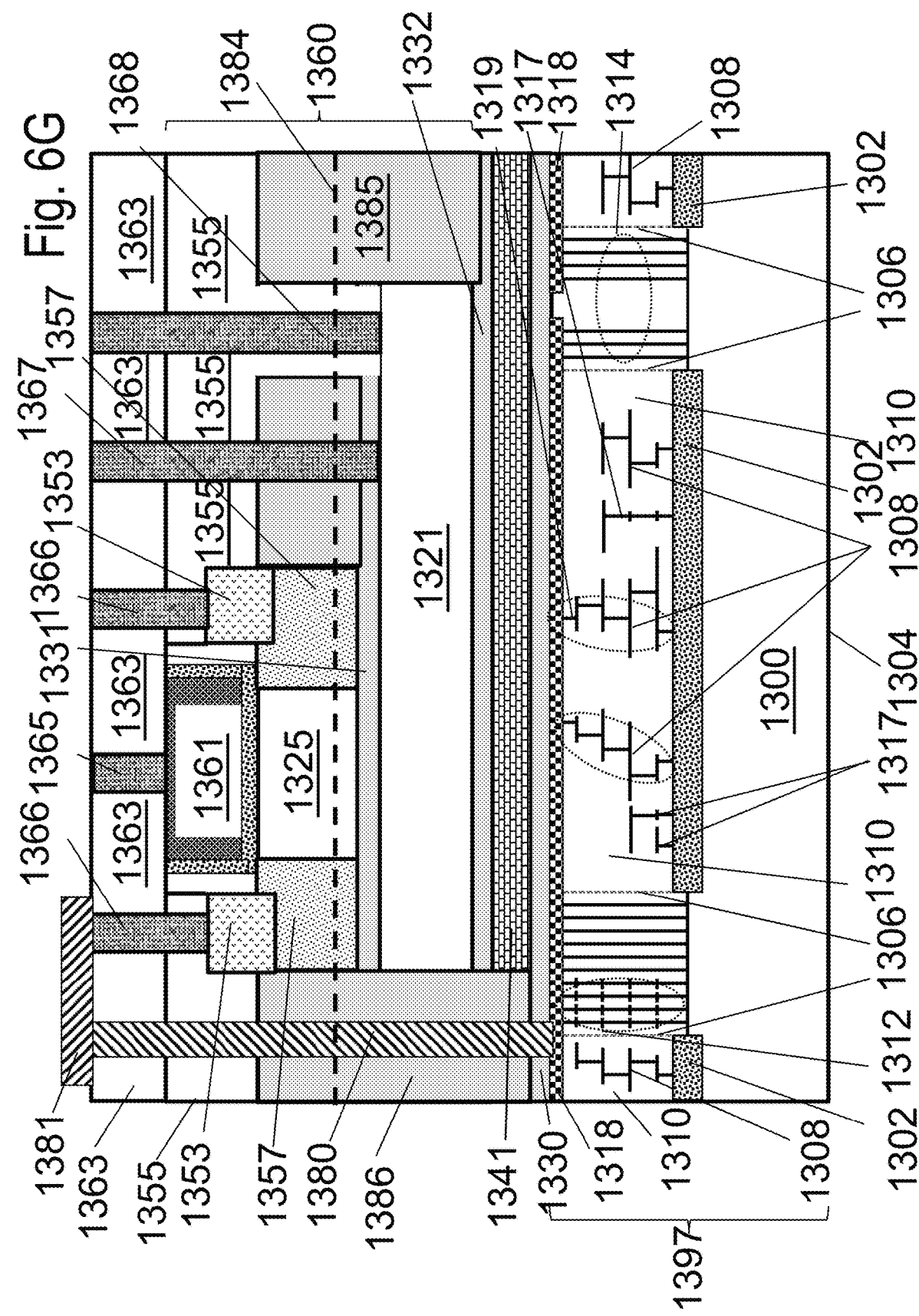

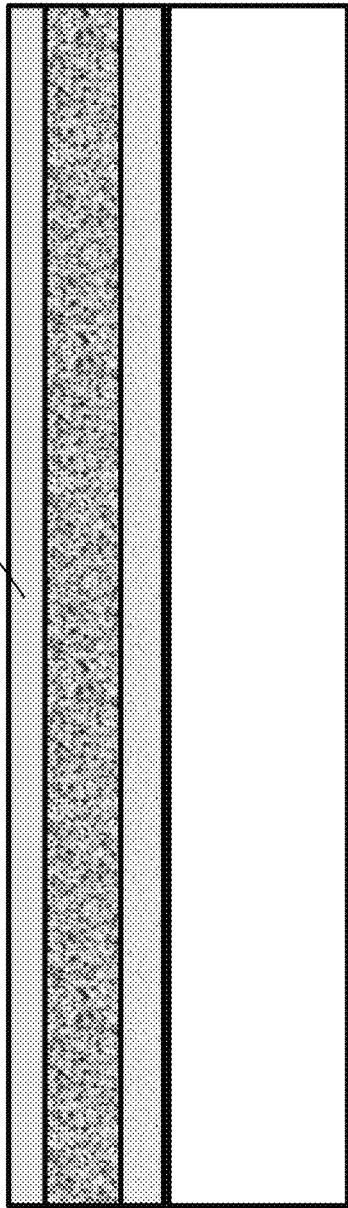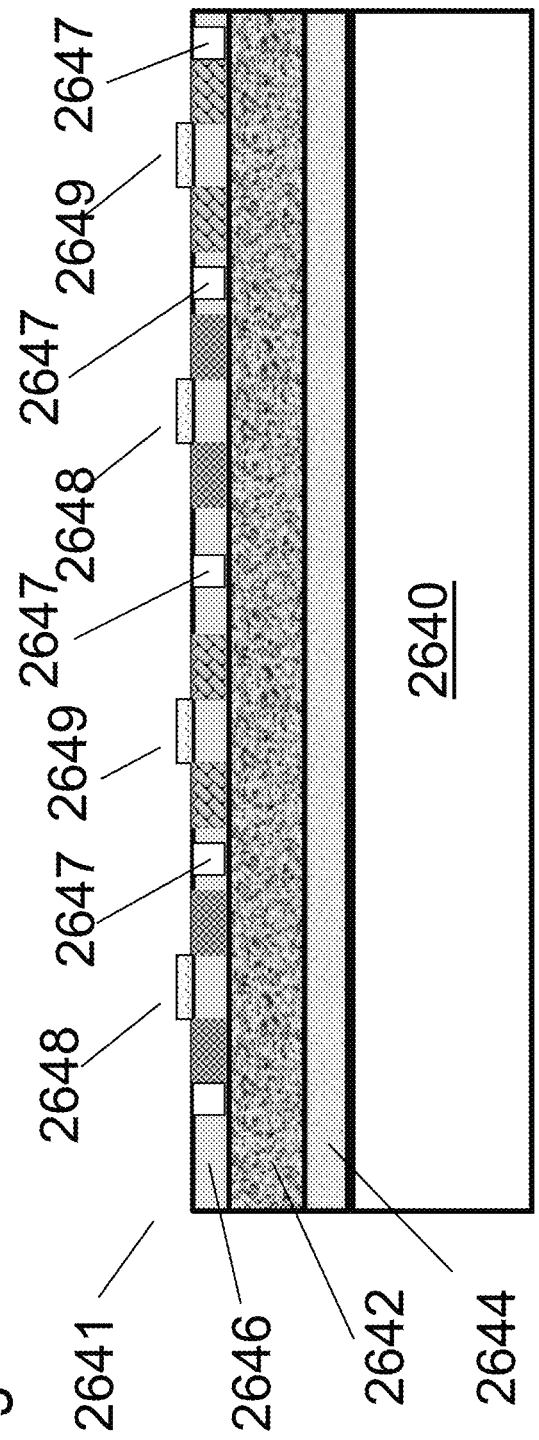

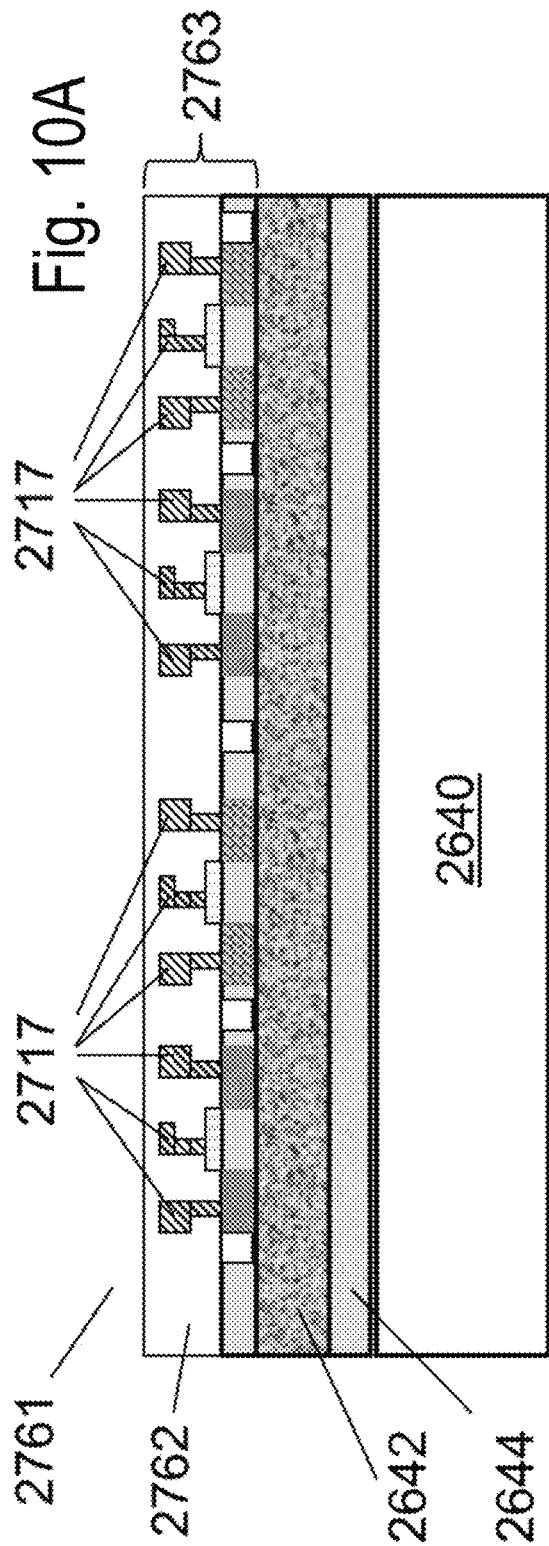
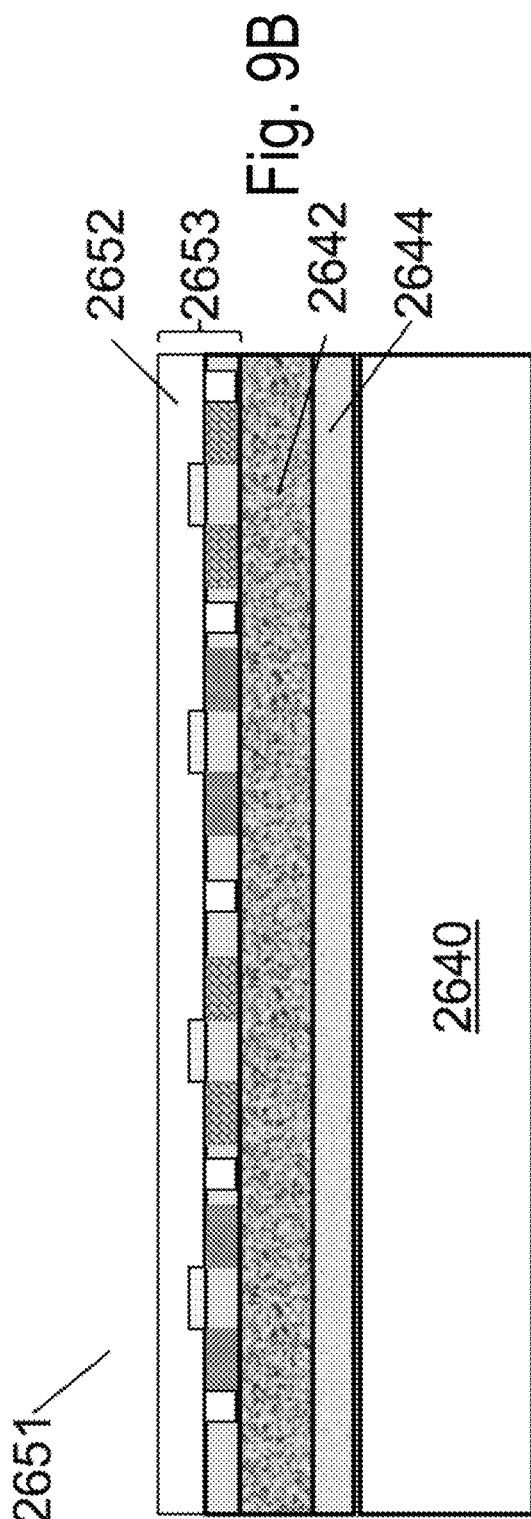

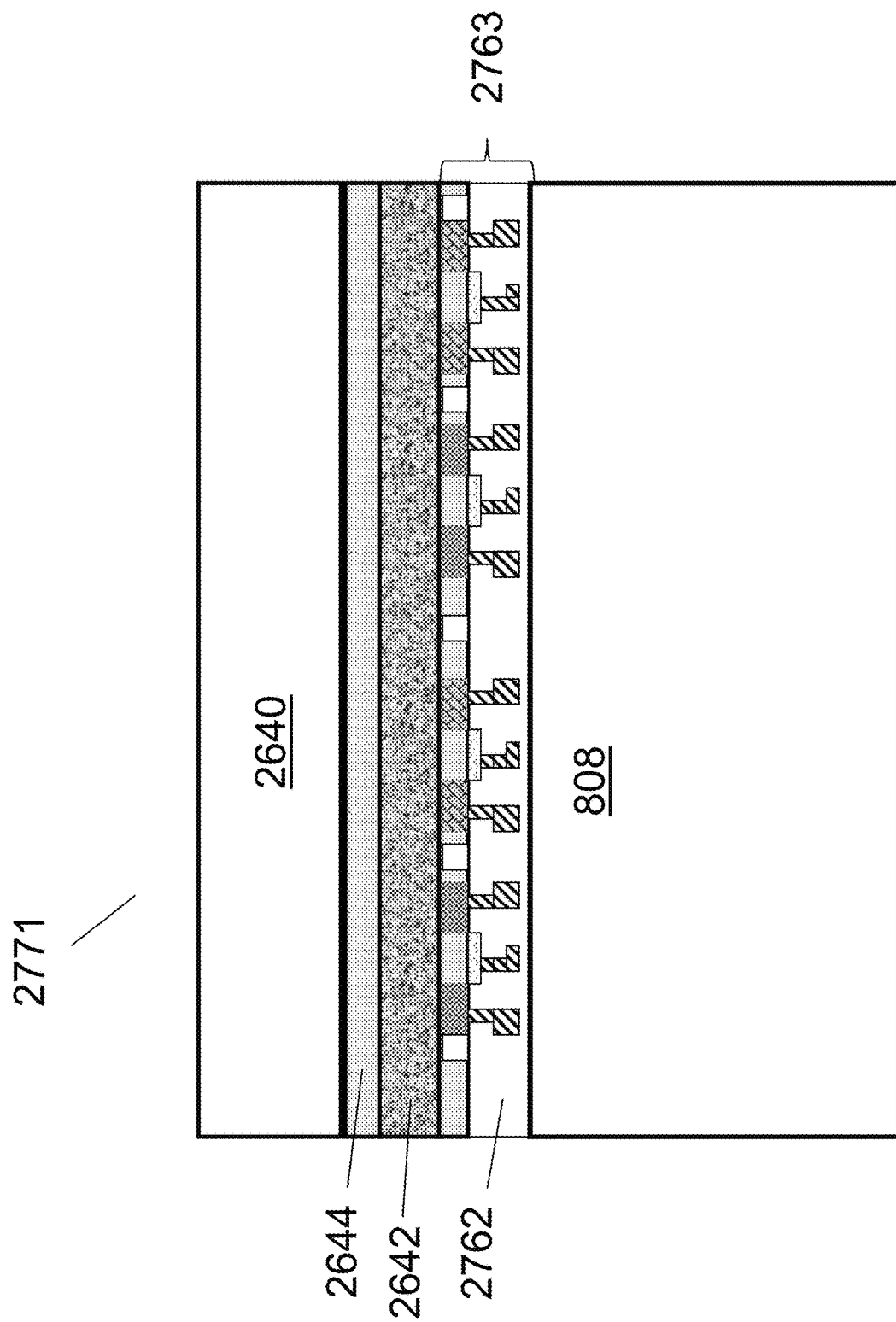

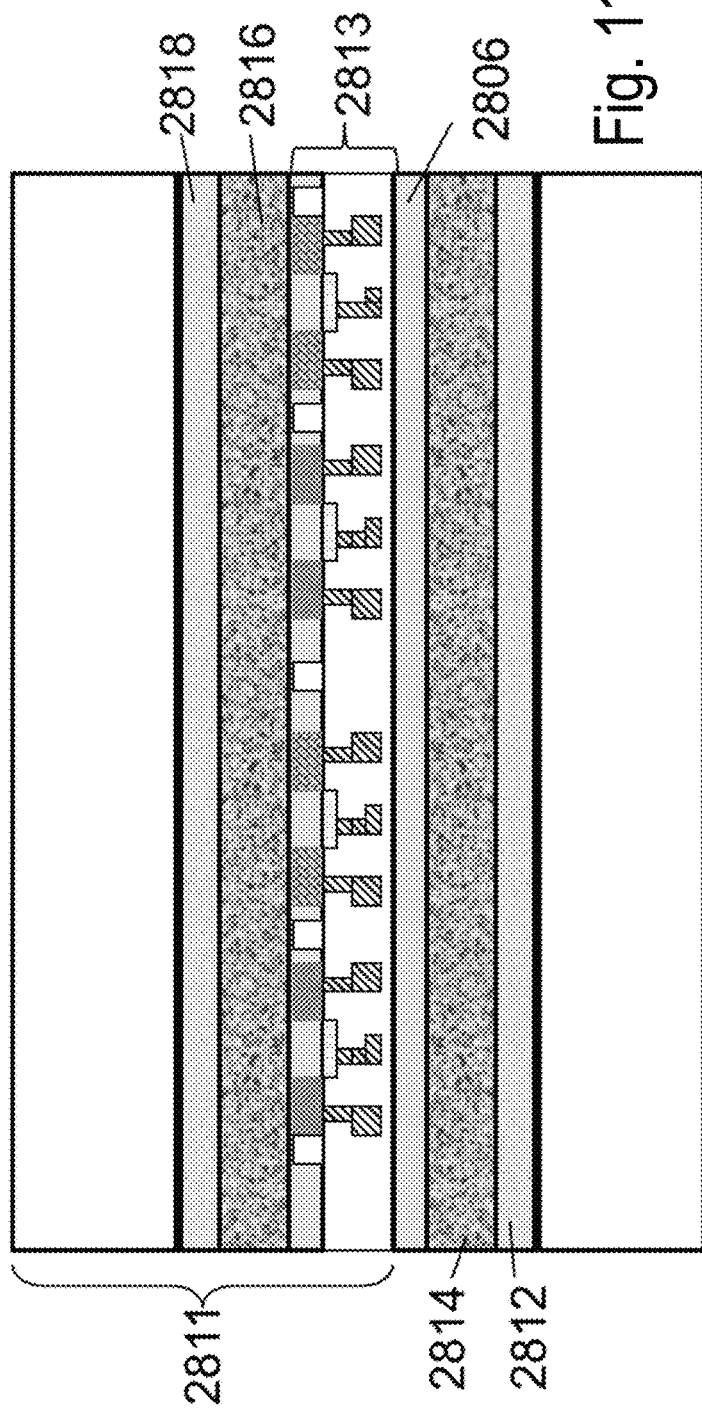
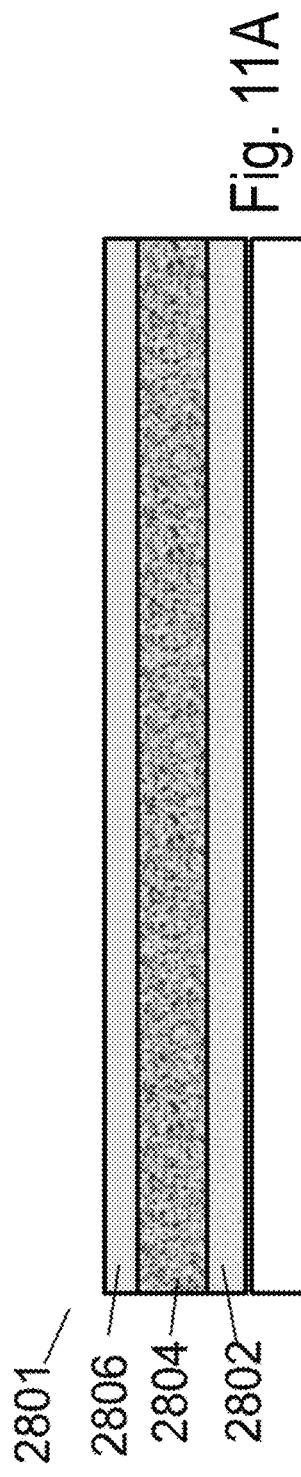

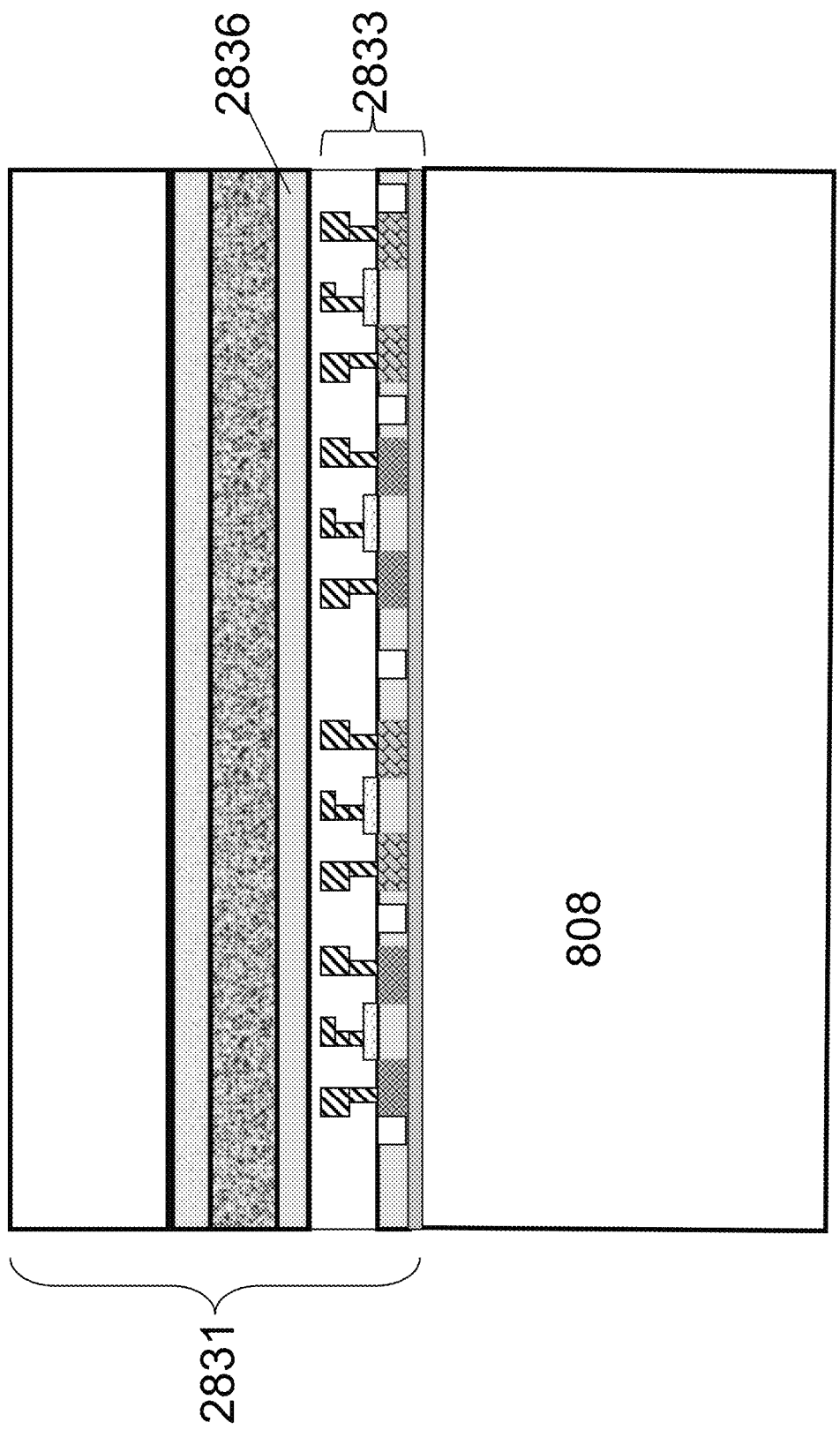

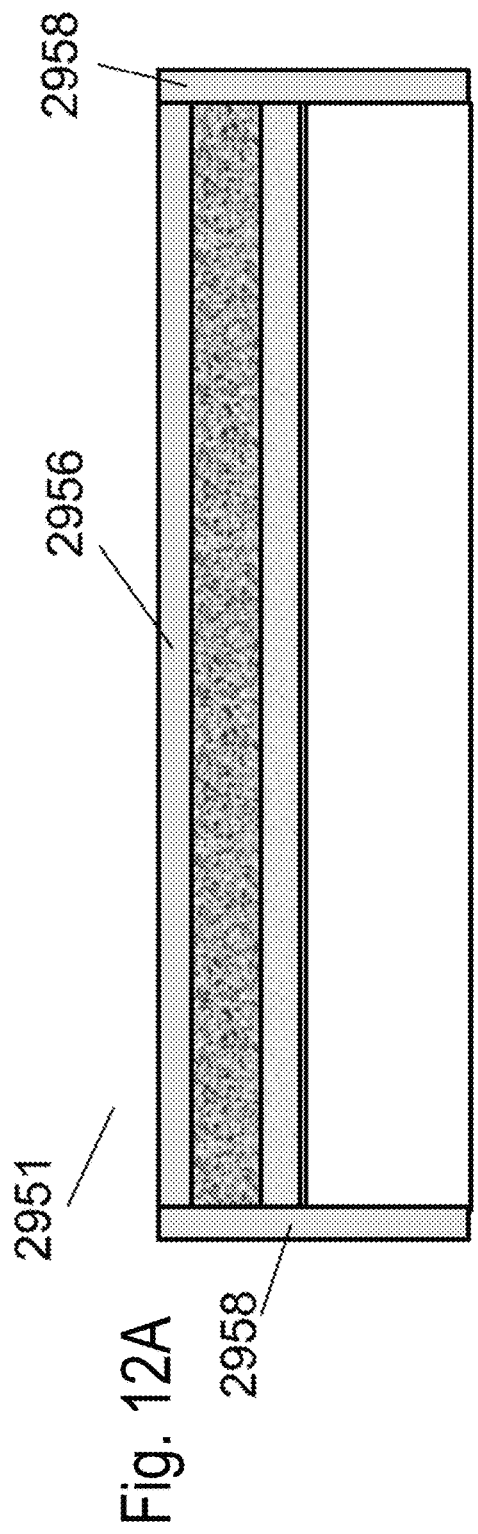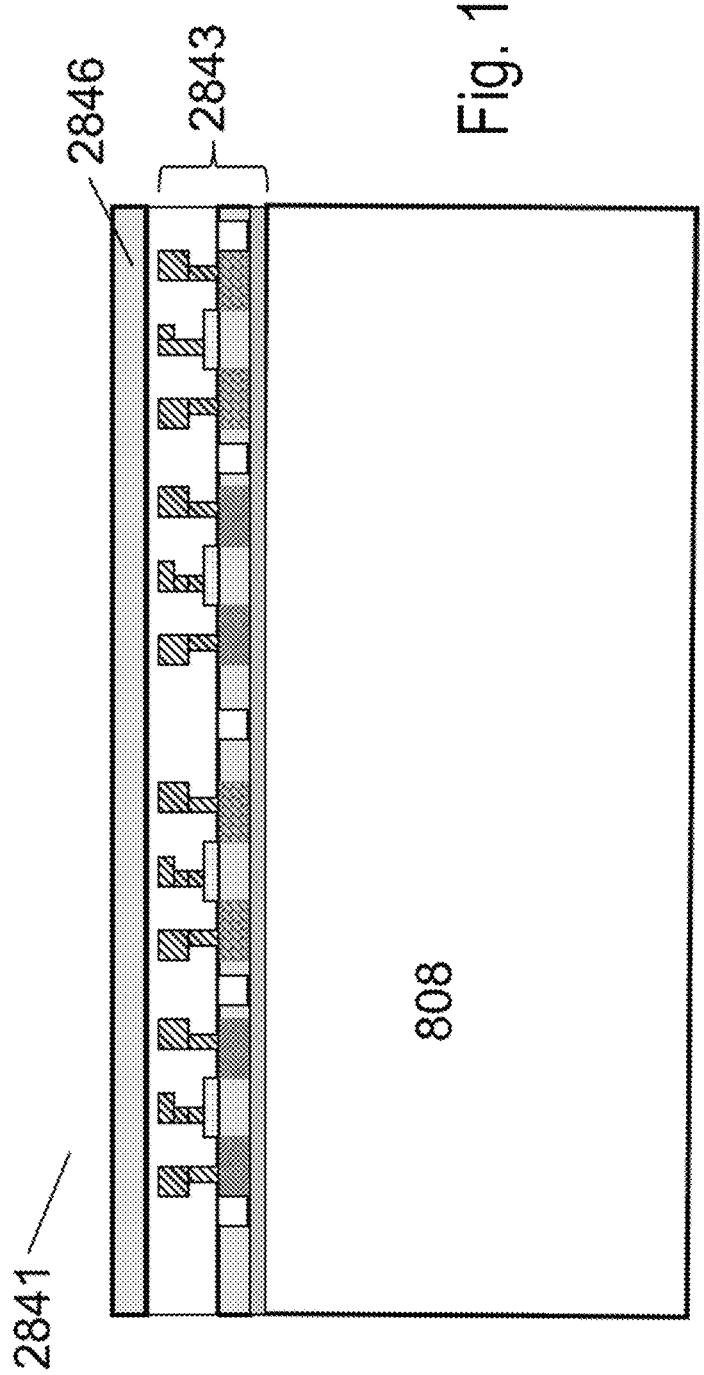

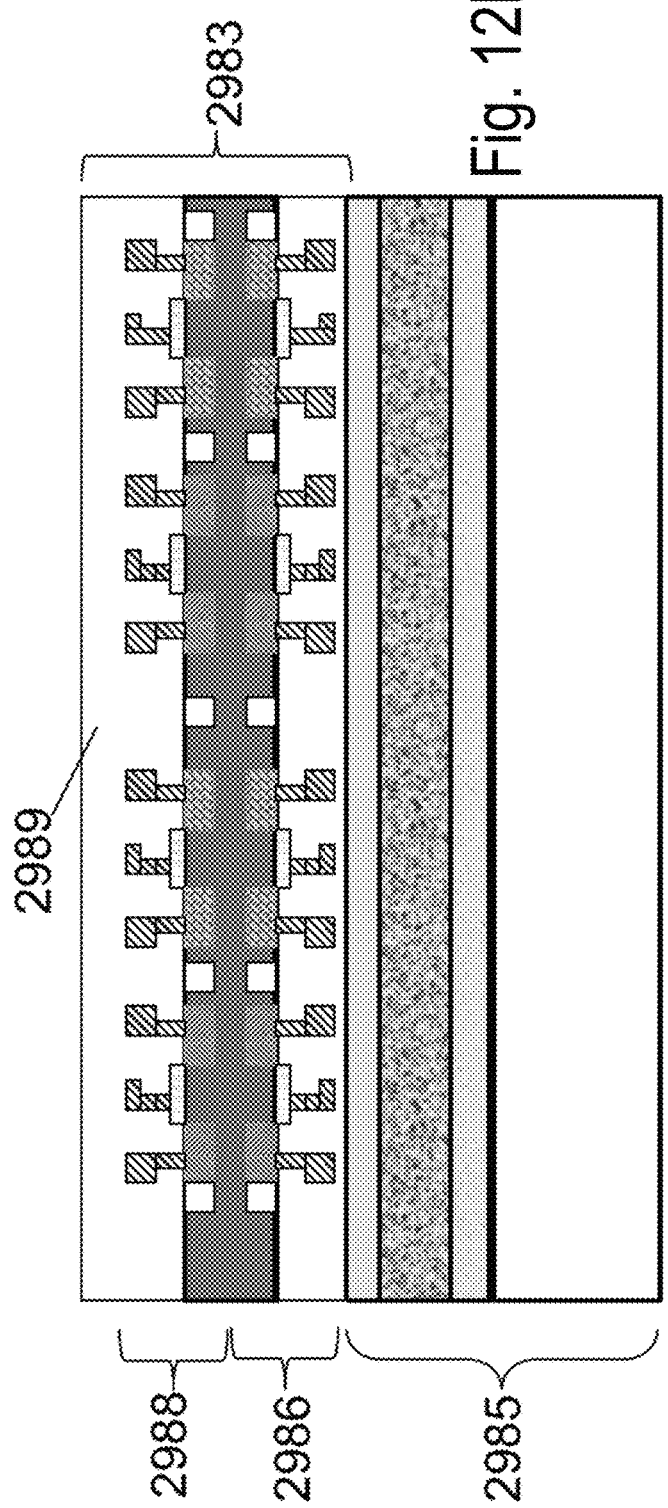
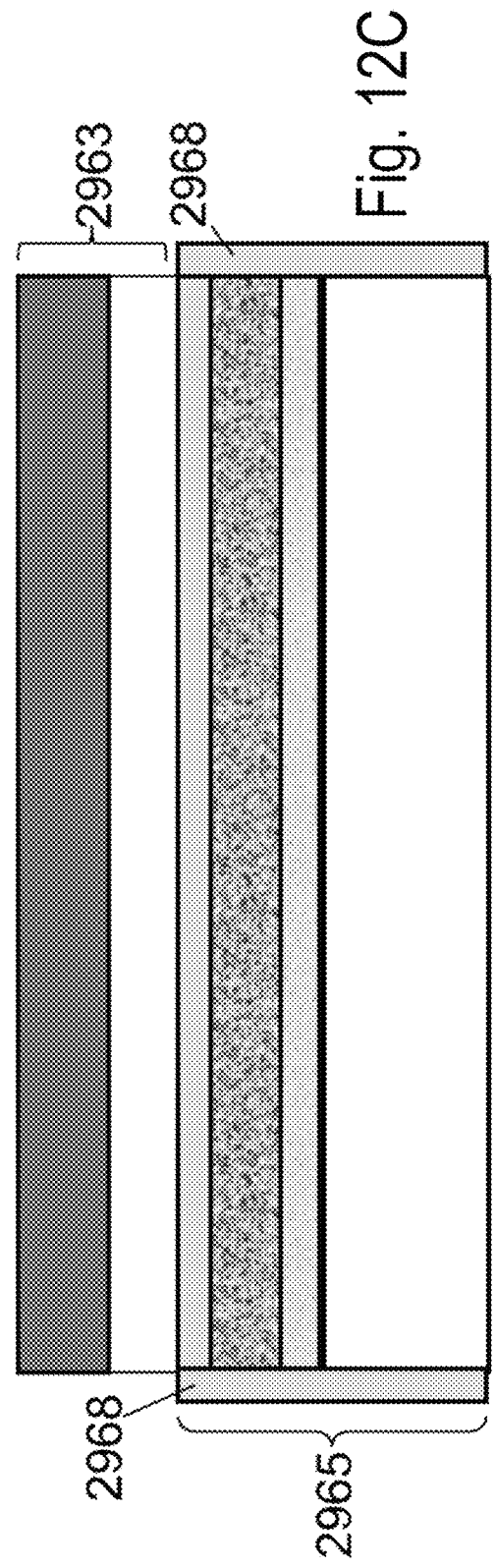
Fig. 12D
Fig. 12C

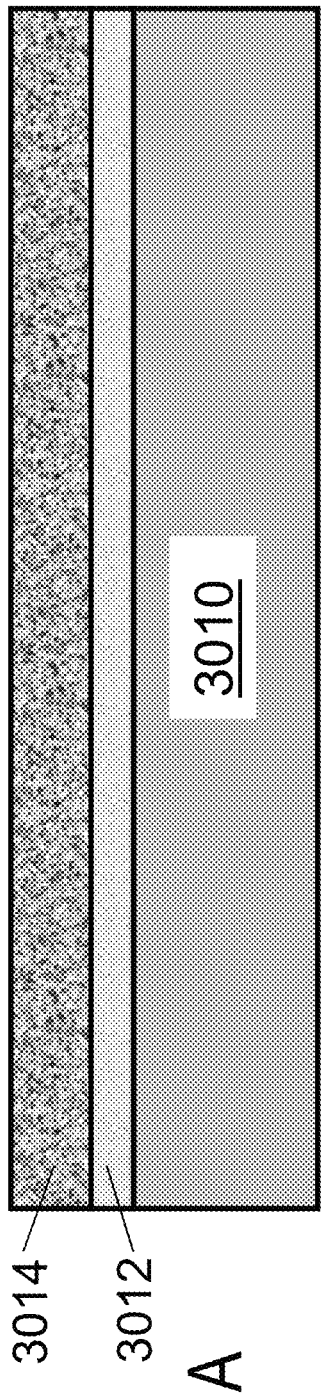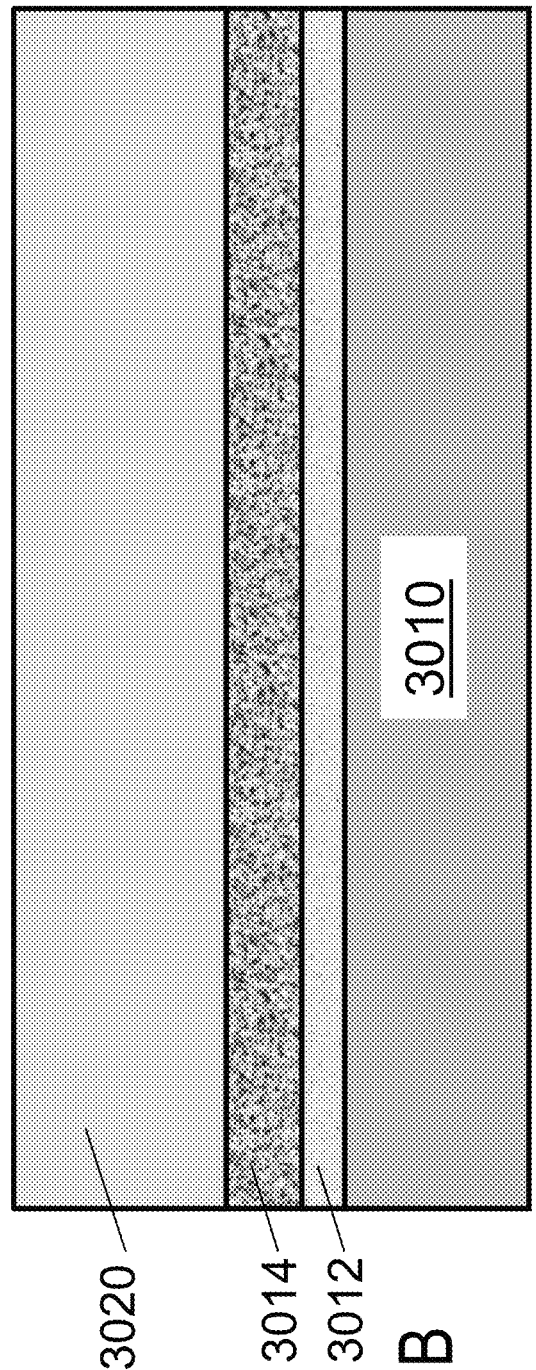
Fig. 13A
Fig. 13B

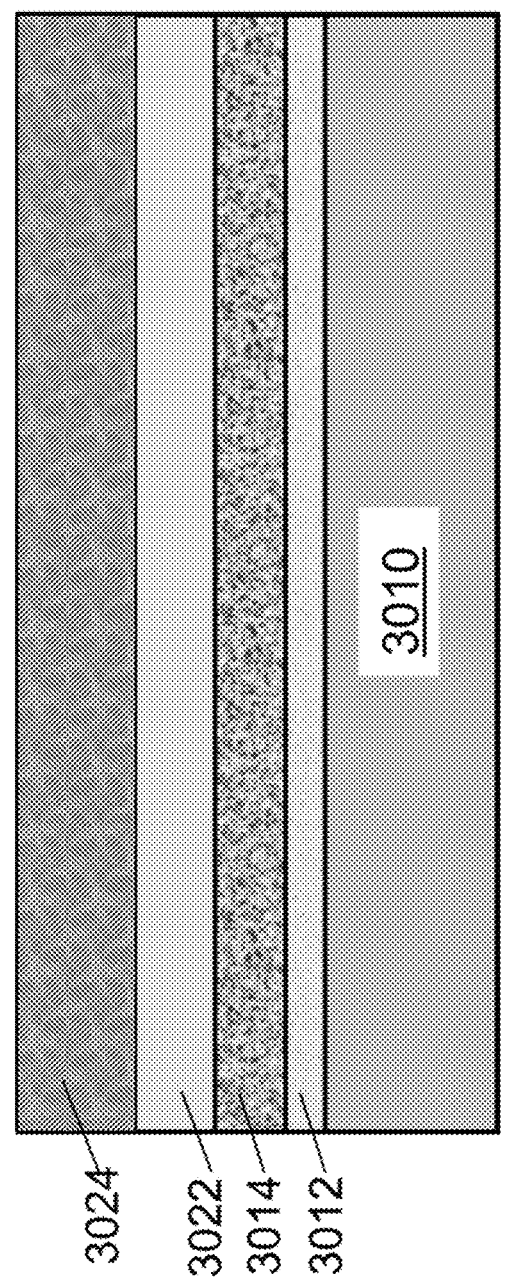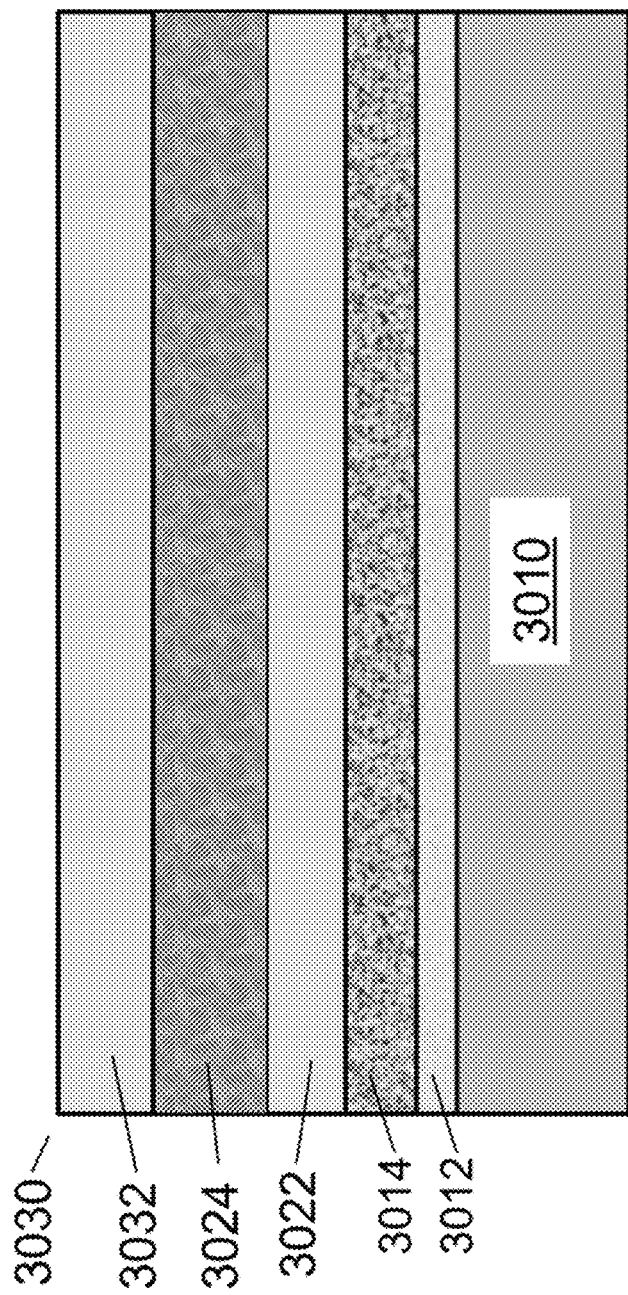

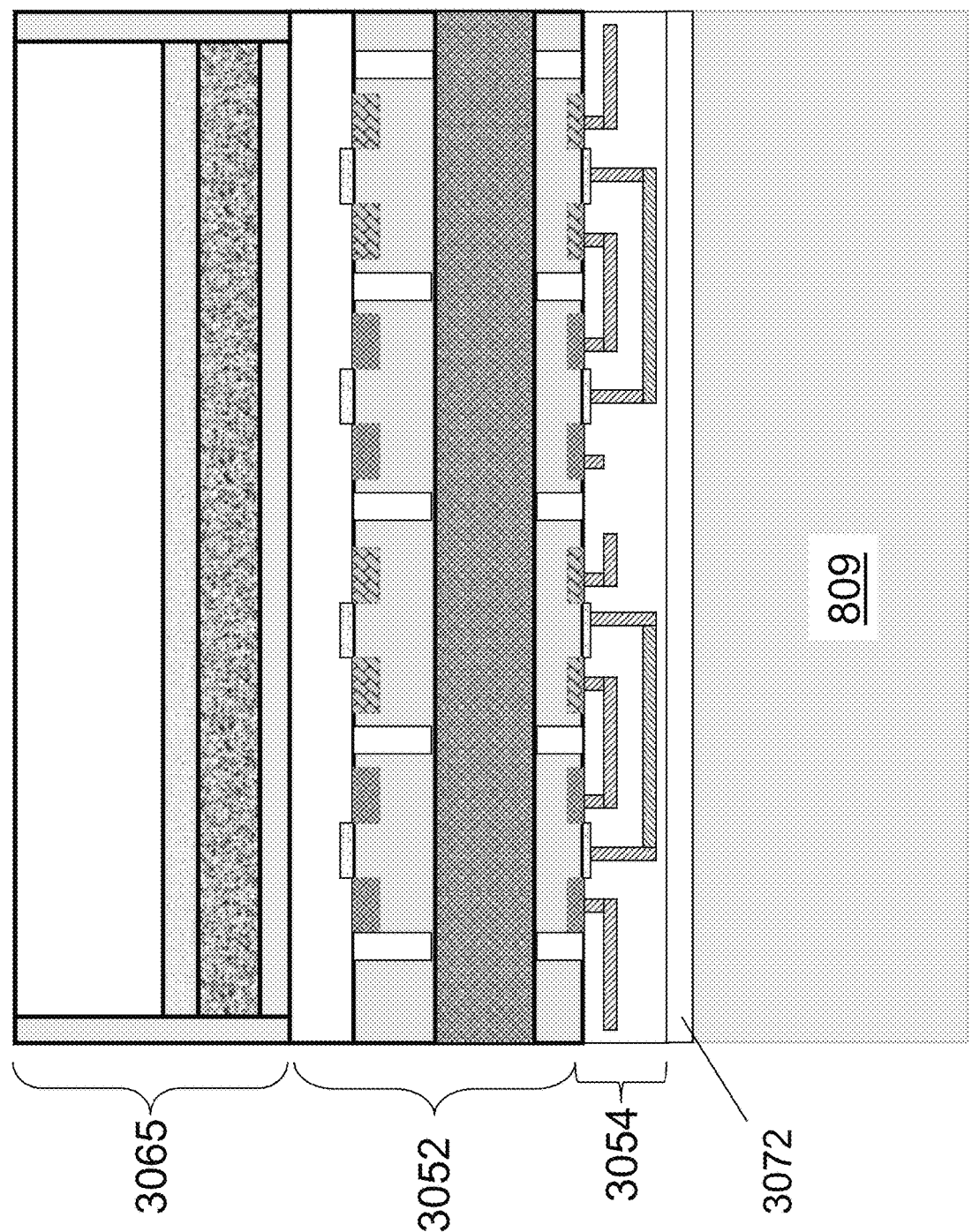

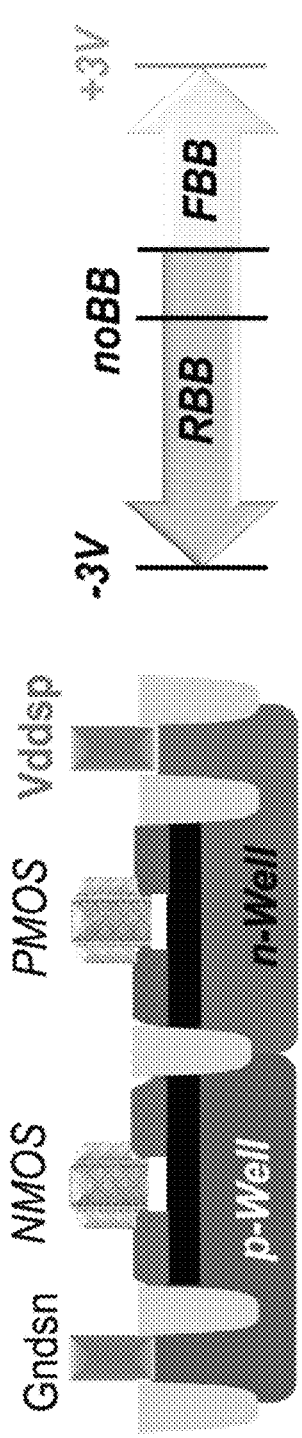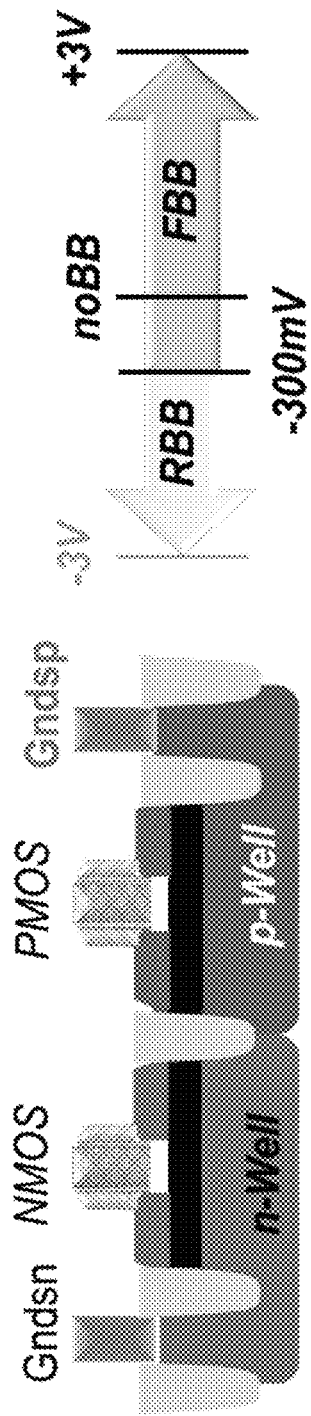
Fig. 14 Prior Art

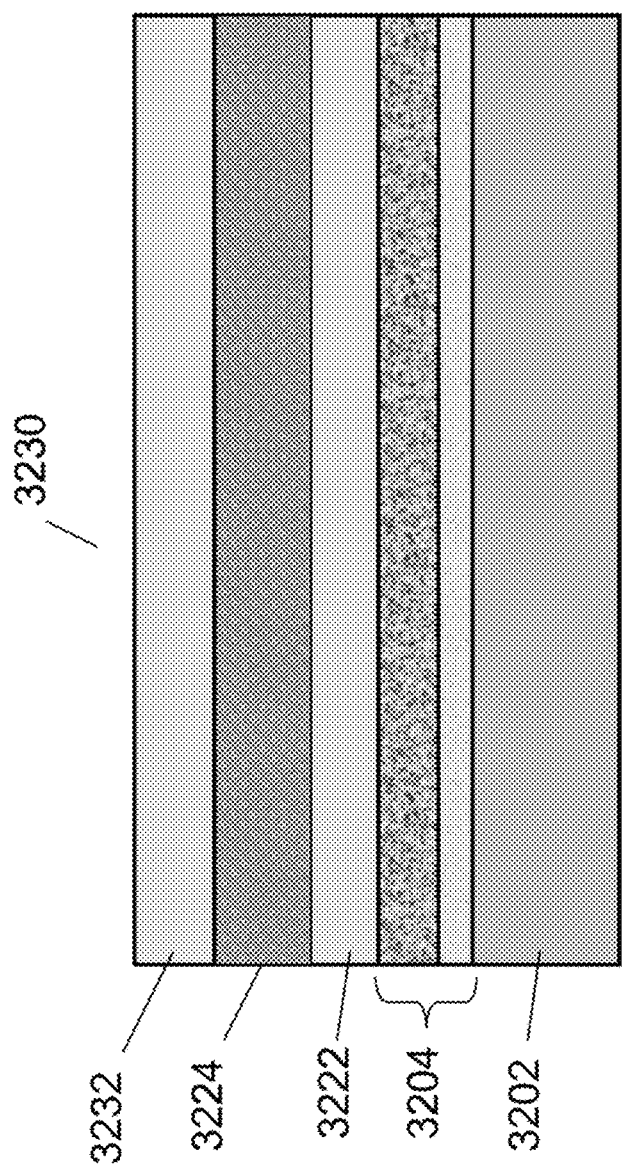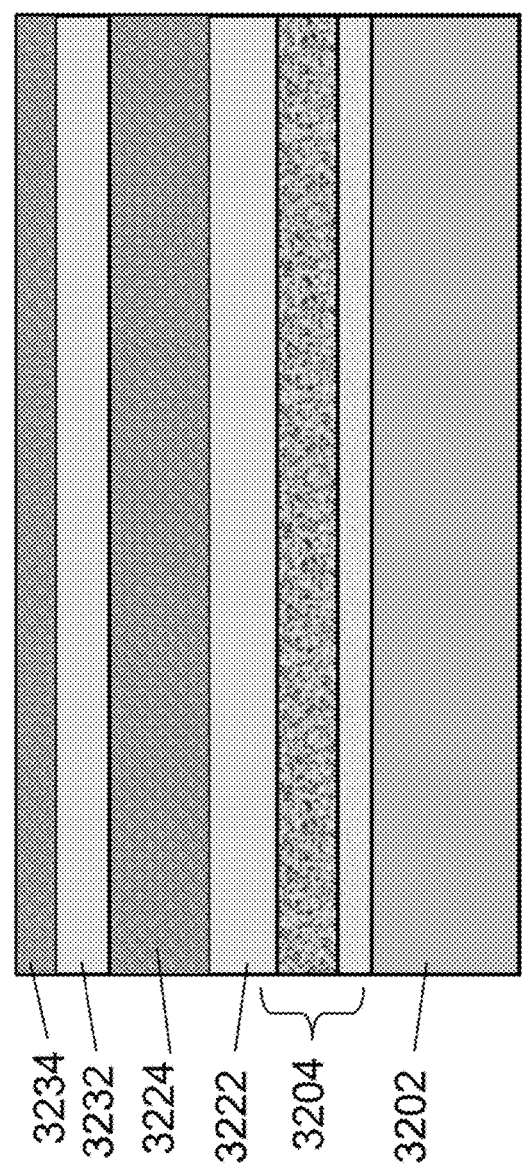

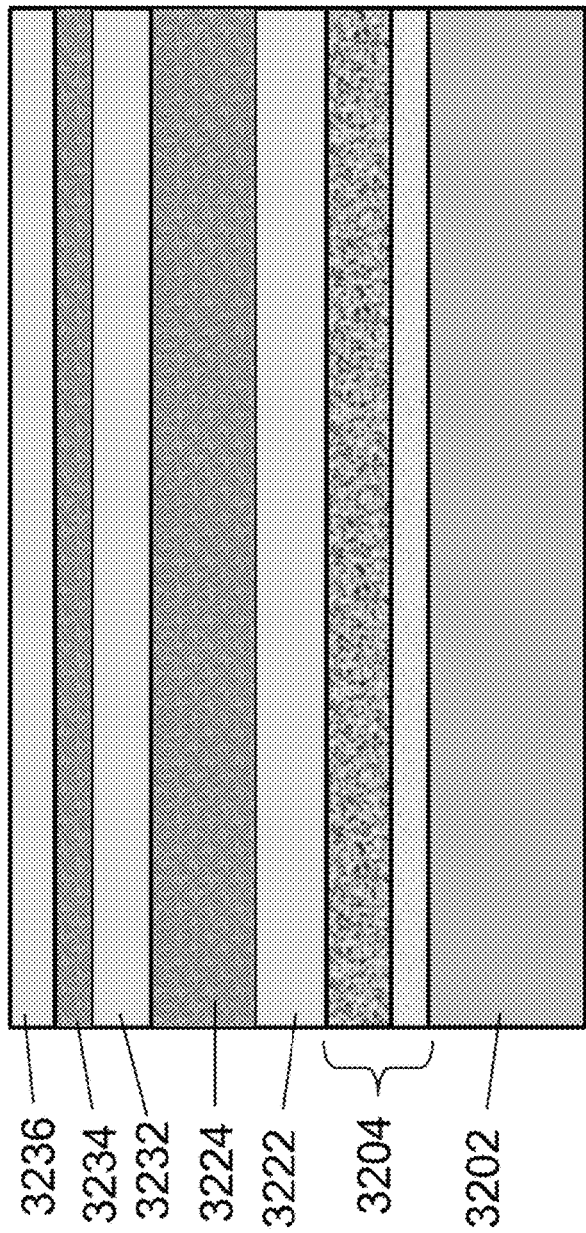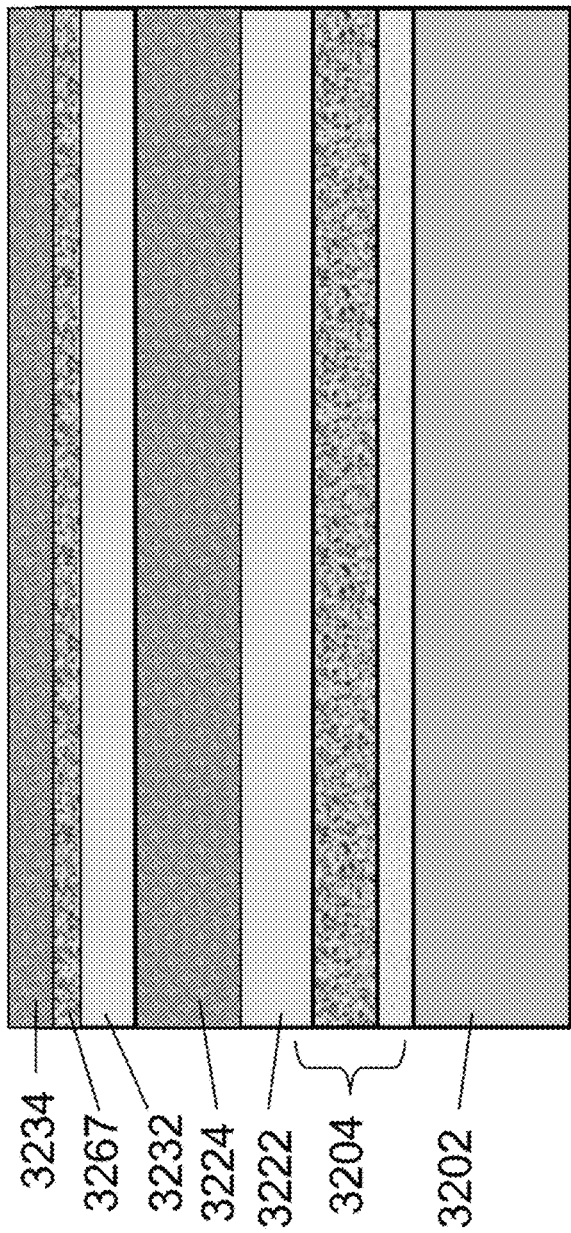

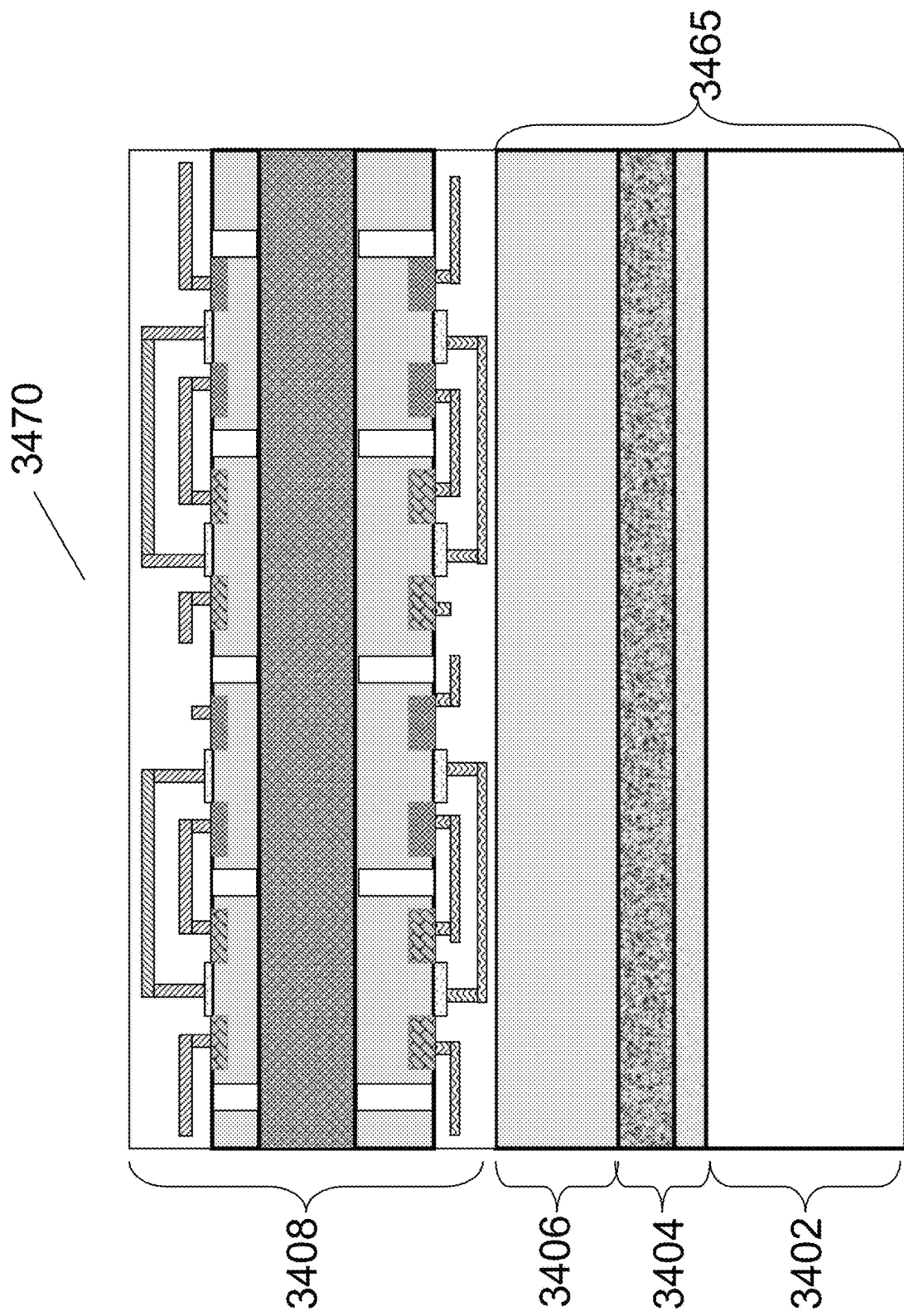

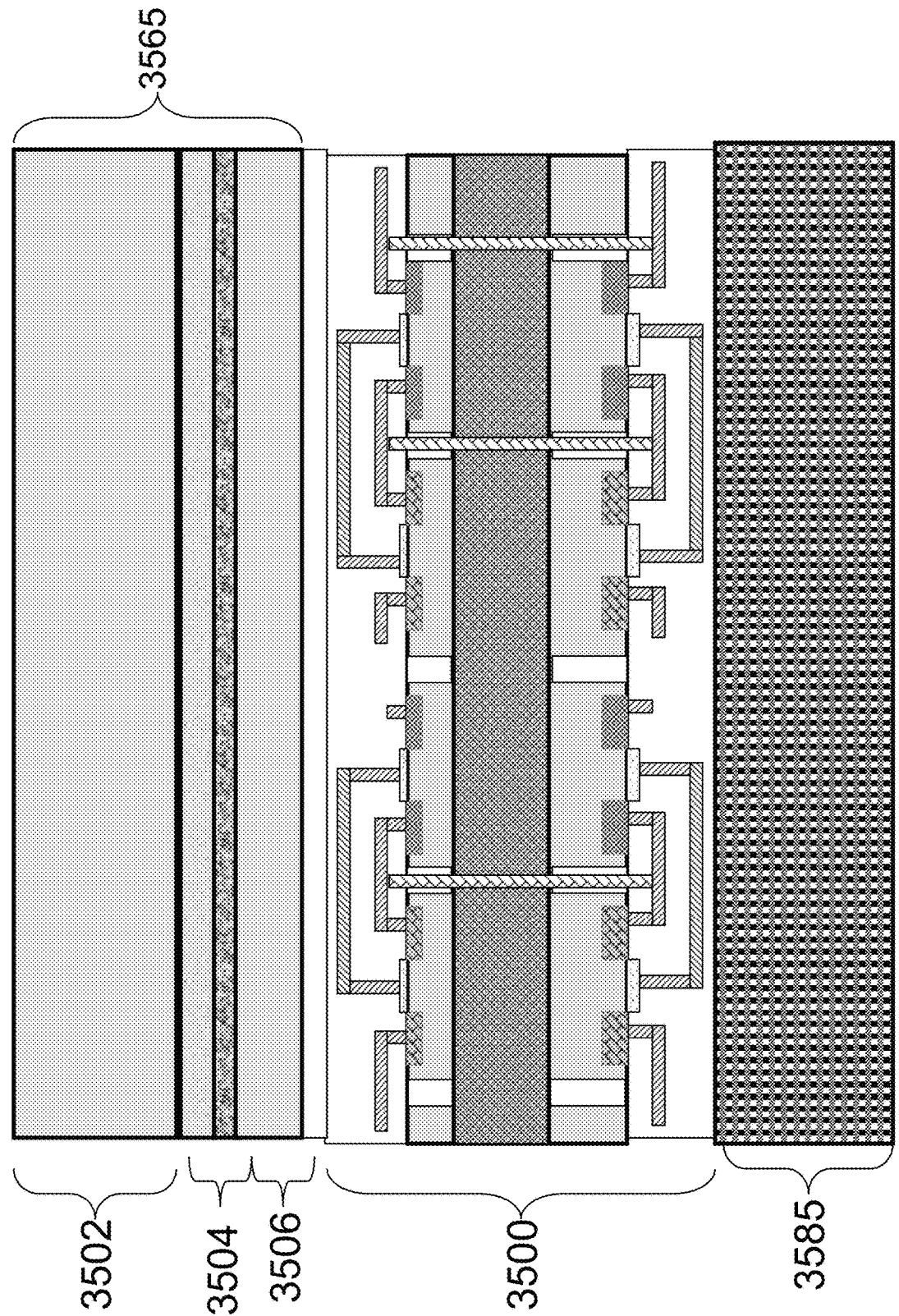

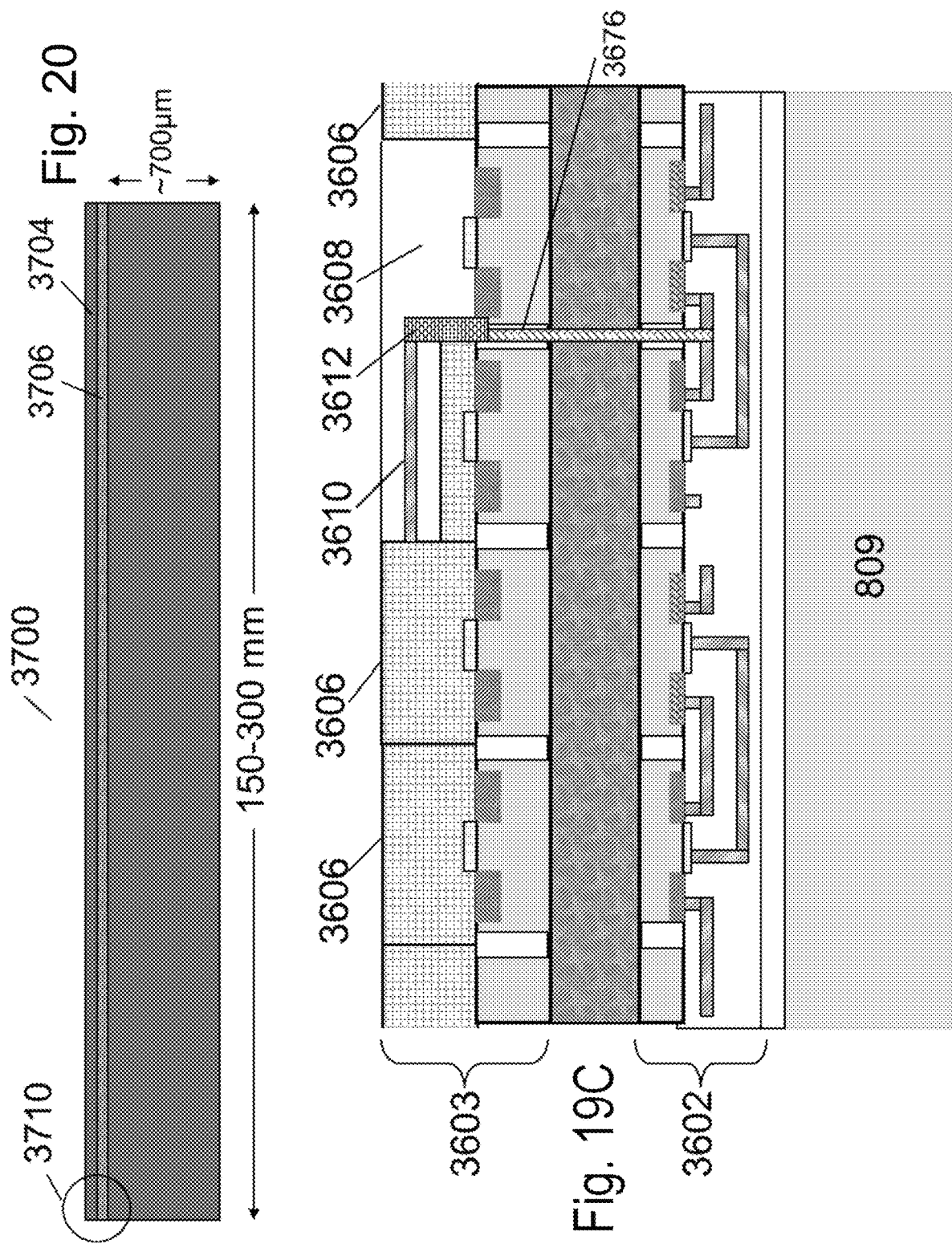

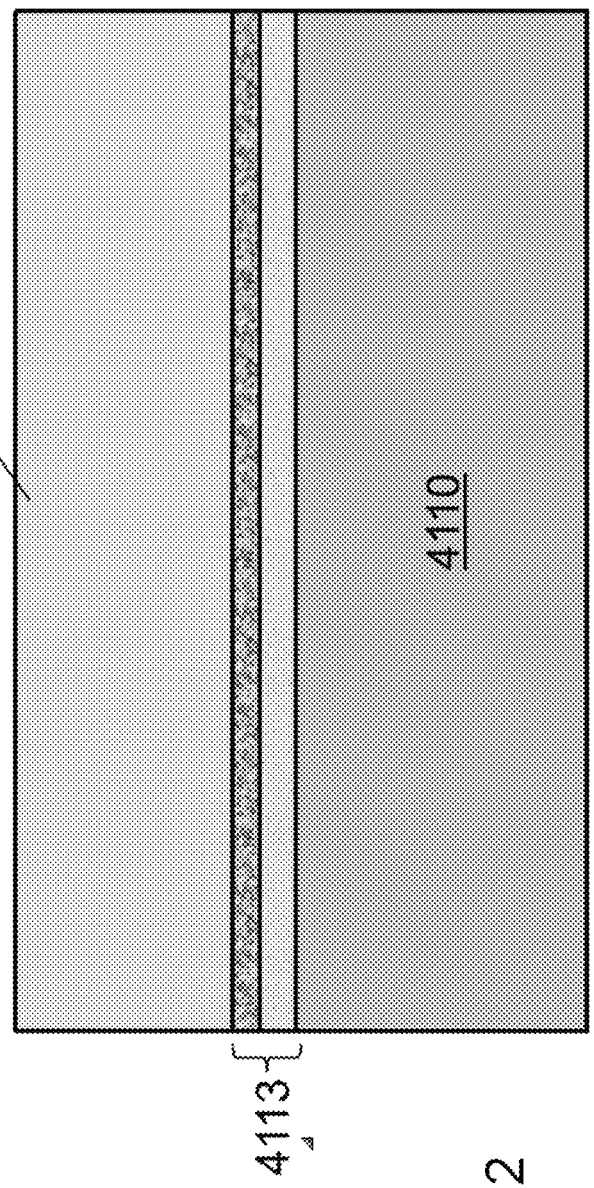
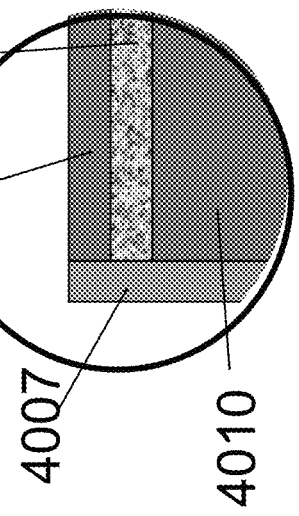

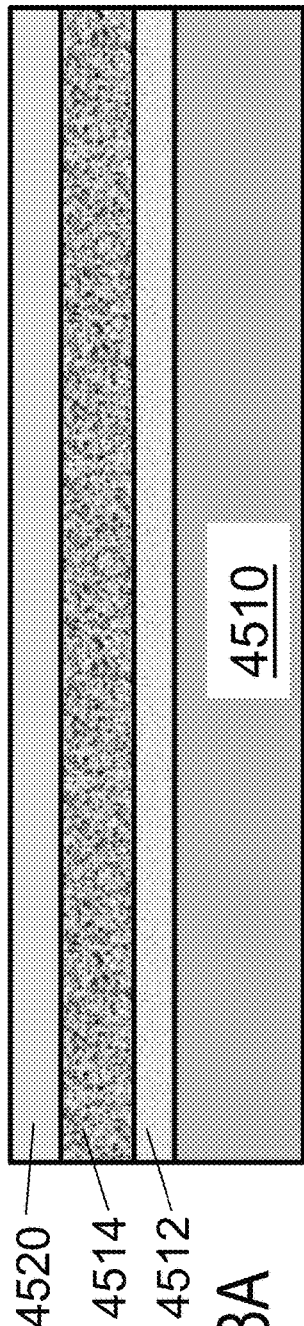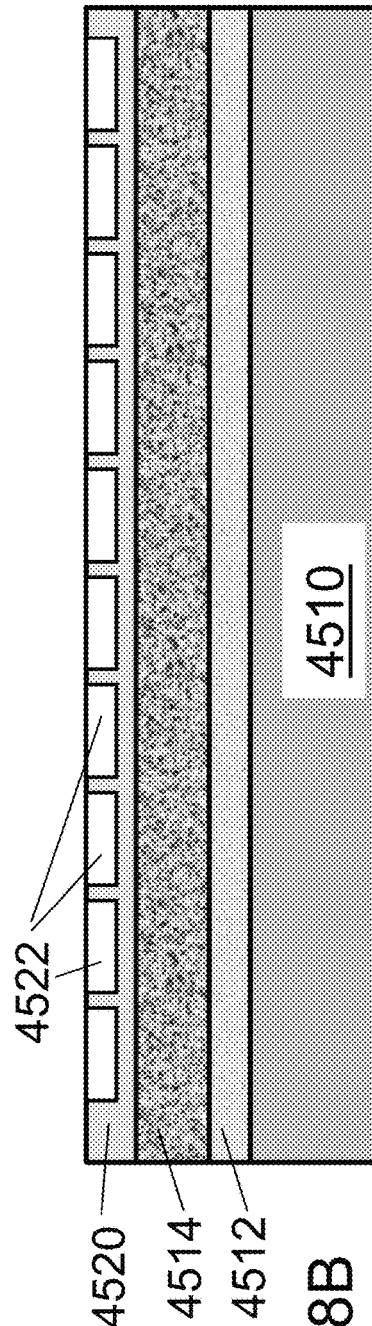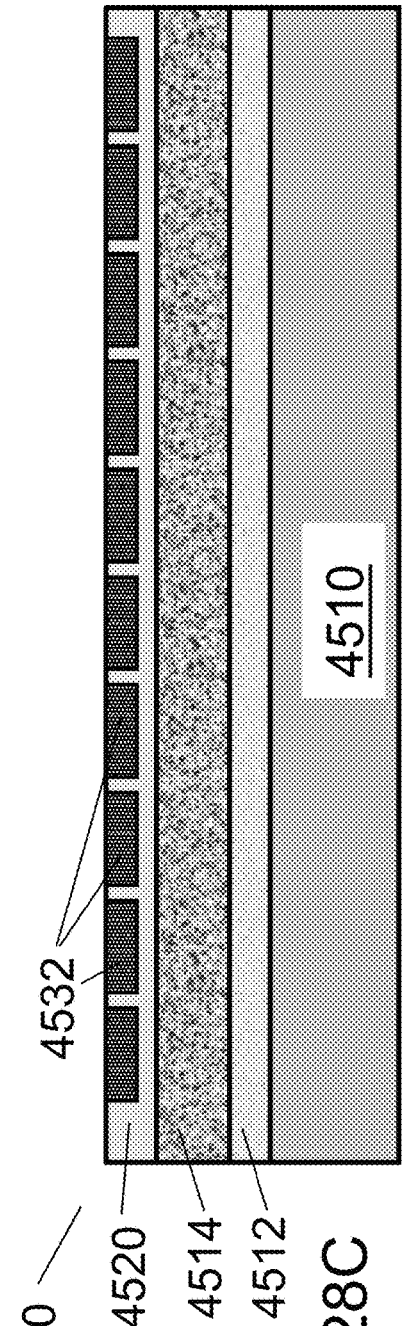

3D SEMICONDUCTOR DEVICE AND STRUCTURE WITH CONNECTION PATHS

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016, 10,991,675, 11,121,121, 11,502,095, 10,892,016, 11,270,988; and pending U.S. Patent Application Publications and applications, Ser. Nos. 14/642,724, 15/150,395, 15/173,686, 62/651,722; 62/681,249, 62/713,345, 62/770,751, 62/952,222, 62/824,288, 63/075,067, 63/091,307, 63/115,000, 63/220,443, 2021/0242189, 2020/0013791; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), PCT/US2018/52332 (WO 2019/060798), PCT/US2021/44110, and PCT/US22/44165. The entire contents of all of the foregoing patents, publications, and applications are incorporated herein by reference.

In addition, the entire contents of U.S. Pat. Nos. 8,283, 215, 8,163,581, 8,753,913, 8,823,122, 9,197,804, 9,419,031, 9,941,319, 10,679,977, 10,943,934, 10,998, 374, 11,063,071, and 11,133,344. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679,977, and 10,943, 934. The entire contents of the foregoing patents, publications, and applications are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting. In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated:

Among the technologies to form the detaching layer, one of the well-known technologies is Hydrogen Exfoliating Implant. This method has a critical disadvantage which can destroy lattice structures of the substrate because it uses high amount of ion implantation. In order to recover the destroyed lattice structures, the substrate should be cured by heat treatment in very high temperature long time. This kind of high temperature heat treatment can damage cell devices in the lower regions." Furthermore, in U.S. application Ser. No. 13/175,652 it is stated: "Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and longtime should be performed, and this can strongly damage the cell devices underneath." In fact the Inventor had posted a video infomercial on his corporate website, and was up-loaded on YouTube on Jun. 1, 2011, clearly stating in reference to the Smart Cut process: "The wafer bonding and detaching method is well-known SOI or Semiconductor-On-Insulator technology. Compared to conventional bulk semiconductor substrates, SOI has been introduced to increase transistor performance. However, it is not designed for 3D IC either. Let me explain the reasons . . . . The dose of hydrogen is too high and, therefore, semiconductor crystalline lattices are demolished by the hydrogen ion bombardment during the hydrogen ion implantation. Therefore, typically annealing at more than 1,100 Celsius is required for curing the lattice damage after wafer detaching. Such high temperature processing certainly destroys underlying devices and interconnect layers. Without high temperature annealing, the transferred layer should be the same as a highly defective amorphous layer. It seems that there is no way to cure the lattice damage at low temperatures. BeSang has disruptive 3D layer formation technology and it enables formation of defect-free single crystalline semiconductor layer at low temperatures . . . ."

In at least one embodiment presented herein, at least one innovative method and device structure to repair the crystal lattice damage caused by the hydrogen implant is described.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al. and "High Performance Heat Sinking for VLSI," IEEE Electron Device Letters, vol. EDL-2, No. 5, May 1981, by D. B. Tuckerman and R. F. W. Pease.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

In addition, thermal limitations during IC fabrication have been a big obstacle on the road to monolithic three-dimensional ICs. The semiconductor and microelectronic processing techniques to form transistors, circuits, and devices, for example to form some silicon oxides or nitrides, repair damages from processes such as etching and ion-implantation, annealing and activation of ion implanted species, and epitaxial regrow techniques, have processing temperatures (for example, greater than 400° C.) and times at temperature that would damage and harm the underlying metallization and/or device layers and structures. These processes may involve transient (short timescales, such as less than 500 ns short wavelength laser pulses) heat exposures to the wafer being processed, or steady state applications (such as RTA, RTO, spike, flash, CVD, ALD) of heat and/or heated material or gases that may have processing times of seconds, minutes, or hours.

Techniques to remove heat from 3D Integrated Circuits and Chips and protect sensitive metallization and circuit elements from either the heat of processing of the 3D layers or the operationally generated heat from an active circuit, will be beneficial.

Additionally the 3D technology according to some embodiments of the invention may enable some very innovative IC devices alternatives with reduced development costs, novel and simpler process flows, increased yield, and other illustrative benefits.

SUMMARY

The invention may be directed to multilayer or Three Dimensional Integrated Circuit (3D IC) devices and fabrication methods.

In one aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, and where the second level includes at least one voltage regulator.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one memory array, and where the third layer includes crystalline silicon; and a heat removal path from the third level to an external surface of the device.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, and where the second level includes at least one charge pump circuit.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one memory array, where the first level includes a first die area, where the first level includes a first clock tree, where the second level includes a second clock tree, where at least one of the connection paths includes connecting between the first clock tree and the second clock tree, and where the third layer includes crystalline silicon.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one area I/O.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one memory array, where the third layer includes crystalline silicon, and where the second level includes at least one Phase Lock Loop (PLL) circuit.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one memory array, where the first level includes a first die area, where the first level includes a first scan chain, where the second level includes a second scan chain, where at least one of the connection paths includes connecting between the first scan chain and the second scan chain, and where the third layer includes crystalline silicon.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one memory array, where the third layer includes crystalline silicon; and where the second level includes at least one SerDes circuit.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one memory array, where the third layer includes crystalline silicon, and where the second level includes at least one oscillator circuit.

In another aspect, a 3D semiconductor device, the device including: a first level, where the first level includes a first layer, the first layer including first transistors, and where the first level includes a second layer, the second layer including first interconnections; a second level overlaying the first level, where the second level includes a plurality of second transistors, where the second level includes a third layer, the third layer including first conductive lines; a third level overlaying the second level, where the third level includes a plurality of third transistors, where the third level includes a fourth layer, the fourth layer including second conductive lines; and a plurality of connection paths, where the plurality of connection paths provides electrical connections at least from a plurality of the first transistors to the plurality of third transistors, and where the first level includes at least one voltage regulator.

In another aspect, a 3D semiconductor device, the device including: a first level, where the first level includes a first layer, the first layer including first transistors, and where the first level includes a second layer, the second layer including first interconnections; a second level overlaying the first level, where the second level includes a plurality of second transistors, where the second level includes a third layer, the third layer including first conductive lines; a third level overlaying the second level, where the third level includes a plurality of third transistors, where the third level includes a fourth layer, the fourth layer including second conductive lines; and a plurality of connection paths, where the plurality of connection paths provides electrical connections from a plurality of the first transistors to the plurality of third transistors, and where the first level includes at least one PLL circuit.

In another aspect, a 3D semiconductor device, the device including: a first level, where the first level includes a first layer, the first layer including first transistors, and where the first level includes a second layer, the second layer including first interconnections; a second level overlaying the first level, where the second level includes a plurality of second transistors, where the second level includes a third layer, the third layer including first conductive lines; a third level overlaying the second level, where the third level includes a plurality of third transistors, where the third level includes a fourth layer, the fourth layer including second conductive lines; and a plurality of connection paths, where the plurality of connection paths provides electrical connections from a plurality of the first transistors to the plurality of third transistors, and where the first level includes at least one SerDes circuit.

BRIEF DESCRIPTION OF THE DRAWINGS

Various embodiments of the invention will be understood and appreciated more fully from the following detailed description, taken in conjunction with the drawings in which:

FIGS. 6A-6G are exemplary illustrations of an n-channel FD-MOSFET with integrated TRL (Trap Rich Layer) device and process flow;

FIG. 8 is an exemplary illustration of an ELTRAN based donor wafer with a multi-layered porous structure ready provided as a substrate for a standard processing flow;

FIGS. 9A-9B is an exemplary illustration of an ELTRAN based donor wafer after front line processing to construct transistors and flow;

FIGS. 10A-10D is an exemplary illustration of an ELTRAN based donor wafer after front line processing to construct transistors be prepared by adding contacts and at least a first metal for transfer onto a target wafer, and flow;

FIGS. 11A-11E is an exemplary illustration of an ELTRAN based donor wafer after front line processing to construct transistors then transfer the donor layer first to a carrier wafer and then from the carrier wafer to the target wafer;

FIGS. 12A-12E is an exemplary illustration of an ELTRAN based donor wafer after front line processing to construct dual strata transistors and make the carrier wafer more resistive to an undesired split while the donor wafer is being split off;

FIG. 14 is an illustration referring to Back Bias (BB) for Ultra-Thin Body (UTBB) FD-SOI (Fully Depleted Silicon on Insulator);

FIGS. 15A-15B, 15B-1, 15C-15D is an exemplary illustration of an alternative porous silicon based donor wafer structure;

FIG. 17 is an exemplary illustration of an alternative flow utilizing a donor wafer structure to construct 3DICs with a final carrier;

FIGS. 18A-18C is an exemplary illustration of an alternative flow utilizing a donor wafer structure to construct 3DICs with a final carrier where a multiple strata structure could be transferred to a functional final carrier or final substrate;

FIGS. 19A-19C is an exemplary illustration of an alternative flow utilizing a donor wafer structure to construct programmable logic 3DICs;

FIG. 20 is an exemplary illustration of an exemplary wafer structure 3700 for porous silicon based processes;

FIGS. 23A and 23B are exemplary illustrations of additional sidewall protection schemes for porous layers;

FIGS. 24A-24C are exemplary illustrations of forming multilayer porous structures;

FIGS. 28A-28C are exemplary illustrations of picking dies and placing them into a carrier wafer and then move the carrier wafer onto a target wafer.

DETAILED DESCRIPTION

Figure 1:
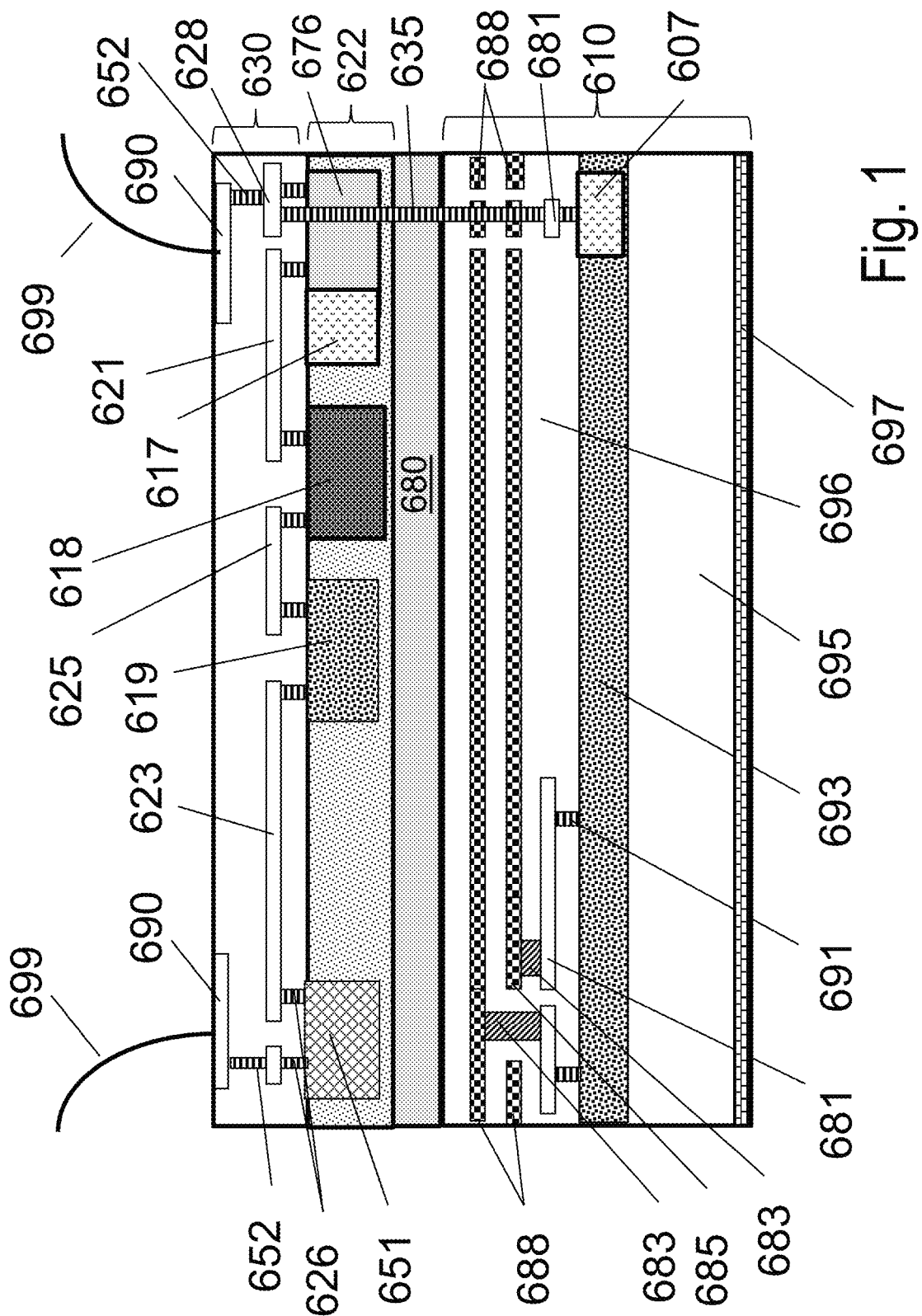
FIG. 1 is an exemplary illustration of embodiments and combinations of devices, circuits, paths, and connections of a 3D device.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

Some monolithic 3D approaches are described in U.S. Pat. Nos. 8,273,610, 8,557,632, 8,298,875, 8,557,632, 8,163,581, 8,378,715, 8,379,458, 8,450,804, 8,574,929, 8,581,349, 8,687,399, 8,742,476, 8,674,470, 8,994,404, 9,023,688, 9,219,005, 9,385,058, 9,640,531. The entire contents of the foregoing patents are incorporated herein by reference.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting or absorbent material layer or layers (which may be called a shield) is incorporated between the sensitive metal interconnect layers and the layer or regions being optically irradiated and annealed, or annealed from the top of the 3D-IC stack using other methods. An exemplary generalized process flow is shown in FIGS. 33A-F of incorporated patent reference 8,574,929. An exemplary process flow for an FD-RCAT with an optional integrated heat shield/spreader is shown in FIGS. 34A-G of incorporated patent reference 8,574,929. An exemplary process flow for a FD-MOSFET with an optional integrated heat shield/spreader is shown in FIGS. 45A-G of incorporated patent reference 8,574,929. An exemplary process flow for a planar fully depleted n-channel MOSFET (FD-MOSFET) with an optional integrated heat shield/spreader and back planes and body bias taps is shown in FIGS. 46A-G of incorporated patent reference 8,574,929. An exemplary process flow for a horizontally oriented JFET or JLT with an optional integrated heat shield/spreader is shown in FIGS. 47A-G of incorporated patent reference 8,574,929. An alternate method to construct a planar fully depleted undoped channel MOSFET (FD-MOSFET) with an optional integrated heat shield/spreader and back planes and body bias taps suitable for a monolithic 3D IC is shown in FIGS. 5A-5F of parent US 2017/0207214. The 3D-ICs may be constructed in a 3D stacked layer using procedures outlined herein and such as, for example, FIGS. 39, 40, 41 of incorporated patent reference 8,574,929 and in other incorporated references. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, CA, USA (10.6 um laser wavelength), or a short pulse laser (such as 160 ns), with 308 nm wavelength, and large area (die or step-field sized, including 1 $cm^2$) irradiation such as offered by Excico of Gennevilliers, France, may be utilized (for example, see Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012). Additionally, the defect anneal may include, for example, laser anneals (such as suggested in Rajendran, B., "Sequential 3D IC Fabrication: Challenges and Prospects", Proceedings of VLSI Multi Level Interconnect Conference 2006, pp. 57-64), Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or neutral/reducing atmospheres (such as nitrogen or argon or hydrogen). The topside defect anneal may include temperatures of the layer being annealed above about 400° C. (a high temperature thermal anneal), including, for example, 600° C., 800° C., 900° C., 1000° C., 1050° C., 1100° C. and/or 1120° C., and the sensitive metal interconnect (for example, may be copper or aluminum containing) and/or device layers below may not be damaged by the annealing process, for example, which may include sustained temperatures that do not exceed 200° C., exceed 300° C., exceed 370° C., or exceed 400° C. As understood by those of ordinary skill in the art, short-timescale (nanosceonds to milliseconds) temperatures above 400° C. may also be acceptable for damage avoidance, depending on the acceptor layer interconnect metal systems used. The topside defect anneal may include activation of semiconductor dopants, such as, for example, ion implanted dopants or PLAD applied dopants. It will also be understood by one of ordinary skill in the art that the methods, such as the heat sink/shield layer and/or use of short pulse and short wavelength optical anneals, may allow almost any type of transistor, for example, such as FinFets, bipolar, nanowire transistors, to be constructed in a monolithic 3D fashion as the thermal limit of damage to the underlying metal interconnect systems is overcome. Moreover, multiple pulses of the laser, other optical annealing techniques, or other anneal treatments such as microwave, may be utilized to improve the anneal, activation, and yield of the process. The transistors formed as described herein may include many types of materials; for example, the channel and/or source and drain may include single crystal materials such as silicon, germanium, or compound semiconductors such as GaAs, InP, GaN, SiGe, and although the structures may be doped with the tailored dopants and concentrations, they may still be substantially crystalline or mono-crystalline. The transistors in a first layer of transistors may include a substantially different channel and/or source/drain material than the second layer of transistors. For example, the first layer of transistors may include silicon-based transistor channels and the second layer of transistors may include a germanium based transistor channels.

The various layers of a 3D device may include many types of circuitry, which may be formed by regions of transistors and other semiconductor device elements within that layer or in combination with other layers of the 3D device, and connections between the transistors within the same region, region to region and vertically (layer to layer. stratum to stratum) may be provided by layers of interconnect metallization and vertical connections such as TLVs and TSVs. In addition, power routing within the 3D device may utilize thicker and/or wider (more conductive) interconnect metallization than another layer, especially if the layer is closest to the source of external power and/or has a greater current load/supply requirement. Many individual device and interconnect embodiments for 3D devices have been described herein and in the incorporated patent references. As illustrated in FIG. 1 herein, some additional embodiments and combinations of devices, circuits, paths, and connections are described and may utilize similar materials, constructions and methods as the incorporated references or discussed herein. With reference to embodiments described, for example, herein and, with respect to FIG. 46 of incorporated reference U.S. Pat. No. 8,574,929, and in the disclosures of many of the other incorporated patent references, a substrate layer, which may have a thicker body than other semiconductor layers above or within the 3D device, such as acceptor 610, may be formed and may include heat sink 697, acceptor substrate 695, acceptor wafer transistors and circuits 693, first (acceptor) layer metal interconnect 681 which may include first layer contacts 691, first layer vias 683, at least one shield layer/region 688 (two layers and many regions, such as lower level shield layer region 685, shown), interconnect insulator regions 696 and ESD diode structures 607. A second semiconductor layer may be transferred and constructed on top of the first layer with isolation layer 680 in-between and vertical layer to layer interconnections may be provided by TLV/TSV 635, only one is shown. A layer of transistors and circuits 622 may include second layer input device structures 676, FD ESD structures 617, Phase Lock Loop circuits PLL 618, SERDES circuitry 619, and output device structure 651. Second interconnections layer 630 may include at least one layer/regions of metallization and associated contacts and via, for example, second layer metallization M1 segments 628, 621, 623, 625, second layer contacts 626, second layer vias 652, and conductive pads 690. The 3D device may be connected to external devices utilizing many structures known to those of ordinary skill in the art, for example, bond wires 699. Input device structures 676 and output device structure 651 may be connected to external devices through, for example, second layer contacts 626, second layer metallization M1 segments 628, second layer vias 652, conductive pads 690, and bond wires 699. A portion of the transistors within input device structures 676 and output device structure 651 may be larger in either or both width and length than most transistors within acceptor wafer transistors and circuits 693, and may have a different gate oxide, in thickness and/or composition. Input device structures 676 (and output device structure 651) may be subjected to voltage and/or current transients from external devices or generated externally and traveling to the 3D device along bond wires 699. Input device structures 676 (and output device structure 651) may be protected by dissipating the transient energy in diode structures, such as ESD diode structures 607 on the relatively thicker (than for example, the second semiconductor layer) acceptor substrate 695, which may be connected by a multiplicity of connection stacks such as first (acceptor) layer metal interconnect 681 which may include first layer contacts 691, first layer vias 683, at least one shield layer/region 688, TLV/TSV 635, and second layer metallization M1 segments 628. Input device structures 676 (and output device structure 651) may be protected by dissipating the transient energy in a transient filtering circuitry such as for example, FD ESD structures 617, which may reside on a relatively thin semiconductor layer in the 3D device and may effectively utilize fully depleted transistors in the filter circuitry. FD ESD structures 617 may be coupled to input device structures 676 (and output device structure 651) by second layer interconnections (not shown). Input device structures 676 may be connected to PLL 618, for example, thru second layer metallization M1 segment 621 and second layer contacts 626. Input device structures 676 may be connected to SERDES circuitry 619, for example, thru second layer metallization (not shown). A monolithic 3D stack, wherein at least one of the layers in the stack is very thin (less than about 200 nm), may provide an unexpected benefit. The thicker substrate may be used for energy dissipating diodes to handle large energy transients and the thin ('second' or 'third' etc.) layer may be used for a high frequency switching capability to protect against a high frequency transient on the input lines. This may be done simultaneously on an I/O. Furthermore, one style could be chosen for specific I/Os as well. The monolithic 3D structure (thin/thick) also provides a low capacitance drive output and very fast input device structure ('fully depleted' transistors), yet still be protected from high energy transients that could be dissipated in the bulk (first layer). This 'two-tier' ESD structure invention could also provide cost effective I/Os anywhere throughout the area of the device, as the larger sized (area-wise) diodes could be placed underneath the second layer input transistors. This would also provide a closer than 2D layout coupling of the I/O to the other chip circuitry, as the large energy dissipating diodes are not on the same level as the circuitry proper, and would not interfere with the data circuitry operation (noise). Output device structures 651 may be connected to SERDES circuitry 619, for example, thru second layer metallization M1 segment 623 and second layer contacts 626. Output device structures 651 may drive signals thru the connection to conductive pads 690 and then out to external devices thru bond wires 699. Transistors within a lower layer, for example within acceptor wafer transistors and circuits 693, may be connected (not shown) to the output device structure 651 and drive a signal to the output device structure 651, and a portion of the transistors of output device structure 651 may have a larger width and/or length than the transistors within acceptor wafer transistors and circuits 693. Power from external sources may be routed thru bond wires 699 to conductive pads 690 to the 3D device, wherein at least a portion of the second interconnections layer 630 may be constructed with thicker and/or wider metallization wiring (for example 4× wiring as described in incorporated patent references) so to provide the higher current carrying capability required for the second layer power distribution grid/network than that of the lower layer, in this example, first layer metallization wiring (for example 1× or 2× wiring as described in incorporated patent references). The width and/or length of the transistors of the second layer of transistors and circuits 622, for example a portion of those in second layer input device structures 676 and/or FD ESD structures 617 and/or output device structures 651, may be substantially larger than the width and/or length of transistors in acceptor wafer transistors and circuits 693. Local ESD clamps or triggering elements may be constructed with the bulk or FD devices, and the FD (UTBB) devices may be band-modulation devices such as the FED (Field Effect Diode), $Z^2$-FET (Zero impact ionization and Zero sub-threshold swing) or BBCT (SOI-BackBiasControlled-Thyristor). One example in 2D may be found in Y. Solaro, et al., "Innovative ESD protections for UTBB FD-SOI Technology," IEEE IEDM 2013, paper 7.3, the contents fully incorporated herein by reference. The back-gate/bias plane may be accomplished with an integrated device, for example, a back-channel region 522 or by a base layer (or layer below) top metal plate/line (for example, such as the topmost shield layer/region 688) in a monolithic 3D configuration. In a monolithic 3D configuration as disclosed herein and in the incorporated references, the layers above the base/substrate layer are naturally constructed SOI, wherein the above techniques to create the back gate controlled ESD structures may be accomplished without the complexity of 2D processing of the buried layers and connections. Design of the ESD protection for, for example, a single-pole multiple throw (SPMT) Tx/Rx switch for multi-mode smart phones, may include a series shunt topology where each path has a series branch to the antenna and a shunt branch to ground (one example in 2D may be found in X. S. Wang, et al. IEEE S3S Conference 2013 paper "Concurrent Design Analysis of A 8500V ESD protected SP10T Switch in SOI CMOS," the contents fully incorporated herein by reference. Feed-forward capacitors (FFCs) may be used to keep an even distribution of AC voltage drops across the shunt branches. The FFCs may be constructed in the same layer as the shunts (preferably an RF optimized layer), the layer below or the layer above. This allows flexibility in type, value, and/or the ability to adjust (hard wired, electrically programmable, or top-layer laser/ e-fuse programmable) each of the shunts effective FFC value.

Conductive pads 690 and associated I/O circuits and any redistribution layers may be arranged and lay-ed out in many configurations. For example, conductive pads 690 may be designed and lay-ed out as a perimeter bond pad grouping or as an array I/O wherein the conductive bond pads may be arrayed throughout the area of the die when viewed from above or below. Conductive pads 690, whether arrayed in area or perimeter, may include the associated I/O and/or ESD circuitry positioned vertically below (or above for 'backside pads') the conductive pads and on the same layer/stratum, vertically below (or above for 'backside pads') on a layer/stratum not the same as the conductive pad layer/stratum, or not vertically below (or above for 'backside pads') the conductive pad, yet on the same layer/stratum as the conductive pads 690 or on a layer/stratum not the same layer/stratum. Array packages may include the PGA, BGA, FBGA, Fan-in QFN, and Fan-out WLPs and may utilize attachments such as solder balls or columns.

Stress relief from wire bonding, ball bonding, column attaching may be mitigated in the 3DIC stack. For example, conductive bond pad 690 may be replicated in full or in part down one or more layers/stratum directly below, and this 'stack of bond pads' may extend to the substrate 695. Bonding stresses may be mitigated by forming a relatively soft layer or region underneath conductive bond pads 690, for example a low-k dielectric and/or an aero-gel. In addition, a region or layer of a conductive aerogel may be formed underneath conductive pad 690 that would allow at least a one-time crush and still maintain conductivity and reliability. A combination of a hard layer and then a soft layer may also be employed below conductive pads 690. Young's modulus may be a measure of soft and hard. A MEMS structure, for example a torsion spring assembly, may be formed directly underneath the bonding area of conductive pad 690.

Persons of ordinary skill in the art will appreciate that the illustrations in FIG. 1 are exemplary and are not drawn to scale. Such skilled persons will further appreciate that many variations may be possible such as, for example, a thick enough semiconductor layer to enable ESD diode style protection circuitry to be constructed need not only be on the base or substrate layer, but may reside elsewhere in the 3D device stack. Moreover, the output circuitry including output device structures 651 may wholly or partially reside on a semiconductor transistor layer that is not on top, and vertical connections including TLVs/TSV may be utilized to connect the output device structures 651 to conductive pads 690. Furthermore, the input circuitry including input device structures 676 may wholly or partially reside on a semiconductor transistor layer that is not on top, and vertical connections including TLVs/TSV may be utilized to connect the input device structures 676 to conductive pads 690. Similarly, SERDES circuitry and 619 PLL 618 may wholly or partially reside on a semiconductor transistor layer that is not on top, these choices being one of design choice and device characteristics driven. Furthermore, connection to external devices (signal and/or power supply) may be made on the backside of acceptor substrate 695. Moreover, connection to external devices form the 3D device may utilize many types of structures other than bond wires 699 shown in the illustration, for example, flipchip and bumps, and/or wireless circuitry. Thus the invention is to be limited only by the appended claims.

A 3D system, such as has been described herein and in relation to at least FIG. 11 and FIG. 12 of incorporated reference U.S. Pat. No. 8,378,715, is not limited to a configurable system and could be used in other types of platform configurations. The strata of such a 3D system could be connected by TSV and might use an interposer or be directly placed one on top of the other. Also the strata might be connected by what has been called in this application and the patents, publications, and applications that are incorporated by reference, through layer via ("TLV") where the layer carrying the transistor may be thin (below about 2 micron or below about 100 nm in thickness or below about 30 nm in thickness).

Figure 2:
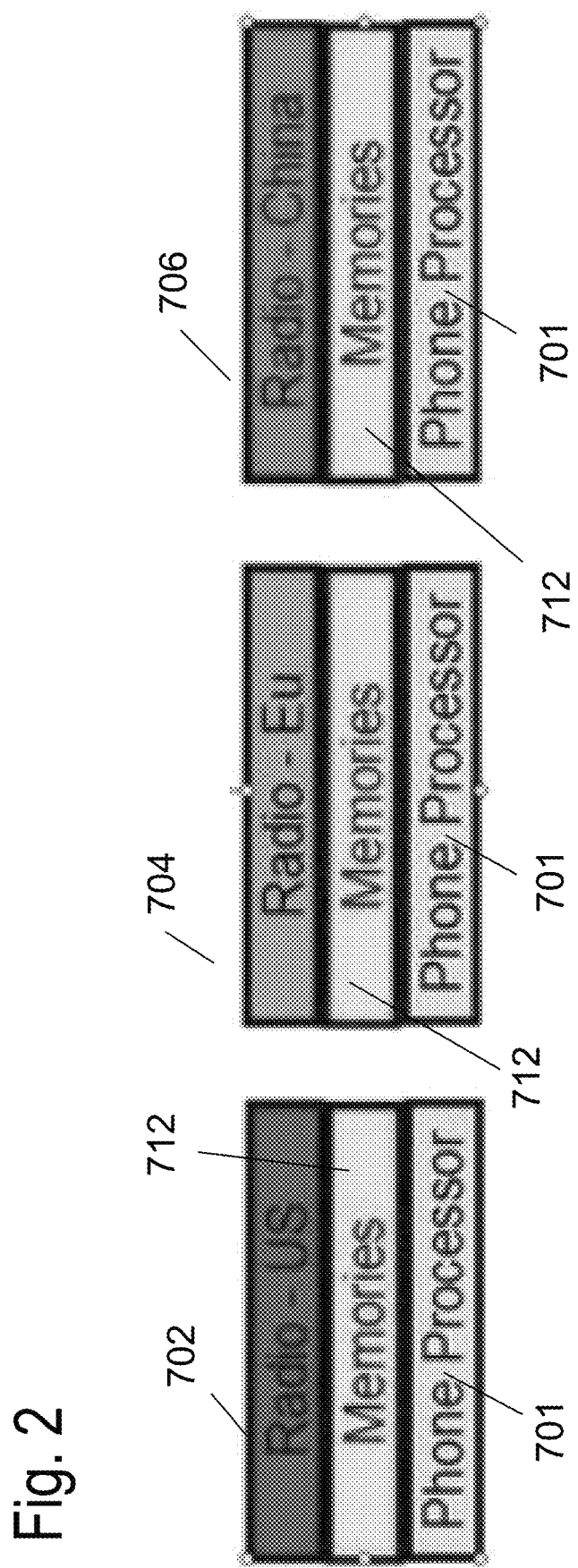
FIG. 2 is an exemplary illustration of a 3D platform.

FIG. 2 illustrates a 3D platform constructed accordingly. Platform base 701 could be the same type of stratum, for example, a Phone Processor, which may be overlaid by and connected to a second stratum 712, for example, a memory stratum. This platform could be produced in high volume and could be stocked in wafer form or die form. A market specific 3D system could be constructed by overlaying and connecting to the platform (formed by platform base 701 and second stratum 712), a third stratum which maybe designed and manufactured for a specific market, for example, a Radio for US 702, a Radio for Europe 704 or a Radio for China 706. The system could be constructed of stratum on top of a stratum interconnected by TSV or TLV or side by side wiring using, what is now called by the industry, interposers. There are many advantages for such a 3D platform, including reduced cost of the common element design, reduced cost of volume manufacturing, and shorter time to market and to volume for any new specific market that need only few, and ideally only one, customized stratum and the remainder of the system a similar set of stratums.

Additional embodiment for a 3D platform is to use a variation of strata which might include in some platforms a single stratum of memory and in another platform two strata of memory offering a larger memory. Another variation could use a different amount of programmable logic ranging from no programmable logic to multiple strata of programmable logic. Another variation could add special system input/output resources ranging from no SERDES to one or more strata of I/O (Input Output) that may include various amounts of SERDES enabled I/O.

While the previous discussion described how an existing power distribution network or structure could be designed/ formed and they can transfer heat efficiently from logic/ memory cells or gates in 3D-ICs to their heat sink, many techniques to enhance this heat transfer capability will be described herein and in at least incorporate reference U.S. Pat. No. 8,803,206. Many embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. The heat transfer capability enhancement techniques may be useful and applied to different methodologies and implementations of 3D-ICs, including monolithic 3D-ICs and TSV-based 3D-ICs. The heat removal apparatus employed, which may include heat sinks and heat spreaders, may include an external surface from which heat transfer may take place by methods such as air cooling, liquid cooling, or attachment to another heat sink or heat spreader structure In 3D systems, a portion of the layers/strata might be dedicated to memory and a portion to logic. The memory layer could include various type of memory such SRAM, DRAM, Floating Body RAM, R-RAM and Flash types. The memory layer might include the memory control circuits and memory peripheral circuits or those could be in a layer above or below the memory layer. The memory could be constructed on a single layer or might include two or more layers. An effective option could be to use two or more layers of memories utilizing an architecture such as have been presented in the incorporated by reference patents, publications, and applications, wherein a lithography step may be used to pattern two or more layers together, thus reducing the overall cost by sharing the costly step of lithography across two or more layers. Some memory layers could be dedicated to a single type of memory or to mix of various types of memory. For example, a compute layer may be supported by multiple layers of memory processed with lithography that is shared across these multiple layers, and where these layers may include non-volatile memory to hold the program and volatile memory to hold data.

An attractive advantage of having the memory decoders and logic above the memory layer wherein the memory layer may be an array of bit cells, relates to an option of pre-patterning the transferred layer prior to the layer transfer. In such a case many high temperature steps could be performed on that layer before the layer transfer, such as forming trench isolation or even full transistors as has been presented in at least U.S. Pat. No. 8,273,610 and before in relation to FIG. 19 of incorporated reference U.S. Pat. No. 8,378,715. Accordingly a transferred layer misalignment could be reduced when the transfer layer is patterned with a repeating pattern. The same concept could be inverted, with a non-repeating layer transferred on top of a repeating one. Accordingly, the alignment error could be reduced to about the size of the repeating element, the bit cell. This approach is similar to the method presented in relation to FIG. 19 of incorporated reference U.S. Pat. No. 8,378,715, except that in this case the shift to compensate for the misalignment may be done in respect to the bit-cell array. This approach will require a relatively larger window to be etched so the required memory could be sized through the overlaying transferred layer and then a connection to the bit lines and word lines could be made by including large enough landing zones/strips to connect to them.

In such way a single expensive mask set can be used to build many wafers for different memory sizes and finished through another mask set that is used to build many logic wafers that can be customized by few metal layers.

Figure 3:
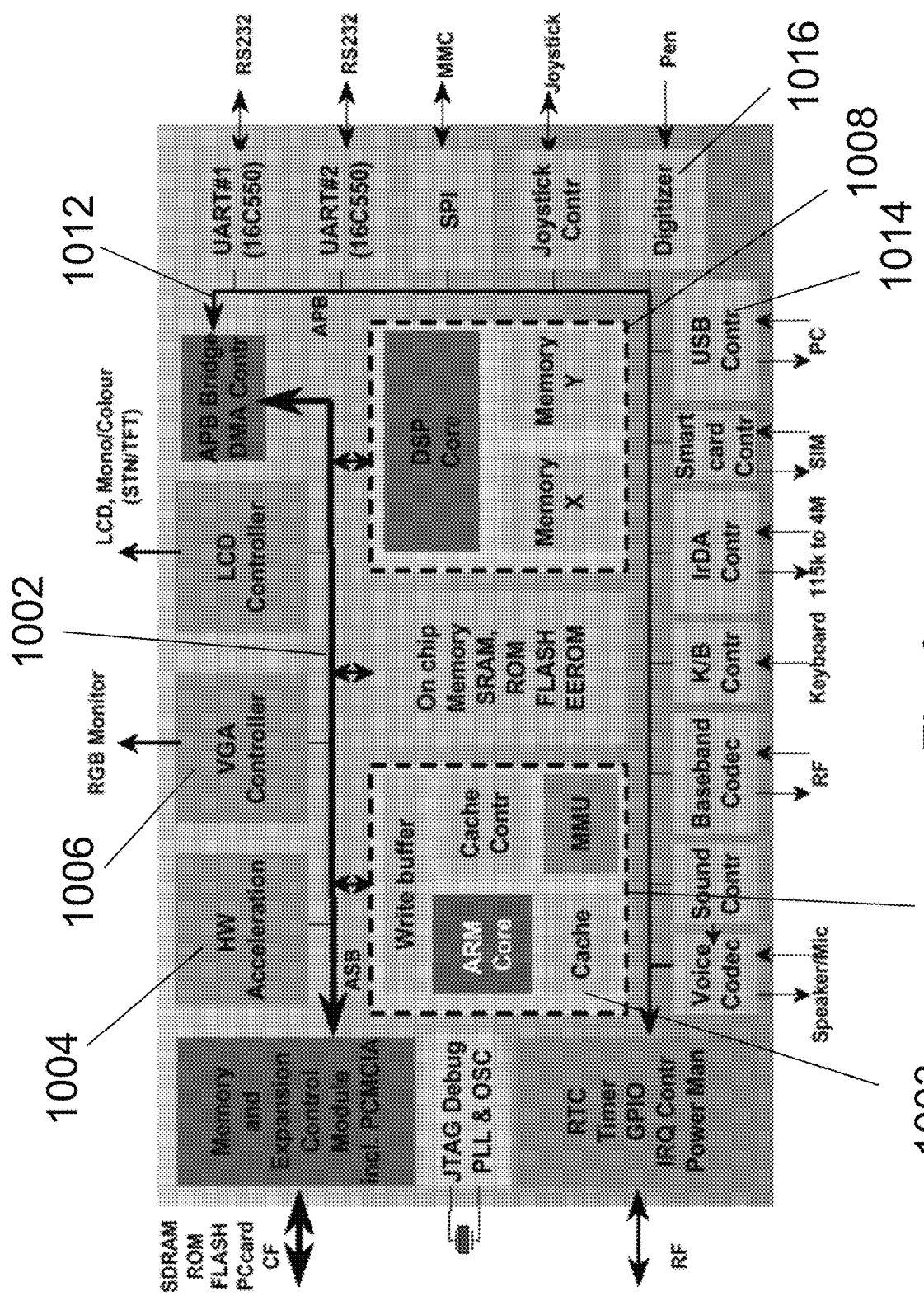
FIG. 3 is an exemplary illustration of a flowchart of a system that uses a processor and at least one bus.
Figure 4A:
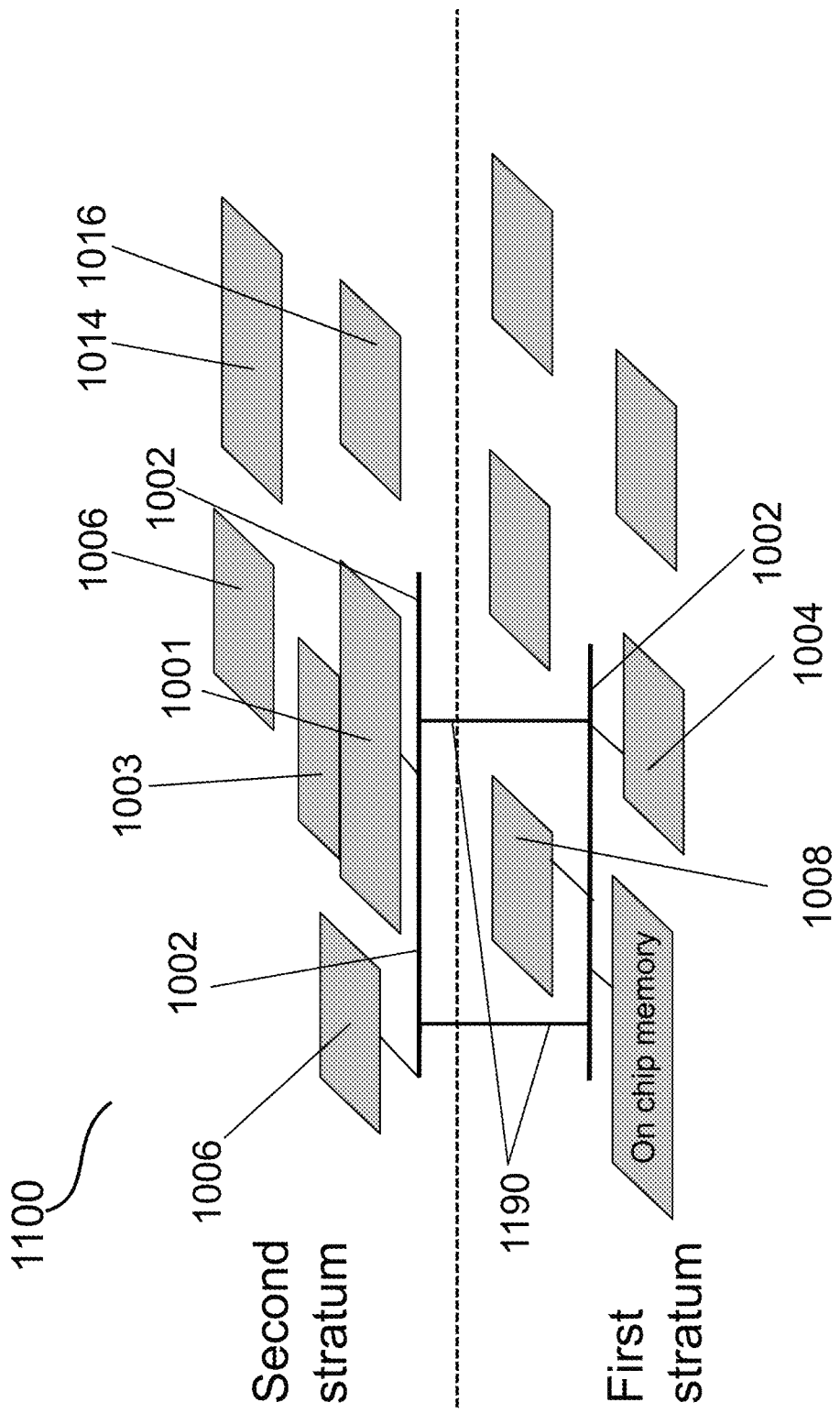
FIG. 4A illustrates an exemplary partitioned 3D system/device.

Many devices may have at least one processor on chip and often more than one. In most cases these processors use at least one bus to commonly communicate with multiple sub systems such as memory and peripherals. FIG. 3 is a drawing illustration of an exemplary system that uses a processor such as, for example, ARM processor 1001 that is connected directly with cache memory 1003 and using a bus 1002 to connect to at least two sub-systems, such as, for example, Hardware Acceleration 1004 and graphic controller 1006. Bus 1002 could be used by a second processing unit such as DSP 1008 to connect to other elements in the overall system. Such a system could also include additional secondary bus 1012 to manage the connection of peripheral units such as, for example, USB Controller 1014 and Digitizer 1016. In many cases a design objective may be to achieve a higher speed of processor operation or to reduce power by making the lines constructing the bus shorter. In a 3D system such objective might be achieved, for example, by properly splitting/partitioning the subsystems connecting to the bus 1002 between the stratum the processor 1001 is on and another stratum that is either above it or below it. (See, for example, FIG. 4A, an exemplary 3D system/device 1100 with exemplary elements, such as, a processor such as, for example, ARM processor 1001, cache memory 1003, a portion of bus 1002 located on the first stratum, Hardware Acceleration 1004, DSP 1008, on-chip memory, graphic controller 1006, and a portion of bus 1002 located on the second stratum which may be connected to the portion of bus 1002 located on the first stratum utilizing TLVs 1190). Another objective related to such splitting/partitioning relates to the fact that some of the units, for example, graphic controller 1006, USB Controller 1014 and Digitizer 1016, have at least one (typically many) connection to external devices, and it may be desired to place those particular logic units on the strata closer to the connection to the external devices, which in some cases might be the top-most stratum. Many types of buses may be utilized in a 3D system, such as, for example, an Advanced Microcontroller Bus Architecture (AMBA) bus, a CoreConnect bus, a STBus, a Wishbone bus, an Open Core Protocol (OCP) bus, or a Virtual Component Interface (VCI) bus.

Figure 4B:
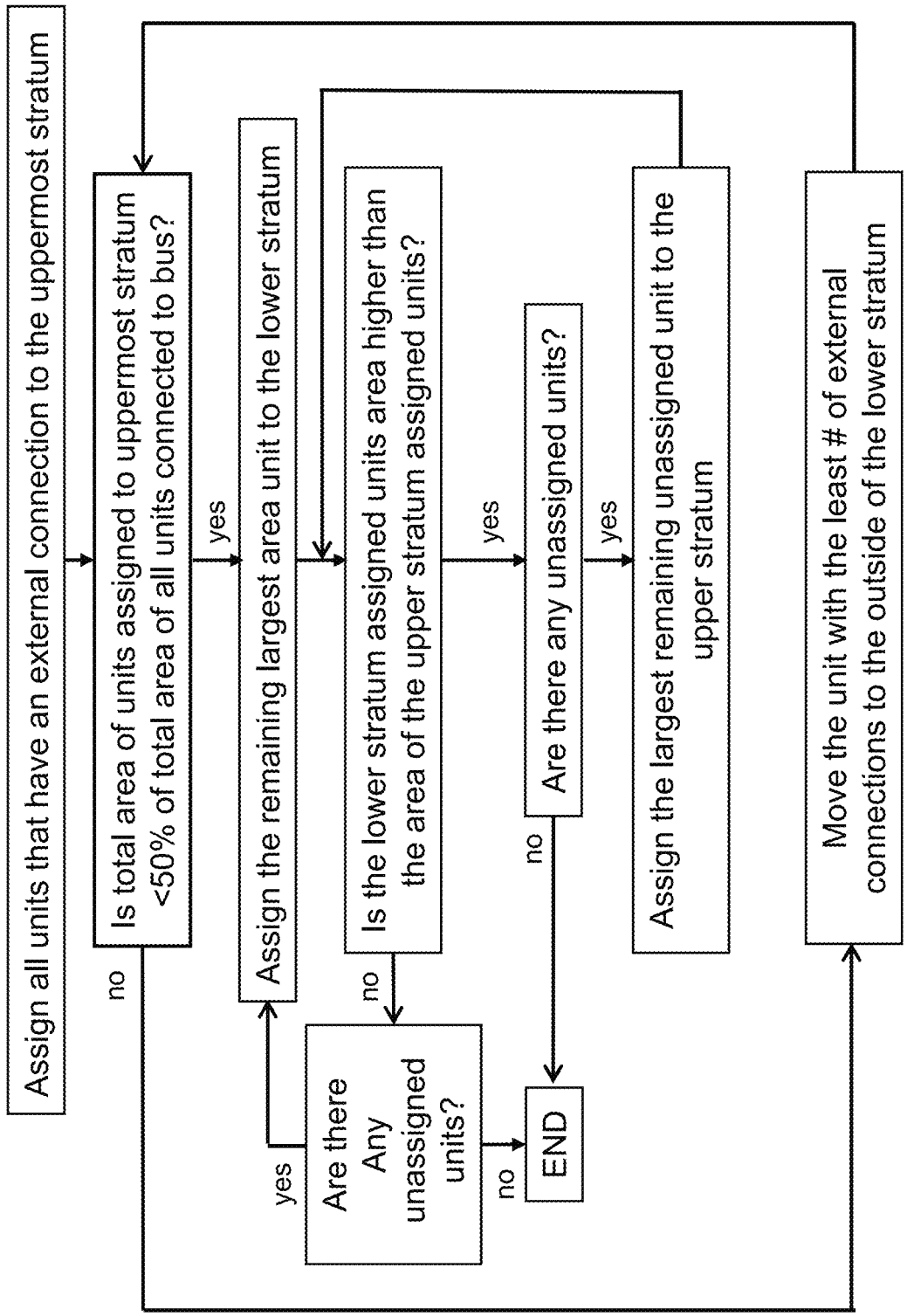
FIG. 4B is an exemplary illustration of a flowchart of partitioning logic units onto at least two stratums.

As illustrated in FIG. 4B, one such splitting/partitioning approach could suggest first placing the logic units that are connected to the bus and have an external connection on the upper stratum. Then, if the total area of these units is less than half of the total area of all the units connected to that bus, start assigning units to the lower stratum from the bigger units to the smaller until the area of those assigned to the lower stratum just exceeds the area of those logic units assigned to the upper stratum. Then assign the biggest un-assigned unit to the upper tier and repeat. If the total area of these units (those units first assigned to the upper stratum) is greater than half of the total area of all the units connected to that bus, then move the unit with the least number of external connections may be moved to the lower stratum (outside if possible for potentially better connectivity), and repeat if necessary to bring the upper stratum assigned area to just below 50% of the total area of all the units connected to that specific bus.

Figure 5A:
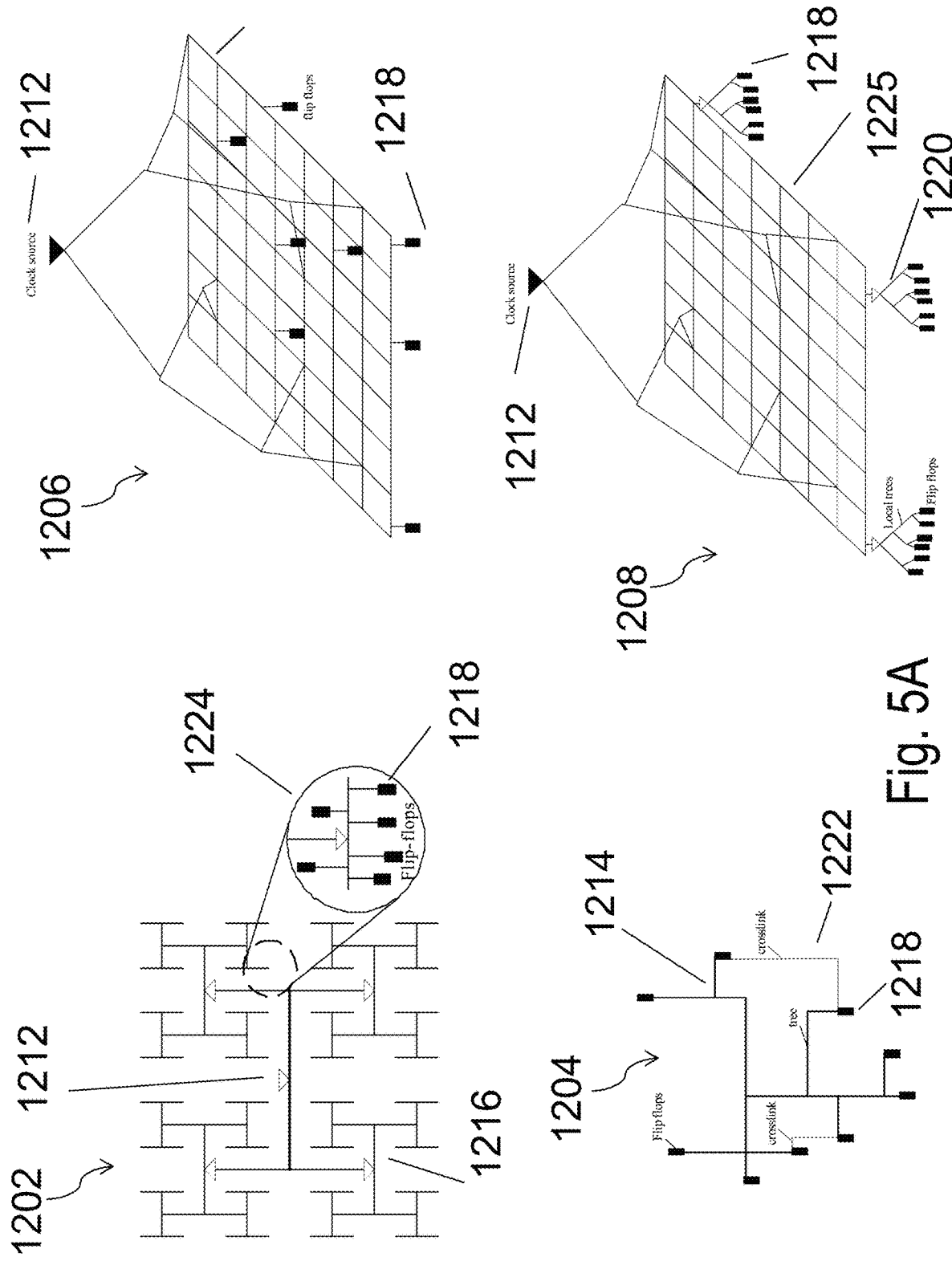
FIG. 5A is an exemplary illustration of different Clock distribution network styles.
Figure 5B:
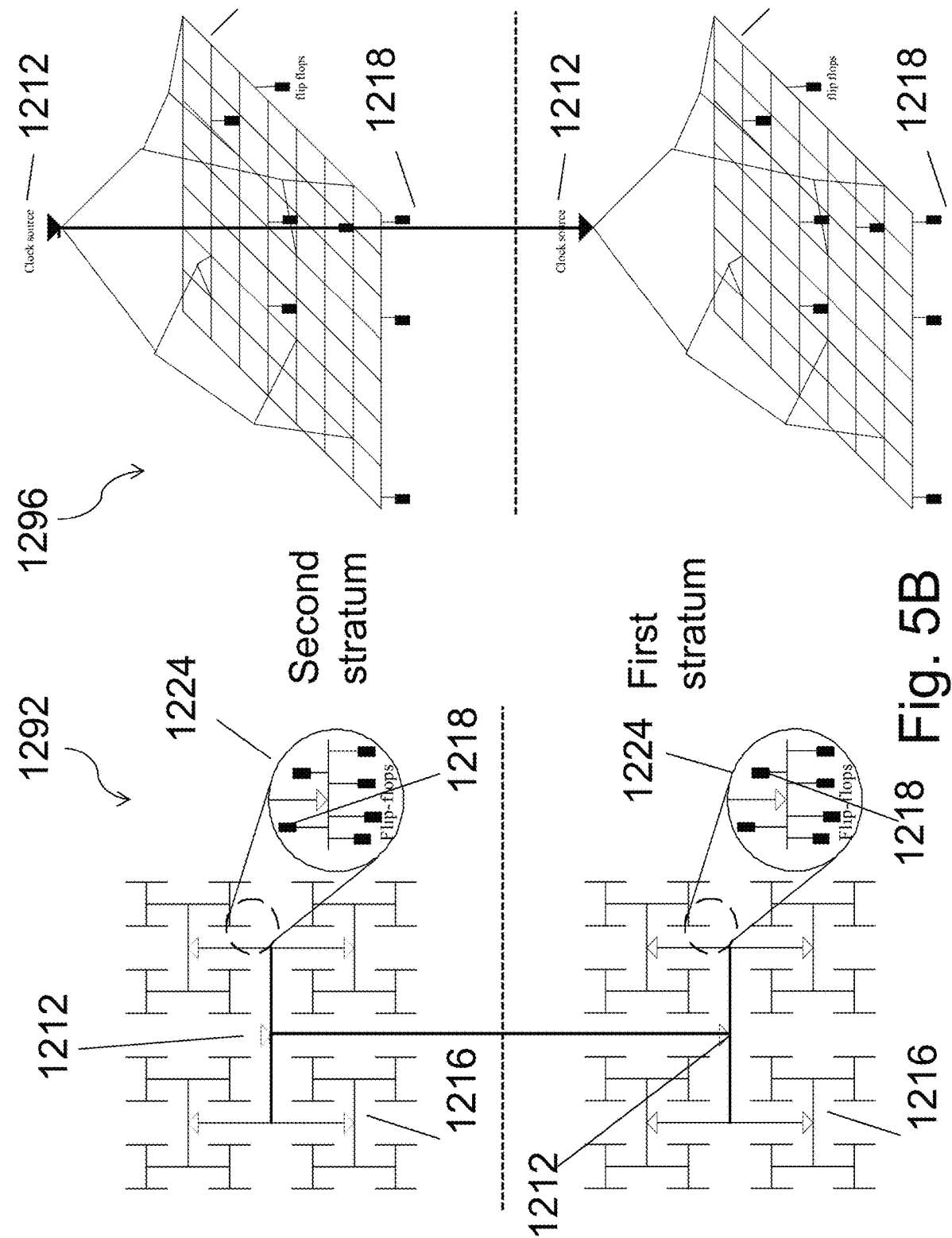
FIGS. 5B and 5C illustrate exemplary 3D system/device clock distribution networks.
Figure 5C:
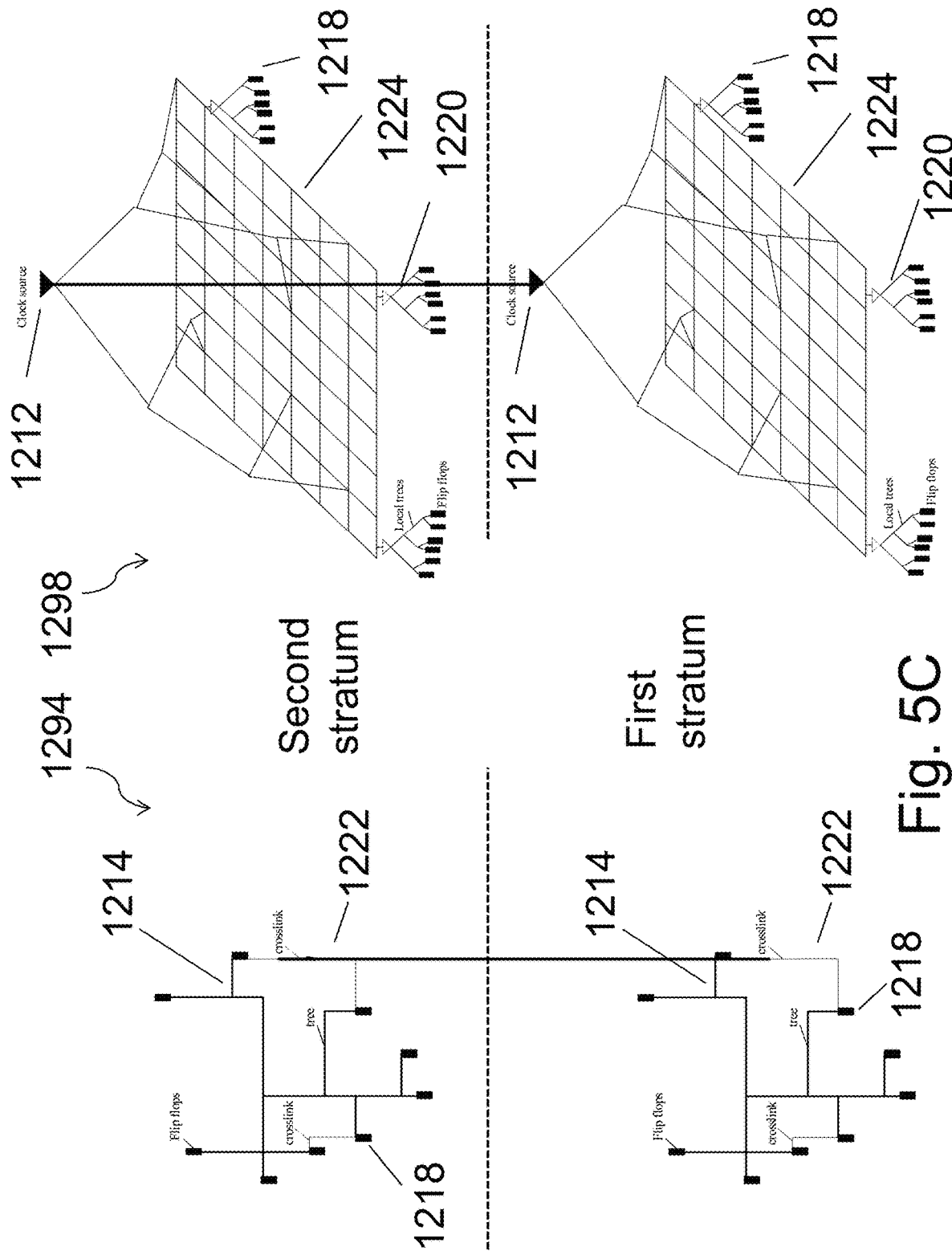

FIG. 5A is a drawing illustration of different Clock distribution network styles. Many logic circuits or logic units may use a clock tree to distribute a clock signal to the Flip-Flops. A common style of clock tree is the H-Clock Tree 1202. The origin point of the clock signal 1212 is driving a first H-Tree from the center of the H. Subsequently, each end-point of the H is an origin of the next H 1216, and so forth. The final edge 1224 drives the individual Flip-Flop cluster 1218.

In some cases it may be desired to reduce the skew between edges as illustrated in the branch tree 1204 wherein clock tree branches 1214 are shorted by cross-link 1222. Another style of clock distribution is called Mesh 1206 where a grid of connection is used to distribute the clock signal. These schemes may be combined to form a hybrid 1208 where a tree 1220 may be added to a grid 1225. In a 3D device it might be desired to split logic circuits between at least two strata including circuits that share the same clock domain. In such case it might be desired to first connect the clock origin to each strata that has circuits that use that clock domain, then to construct within each stratum a clock distribution structure that might include a clock tree such as, for example, H tree, or grid and tree combination or other clock distribution scheme used in the art. (See, for example, FIGS. 5B and 5C, for exemplary 3D system/device clock distribution networks H-Clock 1292, Mesh 1296, branch tree 1294, hybrid 1298). Some circuits could have an interaction between strata wherein a signal may be generated in one stratum and that signal is used and latched on another stratum, and accordingly the skew between Flip-Flop on one stratum and the other would be reduced. A cross-link 1222 could be used between stratum, such as, for example, a TLV or TSV. Alternatively a grid 1224 could be constructed spanning multiple stratum reducing the clock skew between them. In some cases the origin of the clock may be either driven by a signal coming from outside of the 3D device or generated by a circuit on the 3D device such as for example, a Phase-Lock-Loop, which may be synchronized to a signal from outside of the 3D device (a clock source may rather be provide on-chip in the 3DIC stack as suggested later herein). Accordingly it might be desired to first process the clock signal at the upper-most stratum and then drive it down to the origins of the clock distribution structures at the desired stratum or stratums. The clock origin of the clock distribution structure and circuits on one stratum may be connected to the origin of the clock distribution structure and circuits of a second stratum, with one feeding the other.

Distribution of a clock signal from one stratum to the next may be accomplished with electrically conductive vertical connections, for example, TLVs, or may be accomplished by an RF/capacitive or optical device and connection between stratums. For example, a clock signal generated in a device layer above the substrate layer may be electrically coupled to various points on the substrate layer below (supplying a second layer generated clock signal to a portion or substantially all of the substrate based transistors) utilizing a TLV connection or connections, or an RF/capacitive or optical connection or connections. Utilizing an only RF/capacitive or optical connection or connections between stratums may be advantageous when it is desirable to isolate a noisy device type to a single layer, yet bring out the intended signals and not the noise. For example, and analog or RF device layer in a 3DIC stack could be emf/emi shielded top and bottom (and sides if necessary), with only openings for a vertical RF/capacitive or optical connection where desired, thus minimizing the disturb effects of the analog or RF device layer on any of the other device layers in the 3DIC stack.

Scaling advanced CMOS field effect transistors face at least two problems that result in high power consumption: the increasing difficulty of reducing the supply voltage and stopping the rise of leakage currents. One device that may replace the CMOS FET is the tunnel FET (TFET). The primary injection mechanism in a TFET is interband tunneling whereby charge carriers transfer from one energy band into another at a heavily doped p+-n+ junction. (In contrast, for MOSFETs the charge carriers are thermally injected over a barrier). Ioff, the off current of the TFET, is quite low due to this injection barrier and an inherently very steep subthreshold slope. However, obtaining good Ion is difficult. High barrier transparency is vital and strong modulation by the gate of the channel bands is critical. Thus, high permittivity gate dielectrics with as low an equivalent oxide thickness as possible are desirable, as well as providing as thin of a channel body as possible for best case electron transport, plus an abrupt doping profile at the tunnel junction to maximize injection efficiency. Maximizing the gate modulation of the tunneling barrier width can be accomplished by overlapping the gate with the tunneling region, or designing a source region covered with an intrinsic channel layer under the top gate. TFETs can be formed with a horizontally oriented channel or a vertically oriented channel. Many types of TFETs have been developed for 2D applications, for example, double gate heterojunction TFET, nanowire TFET, Resonant TFET, synthetic electric field TFET, III-V based TFETs, and carbon based TFETs. Many of these can be advantageously formed in a monolithic 3D process flow. Furthermore, the gate dielectric on transistors may have different dielectric permittivities than silicon dioxide. The gate dielectric permittivity of the second layer transistors may be different than the gate dielectric permittivity of the first layer transistors.

For example, the 2D strained Si nanowire (SiNW) TFETs of L. Knoll, et al., "Demonstration of Improved Transient Response of Inverters with Steep Slope Strained Si NW TFETs by Reduction of TAT with Pulsed I-V and NW Scaling," IEEE IEDM 2013, paper 4.4, the contents incorporated herein by reference, may be constructed utilizing the monolithic 3D techniques and methods disclosed in the incorporated references. For example, nanowires may be formed by patterning and etching either an amorphous-Si or a layer transferred monocrystalline silicon (may be strained Si as well) thin layer on top of metallization layers that are on top of a substrate of devices and circuits. HKMG gate stacks may be formed and then very thin Ni and Al layers may be deposited to form self-aligned source/drain silicides into which angled implants are shadow implanted to form p+ and n+ pockets on opposite sides of the gates and steep sloped abrupt junctions can be formed with dopant segregation techniques. RTP and/or pulsed laser techniques with or without shielding may be employed for the thermal steps. GAA (Gate All Around) or trigate structures may be formed as disclosed in the incorporated references. Back gates may be formed in-situ above the bonding oxides or may be from topmost metal layers of the layer below's shields and/or interconnect layers, as disclosed in the incorporated references and herein (the back-gate/bias plane may be accomplished with an integrated device, for example, a back-channel region 522 or by a base layer (or layer below) top metal plate/line (for example, such as the topmost shield layer/region 688) in a monolithic 3D configuration).

For example, the synthetic electric field tunnel FETs (SE-TFET) of Y. Morita, et al., "Synthetic electric filed tunnel FETs: drain current multiplication demonstrated by wrapped gate electrode around thin epitaxial channel," IEEE VLSI Symposium 2013, paper 16.1, T236, the contents incorporated herein by reference, may be constructed utilizing the monolithic 3D techniques and methods disclosed in the incorporated references. For example, highly doped source and drains may be formed on a substantially undoped monocrystalline donor substrate with ion-implantation and activated as strips and then layer transferred as a monocrystalline silicon thin layer on top of metallization layers that are on top of a substrate of devices and circuits. The source and drains may also be formed directly on a layer transferred substantially undoped monocrystalline thin layer with masking and ion-implantation/PLAD techniques, and then activated with the optical and/or thermal annealing with or without shields as disclosed in the incorporated references. A thin (about 5 nm to about 20 nm) undoped channel layer may be formed with low temperature, for example, such as MOCVD or SP-ALD techniques, to preserve the abrupt vertical junction profile. A HKMG gate stack may be formed, for example, an about 5 nm $HfO_2$ insulator and an about 40 nm TiN gate electrode deposition, and subsequent patterning and etching. Interconnect formation may then ensue. Narrow channel widths and thicknesses increase electric field effects and thus may substantially improve the Ion. Backgates, for example, as described herein and in the incorporate references, may also be utilized to increase Ion and decrease Ioff. Layer transfer of the source, channel and drain provide a monolithic 3D formation advantage to TFETs: for example, not just the addition of a natural integrated backgate, but also the ability to use a higher carrier mobility transferred layer such as, for example, $Si_{1-x}Ge_x$ or Ge, and InGaAs.

For example, the complementary hetero-junction vertical TFETs (VTFET) of R. Rooyackers, et al., "A New Complementary Hetero-Junction Vertical Tunnel-FET Integration Scheme," IEEE IEDM 2013, paper 4.21, pp. 92-94, the contents incorporated herein by reference, may be constructed utilizing the monolithic 3D techniques and methods disclosed in the incorporated references. For example, and N+Si/intrinsic Si stack may be formed on a donor wafer, flipped, bonded and layer transferred to a pre-processed acceptor substrate (of completed transistors, etc.). The vertical nanowires may be masked and etch utilizing a hard mask, the drain and gate isolated, gate stacks (may be complementary) formed, and the gates and dummy source may be isolated. The source can then be selectively etched out and replaced by a low-band-gap material to form the hetero-junction on top of a silicon channel enable a sharp junction.

ALD (Atomic Layer Deposition) and Spatial ALD (Spatial separation of the half-reactions) techniques may be utilized to form thin nearly monocrystalline layers in a monolithic 3D fashion and for many of the various monolithic 3D structures disclosed herein and in the incorporated references. [S-ALD ref J. Vac. Sci. Technol. A 30(1), January/February 2012, Roll to Roll techniques form USA, Finland, and Poodt, P., et al., Advanced Materials 22 (2010) p. 3564]. These are low temperature processes that may be compatible with copper or aluminum metallization and/or low-k dielectrics on the layers below the ALD/S-ALD layer being formed.

For example, the stacking of layers to eventually form a memory stack, may be formed by ALD/S-ALD exclusively or in combination with other deposition techniques such as low temp CVD. ALD/S-ALD may be utilized, for example, as described in at least incorporated reference U.S. Pat. No. 8,273,610 to form the p-Si 9906/oxide layers in FIG. 99C for FB-DRAM formation and devices, the RRAM stack of FIGS. 101D, 102D, 103F, 109D, 110D, 192D, charge trap stacks such as FIG. 106F, and FIGS. 100D and 200D for DRAM.

ALD layers may be doped in-situ with no need for thermal activation to form doped layers (and ultimately regions with masking and etch processing), and may be used to form both or one of the layers of semiconductor/dielectric stacks or semiconductor/semiconductor stacks, for example, Si & $SiO_2$, Ge & GeO, Si & Si of differing vertical dopant concentrations and/or dopant types, etc. The ALD/S-ALD formed layers may also be conventionally doped with ion-implantation and activated with techniques such as described in the incorporated references, for example, with an optical anneal.

ALD/S-ALD may be utilized, for example, as described in at least incorporated reference U.S. Pat. No. 8,273,610 to form an N+/N−/P+ stack such as shown in FIG. 26A to ultimately form horizontal transistors; may be utilized top form the N+/P−/N+ layer stack of FIG. 39C to ultimately form vertical transistors; and may be utilized to form the layers 6802 and 6803 of FIG. 68C to ultimately form RCAT transistors.

ALD/S-ALD may be utilized, for example, as described in at least incorporated reference U.S. Pat. No. 8,273,610 to form the N+/P− stack of FIG. 137C to ultimately form an NVM FPGA configuration cell.

Also meta-material layers for thermal isolation layers, such as disclosed in U.S. Pat. No. 9,023,688, incorporated herein by reference, may be formed with ALD/S-ALD techniques; disordered nanostructured materials such as WSe2 and the nanoscale layered oxides such as $SiO_2/Y_2O_3$, $SiO_2/Cr_2O_3$, and $SiO_2/Al_2O_3$ for TIL 140.

ALD/S-ALD may be utilized, for example, for low temperature formation of oxide layers, such as $SiO_2$, nearly crystalline silicon layers, and silicon nitride layers such as $Si_3N_4$ and SiN. The formation of these layers would not damage the underlying temperature sensitive layers and regions, for example, including copper, aluminum, low-k dielectrics.

Layer transfer a mono-crystalline layer of silicon on top of an underlying layer or layers of interconnect metallization/dielectrics and transistors/circuits allowing a relatively easy process to seed and crystallize, such as by nanographioepitaxy, an overlying germanium layer was disclosed in at least paragraph 134 of incorporated reference U.S. Pat. No. 8,273,610. This allows formation of the two types of transistors with direct alignment to the underlying device layer. P-channel Ge transistors, such as, for example, an RCAT or MOSFET, may be formed utilizing the technique in certain regions of the transferred layer, and n-channel Si transistors, such as, for example, an RCAT or MOSFET, may be formed in the monocrystalline silicon of other regions of the layer transferred silicon layer. By utilizing the technique of doping and activating the layer to be transferred on the donor wafer prior to transfer, a transistor such as, for example, an RCAT, may be formed on the transferred layer utilizing the methods of at least FIGS. 66-68 and associated specification sections of incorporated reference U.S. Pat. No. 8,273,610. The Ge regions may be crystallized prior to the formation of the silicon transistors and some common formation steps may be taken advantage of, or the silicon based and Ge based transistors may be formed in separate steps of the process flow. Si based MOSFETs may be formed, for example, by the gate replacement methods of at least FIGS. 70, 81, 82 and associated specification sections of incorporated reference U.S. Pat. No. 8,273,610. Regions of the silicon may be etched out (leaving appropriate crystallized silicon edges, regions, spaces for the graphioepitaxy and/or seeding) and crystallized Ge regions may be formed, and Ge based transistors made. Si based MOSFETs may be formed, for example, by the implant and optical anneal methods of at least FIGS. 45, 46, 47 and associated specification sections of incorporated reference U.S. Pat. No. 8,574,929. One of ordinary skill in the art would recognize that there are many devices which may be formed above an underlying layer or layers of interconnect metallization/dielectrics and transistors/circuits wherein a portion of the transistors (such as but not limited to the channel or portions of the transistor channel) may be monocrystalline silicon based and a portion of the transistors (such as but not limited to the channel or portions of the transistor channel) may be crystallized Ge based using a method or combination of methods disclosed herein and/or in the incorporated references. The Ge (or GaAs, InP, etc.) formed by LPE into subcritical vias of the transferred silicon layer with engineered layer such as Ge—see at least FIGS. 27-28 and associated specification sections of incorporated reference U.S. Pat. No. 8,574,929) transistor may be utilized for optical I/Os on the top layer (or lower layers with optical passthrus above or below) of the monolithic 3D stack.

FIGS. 6A-6G illustrate an exemplary n-channel FD-MOSFET with integrated TRL (Trap Rich Layer) and an exemplary process flow. Integrated TPS (Thermal Protective Structure), TIL (Thermal Isolation Layer), and/or TES (Thermally Enhanced Substrate) may be utilized to thermally protect the metallization, isolation layers, device electrical characteristics and reliability of devices that may reside in or on the substrate or a previously constructed layer in the 3D stack from damaging processes and processing temperatures. TPS, TIL and TES formation and composition details may be found in some of the incorporated references, for example, at least U.S. Pat. No. 9,023,688. An exemplary n-channel FD-MOSFET with integrated TRL may be constructed in a 3D stacked layer utilizing procedures outlined herein and in incorporated references. Forming the TRL on a donor wafer as part of the transferred layer may provide a greater process window for TRL formation, especially for temperature exposures, than forming the TRL on the acceptor wafer, which may be limited to temperatures less than about 400° C. due to the presence of copper or aluminum metallization and low k IMDs on the layer or layers below the layer being processed.

Reasons for forming and utilizing a TRL layer and/or regions may include RF applications, for example horizontal and/or vertical emf/emi shielding. For example, RF transistor and circuit performance on any layer of a 3DIC, such as a strata layer or base substrate, may be limited in terms of transmission line losses by the presence of parasitic surface conduction (PSC). A TRL layer would be considered effective if the presence of the TRL provides an effective resistivity, the true electrical resistivity sensed by a co-planar waveguide (CPW) line, higher than about 1 kohm-cm, or higher than about 3 k-ohm-cm. This may result in a CPW attenuation versus frequency response that is substantially similar to the response of a CPW on a quartz substrate. A TRL may accomplish this thru material or materials and processing that creates and/or incorporates defects in the material. A TRL may be formed with temperature exposures and processes above about 400° C. when formed on a donor substrate prior to layer transfer, and may be formed by temperature exposures and process of less than about 400° C. when formed on the acceptor wafer that may include copper or aluminum metallization and/or low-k dielectrics, for example, prior to a monolithic 3D layer transfer or a TSV stack bonding step. An integrated TRL may provide a higher performance for transistors and circuits built on the layers/strata of a 3DIC system stack, for example, a radio frequency (RF) receiver/transmitter circuit may operate at greater than about 1 gigahertz, a phase lock loop (PLL) circuit may operate at greater than about 1 megahertz, a Serializer/Deserializer (SerDes) circuit may operate at greater than about 1 gigahertz, an oscillator may have a frequency stability of better than 100 ppm/° C., an RF circuit may exhibit 'substrate' losses when placed in a second (or third, etc.) layer/stratum of a monolithic 3DIC device which are, for example, less than 0.15 dB/mm at 2 GHz, less than 0.20 dB/mm at 4 GHz. The integrated TRL may provide a shielding effectiveness of vertically adjacent layers/strata devices of, for example, more than 60 dB, more than 50 dB, or more than 70 dB.

As illustrated in FIG. 6A, SOI donor wafer substrate 1301 may include back channel layer 1305 above Buried Oxide BOX layer 1303. Back channel layer 1305 may be doped by ion implantation and thermal anneal, may include a crystalline material, for example, mono-crystalline (single crystal) silicon and may be heavily doped (greater than about 1e16 atoms/cm$^3$), lightly doped (less than about 1e16 atoms/cm$^3$) or nominally un-doped (less than about 1e14 atoms/cm$^3$). SOI donor wafer substrate 1301 may include a crystalline material, for example, mono-crystalline (single crystal) silicon and at least the upper layer near BOX layer 1303 may be very lightly doped (less than about 1e15 atoms/cm$^3$) or nominally un-doped (less than about 1e14 atoms/cm$^3$). Back channel layer 1305 may have additional ion implantation and anneal processing to provide a different dopant level than SOI donor wafer substrate 1301 and may have graded or various layers of doping concentration. SOI donor wafer substrate 1301 may have additional ion implantation and anneal processing to provide a different dopant level than back channel layer 1305 and may have graded or various layers of doping concentration. The donor wafer layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 1301 doping will be undoped to eventually create an FD-MOSFET transistor with an undoped conduction channel. SOI donor wafer may be constructed by layer transfer techniques described herein and/or incorporated references or elsewhere as known in the art, or by laser annealed SIMOX at a post donor layer transfer to acceptor wafer step. BOX layer 1303 may be thin enough to provide for effective DC or RF back and/or device/transistor body bias, for example, about 25 nm, or about 20 nm, or about 10 nm, or about 5 nm thick. Upper isolation layer 1332 may be formed by deposition of a dielectric such as, for example, silicon oxide, and/or by thermal/RTO oxidation of back channel layer 1305. Upper isolation layer 1332 may include, or may have below it, a layer (not shown) that may serve as a heat shield and/or conductive back plane, for example, a layer of tungsten (similar to the description in FIGS. 39, 40, 41, 42, 43 of U.S. Pat. Nos. 8,574,929 and 9,385,058). The thin layer of refractory metal with a high melting point may be formed on top of the isolation layer and then patterned after layer transfer, thus forming metalized back-bias regions for the second layer of transistors, the back-bias region will not be harmed by the thermal cycles of the processing on the layer being processed. Furthermore, back channel layer 1305 and Buried Oxide BOX layer 1303 may be not formed and the transistor formation may proceed from a bulk donor substrate rather than an SOI based substrate.

Continuing with the FIG. 6A illustration, TRL 1340 may be formed on top of upper isolation layer 1332. Upper isolation layer 1332 may be etched (partially or fully) to form TRL regions (not shown).

TRL 1340 formation may include deposition of an amorphous silicon or a polysilicon film, or a combination of the two. The deposition may utilize an LPCVD technique wherein the polycrystalline film may be deposited at about 625° C. and the amorphous silicon film may be deposited at about 525° C. Other techniques, such as sputtering, PECVD, etc., may be utilized. The deposited film may be partially crystallized with a rapid thermal anneal (RTA) exposure, for example about 100 seconds at about 900° C. TRL 1340 may have a thickness that would accomplish the effective resistivity metric at the frequency(ies) of interest for the circuit design discussed previously herein, and may be, for example, about 5 nm, about 10 nm, about 20 nm, about 30 nm, about 50 nm about 100 nm, about 200 nm, or about 500 nm thick.

TRL 1340 formation may include damaging the surface and/or a top layer of, for example, back channel layer 1305 (or of the substrate in the case of a bulk donor layer transfer method), thus creating a damage layer (or regions if masked or etched). Damage may be caused by ion implantation, for example, such as an Argon ion-implant of about $10^{15}$ atoms/cm$^2$. Plasma sheath, or plasma source ion implantation may be utilized. Preferably the implantation is configured to damage and not dope the layer, the objective being to provide as high an effective resistivity as possible. The dose and energy may be set to bring the damaged layer close to or completely amorphize the crystalline structure of the damaged layer or region.

TRL 1340 formation may include deposition of a silicon rich silicon oxide, a silicon rich silicon nitride, and may include deposition of a siliconoxynitride film. TRL 1340 formation may include deposition of a carbon or carbon rich film, for example, amorphous carbon, disordered grapheme, DLC (Diamond Like Carbon), disordered carbon nanotube mats, or SiCO. TRL 1340 formation may include some of the materials formed in creation of the TIL layer of incorporated U.S. Pat. No. 9,023,688 that have a high trap density, for example, forming nanoscale layered oxides or layers of disordered nanostructured materials.

Some references concerning trap layer materials may be found in at least these references: Frohman-Bentchkowsky, D. (1969). An integrated metal-nitride-oxide-silicon (MNOS) memory. Proceedings of the IEEE, 57(6), 1190-1192; and Frohman-Bentchkowsky, D., & Lenzlinger, M. (1969). Charge Transport and Storage in Metal-Nitride-Oxide-Silicon (MNOS) Structures. Journal of Applied Physics, 40(8), 3307-3319; and White, M. H., & Cricchi, J. R. (1972). Characterization of thin-oxide MNOS memory transistors. Electron Devices, IEEE Transactions on, 19(12), 1280-1288; and Thermal and plasma nitridation of silicon and silicon dioxide for ultrathin gate insulators of MOS VLSI. Ph.D. dissertation by Moslehi, Mehrdad Mahmud, Stanford University, 1986; Roda Neve, C., and Raskin, J. P. (2012). RF harmonic distortion of CPW lines on HR—Si and trap-rich HR—Si substrates. Electron Devices, IEEE Transactions on, 59(4), 924-932; and Sarafis, P., Hourdakis, E., Nassiopoulou, A. G., Roda Neve, C., Ben Ali, K., & Raskin, J. P. (2013). Advanced Si-based substrates for RF passive integration: Comparison between local porous Si layer technology and trap-rich high resistivity Si. Solid-State Electronics, 87, 27-33; the following in their entirety are incorporated by reference. These references, esp. Moslehi's thesis, discuss various processes, outside of ion implantation, which may be used to create an embedded layer of trapped charge, and characterize the trapped charge per unit area as a function of various processing conditions.

TRL 1340 may be formed thicker than the desired end thickness, and then thinned by, for example, CMP processing or etching, to the desired end thickness, or for the purposes of smoothing the surface to enable improved bonding.

A pre-layer-transfer anneal may be performed as part of the TRL 1340 formation process or after the formation of TRL 1340, and may include a thermal anneal equal to or greater than the maximum temperature that the TRL 1340 would see during subsequent processing, for example, during the 3D IC stack processing, including layer transfer/bonding, transistor/device formation, activation anneals, and so on. The pre-layer-transfer anneal temperature may be about 10° C. greater than the process exposure maximum, or about 20° C. greater than the process exposure maximum, or about 30° C. greater than the process exposure maximum, or about 40° C. greater than the process exposure maximum. The pre-layer-transfer anneal temperature may be limited by the effect/damage it may have on the doping gradients elsewhere in the donor stack, or the damage repair/stress/ outgassing effects on TRL 1340, as examples. The time of the pre-layer-transfer anneal at maximum temperature (the process exposure maximum) may be less than about 130 minutes, or less than about 1 hour, or less than about 2 hours. The formation of TRL 1340 and/or the anneal of TRL 1340 and the donor stack may be at a temperature and time greater than allowed by a metallized acceptor structure, for example, above about 400° C., above about 600° C., above about 800° C., above about 1000° C.

As illustrated in FIG. 6B, the top surface of the donor wafer stack that may include SOI donor wafer substrate 1301, may be prepared for oxide wafer bonding with a deposition of an oxide to form capping layer 1329.

A layer transfer demarcation plane (shown as dashed line) 1399 may be formed by hydrogen implantation or other methods (such as a preformed SiGe layer) as described in the incorporated references, and may reside within the SOI donor wafer substrate 1301. The SOI donor wafer substrate 1301 stack surface 1382, and acceptor wafer 1397 (first shown in FIG. 6C) may be prepared for wafer bonding as previously described in the incorporated references and may be low temperature (less than approximately 400° C.) bonded.

As illustrated in FIG. 13C, capping layer 1329, back channel layer 1305, BOX layer 1303 and remaining channel layer 1307 may be layer transferred to acceptor wafer 1397. Capping layer 1329 and acceptor wafer 1397 top bonding oxide (not shown) may be oxide to oxide bonded, thus forming lower isolation layer 1330. Acceptor wafer 1397, as described in the incorporated references and herein, may include, for example, transistors, circuitry, and metal, such as, for example, aluminum or copper, interconnect wiring, a metal shield/heat sink layer or layers, and thru layer via metal interconnect strips or pads. Acceptor wafer 1397 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 1397 may include transistors such as, for example, MOSFETS, FD-MOSFETS, FinFets, FD-RCATs, BJTs, HEMTs, and/or HBTs. The portion of the SOI donor wafer substrate 1301 that may be above (when the layer stack is flipped over and bonded to the acceptor wafer 1397) the layer transfer demarcation plane 1399 may be removed by cleaving or other low temperature processes as described in the incorporated references, such as, for example, ion-cut with mechanical or thermal cleave or other layer transfer methods, thus forming remaining channel layer 1307.

Formation of transistors and devices on the layer being processed 1360 without harming the underlying structures of acceptor wafer 1397 may proceed with a variety of methods. For example, as disclosed in at least FIGS. 33 and 46 and related specification sections of incorporated by reference U.S. Pat. No. 8,574,929, transistors may be formed with an integrated heat shields and optical annealing. For example, formation of CMOS in one transferred layer and the orthogonal connect strip methodology may be found as illustrated in at least FIGS. 30-33, 73-80, and 94 and related specification sections of U.S. Pat. No. 8,273,610, and may be applied. Low temperature and/or heat shielded 3D stacking transistor formation techniques may help preserve the effectiveness of the trap rich layer by not significantly annealing the defects and traps.

The exemplary flow herein FIG. 6 is utilizing a similar transistor formation technique as described in incorporated U.S. Pat. No. 9,023,688, and may utilize a TIL, which may be integrated with TRL 1340, on the top or bottom face of the TRL 1340, or both. Or may be one in the same—the TIL may also have trap properties of a TRL. Many conventional semiconductor processing steps may now be utilized to form transistors and devices on the layer being processed 1360 without harming the underlying structures of acceptor wafer 1397, for example, a deposition or anneal may be performed at 800° C. on layer being processed 1360. Heat removal from the substrate, for example, such as via a cooled chuck, is described in incorporated U.S. Patent Application 9,023,688.

Damage/defects to a crystalline structure of back channel layer 1305 and remaining channel layer 1307 may be annealed by conventional thermal anneals with appropriate cold chuck equipment and/or some of the annealing methods as described in the incorporated references, for example the short wavelength pulsed laser techniques, wherein the layer being processed 1360 (which may include back channel layer 1305, BOX layer 1303 and remaining channel layer 1307) may be heated to defect annealing temperatures, but the underlying structures of acceptor wafer 1397 may be kept below the damage temperature of acceptor wafer 1397, for example, less than about 400° C.

The top surface of remaining channel layer 1307 may be chemically mechanically polished, and/or heat treated, to bring the surface quality to conventional defect levels and/or may be thinned by low temperature oxidation and strip processes, such as the TEL SPA tool radical oxidation and HF:$H_2O$ solutions as described in referenced patents and patent applications. Thru the processing, the wafer sized layer channel layer 1307 could be thinned from its original total thickness, and its final total thickness could be in the range of about 5 nm to about 20 nm, for example, 5 nm, 7 nm, 10 nm, 12 nm, 15 nm, or 20 nm. Channel layer 1307 may have a thickness and/or doping that may allow fully-depleted channel operation when the FD-MOSFET transistor is substantially completely formed. Acceptor wafer 1397 may include one or more shield/heat sink layers 1318, which may include materials such as, for example, Aluminum, Tungsten (a refractory metal), copper, silicon or cobalt based silicides, or forms of carbon such as carbon nanotubes or graphene, and may be layered itself as described in FIG. 3 of the parent and in at least incorporated U.S. Pat. No. 9,023,688. Each shield/heat sink layer 1318 may have a thickness range of about 50 nm to about 1 mm, for example, 50 nm, 100 nm, 200 nm, 1300 nm, 500 nm, 0.1 um, 1 um, 2 um, and 10 um. Shield/heat sink layer 1318 may include isolation openings alignment mark openings (not shown), which may be utilized for short wavelength alignment of top layer (donor) processing to the acceptor wafer alignment marks (not shown). Shield/heat sink layer 1318 may act as a heat spreader. Electrically conductive materials may be used for the two layers of shield/heat sink layer 1318 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 1302), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 1318 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 1318 may be sandwiched and/or substantially enclosed by materials with a low thermal conductivity (less than 10 W/m-K), for example, silicon dioxide (about 1.4 W/m-K). When there may be more than one shield/heat sink layer 1318 in the device, the heat conducting layer closest to the TRL 1340 may be constructed with a different material, for example a high melting point material, for example a refractory metal such as tungsten, than the other heat conducting layer or layers, which may be constructed with, for example, a lower melting point material, for example such as aluminum or copper. The remaining SOI donor wafer substrate 1301 may now also be processed, such as smoothing and annealing, and reused for additional layer transfers. Upper isolation layer 1332 and/or lower isolation layer 1330 may include thicknesses of less than about 1 um, less than about 500 nm, less than about 400 nm, less than about 300 nm, less than about 200 nm, or less than about 100 nm.

Figure 6C:
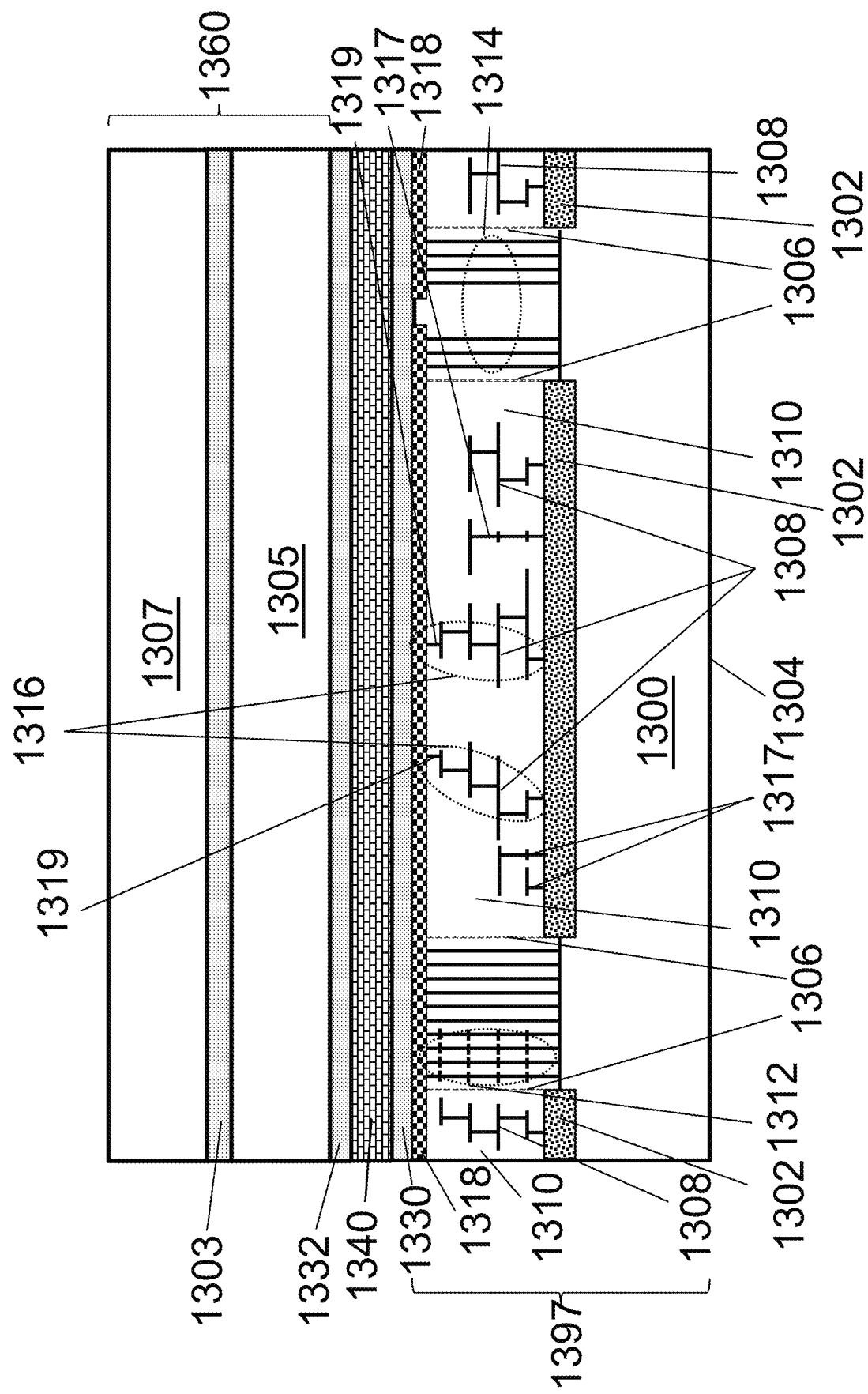
Figure 6D:
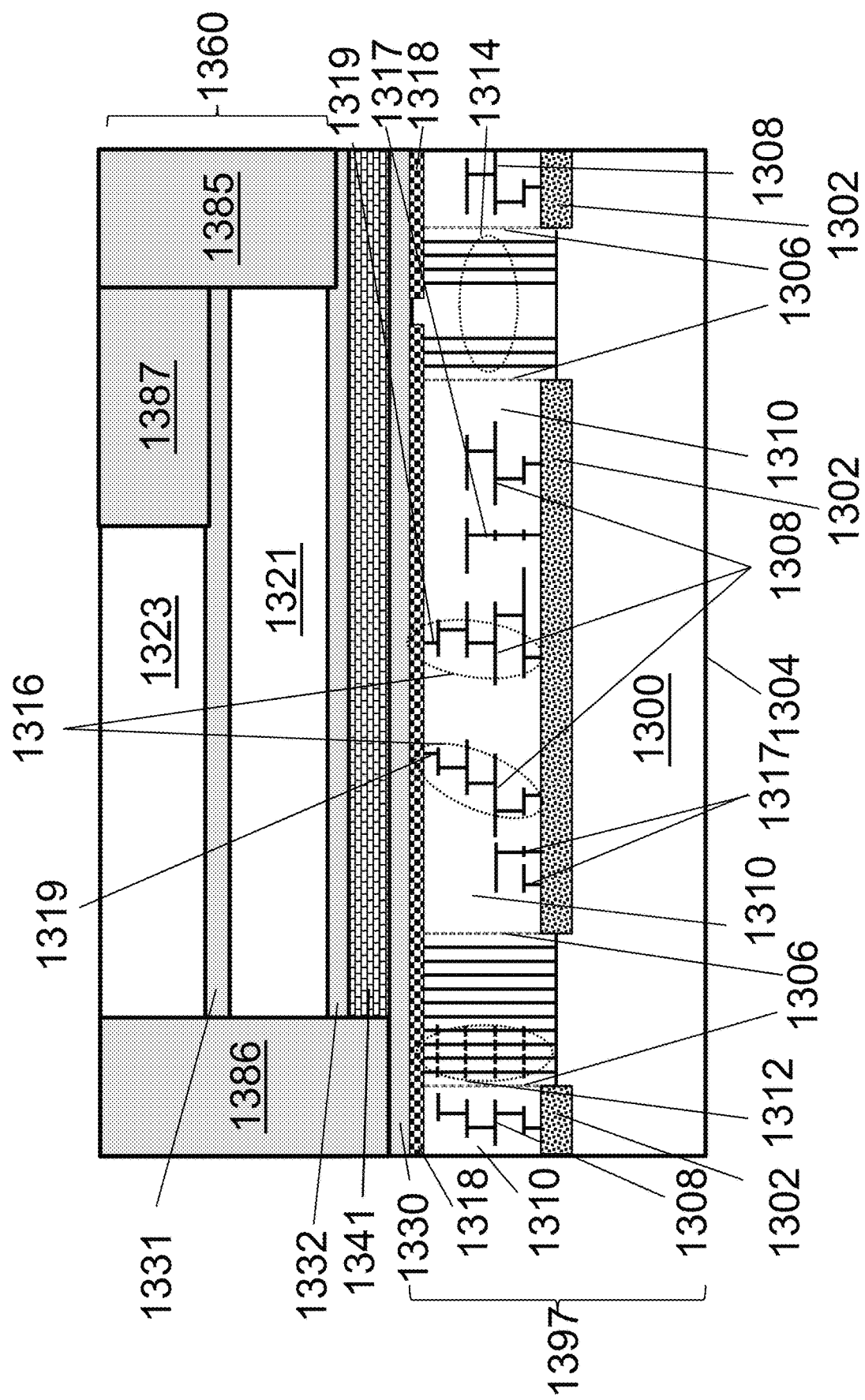

As illustrated in FIG. 6D, transistor and back channel isolation regions 1385 and/or transistor isolation regions 1387 may be formed. Transistor isolation region 1387 may be formed by mask defining and plasma/RIE etching channel layer 1307, substantially to the top of BOX layer 1303 (not shown), substantially into BOX layer 1303, or back channel layer 1305 (not shown). Transistor and back channel isolation regions 1385 and transistor-backchannel-TRL isolation regions 1386 may be formed by mask defining and plasma/RIE etching channel layer 1307, BOX layer 1303 and back channel layer 1305, substantially to the top of upper isolation layer 1332 (not shown) or substantially into upper isolation layer 1332 for transistor and back channel isolation regions 1385 and substantially to lower isolation layer 1330 for transistor-backchannel-TRL isolation regions 1386. Note: transistor-backchannel-TRL isolation regions 1386 are utilized when the electrical conductivity of the TRL 1340 is undesirably high and may cause undesired leakage paths between the eventual TLVs. Thus channel region 1323 may be formed, which may substantially form the transistor body, back-channel region 1321 may be formed, which may provide a back bias and/or Vt control by doping or bias to one or more channel regions 1323, and BOX region 1331. (TRL regions 1341 may also be thusly formed.) Back-channel region 1321 may be ion implanted for Vt control and/or body bias efficiency. A conventional or low-temperature gap fill dielectric, such as SACVD oxide, may be deposited and chemically mechanically polished, the oxide remaining in transistor and back channel isolation regions 1385 and transistor isolation regions 1387. An optical or a conventional thermal and/or oxidizing anneal may be performed to anneal etch damage in back-channel region 1321 and channel region 1323, and densify the STI oxide in transistor and back channel isolation regions 1385 and transistor isolation regions 1387. The doping concentration of channel region 1323 may include vertical or horizontal gradients of concentration or layers of differing doping concentrations. The doping concentration of back-channel region 1321 may include vertical or horizontal gradients of concentration or layers of differing doping concentrations. Any additional doping, such as ion-implanted channel implants, may be activated and annealed with optical annealing, or conventionally. BOX region 1331 may be a relatively thin dielectric, including the thickness range of about 5 nm to about 100 nm, at least a portion of which being between the back-channel region 1321 and channel region 1323. Back-channel region 1321 could be constructed from a material other than crystalline silicon, for example, a refractory metal or doped silicon in crystallized form, poly or amorphous, or other conductive materials that are acceptable for semiconductor processing and can withstand high temperatures.

As illustrated in FIG. 6E, a transistor forming process, such as a conventional HKMG with raised source and drains (S/D), may be performed. For example, a dummy gate stack (not shown), utilizing oxide and polysilicon, may be formed, gate spacers 1351 may be formed, raised S/D regions 1353 and channel stressors may be formed by etch and epitaxial deposition, for example, of SiGe and/or SiC/P depending on P or N channel (and may be doped in-situ or ion-implantation and anneal activation), LDD and S/D ion-implantations may be performed, and first ILD 1355 may be deposited and CMP'd to expose the tops of the dummy gates. Thus transistor channel region 1325 and S/D & LDD regions 1357 may be formed. The dummy gate stack may be removed and a gate dielectric 1359 may be formed and a gate metal material gate electrode 1361, including a layer of proper work function metal ($Ti_xAl_yN_z$ for example) and a conductive fill, such as aluminum, and may be deposited and CMP'd. The gate dielectric 1359 may be an atomic layer deposited (ALD) gate dielectric that may be paired with a work function specific gate metal in the industry standard high k metal gate process schemes, for example, as described in the incorporated references. Furthermore, the gate dielectric on transistors may have different dielectric permittivities than silicon dioxide. The gate dielectric permittivity of the second layer transistors may be different than the gate dielectric permittivity of the first layer transistors. An optical anneal may be performed to densify and/or remove defects from gate dielectric 1359, anneal defects and activate dopants such as LDD and S/D implants, densify the first ILD 1355, form DSS junctions (Dopant Segregated Schottky such as $NiSi_2$), and/or form contact and S/D silicides (not shown). Optionally, portions of transistor isolation region 1387 and BOX region 1331 may be lithographically defined and etched away, thus forming second transistor isolation regions 1389 and PD transistor area 1363. Partially depleted transistors (not shown) may be constructed in a similar manner as the FD-MOSFETs constructed on transistor channel region 1325 herein, but now with the thicker back-channel region 1321 silicon as its channel body. PD transistor area 1363 may also be utilized to later form a direct connection thru a contact to the back-channel region 1321 for back bias and Vt control of the transistor with transistor channel region 1325. This may also be utilized for RF transistors. If no PD devices are desired, then it may be more efficient to later form a direct connection thru a contact to the back-channel region 1321 for back bias and Vt control of the transistor with transistor channel region 1325 by etching a contact thru transistor isolation region 1387.

Figure 6F:
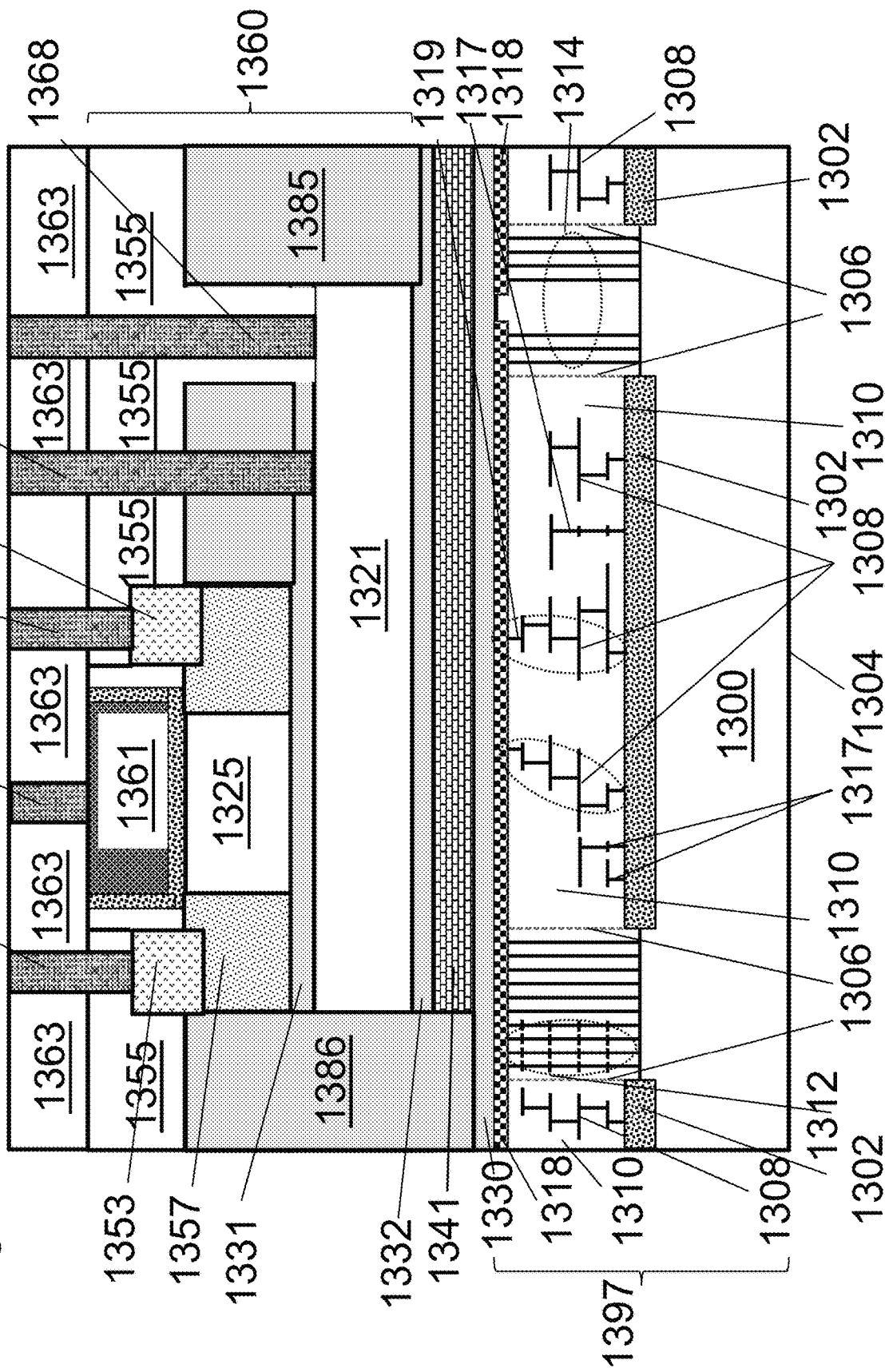

As illustrated in FIG. 6F, a thick oxide 1363 may be deposited and planarized. Source, gate, drain, two types of back contact openings may be masked, etched, and filled with electrically conductive materials preparing the transistors to be connected via metallization. Thus gate contact 1365 connects to gate electrode 1361, source & drain contacts 1366 connect to raised S/D regions 1353, back channel contact 1368 may connect to back-channel region 1321, and direct back contact 1367 may connect to back-channel region 1321. Back channel contact 1368 and direct back contact 1367 may be formed to connect to shield/heat sink layer 1318 by further etching, and may be useful for hard wiring a back bias that may be controlled by, for example, the second layer or first layer transistors and circuitry into the FD MOSFET.

As illustrated in FIG. 6G, thru layer vias (TLVs) 1380 may be formed by etching thick oxide 1363, first ILD 1355, transistor-backchannel-TRL isolation regions 1386, upper isolation layer 1332, lower isolation layer 1330, and filling with an electrically and thermally conducting material (such as tungsten or cooper) or an electrically non-conducting but thermally conducting material (such as described herein and in the incorporated references). Second device layer metal interconnect 1381 may be formed by conventional processing. TLVs 1380 may be constructed of thermally conductive but not electrically conductive materials, for example, DLC (Diamond Like Carbon), and may connect the FD-MOSFET transistor device and other devices on the top (second) crystalline layer thermally to shield/heat sink layer 1318. TLVs 1380 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 1318, which may be a ground or Vdd plane in the design/layout. TLVs 1380 may be also constructed in the device scribelanes (pre-designed in base layers or potential dicelines) to provide thermal conduction to the heat sink, and may be sawed/diced off when the wafer is diced for packaging, not shown). Shield/heat sink layer 1318 may be configured to act (or adapted to act) as an emf/emi (electromotive force/interference) shield to prevent direct layer to layer cross-talk between transistors in the donor wafer layer and transistors in the acceptor wafer. In addition to static ground or Vdd biasing, shield/heat sink layer 1318 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 1384, may have regions, for example, transistor channel region 1325 and S/D & LDD regions 1357, that differ substantially in dopant concentration, for example, a 10 times greater doping concentration in S/D & LDD regions 1357 than in transistor channel region 1325, and/or may have a different dopant type, such as, for example p-type or n-type dopant, and/or may be doped and substantially undoped in the neighboring regions. For example, transistor channel region 1325 may be very lightly doped (less than about 1e15 atoms/$cm^3$) or nominally un-doped (less than about 1e14 atoms/$cm^3$) and S/D & LDD regions 1357 may be doped at greater than about 1e15 atoms/$cm^3$ or greater than about 1e16 atoms/$cm^3$. For example, transistor channel region 1325 may be doped with p-type dopant and S/D & LDD regions 1357 may be doped with n-type dopant.

An operations thermal conduction path may be constructed from the devices in the upper layer, the transferred donor layer and formed transistors, to the acceptor wafer substrate and an associated heat sink. The thermal conduction path from the FD-MOSFET transistor device and other devices on the top (second) crystalline layer, for example, raised S/D regions 1353, to the acceptor wafer heat sink (not shown, but may be placed on the backside of substrate 1300, may include source & drain contacts 1366, second device layer metal interconnect 1381, TLV 1380, a portion of heat sink/shield 1318, 1308, 1312, 1314, and acceptor substrate 1300. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 1300. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 1310, which may be a dielectric such as, for example, carbon doped silicon oxides. The heat removal apparatus, which may include acceptor wafer heat sink (not shown), may include an external surface from which heat transfer may take place by methods such as air cooling, liquid cooling, or attachment to another heat sink or heat spreader structure.

Furthermore, some or all of the layers utilized as shield/heat sink layer 1318, which may include shapes of material such as the strips or fingers as illustrated in at least FIG. 33B and related specification sections of U.S. Pat. No. 8,450,804, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 1318 layer or layers. Moreover, some or all of the layers utilized as shield/heat sink layer 1318, which may include strips or fingers as illustrated in FIG. 33B and related specification of U.S. Pat. No. 8,450,804, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 1318 layer or layers. The Vsupply on line 17C12 and the control signals on control line 17C16 may be controlled by and/or generated in the second layer transistors (for example donor wafer device structures such as the FD-MOSFETs formed as described in relation to FIG. 6) or first layer transistors (acceptor, for example acceptor wafer transistors and devices 1302), or off chip circuits. Furthermore, some or all of the layers utilized as shield/heat sink layer 1318, which may include strips or fingers as illustrated in FIG. 33B and related specification of U.S. Pat. No. 8,450,804 or other shapes such as those in FIG. 33B, may be utilized to distribute independent power supplies to various portions of the second layer transistors or first layer transistors (acceptor, for example acceptor wafer transistors and devices 1302) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 1318 or layers can impact their heat-shielding capacity. This impact may be mitigated, for example, by enhancing the top shield/heat sink layer 1318 areal density, creating more of the secondary shield/heat sink layers 1318, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, for example donor wafer device structures such as the FD-MOSFETs formed as described in relation to FIG. 6, may include I/O logic devices, such as SerDes (Serialiser/Deserialiser), and conductive bond pads (not shown). The output or input conductive pads of the I/O circuits may be coupled, for example by bonded wires, to external devices. The output or input conductive pads may also act as a contact port for the 3D device output to connect to external devices. The emf/emi generated by the I/O circuits could be shielded from the other layers in the stack by use of, for example, the shield/heat sink layer 1318. Placement of the I/O circuits on the same stack layer as the conductive bond pad may enable close coupling of the desired I/O energy and lower signal loss. Furthermore, the second layer of circuits and transistors, for example donor wafer device structures such as the FD-MOSFETs formed as described in relation to FIG. 6, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf/emi generated by the RF circuits could be shielded from the other layers in the stack by use of, for example, the TRL 1340 and/or shield/heat sink layer 1318.

TLVs 1380 may be formed through the transferred layers. As the transferred layers may be thin, on the order of about 1 um or less in thickness, the TLVs may be easily manufactured as a typical metal to metal via may be, and said TLV may have state of the art diameters such as nanometers or tens to a few hundreds of nanometers, such as, for example about 250 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. Design choices may determine if TLVs are formed thru transistor and back channel isolation regions 1385 and/or thru transistor-back-channel-TRL isolation regions 1386.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 6 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 6A through 6G are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 1301 may be n type or un-doped. Furthermore, transistor and back channel isolation regions 1385 and transistor isolation region 1387 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Strain on a transistor channel to enhance carrier mobility may be accomplished by a stressor layer or layers as well. Moreover, a process could be done on bulk donor wafer rather than an SOI wafer as well to form other types of transistors without integrated body/back-channel layer/regions. Additionally, the layer transfer process may utilize a method other than ion-cut, for example, a porous layer or selectively etchable layer, detach layer method. Furthermore, a process could be done to form other types of transistors on the layer to be processed 1360, for example, FinFets or TFETs. Many other modifications within the scope of the invention will suggest themselves to such skilled persons after reading this specification. Thus the invention is to be limited only by the appended claims.

A donor wafer that may include a pre-made TRL and other layers, for example, the structure as illustrated in FIG. 6B, may be manufactured for/by and supplied by a wafer vendor such as MEMC/SunEdison, SEH, Soitec, etc.

A donor wafer that may include a pre-made TRL and other layers, for example, the structure as illustrated in FIG. 6B, may be layer transferred utilized the perforated carrier wafer methods as described in at least FIGS. 184, 185, 186, and 187 and related specification sections of U.S. Pat. No. 8,273,610. A debond/release etchant protect layer may be included in the transfer layer stack to protect the TRL 1340 and other layers from the debond/release etchant utilized in the perforated carrier wafer methodology.

A TRL may be formed directly on the acceptor wafer prior to a layer transfer of the material to form the next layer of devices and circuits. Structures and devices similar to those described and illustrated with respect to at least FIG. 6 may be formed, but the TRL formation may be limited to temperatures less than about 400° C. due to the presence of copper or aluminum metallization and low k IMDs on the layer or layers below the layer being processed. An exemplary process flow is described with respect to FIGS. 7A-7E. FIG. 7E illustrates an exemplary n-channel FD-MOSFET with integrated TRL (Trap Rich Layer). Integrated TPS (Thermal Protective Structure), TIL (Thermal Isolation Layer), and/or TES (Thermally Enhanced Substrate) may be utilized to thermally protect the metallization, isolation layers, device electrical characteristics and reliability of devices that may reside in or on the substrate or a previously constructed layer in the 3D stack from damaging processes and processing temperatures. Formation and composition details may be found in at least some of the incorporated references, for example, U.S. Pat. No. 9,023,688. An exemplary n-channel FD-MOSFET with integrated TRL may be constructed in a 3D stacked layer utilizing procedures outlined herein and in incorporated references.

Figure 7A:
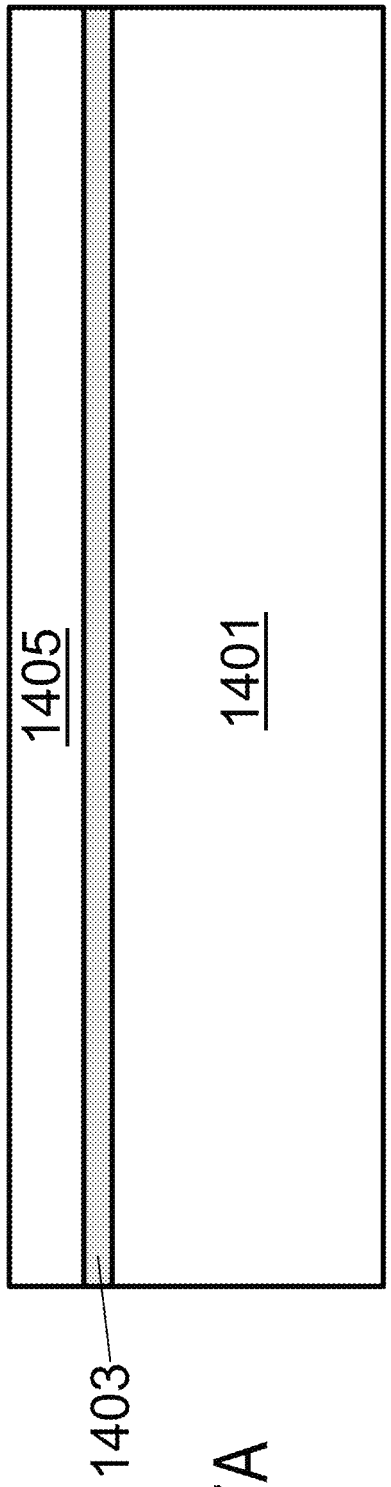
FIGS. 7A-7E are exemplary illustrations of an additional n-channel FD-MOSFET with integrated TRL (Trap Rich Layer) device and process flow.

As illustrated in FIG. 7A, SOI donor wafer substrate 1401 may include back channel layer 1405 above Buried Oxide BOX layer 1403. Back channel layer 1405 may be doped by ion implantation and thermal anneal, may include a crystalline material, for example, mono-crystalline (single crystal) silicon and may be heavily doped (greater than about 1e16 atoms/cm$^3$), lightly doped (less than about 1e16 atoms/cm$^3$) or nominally un-doped (less than about 1e14 atoms/cm$^3$). SOI donor wafer substrate 1401 may include a crystalline material, for example, mono-crystalline (single crystal) silicon and at least the upper layer near BOX layer 1403 may be very lightly doped (less than about 1e15 atoms/cm$^3$) or nominally un-doped (less than about 1e14 atoms/cm$^3$). Back channel layer 1405 may have additional ion implantation and anneal processing to provide a different dopant level than SOI donor wafer substrate 1401 and may have graded or various layers of doping concentration. SOI donor wafer substrate 1401 may have additional ion implantation and anneal processing to provide a different dopant level than back channel layer 1405 and may have graded or various layers of doping concentration. The donor wafer layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 1401 doping will be undoped to eventually create an FD-MOSFET transistor with an updoped conduction channel. SOI donor wafer may be constructed by layer transfer techniques described herein or elsewhere as known in the art, or by laser annealed SIMOX at a post donor layer transfer to acceptor wafer step. BOX layer 1403 may be thin enough to provide for effective DC or RF back and/or device/transistor body bias, for example, about 25 nm, or about 20 nm, or about 10 nm, or about 5 nm thick. Furthermore, back channel layer 1405 and Buried Oxide BOX layer 1403 may be not formed and the transistor formation may proceed from a bulk donor substrate rather than an SOI based substrate.

Figure 7B:
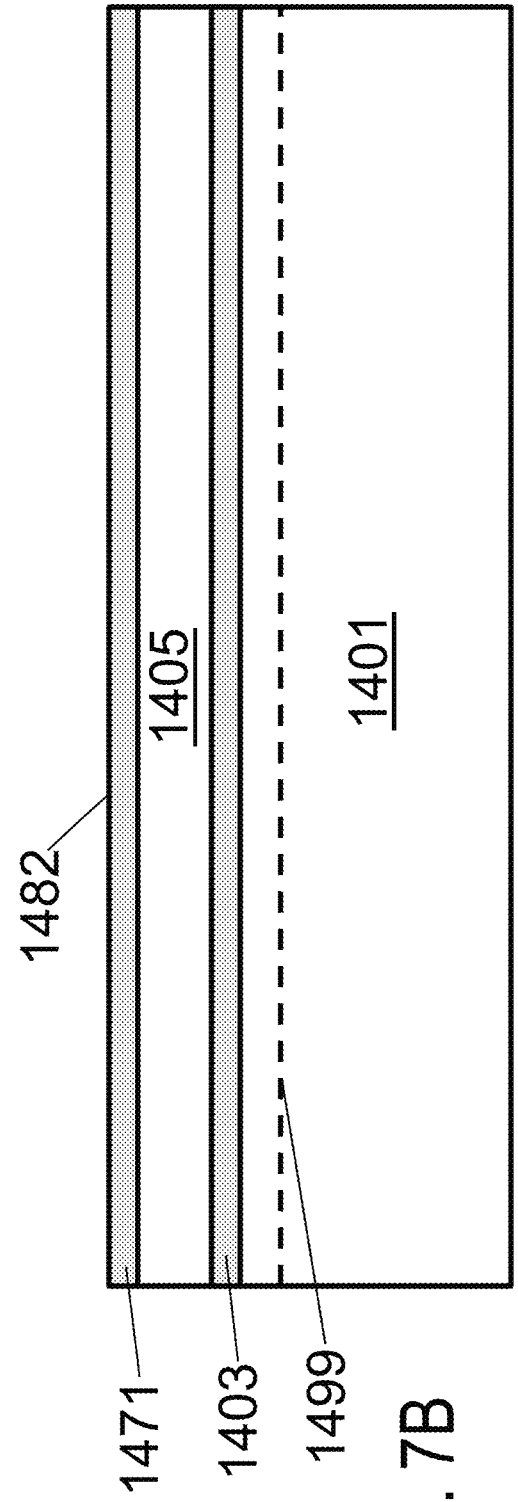

As illustrated in FIG. 7B, the top surface of the donor wafer stack that may include SOI donor wafer substrate 1401, may be prepared for wafer bonding with a deposition of an oxide on or by thermal/RTO oxidation of back channel layer 1405 to form bonding oxide layer 1471. Bonding oxide layer 1471 may include, or may have below it, a layer (not shown) that may serve as a heat shield and/or conductive back plane, for example, a layer of tungsten (a layer of tungsten (similar to the description in FIGS. 39, 40, 41, 42, 43 of U.S. Pat. Nos. 8,574,929 and 9,385,058). The thin layer of refractory metal with a high melting point may be formed on top of the isolation layer and then patterned after layer transfer, thus forming metalized back-bias regions for the second layer of transistors, the back-bias region will not be harmed by the thermal cycles of the processing on the layer being processed.

A layer transfer demarcation plane (shown as dashed line) 1499 may be formed by hydrogen implantation or other methods as described in the incorporated references, and may reside within the SOI donor wafer substrate 1401.

Figure 7C:
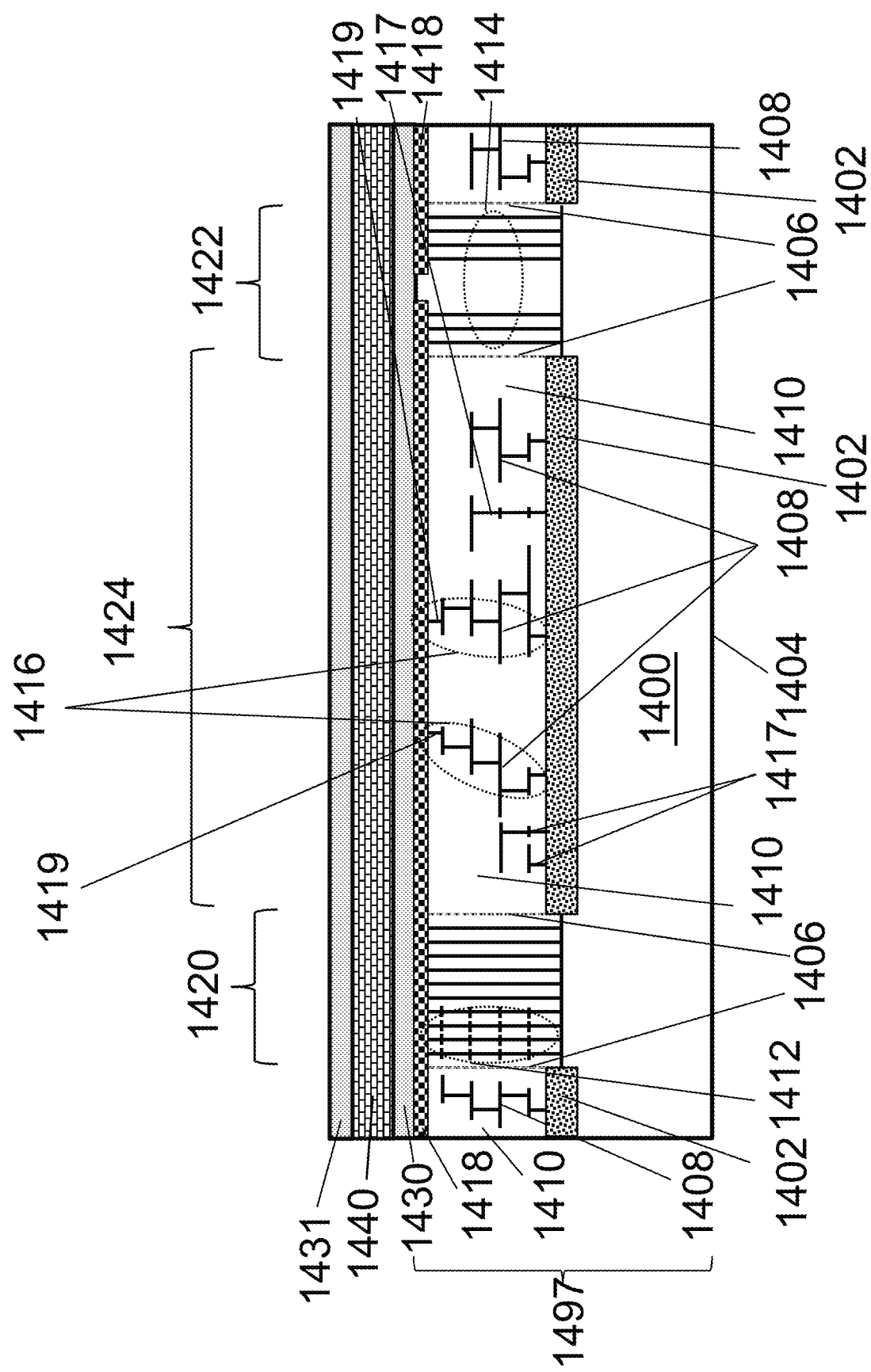

As illustrated in FIG. 7C, acceptor substrate 1497 may be prepared and a TRL 1440 may be formed including a capping/bonding layer 1431. Acceptor substrate 1497 may be prepared in a similar manner as at least as the structures and devices described in FIGS. 1A-1E of incorporated U.S. Pat. No. 9,023,688, up to and including lower isolation layer 1300 (lower isolation layer 1430 in FIG. 7C), and using known in the art techniques. Acceptor wafer 1497, as described in the incorporated references and herein, may include, for example, transistors, circuitry, and metal, such as, for example, aluminum or copper, interconnect wiring, a metal shield/heat sink layer or layers, and thru layer via metal interconnect strips or pads. Acceptor wafer 1497 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 1497 may include transistors such as, for example, MOSFETS, FD-MOSFETS, Fin-Fets, FD-RCATs, BJTs, HEMTs, and/or HBTs.

TPS protective structures to protect the desired regions of substrate devices may be constructed. These protective structures may be constructed using conventional and known in the art processing techniques. A substrate 1400, for example, a monocrystalline silicon wafer which may be thermally enhanced (a Thermally Enhanced Substrate—TES—as described in incorporated U.S. Pat. No. 9,023,688), of which a portion is shown in FIG. 7, may have substrate device regions 1402 including devices, such as, for example, transistors, capacitors, and resistors. These substrate device regions 1402 could be formed as eventual product dice with surrounding scribelanes and die edge seals. The devices within the regions of substrate devices could be wholly or partially within the substrate 1400 material. The scribelanes may also be called dicing streets or scribelines.

The substrate 1400 may also have a backside surface 1404 that may be utilized to conduct processing heat (the heat source may be the layer being processed 1460 during device formation steps or portions of the equipment performing the processing such as IR lamps) from the substrate 1400 to a processing equipment cooling chuck or other thermal conduction/heat removal device, generally within the processing equipment.

The substrate device regions 1402 may have corresponding regions of substrate metallization 1408 and BEOL isolation 1410 interconnect layers, which may include copper or aluminum metallization materials and low-k dielectric inter-metal dielectrics (IMD) respectively. These may be constructed with known in the art BEOL processing.

As part of the construction of or separately from the formation of regions of substrate metallization 1408 and BEOL isolation 1410 interconnect layers, one or more shield layer or regions 1418 of metallization and isolation may be constructed. Details are in referenced applications. For example, the shield layer or regions 1418 metallization may include materials such as tungsten, copper, aluminum, grapheme, diamond, carbon, materials with a high thermal conductivity (>10 W/m-K) and an appropriate melting/softening point. The shield layer or regions 1418 may be constructed as a continuous slab across substantially the entire extant of the substrate area, or may be formed as regions.

The shield layer or regions 1418 may have terminations within the device die scribelanes. The shield layer or regions 1418 may include TLV landing pads wherein signals from the second layer of devices may connect either to a lower shield layer (for example shield layer or regions 1418) or to the interconnect layers or regions of substrate metallization 1408 and BEOL isolation 1410 interconnect or lower layer devices and circuits. The shield layer or regions 1418 may be thermally but not electrically connected or may be thermally and electrically connected to the substrate 1400 in a variety of ways.

The scribelanes, for example, scribelane with thermal via stacks and continuous shield 1420 and/or scribelane with thermal via stacks and cut shield layer 1422, may be substantially populated with thermal via stacks, which may be formed as thermal via stacks with via landing pads 1412 as each metallization and via layer of the regions of substrate metallization 1408 and BEOL isolation 1410 interconnect layers are formed, or the thermal vias in the scribelane 1414 may be formed as an etched and filled deep-via prior to the formation of the shield layer or regions 1418. Forming the thermal via stack after the regions of substrate metallization 1408 and BEOL isolation 1410 interconnect layers are formed may provide the use of a different BEOL isolation material, material that may be more thermally isolative and/or thermally stable, for the thermal via stacks than for the devices. The thermal vias in the scribelane 1414 may also be formed as one or a few to substantially fill (with appropriate stress relief structures) the scribelane with metal (thermally conductive) material (as much as practical given CMP dishing design rules) that may be part of the shield layer formation, or may be formed in a separate metal deposition and planarization step and may provide use of a more thermally conductive material than copper or aluminum to form the thermal vias in the scribelane 1414, for example, carbon nanotubes, Plasma Enhanced Chemical Vapor Deposited Diamond Like Carbon-PECVD DLC (about 1000 W/m-K), and Chemical Vapor Deposited (CVD) graphene (about 5000 W/m-K).

As dictated by design choices, the thermal vias (such as, for example, substantially all or a portion of thermal via stacks with via landing pads 1412 and/or thermal vias in the scribelane 1414, and/or in-die thermal via stacks 1416 and/or fill-in thermal paths 1417) may truncate in a dielectrically isolated or reverse biased junction electrically isolated connection to the substrate, or the thermal vias may truncate as a conventional forward biased junction or no junction substrate contact that may be thermally and electrical connected to the substrate. Processing, structure, and operational details are in referenced applications.

In-die thermal via stacks 1416 (may also be called in-die thermal via paths) may also be constructed over the regions of substrate devices 1402 (within die extant 1424) by forming a via stack that utilizes the interconnect structures of the regions of substrate metallization 1408 and BEOL isolation 1410 interconnect layers, with a via connection 1419 from the shield layer to a metallization layer/segment within the regions of substrate metallization 1408 and BEOL isolation 1410 interconnect layers. Via connection 1419 may be connected at a later step to electrically couple to the second layer devices (such as a TLV), or may primarily enable (as part of a thermal path) a thermal connection from substrate 1400 to shield layer or regions 1418. Details of this formation have been described in referenced applications.

Additionally, as a matter of design choice and may be controlled by an EDA design and placement algorithm, fill-in thermal paths 1417 may be added to a chip die design/layout to maximize local and die average thermal conductivity. The fill-in thermal paths 1417 may be formed anywhere on the die and from any level of the regions of substrate metallization 1408 and BEOL isolation 1410 interconnect layers to the substrate 1400, for example, metal 4 to substrate, metal 3 to substrate, and so on). Fill-in thermal paths 1417 may be added to a power or ground line as extra thermal connections to the substrate 1400, which may be electrically conductive or non-conductive due to design constraints. Fill-in thermal paths 1417 may be additional connections beyond what a conventional design or EDA tool may provide/construct. Fill-in thermal paths 1417 may be added to/formed in so called 'white space' within the device die, where there may be a path vertically and horizontally thru the regions of substrate metallization 1408 and BEOL isolation 1410 interconnect layers to the substrate 1400. Moreover, fill-in thermal paths 1417 may be formed from the CMP fill structures of one or more of the regions of substrate metallization 1408 and BEOL isolation 1410 interconnect layers.

As a matter of design choice, die seal 1406 (or die seal-ring) may be utilized as a thermal connection from either interconnect metal layers of the ring itself or the shield layer or regions 1418 to the substrate 1400.

Lower isolation layer 1430 may be deposited on top of shield layer or regions 1418 to protect and electrically and partially thermally isolate above and below and may include the bonding oxides for an ion-cut layer transfer process (for the case wherein TRL 1440 is formed on a donor wafer or substrate). Lower isolation layer 1430 may include designed-in voids (not shown), for example, by etch removal of portions of lower isolation layer 1430, thus forming regions of vacuum and/or gas and regions of the remaining material (for example, silicon oxide) of lower isolation layer 1430. The voids may be formed such that they extend fully or partially thru the entire thickness lower isolation layer 1430. The presence of the voids may reduce the average thermal conductivity of lower isolation layer 1430. The voids may include greater than about 5%, greater than about 10%, greater than about 20%, or greater than about 50% of the area and/or volume of lower isolation layer 1430, thus affecting the total average lower isolation layer 1430 thermal conductivity by greater than about 5%, or greater than about 50%.

Continuing with the FIG. 7C illustration, TRL 1440 may be formed on top of lower isolation layer 1430. TRL1440 may be etched (partially or fully) to form TRL regions (not shown).

TRL 1440 formation may include deposition of an amorphous silicon or a polysilicon film, or a combination of the two. The deposition may utilize deposition techniques and processes that will not thermally harm the underlying metallization and/or dielectric BEOL isolation materials and structure, which for copper and/or aluminum metallization and low-k dielectrics are generally less than 400° C. temperature exposures. Techniques, such as sputtering, PECVD, etc., may be utilized. TRL 1440 may have a thickness that would accomplish the effective resistivity metric at the frequency(ies) of interest for the circuit design as discussed previously herein, and may be, for example, about 5 nm, about 10 nm, about 20 nm, about 30 nm, about 50 nm about 100 nm, about 200 nm, or about 500 nm thick.

TRL 1440 formation may include damaging the surface and a top layer of, for example, a deposited layer of silicon or a layer transferred silicon layer, or of lower isolation layer 1430, thus creating a damage layer (or regions if masked or etched). Damage may be caused by ion implantation, for example, such as an Argon ion-implant of about $10^{15}$ atoms/cm$^2$. Plasma sheath, or plasma source ion implantation may be utilized. Preferably the implantation is configured to damage and not dope the layer, the objective being to provide as high an effective resistivity as possible. The dose and energy may be set to bring the damaged layer close to or completely amorphize the crystalline structure of the damaged layer or region.

TRL 1440 formation may include deposition of a silicon rich silicon oxide, a silicon rich silicon nitride, and may include deposition of a siliconoxynitride film. TRL 1440 formation may include deposition of a carbon or carbon rich film, for example, amorphous carbon, disordered grapheme, DLC (Diamond Like Carbon), disordered carbon nanotube mats, or SiCO. TRL 1440 formation may include some of the materials formed in creation of the TIL layer of incorporated U.S. Pat. No. 9,023,688 that have a high trap density, for example, forming nanoscale layered oxides or layers of disordered nanostructured materials.

TRL 1440 may be formed thicker than the desired end thickness, and then thinned by, for example, CMP processing or etching, to the desired end thickness, or for the purposes of smoothing the surface to enable improved bonding.

A pre-layer-transfer anneal may be performed as part of the TRL 1440 formation process or after the formation of TRL 1440, and may include a thermal anneal equal to or greater than the maximum temperature that the TRL 1440 would see during subsequent processing, for example, during the 3D IC stack processing, including layer transfer/bonding, transistor/device formation, activation anneals, and so on as long as the TRL formation temperature does not exceed the damage temperature of underlying structures, which may be less than about 400° C., or less than about 350° C., for copper and low-k BEOL materials and structures. If higher temperature metals and dielectrics are utilized in the construction of the acceptor substrate 1497, for example, tungsten and silicon dioxide, greater temperatures to form the TRL 1440 may be available. The ramp up and cool down rates may be carefully controlled depending on the type and condition of material in TRL 1440 to minimize cracking, outgassing effects, and other stress effects on the stack. The time of the pre-layer-transfer anneal at maximum temperature (the process exposure maximum) may be less than about 30 minutes, or less than about 1 hour, or less than about 2 hours.

Continuing as illustrated in FIG. 7C, the top surface of the donor wafer stack that may include acceptor substrate 1497, may be prepared for oxide wafer bonding with a deposition of a low temperature oxide to form capping/bonding layer 1431.

The SOI donor wafer substrate 1401 stack, such as surface 1482 (shown in FIG. 7B), and acceptor wafer 1497 (first shown in FIG. 7C) may be prepared for wafer bonding as previously described in the incorporated references and low temperature (less than about 400° C.) bonded.

Figure 7D:
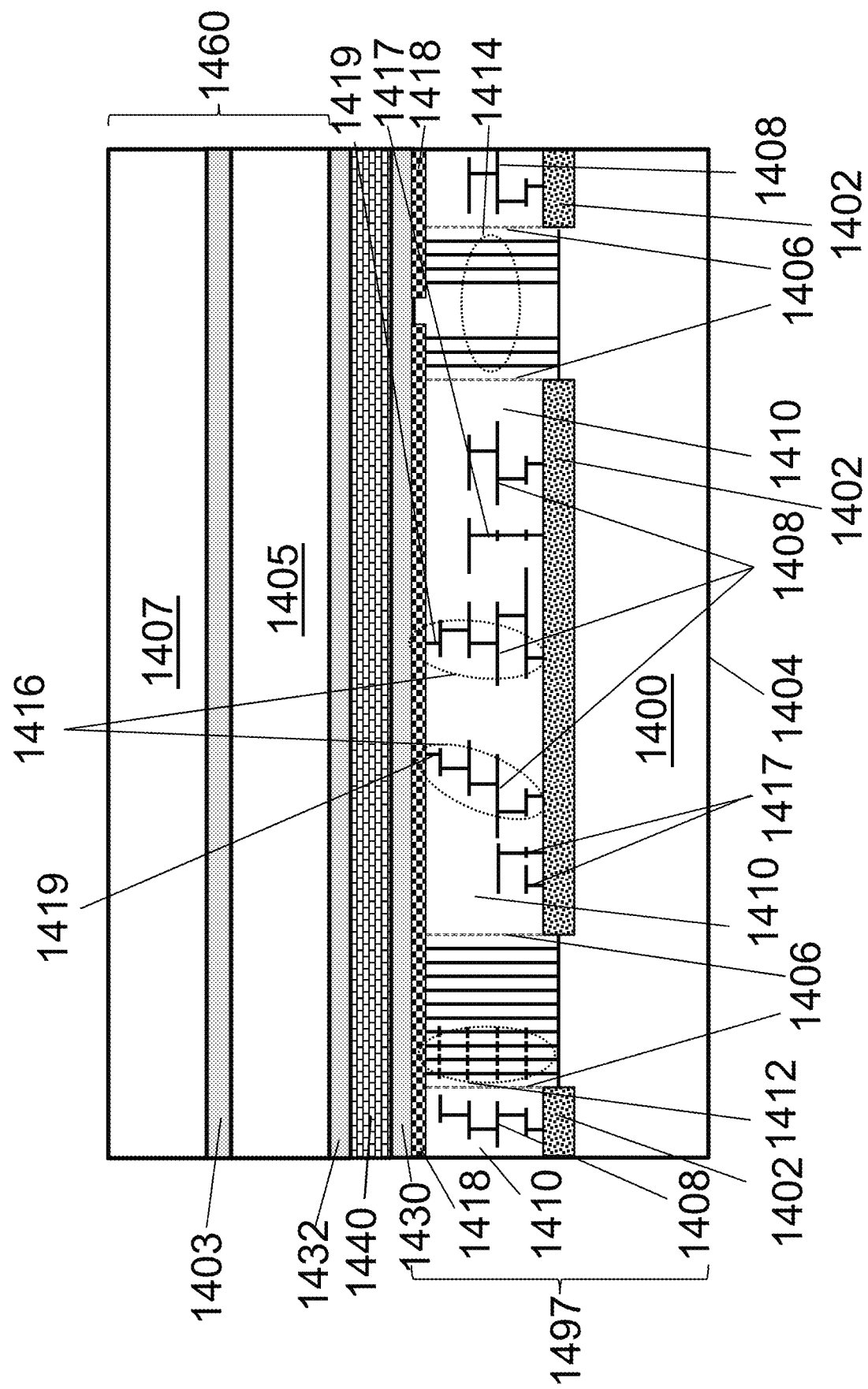
Figure 7E:
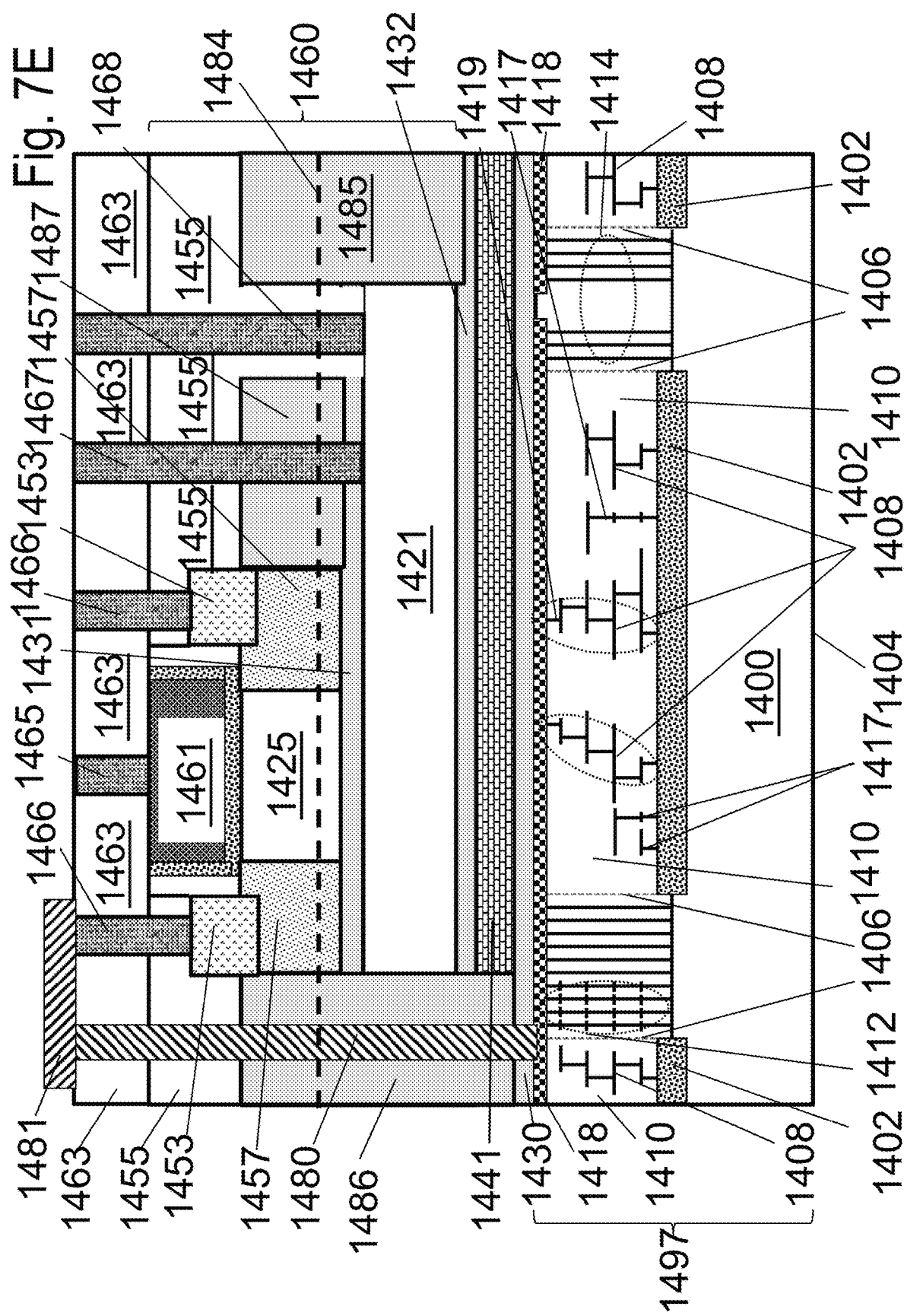

As illustrated in FIG. 7D, bonding oxide layer 1471, back channel layer 1405, BOX layer 1403 and remaining channel layer 1407 may be layer transferred to acceptor wafer 1497. Donor wafer bonding oxide layer 1471 and acceptor wafer 1497 capping/bonding layer 1431 may be oxide to oxide bonded, thus forming upper isolation layer 1432. The portion of the SOI donor wafer substrate 1401 that may be above (when the layer stack is flipped over and bonded to the acceptor wafer 1497) the layer transfer demarcation plane 1499 may be removed by cleaving or other low temperature processes as described in the incorporated references, such as, for example, ion-cut with mechanical or thermal cleave or other layer transfer methods, thus forming remaining channel layer 1407.

Formation of transistors and devices on the layer being processed 1460 without harming the underlying structures of acceptor wafer 1497 may proceed with a variety of methods. For example, as disclosed in at least FIGS. 33 and 46 and related specification sections of incorporated by reference U.S. Pat. No. 8,574,929, transistors may be formed with an integrated heat shields and optical annealing. For example, formation of CMOS in one transferred layer and the orthogonal connect strip methodology may be found as illustrated in at least FIGS. 30-33, 73-80, and 94 and related specification sections of U.S. Pat. No. 8,273,610, and may be applied. Low temperature and/or heat shielded 3D stacking transistor formation techniques may help preserve the effectiveness of the trap rich layer by not significantly annealing the defects and traps.

The exemplary flow herein FIG. 7 is utilizing a similar transistor formation technique as described in incorporated U.S. Pat. No. 9,023,688, by utilizing a TIL, which may be integrated with TRL 1440/TRL regions 1441, on the top or bottom face, or both. Or may be one in the same (shown). Many conventional semiconductor processing steps may now be utilized to form transistors and devices on the layer being processed 1460 without harming the underlying structures of acceptor wafer 1497, for example, a deposition or anneal may be performed at 800° C. on layer being processed 1460. Heat removal from the substrate, for example, such as via a cooled chuck, is described in incorporated U.S. Pat. No. 9,023,688.

Processing similar to the processing and transistor/device formation such as, for example, illustrated in FIGS. 6D to 6G and described in related specification sections herein, or many other semiconductor processes and steps, may be performed. For example, as illustrated in FIG. 7E, an exemplary FD-MOSFET structure may be formed. The structures, numerals and labels may be common between FIGS. 6A-6G and FIGS. 7A-7E with just the first number adjusted to match the present figure.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 7 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 7A through 7E are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 1401 may be n type or un-doped. Furthermore, transistor and back channel isolation regions 1485 and transistor isolation region 1487 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Moreover, a process could be done on bulk donor wafer rather than an SOI wafer as well to form other types of transistors without integrated body/back-channel layer/regions. Additionally, the layer transfer process may utilize a method other than ion-cut, for example, a porous layer or selectively etchable layer, detach layer method. Furthermore, a process could be done to form other types of transistors on the layer to be processed 1460, for example, FinFets or TFETs. Many other modifications within the scope of the invention will suggest themselves to such skilled persons after reading this specification. Thus the invention is to be limited only by the appended claims.

The acceptor wafer herein or in the incorporated references may include a top or near top low-k dielectric layer or layers, as part of the BEOL processing and formation. The low-k dielectrics utilized may have a lower physical strength, for example as represented by its Young's Modulus, than desired to enable a defect free bond and/or cleave of a transferred layer. Use of a TRL and/or a TIL may also provide a weaker structure than desired. Preparation for bonding and/or cleaving may include structures and/or materials which include the purpose of enhancing the physical strength and/or cracking resistance of the stack structure, especially the bond plane and the acceptor wafer BEOL layers. The top BEOL layer or layers dielectrics may utilize a stronger dielectric material, for example fluorinated oxides or undoped oxides. Furthermore, strengthening regions may be placed within the BEOL, TIL, TRL and/or acceptor wafer to stiffen and/or mechanically strengthen the 3DIC structure. Strengthening regions may provide smaller regions of the softer and weaker low-dielectrics and may mitigate cracking and fracture initiation and/or propagation. Strengthening regions may include materials that have a higher Young's modulus than the majority of the material within acceptor wafer BEOL, or any TIL or TRL. For example, strengthening regions may include, for example, silicon oxide, which has a higher mechanical strength than, for example, most low-k dielectrics, such as SiCO, aerogels and silsesquioxanes. Strengthening regions may include less than about 0.5%, less than about 1%, less than about 2%, less than about 5% or less than about 10% of the area and/or volume of BEOL, or any TIL or TRL. Strengthening regions may include the scribelanes of the wafer, the scribelanes may be processed with stiffer material during its formation as part of the process flow, or the material within the scribelane may be removed and replaced with a stiffer material before layer transfer of a layer above. Moreover strengthening regions may be designed to be aligned to the scribelanes and may underlap the full extent of the scribelanes by an underlap, which may be the layout distance between the acceptor die seal and the edge of the closest strengthening regions. For example, the underlap may have the dimension of 0 or at least about 1 um, at least about 5 um, at least about 10 um, at least about 20 um, at least about 50 um. A similar strengthening strategy may be employed on a second layer of device and circuits when bonding and cleaving a 'third' layer on top of the second layer. A portion of the strengthening regions may be replaced after the layer transfer. More teaching on strengthening regions may be found in at least incorporated reference U.S. Pat. No. 9,023,688.

An embodiment of the invention may include various modification of the process flows described in U.S. Pat. No. 8,273,610 in relation to at least FIGS. 70A-70F, 81A-81F, 82A-82G, 83A-83L. These flows may start with a donor wafer which may go through a normal process flow to form a circuit layer which we could call stratum-3. The described flow suggests the use of a 'gate-replacement' flow, also called 'gate-last' flow for transistor formation, although other structures/techniques may be utilized. The stratum-3 layer would be first transferred, for example, using ion-cut, to a carrier wafer/substrate and then transferred on top of a target wafer (also called base or acceptor wafer/substrate in some circumstances). Once on top of the target wafer the dummy oxide and the dummy gate could be replaced with the gate last gate stack of, for example, hafnium oxide and metal gate. This flow provides the advantage that any damage caused by the ion-cut would be removed by the replacement step. In an embodiment the replacement oxide and gate could be made with silicon oxide and poly gate which are in most cases cheaper and easier to process. So the repair of the ion-cut potential damage is not a condition of having high-K metal gate process. It should be noted that once stratum-3 is bonded on the target wafer the temperature limitation, generally restricted to less than 400° C., due to the underlying structure does exist. Therefore, a process should be used for the deposition of a high quality gate oxide at the metallization compatible temperatures. Furthermore, the dummy gate stack may be replaced after the ion-cut by other types of gate stacks, for example, such as a grown or deposited oxide/dielectric with a polysilicon/polycide electrode, or a grown or deposited oxide/dielectric with a tungsten electrode. Such processes have been presented in at least U.S. Pat. No. 8,273,610.

While ion-cut is a good option for cutting a less than a micron thick layer from the donor wafer transferring it to the carrier wafer, other layer transfer options do exist. It also should be noted that the transferred layer could had been fully processed first to include transistors and isolation, or alternatively the transferred layer might be just a monocrystal layer, giving up stratum-3 in the layer transfer.

In the following we outline few alternative process flows to ion-cut available for transferring a layer from a donor wafer to either a carrier wafer or to the final target wafer:

A. Use of donor wafer that has been pre-processed for a future cut/layer transfer such as:

1) Pre-cut by laser, as described in at least US patent application US 2014/0038392—this patent publication is hereby incorporated by reference in this application;
2) Use an SOI wafer or construct an SOI wafer;
3) Use an ELTRAN treated wafer with a porous layer before the top high quality layer, or construct an ELTRAN wafer;
4) Use a wafer with etch stop indicators pre-defined (LTDP-Layer Transfer Demarcation Plugs) as is been described in relation to FIG. 150 of incorporated U.S. Pat. No. 8,273,610.

B. Use a laser, as described in US patent application 2014/0038392, to cut the desired transfer layer off the donor wafer after high (over 400° C.) processes for stratum-3 are completed.

C. Use 'Cold Split' technology, for example, as developed and offered by commercial company called Siltectra (http://www.siltectra.com) and been described in at least US Patent Applications 2011/0259936—this patent publication is hereby incorporated by reference in this application.

Some of the above techniques are better used for a thicker layer of few microns, generally due to the variability of depth of the 'cut' of the transfer process. So after the transfer layer has been bonded to the carrier wafer or the target wafer and cut off the donor wafer, an additional process or processes could be used to thin the transferred layer further to about one of the following device thickness targets: about 20 nm, or about 50 nm, or about 100 nm, or about 200 nm or about 400 nm. Alternatives for such additional processing could include the following:

A. Etch, grind and Chemical Mechanical Polishing (CMP), which might include some sensing of depth control;

B. Etch, grind and Chemical Mechanical Polishing-CMP, which might include an stop indicator scheme, for example, such as described above with respect to LTDP;

C. Forming an etch stop or other types of a detach layer and then processing an epitaxial layer on which the donor transistors are constructed. For example, an ion implantation and anneal may be utilized to form an etch stop layer, either on the donor surface or buried, and then a device epitaxial layer may be formed on top. A diffusion process may be utilized to form a doped etch-stop layer, and then a device epitaxial layer may be formed on top. An etch-stop layer may include, for example, heavily doped p+ or doped n+ silicon, depending on the chemistries used for selectivity of the etch-stop etching. Etch stop layer may include a material such as SiGe. Furthermore, a single epitaxial process may start with a light doping, then switch to a heavy doping (or change type) and then back to a light or undoped epitaxial deposition, thus forming two or more layers of differing dopant concentration and/or type. An 'etch-stop' may mean a significant (usually greater than a 5-10× etch rate) slowing of the etch removal rate so that control of the endpoint layer and planarity with respect to the desired device surface may be achieved. Many etch stop techniques for layer transfer may be described in at least FIGS. 14, 139-140, and 230-232 of incorporated U.S. Pat. No. 8,273,610.

C. Use of a secondary ion-cut of the bonded layer to trim the transferred layer down to a precisely controlled thickness and thickness variation across the wafer/substrate. This does avoid the ion damage from the thin layer as the ion implant is done from the back of the transfer layer. Following the ion cut some etch or CMP should be used to further treat the surface.

In addition some anneal might also be used to further treat the transferred layer for future step.

It should be noted that in most of these alternatives the donor wafer could be treated after the layer transfer to repair the top layer surface and prepare the donor wafer for additional steps of layer transfer.

The secondary ion-cut could be tuned to overcome some limitation of the first cut techniques such as un-even thickness of the transferred layer. A measurement tool could be used to create a depth profile of the wafer surface. The depth profile could be then transfer to an ion implanter tool which will adjust the ion (H+) implant depth accordingly. Thus a precise and well controlled ion-cut damage layer, or layer transfer demarcation layer, may be formed in the transferred layer.

This combination of cut techniques could allow for high quality thin (20 nm-200 nm) layer transfer. This could be done to a layer that has gone through process of complete or partial front end process of stratum-3 without damaging the sensitive transistor formation of stratum-3.

To assist the layer depth measurement, the bonding layers could be specially engineered to enhance the accuracy of such depth profile measurement. An example for such could be layering silicon oxide and silicon nitride to form a reflective layer tuned to reflect a laser wavelength of the measurement tool. Or including a metal layer if the reflective layer is on the target wafer. In U.S. Pat. No. 4,827,325, incorporated here by reference, such reflective layering is presented.

The donor wafer/substrate with a detach and/or etchstop layer or structure may be processed in the manufacturing flow and facility of the device stack manufacturer, or may be constructed at a wafer supplier and bought by the wafer stack manufacturer as a 'pre-made' substrate. After use in the stack formation flow, the wafer stack manufacturer may perform reclaim or recycle processing on the used donor wafer/substrate or may deliver it back to the wafer supplier for reclaim and/or recycle—reprocessing may include a fresh detach and/or etchstop layer or structure in the donor wafer/substrate. For example, a wafer supplier, such as, for example, SunEdison, may process a prime silicon wafer with a porous detach layer covered on one side by an epitaxial layer of silicon made to order (thickness, doping, etc.) for the specific wafer stack flow and device desired by the wafer stack manufacturer. Thus forming a Si-dDS, a silicon topped detachable donor substrate. The wafer stack manufacturer, for example Intel or Samsung, utilizes the Si-dDS in a stack process flow with a detach step, and then returns the used Si-dDS to SunEdison for recycle or reclaim.

In U.S. Pat. No. 8,273,610, FIG. 81 (A to F) transferring a full process stratum-3 is described—7032, 7028, 7026, 7030, 7008, from a donor wafer 8100 to a target wafer 808.

In FIG. 82 of U.S. Pat. No. 8,273,610 transferring the stratum-3 layer—8202 off a donor wafer 8206A, first to a carrier wafer 8226 and then from the donor wafer using a second ion-cut 8218 to the target wafer 808, is described.

In U.S. Pat. No. 8,273,610, FIG. 83 (A to K) the transfer of a stratum-3 layer—8302+ from a donor wafer 8300A first to a carrier wafer 8320, then process stratum-2-8300+ on the other side of the transferred layer while it is on the carrier wafer 8320 is described.

And then from the carrier wafer the layer comprising stratum-2 and stratum-3 (as dual strata 400) is transferred on to the target wafer 808 using a second ion cut 8321.

The ion-cut may be associated with defects caused by the ion implant process. The defects may be repaired with high temperature processing, such as previously described at least herein and in incorporated references, for example, thermal treatments such as RTA, RTO, furnace annealing, laser annealing. Ion-cut damage to sensitive areas may be avoided by backside ion-cut, by screening the H+(and any co-implant) from the sensitive device areas (gate, source rain junctions, etc.) such as described in at least FIG. 70B-1 of incorporated reference U.S. Pat. No. 8,273,610. The gate stack may be replaced after the ion-cut ion-implant, such as described herein and in incorporated references. For example, the dummy gate stack may be replaced by HKMG stack or by an oxide dielectric and poly/polycide gate electrode. The ion-cut ion implant may also be performed prior to the gate formation if the subsequent thermal cycles allow such, to avoid premature cleave/release.

Furthermore, alternative cut techniques presented before in respect for the transfer layer from the donor wafer could be used here as well.

Yet the transfer from the carrier wafer opens up more options since:

A. The carrier wafer is not the one contributing the device layer and therefore does not have to have a top layer of high quality to support transistor formation accordingly:

1) The carrier wafer may be built from low cost test wafers, which could be ground and/or etched away, or other alternatives in some flows (depending on for example thermal and/or sheer stresses of post attach processing), for example, glass substrates, 2) The carrier wafer may have a top layer which is designed for detach such as:

a) Porous layer (variation of the ELTRAN technique), which may be buried by, for example, epitaxial silicon and oxide, thereby providing an ox-ox bond from carrier to transfer layer, and may include release ports in the transfer layer scribelanes and/or interior to each die;

b) Other porous structures such as Aerogel materials, and may include release ports in the transfer layer scribelanes and/or interior to each die (may include aerogels and techniques described in U.S. patent application Ser. No. 14/298,917, incorporated by reference;

c) Photo-resist;

3) The carrier wafer could be designed for layer release as described in U.S. Pat. No. 8,273,610 in relation to at least FIG. 184, and/or to FIGS. 185, 186, 187, 188, 189.

4) The carrier wafer may include a top layer which is designed for detach such as a buried layer of laser damaged silicon, for example, such as described in at least FIG. 5A of U.S. Patent Publication No. 2014/0038392 to Yonehera, et al., of Solexel Corporation.

Note: The carrier wafer could be covered with oxide to support good bonding to the transfer layer. Other bonding layers could also be used.

B. There is a natural barrier between the carrier wafer and the transferred layer carrying stratum-2 and stratum-3 (dual strata 400)—the bonding layer. The bonding layer could be an oxide and would provide an etch stop. Accordingly the whole carrier wafer could be ground or etched away to that oxide layer after the bonding to the target wafer. Alternatively if any of the other techniques is used to cut the transferred layer from the carrier wafer and if such might leave some portion still attached, then it could be easily etched away. For example, forming a thin buried etch-stop layer within the carrier wafer, either buried or at the surface (and then coat with oxide for an ox-ox bond) may be utilized. In most cases this will be cheaper than the use of a secondary ion-cut as presented before in respect to the flow with the donor wafer.

The release from the carrier wafer may depend on the choice of process and may include any of steps such as: anneal step, mechanical pulling or force application from top and/or mechanical side stress, water jet to form side stress, laser side stress, knife edge side stress, etching or cooling step (thermal shock or thermal exposure), perforated carrier and selective etchant release as described and referenced herein. The release procedure may include providing release ports in the transfer layer scribelanes and/or interior to each die. The release procedure may utilize a frontside release, may include providing frontside release ports in the transfer layer scribelanes and/or interior to each die. Release utilizing an oxide layer may include a wet HF, vapor-phase HF, a MEMS style Bosch DRIE etch (alternating $SF_6$ and $C_4F_4$ plasma etches). Silicon release etches on the porous silicon may include KOH, $XeF_2$ and/or EDP or TMAH. Substances such as supersaturated $CO_2$ may help with a stiction free release as well as precise design and spacing of the release etchant ports.

Furthermore, the carrier wafer/substrate may include etch stop indicators pre-defined (LTDP-Layer Transfer Demarcation Plugs) as is been described in relation to FIG. 150 of incorporated U.S. Pat. No. 8,273,610. This may be used in combination with other release techniques; for example, the Siltectra stress or Solexel laser damage layer. The LTDPs may assist a 'rough' cleave technique (such as the Solexel stress cleave) to have an endpoint that may form a precisely defined, flat and parallel to the device surface cleave or allow a cleanup CMP/etch after a 'rough' cleave to have the same.

The carrier wafer/substrate with a detach and/or etchstop layer or structure may be processed in the manufacturing flow and facility of the device stack manufacturer, or may be constructed at a wafer supplier and bought by the wafer stack manufacturer as a 'pre-made' substrate. After use in the stack formation flow, the wafer stack manufacturer may perform reclaim or recycle processing on the used carrier wafer/substrate or may deliver it back to the wafer supplier for reclaim and/or recycle—reprocessing may include a fresh detach and/or etchstop layer or structure in the carrier wafer/substrate. For example, a wafer supplier, such as, for example, SunEdison, may process a test or prime silicon wafer with a porous detach layer covered on one side by a thin epitaxial layer of silicon and a thick layer of oxide, ready for ox-ox bonding. Thus forming an Ox-dCS, an oxide topped detachable carrier substrate. The wafer stack manufacturer, for example Intel or Samsung, utilizes the Ox-dCS in a stack process flow with a detach step, and then may return the used Ox-dCS to SunEdison for recycle or reclaim.

Vertical isolation between Stratum-2 and Stratum-3 devices may be a matter of design, layout and process flow choices. An oxide layer and/or regions may provide some isolation between stratum-2 devices from stratum-3 devices, and may include process that may include, for example, an SOI donor wafer/substrate, the donor wafer/substrate may start as a bulk silicon wafer and utilize an oxygen implantation and thermal anneal to form a buried oxide layer, such as, for example, the SIMOX process (i.e., separation by implantation of oxygen) or an MLD-SIMOX (modified low dose SIMOX) approach such as DK Sandana, or a double layer transfer with oxide deposition in between to form dual strata layer. Furthermore, for example, a pn junction may be formed between the vertically stacked transistors and may be biased. Also, a silicon-on-replacement-insulator technique may be utilized for the first formed dummy transistors wherein a buried SiGe layer may be selectively etched out and refilled with oxide, thereby creating islands of electrically isolated silicon, similar to the 2D process known as SioN—'Silicon on Nothing'. Vertical isolation may be obtained somewhat naturally from a structure in one or more of a stratum-2 or stratum-3 device, for example, the buried back-bias layer/regions of a Zeno Semiconductor NVM cell, a deep implanted layer or region, biased or un-biased as required between stratum-2 and stratum-3. Vertical isolation may occur due to placement of stratum-2 and stratum-3 devices, for example, a layout rule could require no high speed logic over another high speed logic cell or region, but may allow a memory to be over the logic cell or region.

Additional embodiments are device structures that leverage this front and back layer processing to enable effective device structures including vertical device options. Vertical devices may include, for example, memory (V-NAND, V-RRAM, Bi-ristor) as well as devices such as Gate All Around transistors, vertical junction-less transistors, nanowire, CNT, vertical bipolar, and so on. Some vertical structures and devices may be found in at least incorporated reference U.S. Pat. No. 8,273,610.

After the pre-injection, epitaxial growth may be carried out at temperatures of about 900-1000° C. The epitaxial layer illustrated as epi layer 2536 in FIG. 8 could be grown to a few nm thick layer, for example, such as 5 nm or 10 nm, to a moderately thick layer, such as, for example, 100 nm or 200 nm, to a relatively thick layer, such as, for example, 1 micron, or 3 microns thick.

The ELTRAN based donor wafer 2531 could be then provided as a substrate for a standard processing flow. An important advantage is that the ELTRAN donor wafer could withstand the high temperature of a conventional front line process and not detach. There are multiple process steps in a typical conventional front-line process with processing temperatures ranging from 500° C. to about 1000° C. in which transistors and their contacts are formed.

FIG. 9A illustrates donor wafer 2641 which includes base wafer 2640 with lower porous layer 2644 and upper porous layer 2642 and an epitaxial layer/regions 2646, which has gone through front line processing to construct at least N type transistors 2648 and P type transistors 2649 and shallow trench isolations—STI 2647, in between.

FIG. 9B of the donor wafer 2651 now illustrates the donor layer 2653 with N type and P type transistors covered with planarizing oxide 2652.

Such a donor layer, for example donor wafer 2651, could be transferred onto a carrier wafer for further high temperature processing as will be presented later or be prepared by adding contacts and at least a first metal for transfer onto a target wafer, as described below and in FIGS. 10A-10D.

FIG. 10A of the donor wafer 2761 now illustrates the donor layer with N type and P type transistors 2663 contacted thru planarizing oxide 2652 and an added metal one (shown as metal layer structures 2717) and then covered with oxide 2762.

Figure 10C:
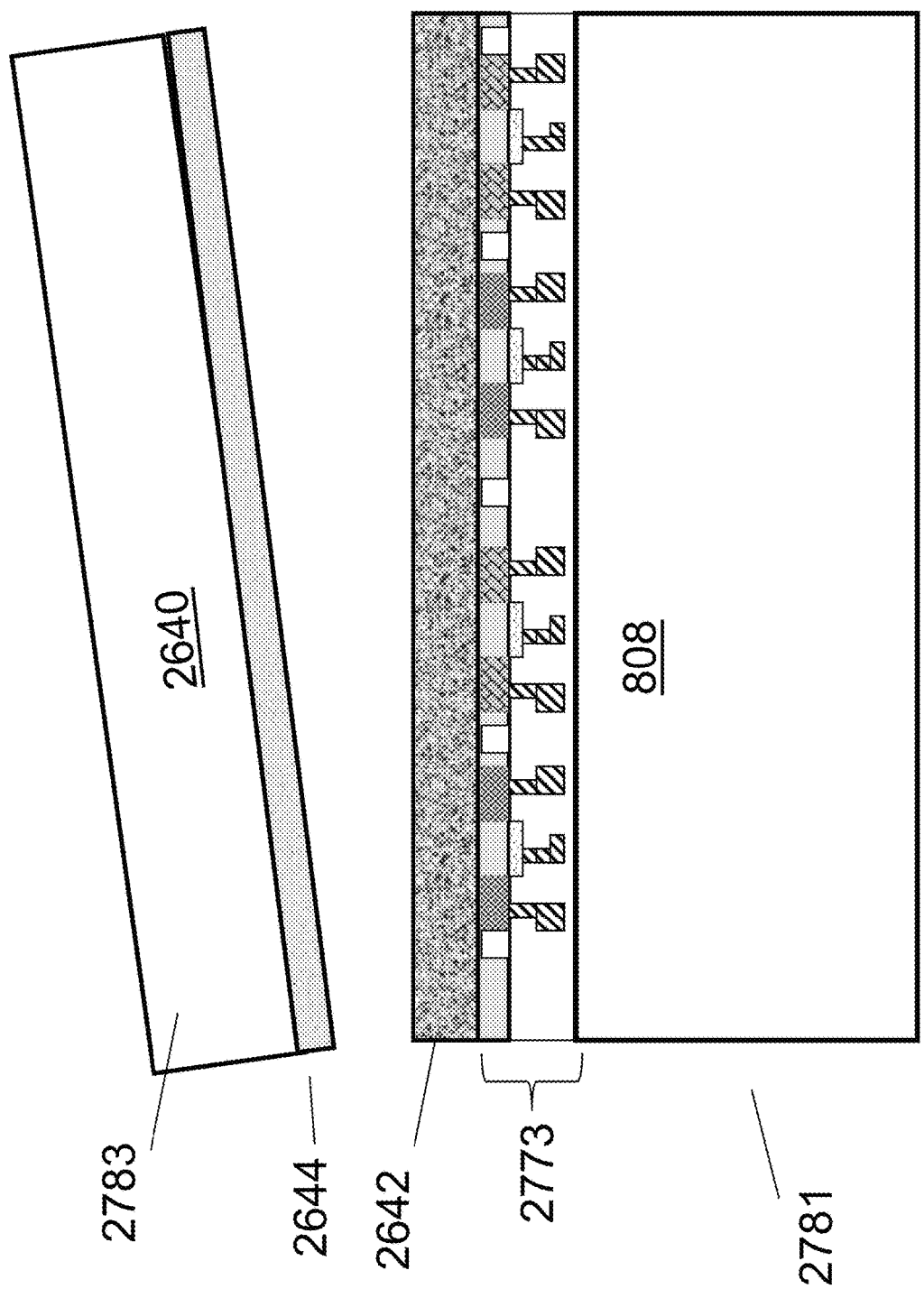

The donor wafer 2761 could be now flipped and bonded on top of the target wafer 808 as is illustrated in FIG. 10B. The bonding could be oxide to oxide bonding or hybrid bonding where some of metal layers of the contacted and metalized donor layer 2763 would bond to top metal landing connections which are part of the target wafer 808 as described elsewhere herein and in incorporated references. This flow could leverage the new class of precision bonders such as one being offered by the Austrian company EVG named Gemini FB XT. Such bonder could align the donor wafer 2761 to the target wafer 808 with better than 200 nm wafer to wafer alignment. For many applications such alignment is sufficient. In other applications the smart alignment described in at least U.S. Pat. No. 8,273,610 as related to its FIG. 77 or FIG. 80 and related description could be used after the removal of the donor wafer leaving the donor wafer on the target wafer as illustrated in FIG. 10C. This is also been described in a paper by Or-Bach et al titled "Precision Bonders—A Game Changer for Monolithic 3D" at the 2014 IEEE S3S Conference 2014, incorporated herein by reference.

FIG. 10C illustrates the removal of the donor wafer leveraging the porous layer in-between as a cut layer. The cutting of the porous layers is also called splitting. The porous silicon layer in the bonded wafer could have been illustrated as a double layered structure. The bonded wafer is split parallel to its surface close to the interface between these two layers using a water-jet method. There many alternative methods for performing the split including simple mechanical pulling. These could also combine an etching step or steps as the porous structure etch-rate is highly accelerated. Also, specially designed donor wafers, such as described in at least U.S. Pat. No. 8,273,610 as it relates to FIG. 184, may be utilized for a backside detach.

Figure 10D:
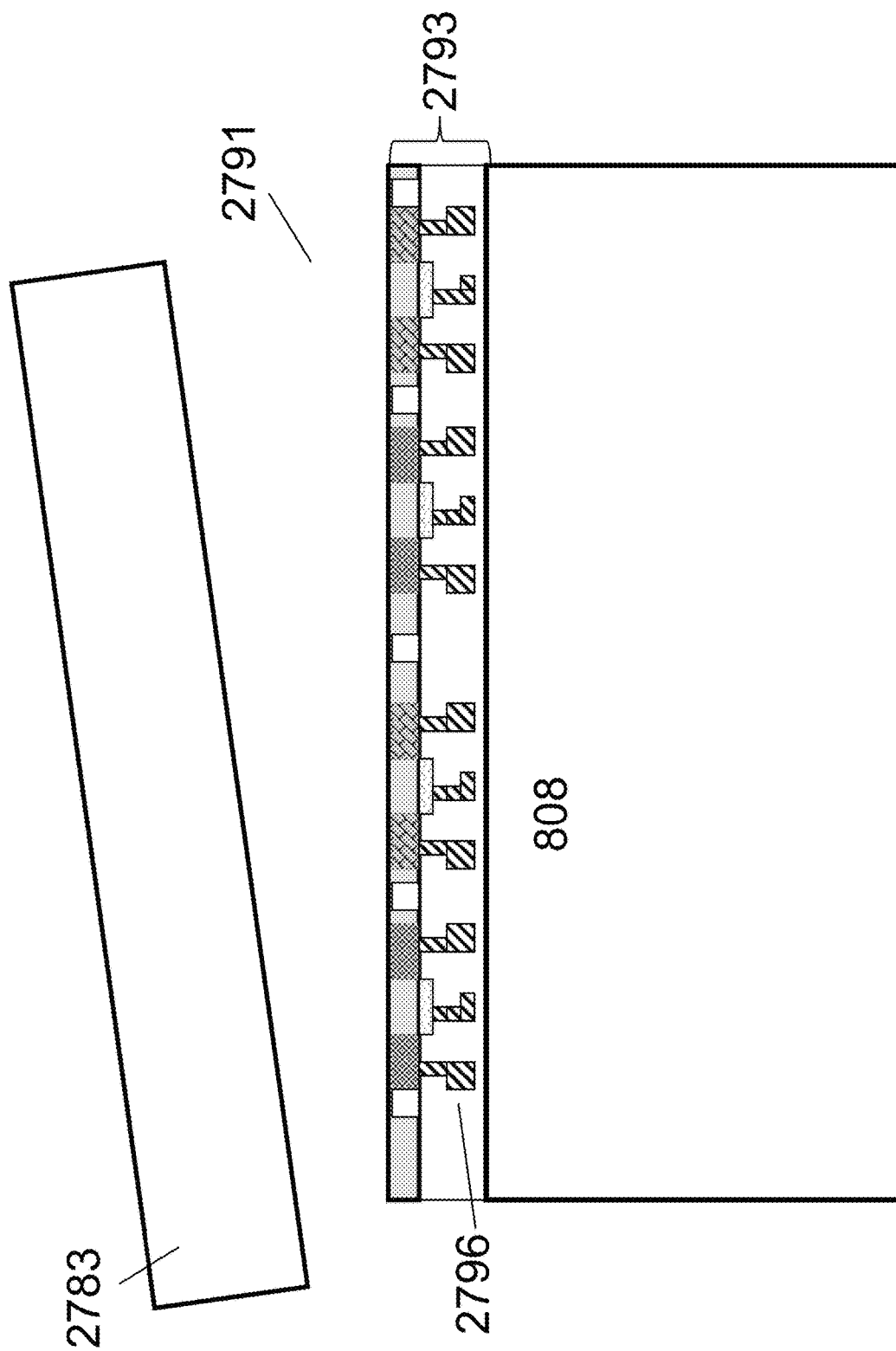

The dual porous layers helps to achieve a very clean split as there border between the two porous layers tend to be a natural cut-plane. The residue of porous structure could be etch away, using a solution containing a mixture of HF, $H_2O_2$ and $H_2O$. Once a certain incubation period has passed, the porous silicon is etched virtually all at once. The selectivity of this etching is as high as 100,000×, meaning that the etching does not cause significant degradation of the uniformity of the thickness of the remaining layer. This means that the donor wafer 2783 could be recycled for reuse and the transferred layer 2773 is now ready for future processing as is illustrated in FIG. 10D. The donor wafer is accordingly a reusable donor wafer and more specifically a porous layer based reusable donor wafer. It should be noted that these illustration are not presenting the layers in thickness proportion. Both the donor wafer 2783 and the target wafer 808 may be about 700 μm thick. The donor layer and some of the interconnection layer 2793 at the upper part of the target wafer 808 are few tens of nm to a few microns thick depending on the choice of process line and other considerations.

In addition to the removal of the porous layer by etch a hydrogen annealing could be used to further smooth the top layer surface.

Now additional interconnection could be added on top of 3D structure 2791. First through layer vias need to be formed to provide access to the transistors in the transferred layer 2793 which we could call Stratum-2, and to the underlying target wafer 808 circuitry. The prefabricated metal 1 of Stratum-2 2796 may be designed so these through silicon vias could be made without interfering with transistors of Stratum-2 (for example, similar to 2092 in FIGS. 20 and 1947/1967 in FIG. 19J of the parent application).

Another alternative is to transfer the donor layer first to a carrier wafer and then from the carrier wafer to the target wafer. The ELTRAN process could be used also for the carrier wafer.

FIG. 11A illustrates such a carrier wafer 2801 is processed very much like the donor wafer. But since the carrier wafer does not need to provide a donor layer its epitaxial process is minimal or even skipped and an oxide layer is deposited and/or formed by oxidation of the top layer to form the bonding oxide layer 2806. Carrier wafer 2801 may include lower porous layer 2802 and upper porous layer 2804.

FIG. 11B illustrates the donor wafer with n and p transistors 2811 bonded on top of the carrier wafer. It might be preferred to have the porosity of the donor wafer porous layers 2816 and 2818 constructed with a much higher porosity than that of the carrier wafer porous layers 2812 and 2814, so the split of the donor wafer would not impact the carrier wafer attachment.

Figure 11C:
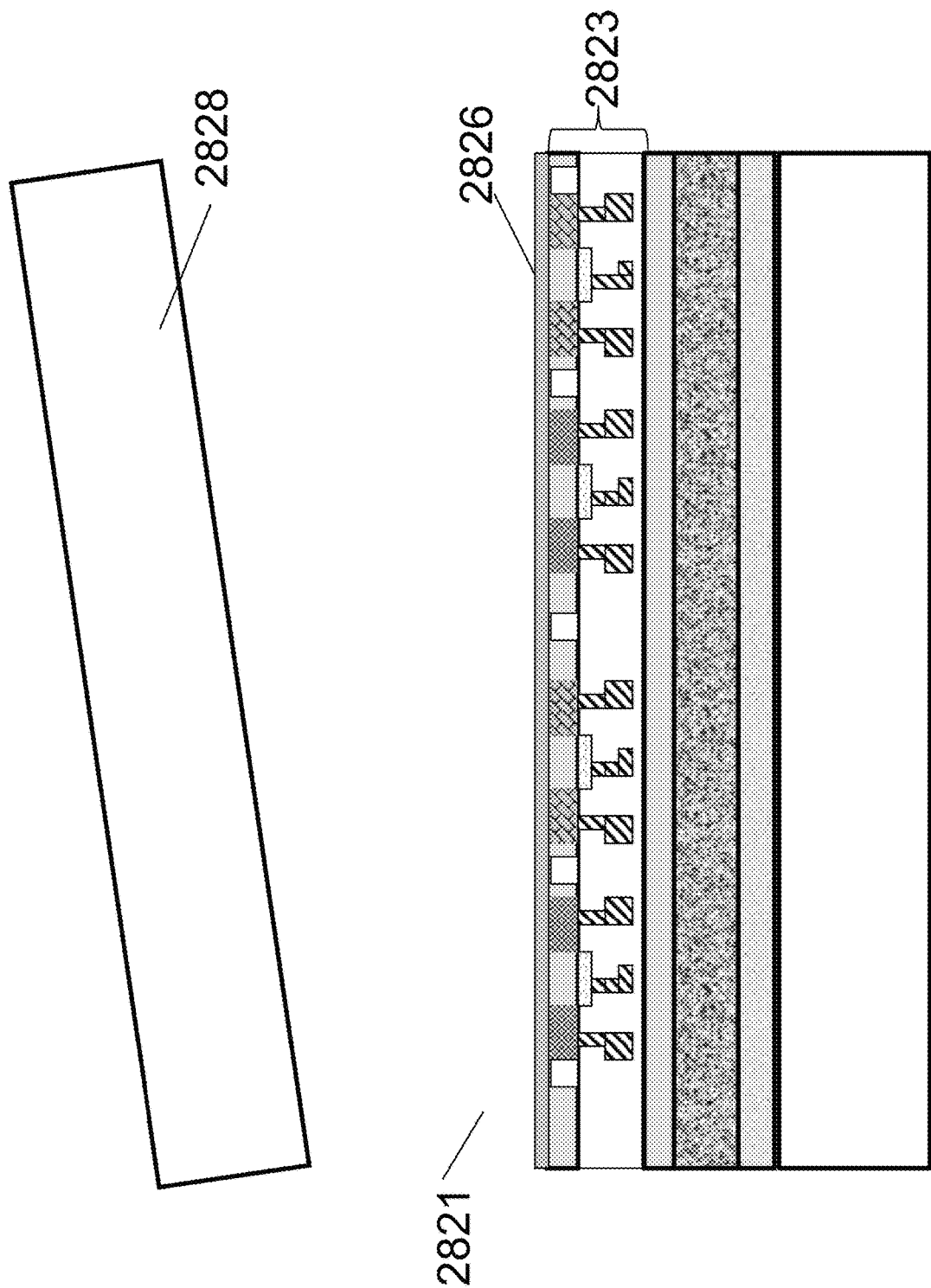

Now the donor wafer would be removed leaving the donor layer 2813 on the carrier wafer as illustrated by FIG. 11C.

The split and the removal of the porous layer and cleaning the surface could be done similar to presented before in respect to FIG. 10C and FIG. 10D resulting as illustrated by FIG. 11C with a ready for reuse donor wafer 2828 and a carrier wafer 2821 with donor layer 2823. An oxide layer may be deposited and/or formed by oxidation of the top layer of the donor layer 2823 to form bonding oxide layer 2826.

FIG. 11D is illustrating carrier wafer 2831 flipped and bonded onto the target wafer 808. Now the carrier wafer may be split off, leveraging the porous layer 2812 and 2814 again such as was described before in relation to FIGS. 10C and 10D, and the left over porous layer could be removed and cleaned as was described before. The carrier wafer could be recycled for reuse. The carrier wafer is accordingly a reusable carrier wafer and more specifically a porous based reusable carrier wafer.

FIG. 11E illustrates the resulting 3D IC structure 2841 including the target wafer 808 with an additional stratum of transistors layer 2843 covered with additional oxide layer 2846. Additional interconnection layer or layers could now be processed starting with a through layer via to connect the new stratum 2843 to the target wafer 808 circuitry.

The described flow allows the processing of the additional stratum of the donor layer 2843 to be done in a conventional front line without limiting the frontline processing temperatures. The transistor formation, STI and contact formation are done before the donor layer is transferred on top of the copper or aluminum interconnect which might be part of the target wafer 808 interconnect. The use of a precision bonder with an ELTRAN based layer transfer as presented provides monolithic 3D ICs with very rich vertical interconnect. The donor layer 2843 thickness could be as thin as about 10 nm or thicker as about 20 nm or 80 nm or even few hundreds nm, such as, for example, about 100 nm or 200 nm. The through layer via through it may have a small diameter such as about 20 nm, 50 nm, 100 nm or even larger than 200 nm. This flow could integrate in many of the benefit of other flows described herein or incorporated and related patents.

Additional alternative is to use additional process steps to make the carrier wafer more resistive to an undesired split while the donor wafer is being split off.

Accordingly for the processing of the carrier wafer 2801 after forming the porous layers 2802 and 2804 the step of forming the oxide bonding layer 2806, oxide 2956 will include covering the carrier wafer side walls with oxide 2958 as illustrated in FIG. 12A. The improved carrier wafer 2951 is now ready for the transfer of the donor layer.

Figure 12B:
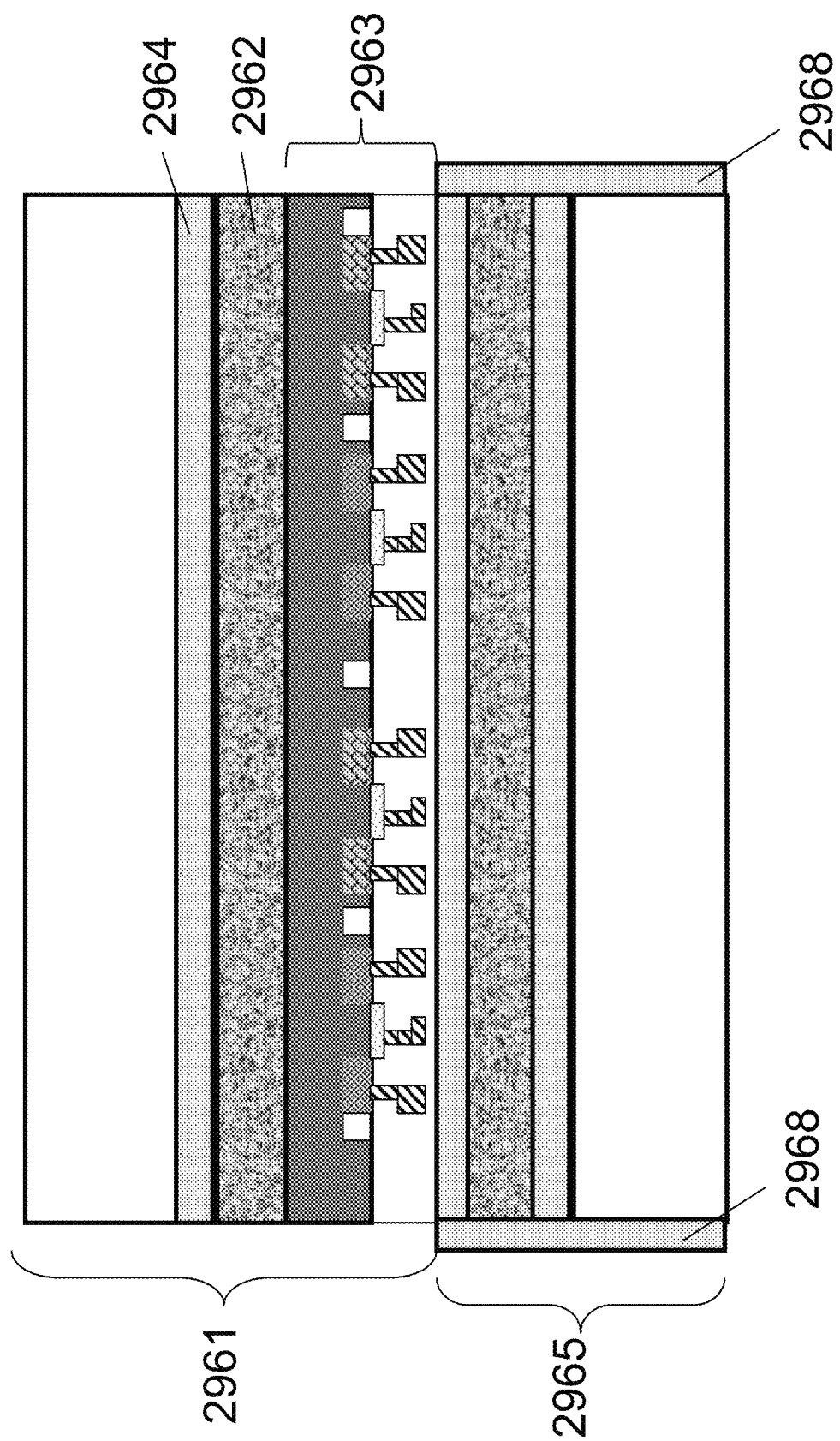

FIG. 12B illustrates the improved carrier wafer 2965 after having the donor wafer 2961 bonded top of it similar to what was been presented in FIG. 11B. The improved carrier wafer has protective sidewalls 2968. These sidewalls may include thickness of few tens of nm (for example about 10 nm or 40 nm) to few micrometers thick (for example about 1 um or 3 um). The donor wafer 2961 may include the two porous layers 2962 and 2964 and the donor layer 2963 which include transistors and may also include contacts and first metal similar to what was presented before.

Now the bulk donor wafer may be split off leveraging the porous layers 2962 and 2964 while the carrier wafer 2965 may be protected by its side walls 2968. The porous residue could be removed and cleaned similarly to the discussion before making the donor wafer reusable for future use.

After the porous silicon layers 2964 and 2962 have been removed by selective etching, a heat treatment in a hydrogen-containing atmosphere could be carried out for smoothing the back-side of the donor layer 2963, now on top/facing up. The resulting structure is illustrated in FIG. 12C.

Figure 12E:
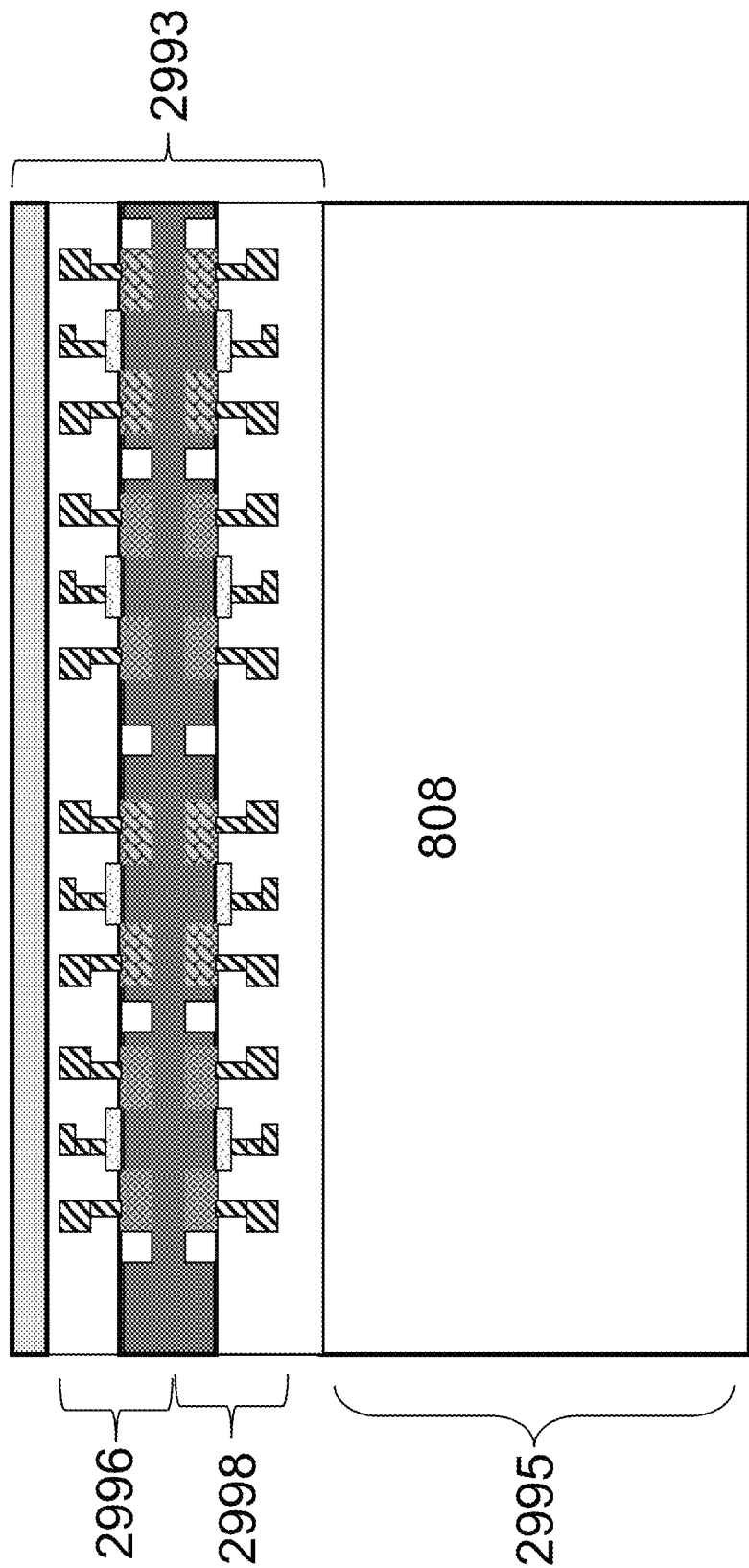

The protective side walls could be now removed in preparation of transferring the donor layer 2963 onto the target wafer 808 as has been illustrated in relation to FIG. 11D and FIG. 12E.

Yet in another alternative while the donor layer is still on the carrier wafer the other side of the donor layer could be processed to form an additional stratum of transistors as illustrated in FIG. 12D.

FIG. 12D illustrates the carrier wafer 2985 after removal of the protective sidewalls 2968 with donor layer 2983 bonded on top. The donor layer 2983 now include the first stratum of transistors 2986 that we could call stratum-3 and the new stratum now processed 2988 we will call stratum-2, with contact and at least first metal. The structure may now be covered with isolation/bonding layer which could be oxide 2989.

It should be noted that attention should be given for proper interaction between stratum-2 and stratum-3. This will depend on the type of transistors and circuits built on both strata. Many options exist including reverse diode of the medium in between stratum-2 and stratum-3 to provide vertical isolation between strata 2 and 3 transistors/devices, use of back-bias of one stratum as isolation from the other, use of Fin-FET transistors and others. This had been described in detail elsewhere herein.

The donor wafer could then be transferred on top of the target wafer 808, splitting off the carrier wafer 2985 for reuse as was described before in relation to FIG. 11D and FIG. 12E. A resulting 3D IC is illustrated in FIG. 12E. The target wafer 2995 has now bonded to it a donor layer 2993 comprising stratum-2 2998 on the lower side and stratum-3 2996 on the other side—the top side. The donor layer 2993 could be relatively thin, for example about 10-20 nm thick or thicker such as, for example, about 100 nm or even 1-2 micrometers. The donor layer 2993 is still thin enough to lithographically align through it to the target wafer 808 structures and alignment marks, allowing state of the art alignment tolerances, for example 2 nm, 4 nm, or 6 nm. The donor layer 2993 may include its own alignment marks. The through layer via (TLV) could be now made to connect stratum-2 and stratum-3 circuits to the target wafer 808 circuits (as has been described elsewhere herein). The through layer vias diameter could be accordingly very small. For example, such as about 20 nm or 40 nm, or larger such as about 100 nm or even 400 nm, similarly to as been described in U.S. Pat. No. 8,273,610 such as relates to its FIG. 83.

Figure 13E:
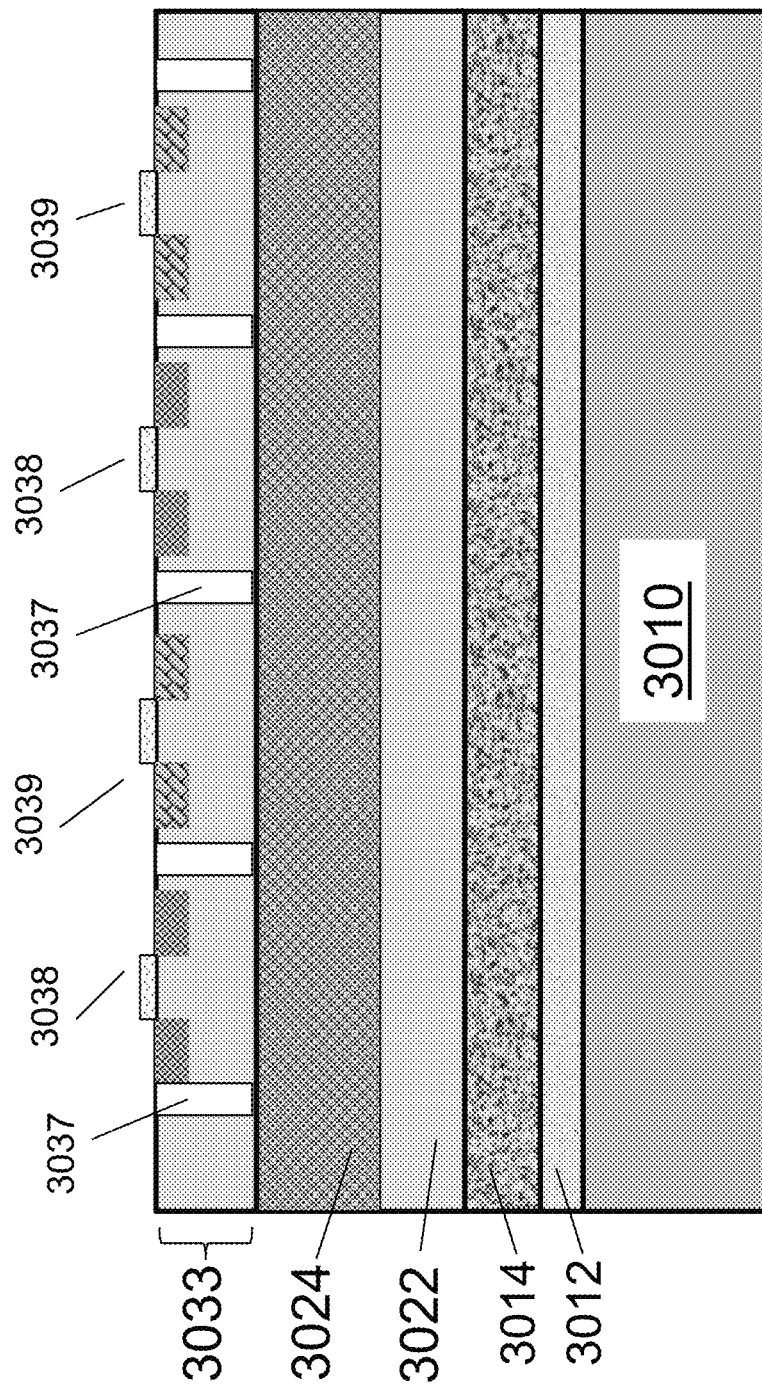
FIGS. 13A-13O is an exemplary illustration of an alternative porous silicon based donor wafer after front line processing to construct dual strata transistors.

FIG. 13A to FIG. 13F illustrates an additional process flow. The starting point may be similar to the structure illustrated by FIG. 8. FIG. 13A illustrates a base donor substrate 3010 after forming two porous layers; upper layer of porous silicon 3014, which may contain microscopic pores of diameter of a few nm, and below this is formed a lower layer of porous silicon 3012 for which the pore diameter may be a few (or more) times greater, for the future 'cut' or cleave.

In this alternative flow the epitaxial step for formation of the first epitaxial layer 2536 could be used to build a thick first epitaxial layer 3020 as is illustrated in FIG. 13B. Now a new step of porous formation could take place. The new formed first epitaxial layer 3020 could be made partly porous using a porous formation process, perhaps as described earlier herein. FIG. 13C illustrates the structure afterward, first epitaxial layer 3020 is now partially still remaining monocrystalline layer 3022 while first epitaxial layer 3020's upper part is now made porous, illustrated as second porous layer 3024. The thickness of second porous layer 3024 and first epitaxial layer 3020 could be as thin as few nanometer (nm) to tens of micrometers (μm); for example, about 5 nm, about 10 nm, about 20 nm, about 100 nm, about 200 nm, about 500 nm, about 1 um, about 2 um, about 5 um, about 10 um, about 20 um, or about 50 um. Remaining monocrystalline layer 3022 and second porous layer 3024 could be constructed to be (or resulting thickness be) of similar thickness or substantially different. This could be designed according to the target application. For example, for photo voltaic applications tens of μm might be desired while for advanced fully depleted SOI (Silicon on Insulator) transistor layer(s) about 10 nm could be desired. For example, remaining monocrystalline layer 3022 and second porous layer 3024 thicknesses may include about 2 nm, about 5 nm, about 10 nm, about 20 nm, about 100 nm, about 200 nm, about 500 nm, about 1 um, about 2 um, about 5 um, about 10 um, or about 20 um.

Forming second porous layer 3024 could be done using similar processes described before in respect to the formation of upper layer of porous silicon 3014, which may contain microscopic pores of diameter of a few nm, and lower layer of porous silicon 3012 for which the pore diameter may be a few (or more) times greater. In such case care needs to be made that the early lower layers, such as in this illustration lower layer porous silicon 3012 and upper layer porous silicon 3014, are not fully oxidized. This will allow the current flow to layer 3020 from the back, thus enabling an efficient anodization process, which may involve passing a current through a solution of HF and ethanol with the base single-crystal silicon wafer 3010 as the anode. Alternatively vias could be formed connecting the two crystalline layers, for example, the illustrated base donor substrate 3010 and first epitaxial layer 3020. Additionally, side wall vertical connection may be temporarily made with conductive attachments, and/or semi-permanent thru conductive side wall placed vias/regions (with appropriate isolation coverings), which may double as sidewall cleave protection regions to prevent unintended cleaving.

Yet, another alternative is to use alternative methods of porous layer formation processing. Such processes could be using "stain Etching Process" as presented in article titled: "Electrochemical Behaviour of Porous Silicon Layers Prepared by Stain Etching Processes" by F. A. Ben Handera at al. Journal of New Materials for Electrochemical Systems 6, 129-135 (2003), incorporated herein by reference.

As illustrated in FIG. 13D, a follow-on step could be oxidizing the newly formed second porous layer 3024. And then formation of a second epitaxial layer 3032 as illustrated in FIG. 13D may be done. The second epitaxial layer 3032 could be made very thin like 10 nm or thicker of few tens nm to even few or tens of m. For example, second epitaxial layer 3032 could be as thin as few nanometer (nm) to tens of micrometers (μm); for example, about 5 nm, about 10 nm, about 20 nm, about 100 nm, about 200 nm, about 500 nm, about 1 um, about 2 um, about 5 um, about 10 um, about 20 um, or about 50 um. The oxidation and the second epitaxial layer could be made similarly to the process described before in respect to FIGS. 23-25.

The second epitaxial layer 3032 could now be processed to form transistors. As illustrated in FIG. 30E, second epitaxial processed layer 3033 may include STI (Shallow Trench Isolation) 3037, N type transistors 3038 and P type transistors 3039. This processing could utilize a conventional transistor front line process and could include all the high temperature steps required including silicidation process, raised source/drains, strain, and contact formation to these transistors. IBM U.S. Pat. No. 7,365,399, incorporated herein by reference, teaches a flow of forming transistors over porous isolation. The transistors formed could include many types of transistors, for example, such as fully depleted SOI and/or FinFET, or many other types of other transistors at least as described herein and in the incorporated references. Second porous layer 3024 which may be disposed between the two crystalline layers, remaining monocrystalline layer 3022 and second epitaxial layer 3032 (or second epitaxial processed layer 3033 if processed), could be fully oxidized at least either before the second epitaxial step or afterward may be etched into porous regions (for example, as part of the formation of the STI 3037), and subsequently oxidized (from the side) to form oxide regions. Second porous layer 3024 or regions of it formed by etch could also be etched away and filled with oxide or other isolating material. Thus the two crystalline layers, remaining monocrystalline layer 3022 and second epitaxial processed layer 3033, could be made isolated and allow greater flexibility with future circuits on each of these layers. Second epitaxial processed layer 3033 may be called Stratum-3.

This could make the structure illustrated in FIG. 13D, a desirable substrate product 3030 which could be provided by substrate providers to the processing foundries and other wafer fabs. Substrate product 3030 may include second epitaxial layer 3032, second porous layer 3024, remaining monocrystalline layer 3022, upper layer of porous silicon 3014, lower layer of porous silicon 3012, base donor substrate 3010. It might be desirable to protect the two crystalline layers, remaining monocrystalline layer 3022 and second epitaxial layer 3032, sub-structure of substrate product 3030. An optional protection could be formed similar to the side protection 2958 as was presented in respect to FIG. 29A.

The process flow of FIGS. 13A-13F could be attractive to a large range of applications for forming layers of transistors, such as Stratum-2 and Stratum-3, as described herein and incorporated references. These layers would be provided with very good vertical isolation and could allow effectively a wide range of transistors stacked in 3D including these that require very thin silicon on insulator (SOI) such as Fully Depleted SOI or FinFET over SOI. The formation of the transistors, for example, such as N type transistors 3038 and P type transistors 3039 illustrated in FIG. 13E, could include forming alignment marks on or within second epitaxial layer 3032 (or second epitaxial processed layer 3033), and/or base donor substrate 3010. These alignment marks could be visible at the later time when remaining monocrystalline layer 3022 could be processed, for example, to form another stratum of transistors. Thus transistors/devices built on remaining monocrystalline layer 3022 and interconnection on and through remaining monocrystalline layer 3022 could be lithographically aligned to those structures/interconnect/transistors/devices built on second epitaxial layer 3032 (or second epitaxial processed layer 3033). These structures could be aligned to well below 40 nm to a precise alignment of a few nm or even less, being a 'direct' alignment that may be accomplished with short wavelength optical means. The alignment marks on second epitaxial layer 3032 could be visible to the lithographic tool used for processing patterns on remaining monocrystalline layer 3022 as the layers second epitaxial layer 3032, second porous layer 3024 and remaining monocrystalline layer 3022 could be made thin enough for high resolution alignment. When needed, additional steps could be made to support such alignment, such as opening mark viewing regions/holes, etc. These may include etching alignment marks deep enough through these layers so they could be detected on the other side or opening a window in the remaining monocrystalline layer 3022 and second porous layer 3024 to make them more visible at the desired wavelength, and combination of these and other similar techniques known in the art.

Figure 13F:
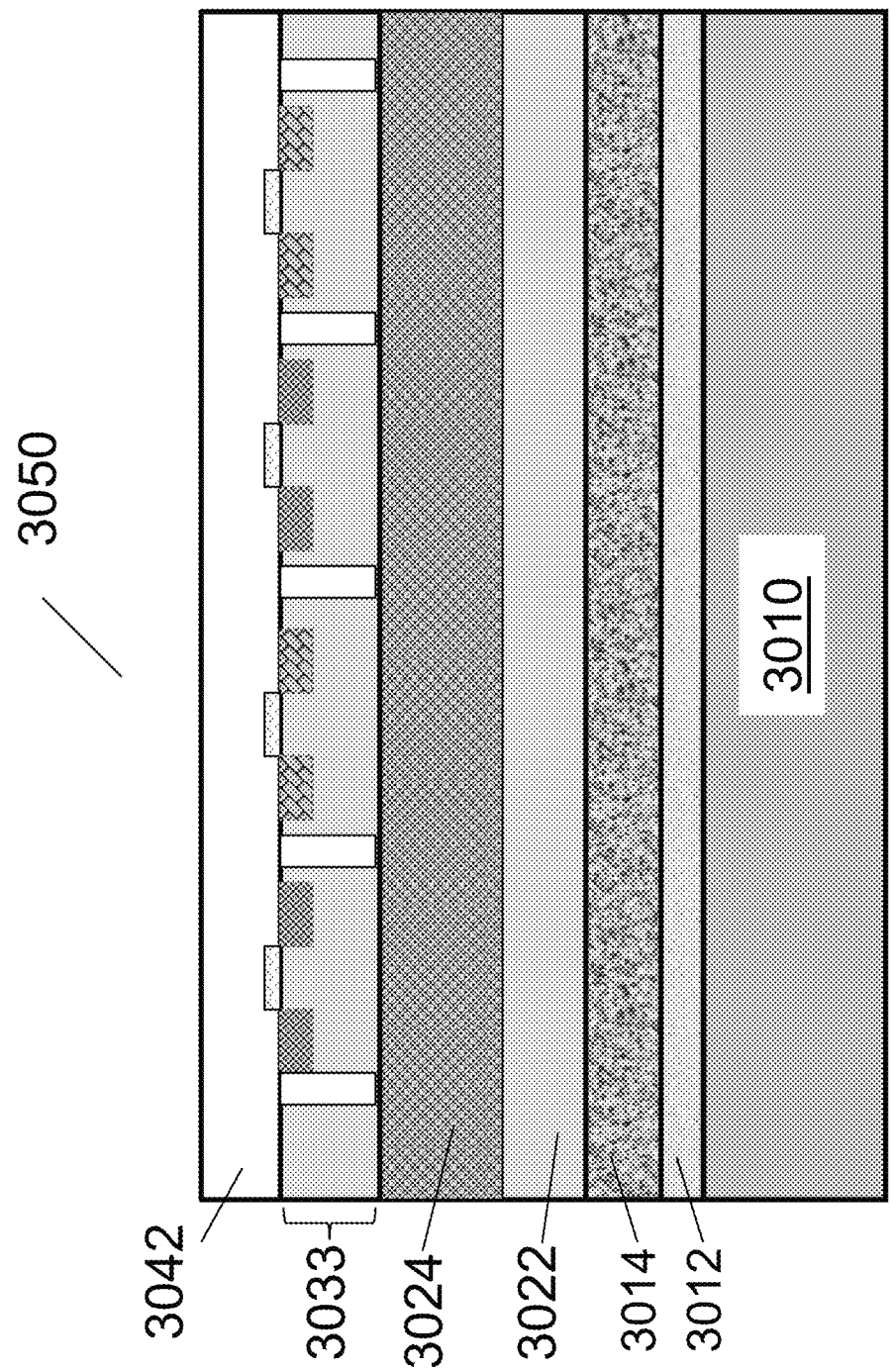

As illustrated in FIG. 13F, dielectric layer 3042 may be formed on top of second epitaxial processed layer 3033 in preparation of transferring the stratum donor structure 3050 onto a carrier wafer for the processing remaining monocrystalline layer 3022 (formed from first epitaxial layer 3020). Dielectric layer 3042 may include deposited doped or undoped silicon oxide and low k dielectric materials. In these drawings the contact layers and the first metal layer are not shown while it could be made in similar to contacts 2717 illustrated in respect to FIG. 10A. The following steps could be similar to those illustrated in respect to FIG. 12A-12E. Stratum donor structure 3050 may include dielectric layer 3042, second epitaxial processed layer 3033, second porous layer 3024, remaining monocrystalline layer 3022, upper layer of porous silicon 3014, lower layer of porous silicon 3012, base donor substrate 3010.

In some applications two layers of transistors, for example Stratum-2 and Stratum-3, are sufficient and then the target wafer/base wafer, such as at least 808 herein and in incorporated references, could be replaced with simple carrier wafer. In such case it might be useful to process 2 or more layers of interconnection for Stratum-2 as illustrated with respect by Stratum-2 2988 of FIG. 12D before transferring to a carrier wafer or target wafer 808. The following illustrates these additional steps.

Figure 13G:
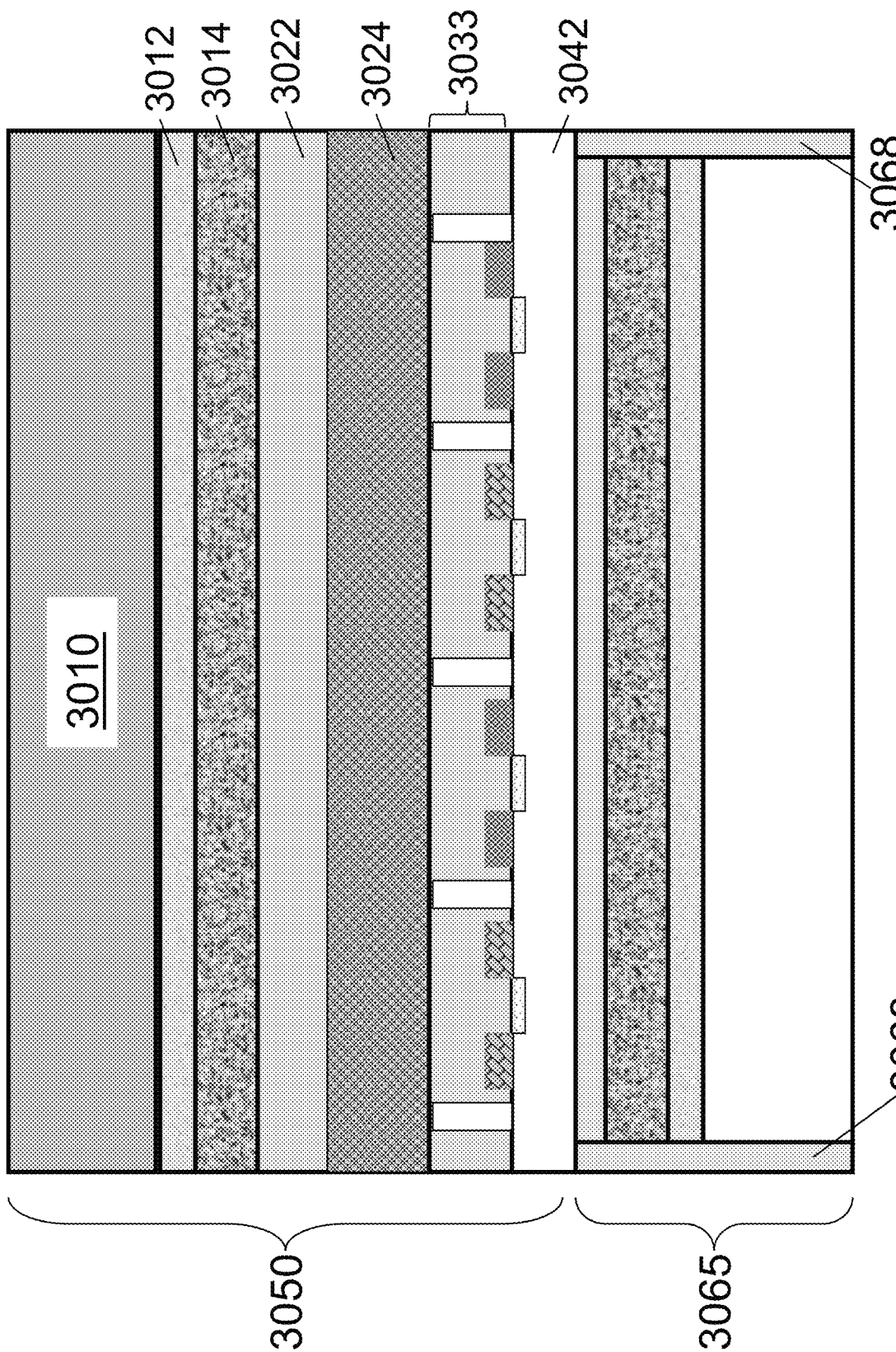

As illustrated in FIG. 13G, stratum donor structure 3050 may be bonded (for example, oxide-oxide wafer bonding) on top of a carrier wafer 3065. Carrier wafer 3065 may be preprocessed similar to what was presented in reference to FIG. 12A, and may include a side wall protection 3068. Carrier wafer 3065 may include porous layers 2802 and 2804, oxide bonding layer 2806, or oxide 2956 which may cover the carrier wafer sidewalls, as described with respect to FIGS. 12A and 11A.

Figure 13H:
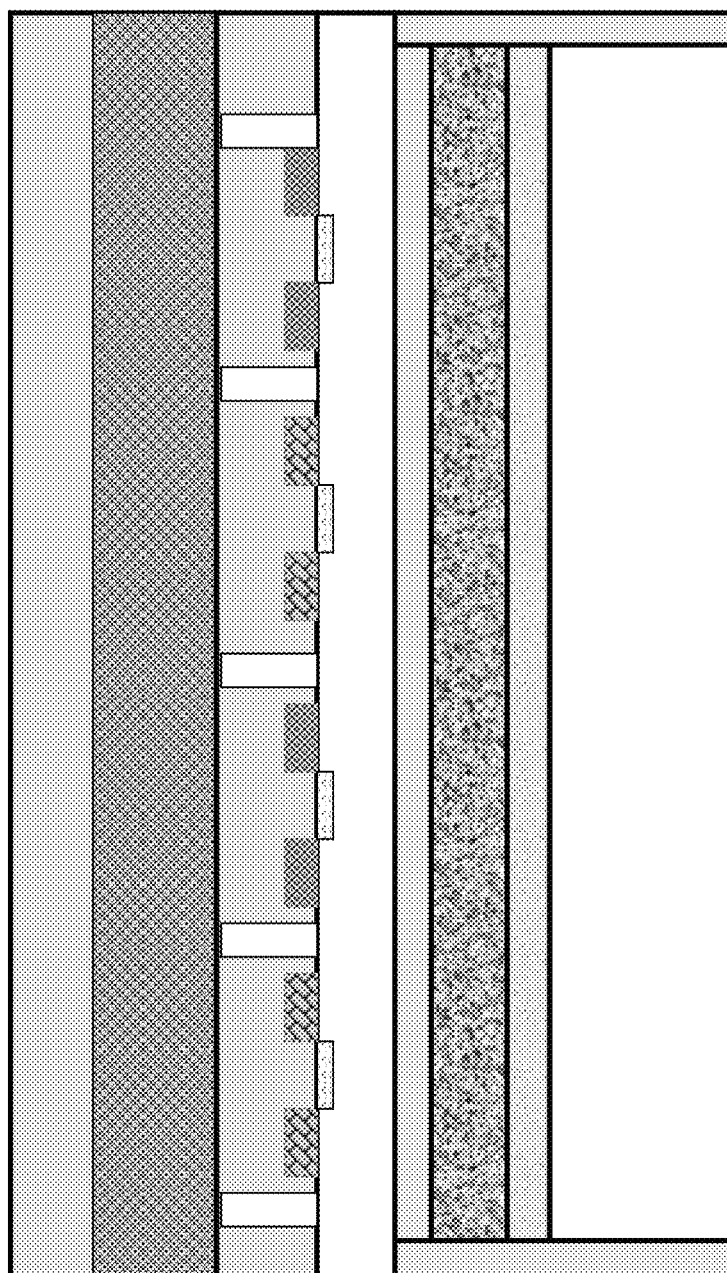

FIG. 13H illustrates the bonded structure after cutting off the donor wafer at porous layers upper layer of porous silicon 3014 and lower layer of porous silicon 3012, and then removing the residues of the porous layer in similar to what have been presented in reference to FIG. 12B and FIG. 12C. Thus, carrier wafer 3065 is carrying the two isolated crystalline silicon strata structure 3051.

Figure 13I:
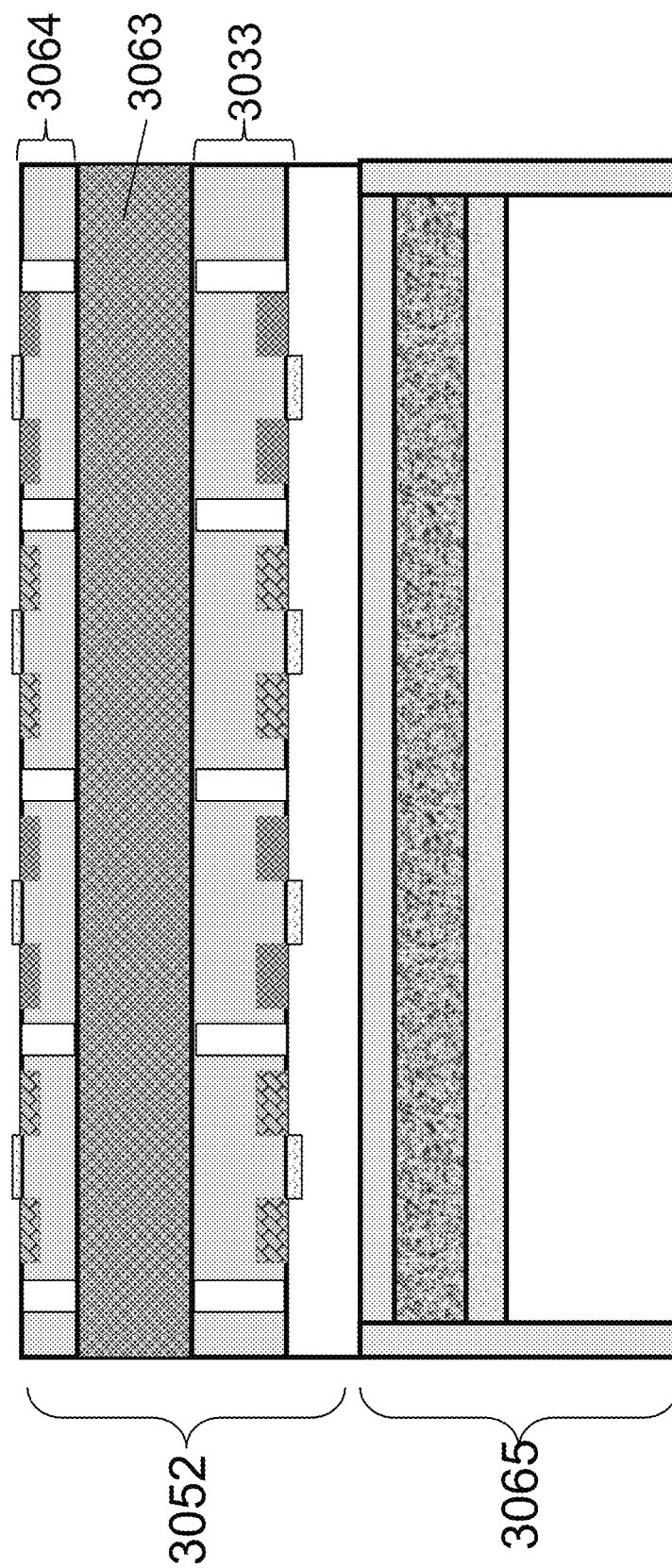

As illustrated in FIG. 13I, transistors may be processed and formed on the top layer of carrier wafer 3065 with two isolated crystalline silicon strata structure 3051, thus forming stratum-2 3064. Thus dual strata structure 3052 may include stratum-2 3064, isolation layer 3063 of oxidized porous silicon or other isolation material previously second porous layer 3024), and the previously processed transistor/device layer second epitaxial processed layer 3033—Stratum-3.

The new transistor process could be done using standard processing, however, the thermal budget needs to be considered as to its effect on the earlier processed transistor layer of second epitaxial processed layer 3033. This is similar to what was presented before. Additional measures to reduce the thermal budget impact of the processing of Stratum-2 on the preprocessed Stratum-3 can be found in at least U.S. Pat. No. 9,023,688 titled NOVEL METHOD OF PROCESSING A SEMICONDUCTOR DEVICE, of the incorporated references. The isolation layer 3063 could be designed to be thick enough and/or of proper material composition to have extremely low thermal conductivity (for example, the TIL of U.S. Pat. No. 9,023,688). And if care is taken to construct the carrier wafer 3065 with good thermal conduction from Stratum-3 to a heat removal apparatus (for example on the backside of carrier wafer 3065) during the high temperature processing steps of Stratum-2, then the heat impact on Stratum-3 could be highly reduced, and especially so for short high temperature Stratum-2 processing steps.

Figure 13J:
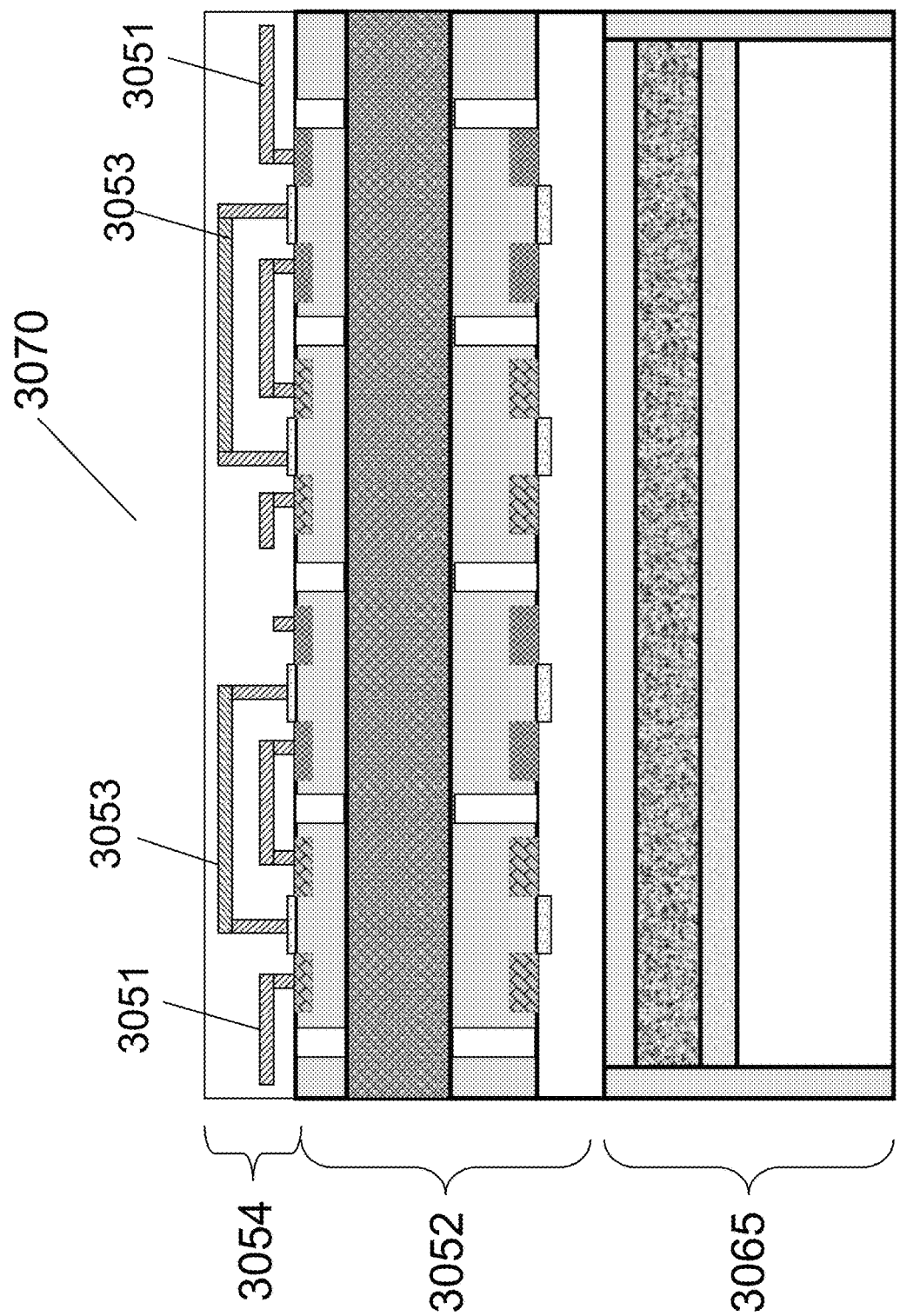

As illustrated in FIG. 13J, interconnection layers 3054 for Stratum-2 may be processed/formed on carrier wafer 3065 with dual strata structure 3052. Interconnection layer 3054 may include a single metal layer or multiple metal and inter-metal isolation layers. For example, interconnection layer 3054 may include metal-1 layer 3051, metal-2 layer 3053, vias, contacts, etc. Thus, partially interconnected dual strata structure 3070 may be formed and may include interconnection layer 3054, dual strata structure 3052, and carrier wafer 3065.

As illustrated in FIG. 13K, partially interconnected dual strata structure 3070 could then be flipped and bonded onto a target wafer 808 (not shown) or onto a carrier substrate 809 (shown) which may include a top oxide layer 3072 for bonding.

Figure 13L:
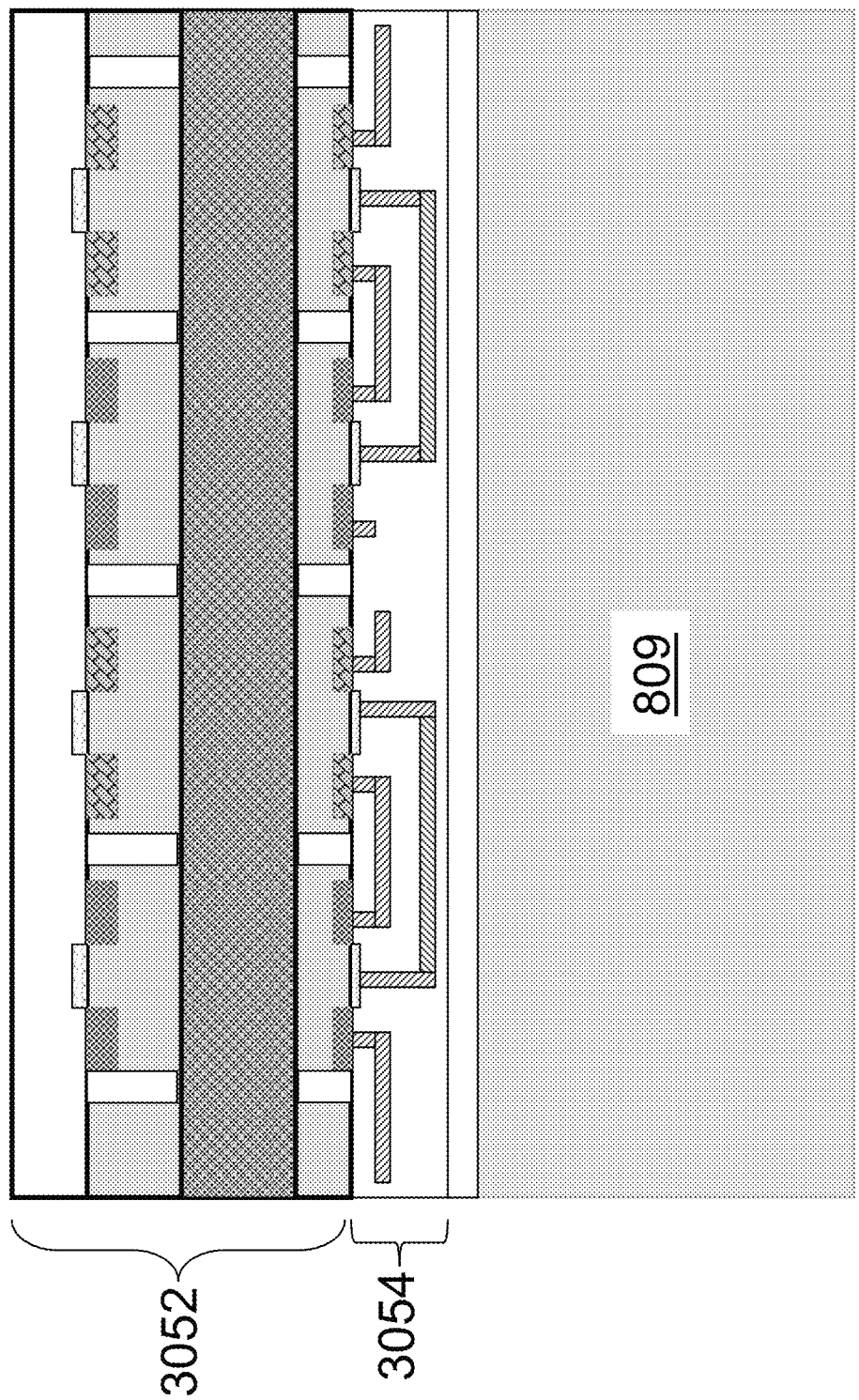

As illustrated in FIG. 13L, carrier wafer 3065 may be cleaved/cut-off and cleaning of the porous residue similar to what presented in reference to FIG. 12D and FIG. 12E may be performed. Thus, dual strata structure 3052 and interconnection layer 3054 remain and are still attached to carrier substrate 809 (shown) or a target wafer 808 (not shown)

Figure 13M:
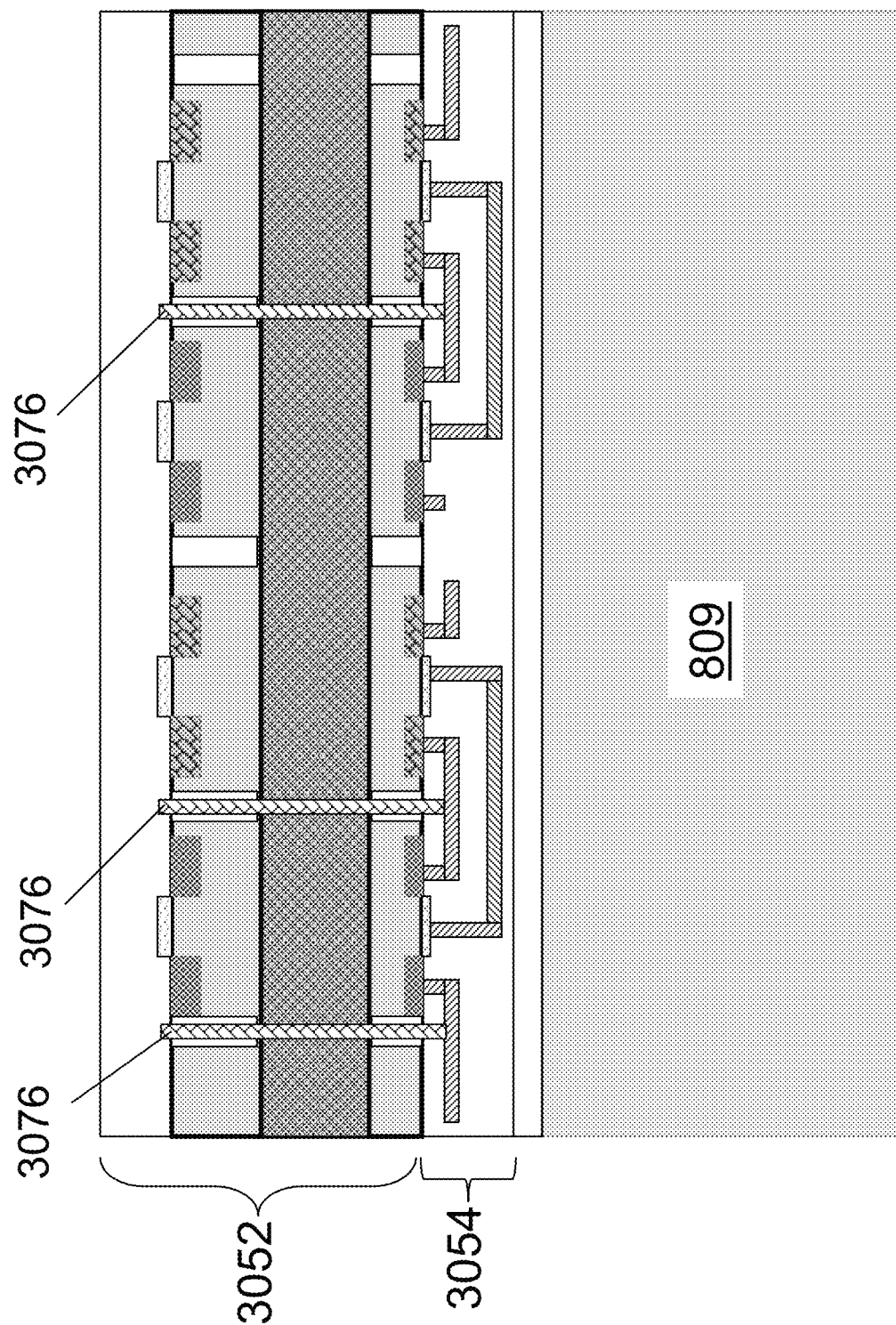

As illustrated in FIG. 13M, through layer vias (TLV) 3076 may be formed and stratum-3 and stratum 3 to TLV interconnect may be formed (not shown). TLVs 3076 are going through both silicon (preferred thru the STI of each stratum and oxidized isolation layer) that of Stratum-2 and that of Stratum-3 to provide electrical and thermal connection between these two strata.

Figure 13N:
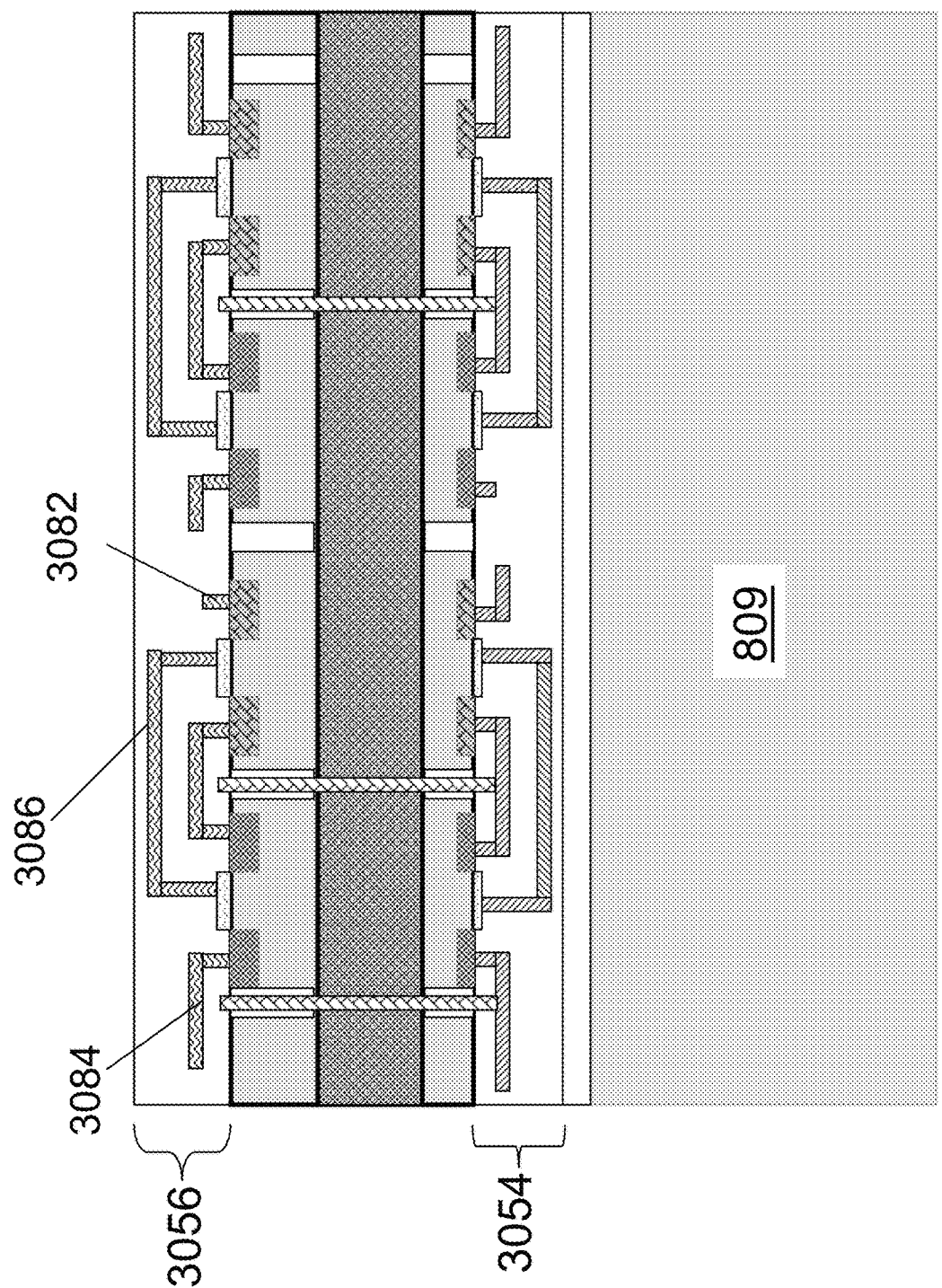

FIG. 13N illustrates the structure of FIG. 13M after adding exemplary contact 3082, metal-1 interconnection layer 3084 and metal-2 interconnection layer 3086. The number of metal layers for each stratum would be a design choice of each design similar to a 2D IC. The wafer having the two strata with their strata interconnection 3056 over a carrier substrate 809 is now ready to have the pads for connection to external devices as is illustrated in FIG. 13O

Figure 13O:
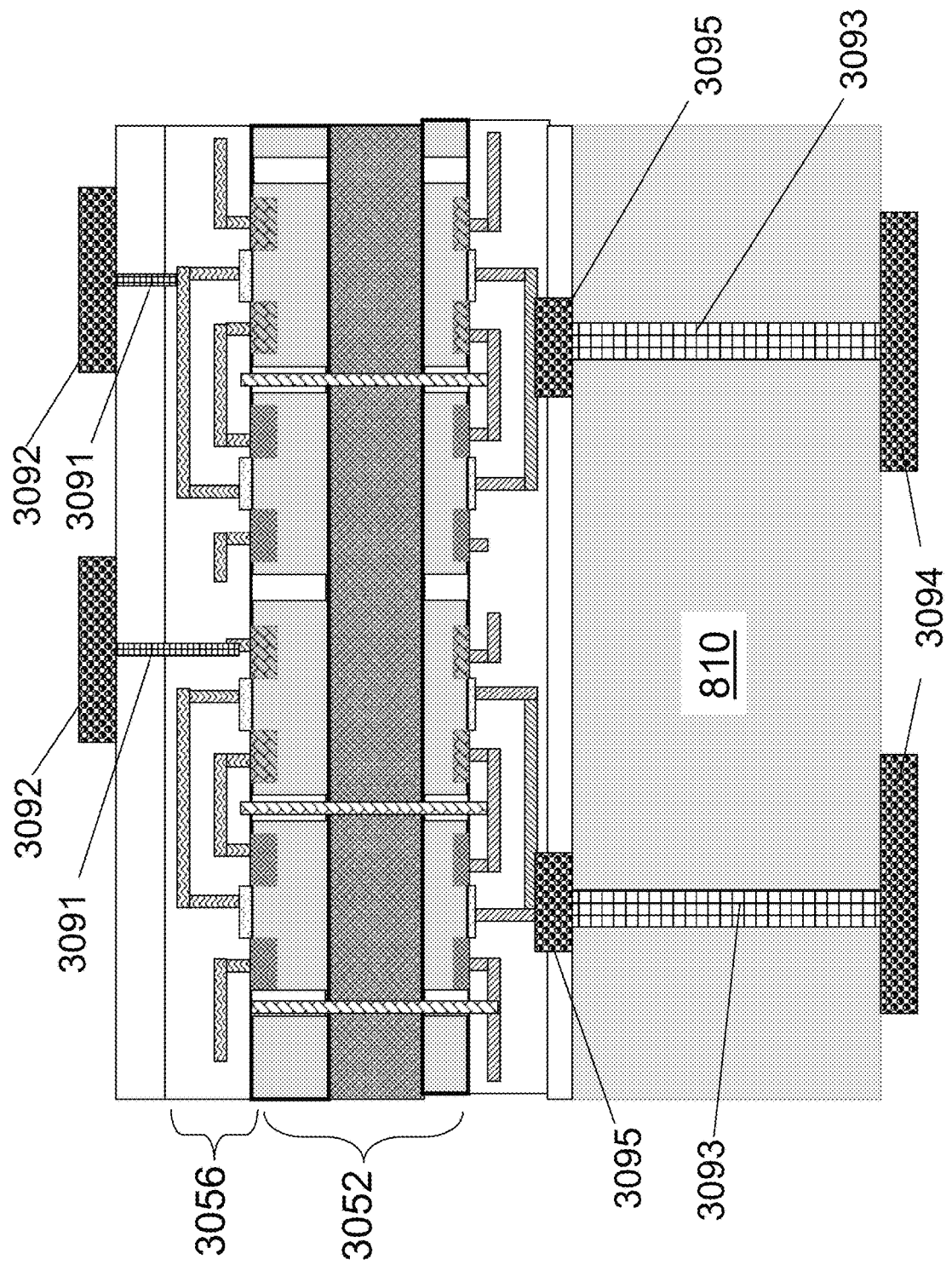

FIG. 13O illustrates the structure after the addition of pads 3092 and associated via connection 3091 to strata interconnection layer 3056 or dual strata structure 3052. In some applications it might be desired to have addition connection to an external device from the bottom of the 3D strata device. In those cases it might be preferable to use a designed carrier 810 with TSV 3093 connections already built into it. In those cases a hybrid bonding could be used forming the connection 3095 to the carrier wafer 810 with built in TSV 3093. The bottom pads 3094 could be added to facilitate the bottom connection to external devices.

FIG. 14 is an illustration referring to prior art of Back Bias (BB) for Ultra-Thin Body (UTBB) FD-SOI (Fully Depleted Silicon on Insulator). It is a well-known technique to enhance the performance of FD-SOI by providing a back bias. As illustrated, in some cases it is desired to provide a negative voltage as back bias which could be referred as Reverse Back Bias (RBB) and sometimes it is preferred to provide positive voltage which is referred as Forward Back Bias (FBB). An embodiment of the invention can be such back bias capabilities added to the structure illustrated in FIGS. 13A-13M.

U.S. Pat. No. 7,772,096, incorporated herein by reference, teaches the use of multiple layers with alternating levels of porosity for the formation of high quality silicon over oxide. The following inventive embodiments extend these concepts for the formation of multiple strata ICs. FIG. 15A illustrates the substrate product 3030 (now numbered as substrate product 3230) previously illustrated in FIG. 13D. A base donor substrate 3202 is processed to form first porous layer 3204 (which may include two porous layers—shown) for a future cut or cleave. As described in respect to FIGS. 13A to 13D, a first epitaxial layer is formed of which portion is made porous, thus forming remaining first epitaxial layer 3222 and second porous layer 3224. Then the follow-on processing may include forming a second epitaxial layer 3232. The second epitaxial layer 3232 could be used to form a back bias region of the type illustrated in FIG. 14. The back bias layout structure may be planned according to the plan of the follow-on formed transistor layer which may be aligned to second epitaxial layer 3232 based on alignment mark formed in similar way as discussed before.

As illustrated in FIG. 15B, substrate product 3230 may be processed to form third porous layer 3234 out of a portion of second epitaxial layer 3232. Third porous layer 3234 may be constructed in similar manner as have been discussed before in respect to second porous layer 3024.

As illustrated in FIG. 15C, substrate product 3230 may be processed to form third epitaxial layer 3236 on top of third porous layer 3234.

Figure 15D:
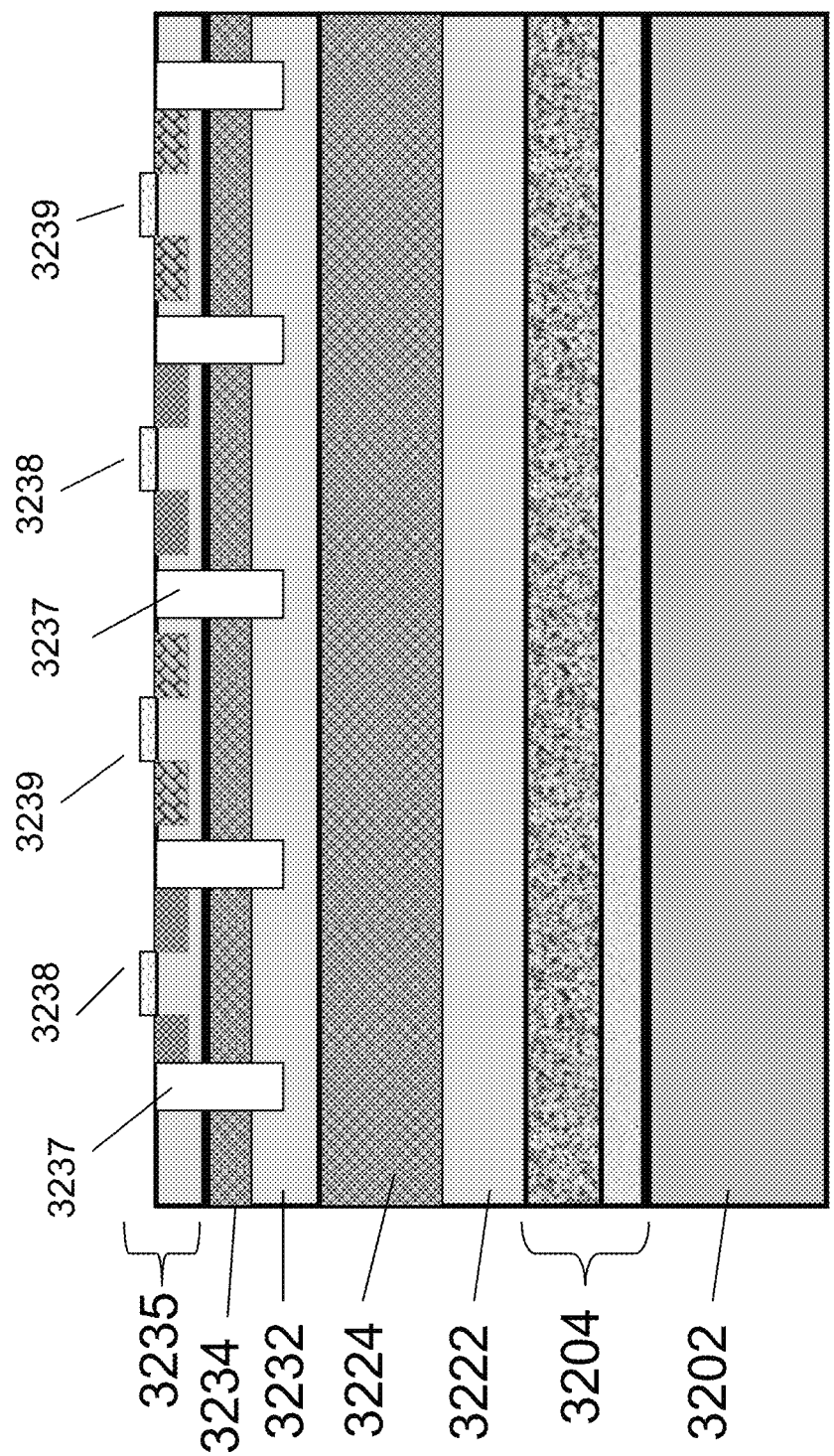

The third epitaxial layer 3236 could now be processed to form transistors. As illustrated in FIG. 15D, third epitaxial processed layer 3035 may include STI (Shallow Trench Isolation) 3237, N type transistors 3238 and P type transistors 3239. This transistors layer third epitaxial processed layer 3035 could be now referred to as Stratum-3. Through STI connection could be made to layer 3232 for the proper back bias contact locations. As discussed before the high temperature processing step could be done at this phase. This processing could utilize a conventional transistor front line process and could include all the high temperature steps required including silicidation process, raised source/drains, strain, and contact formation to these transistors. The transistors formed could include many types of transistors, for example, such as fully depleted SOI and/or FinFET, or many other types of other transistors at least as described herein and in the incorporated references.

The subsequent processing of the structures of FIG. 15D could be done in a similar manner to those illustrated in FIG. 13E to FIG. 13M, thus forming at least a fully interconnected Stratum-2 and Stratum-3 on top of a carrier substrate such as carrier substrate 809.

The thicknesses of the layers first epitaxial layer 3222, second porous layer 3224, second epitaxial layer 3232, third porous layer 3234, third epitaxial layer 3236 and third epitaxial processed layer 3235 could each be designed independently as desired and range from a few nanometer (nm) to tens of micrometers (μm); for example, about 5 nm, about 10 nm, about 20 nm, about 100 nm, about 200 nm, about 500 nm, about 1 um, about 2 um, about 5 um, about 10 um, about 20 um, or about 50 um. In many cases the layers third porous layer 3234 and third epitaxial layer 3236 could be made relatively thin. Having the layer third porous layer 3234 thin to about 20 nm could be effective for the back bias to affect N type transistors 3238 and P type transistors 3239 at voltages in the range of −3 volt to +3 volt. Having the third epitaxial layer 3236 at about 10 nm or 20 nm could be a fit for ultra-thin body FD SOI.

Another alternative not illustrated here is to repeat the process to form an additional porous layer and one more crystalline layer, so that the one back bias layer could serve Stratum-2 transistors and devices and different back bias layer to serve Stratum-3 transistors and devices.

The formation of a back bias p-Well and n-Well in the second epitaxial layer 3232 could be done by patterning and ion implant. It could be processed after formation of the third porous layer 3234 illustrated in FIG. 15B.

In another alternative second epitaxial layer 3232 could include a high-resistivity layer to support RF circuits in third epitaxial processed layer 3235 of the Stratum-3. A high-resistivity layer to support RF circuits may be effective if the true electrical resistivity sensed by a co-planar waveguide (CPW) line is higher than about 1 kohm-cm, or higher than about 3 k-ohm-cm. This may result in a CPW attenuation versus frequency response that is substantially similar to the response of a CPW on a quartz substrate. There are a variety of ions that could be implanted to increase second epitaxial layer 3232's resistivity such as hydrogen, oxygen, nitrogen and others. The implant could be annealed before the formation of transistors on third epitaxial layer 3236 to simplify managing the thermal budget for Stratum-3 transistors such as N type transistors 3238 and P type transistors 3239 (also see previous discussions of integrated TRL).

As illustrated in FIG. 15B-1, additional layer 3267 could be formed disposed between the high porosity for future isolation layer third porous layer 3234 and the high-resistivity substrate second epitaxial layer 3232. Additional layer 3267 could include a trap-rich layer for further enhancement for an RF circuit planned for third epitaxial layer 3236. Formation of additional layer 3267 may include a reduction of the anodizing current so that additional layer 3267 has low porosity and may act similarly to a poly-silicon layer to support a trap-rich function. There are multiple techniques known in the art for the formation of trap rich layer. For example, silicon-into-silicon implantation could be used together with hydrogen implant and RF plasma to cause platelet nucleation. These techniques could be now applied to make additional layer 3267 trap-rich. For simplicity, the following illustrations FIG. 15C to FIG. 15D do not show layer 3267.

It some cases it could be desirable to form into discrete regions of second epitaxial layer 3232 different zones such as back bias and/or high resistivity. These variations could be made by patterning and implant followed by annealing as is well known in the art.

It should be noted that while silicon is by far the most common material used in semiconductor devices and accordingly the presented flows detailed for silicon based processing could be implemented for other types of crystals or even allow a mixing of different crystals as is known in the art in epitaxial processes. A list of other crystals and materials that could be used or mixed could be found, for example, in Handbook of Porous Silicon published by Springer International Publishing Switzerland, 2014, incorporated herein by reference.

Figure 16A:
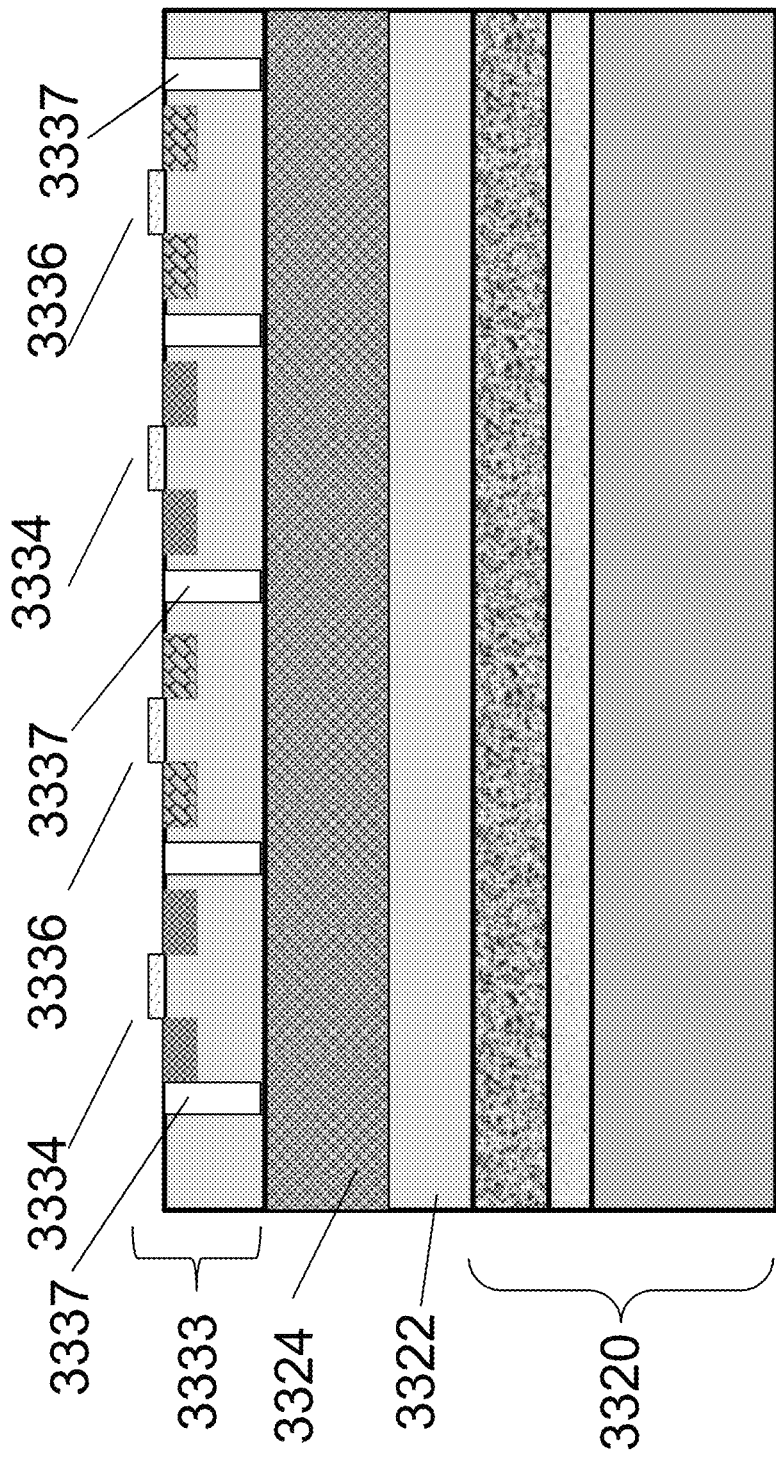
FIGS. 16A-16F is an exemplary illustration of an alternative flow utilizing a donor wafer structure to construct 3DICs.

Additional 3D flows may be a modification of the flows presented before. FIG. 16A is illustrating the structure illustrated before as in FIG. 13E. Donor wafer structure 3320 may include the two porous layers built-in to support a future cut-off step. Remaining monocrystalline layer 3322 may be the first epitaxial layer that could be used for Stratum-2 transistors and devices. Second porous layer 3324 may be an isolation layer which could be porous silicon that gets oxidized. Second epitaxial processed layer 3333 may include STI (Shallow Trench Isolation) 3337, N type transistors 3334 and P type transistors 3336. Second porous layer 3324 could be replaced with multiple layers for back bias or other functions as presented before.

Figure 16B:
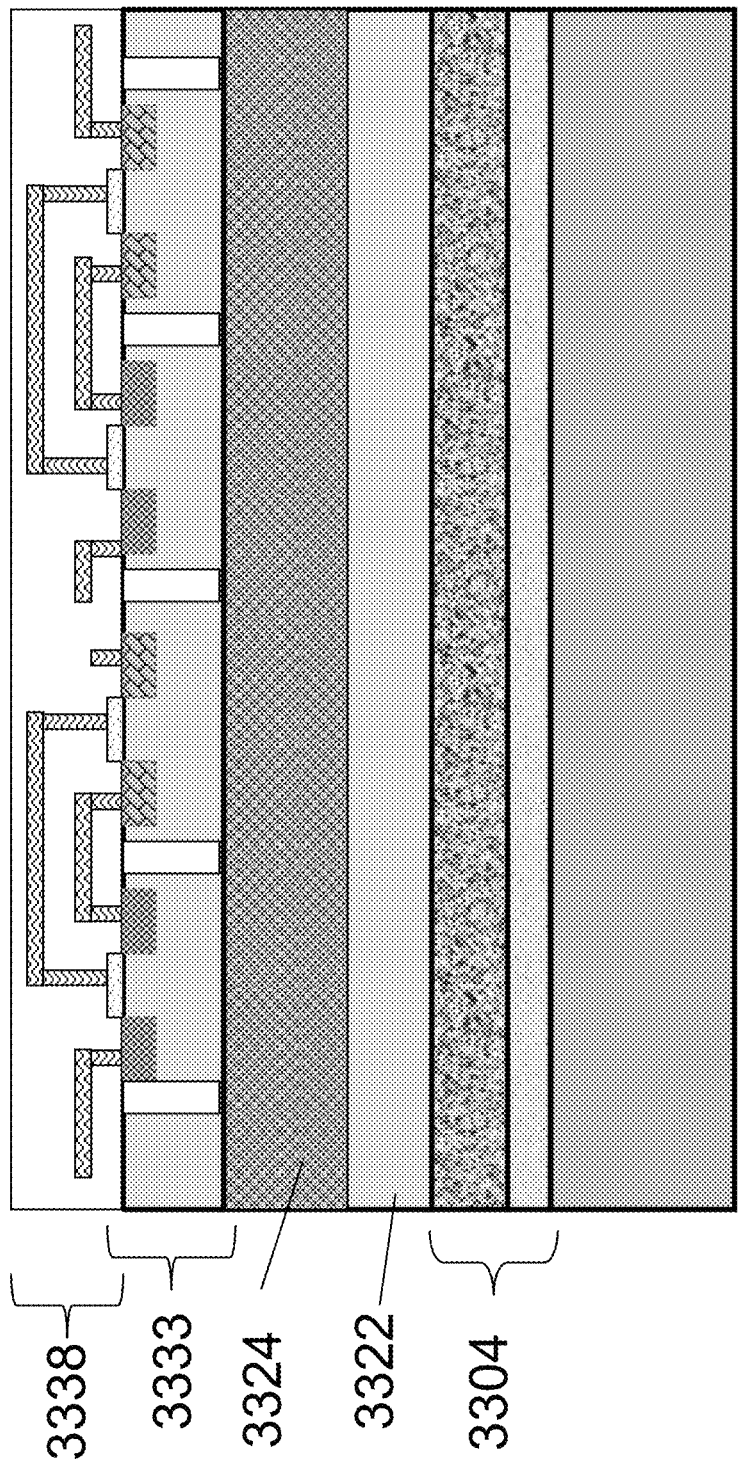

As illustrated in FIG. 16B, stratum-3 interconnection layers 3338 may be formed to provide interconnection for Stratum-3 and future potential connection to Stratum-2. Interconnection layers 3338 could include refractory metals such as tungsten so that high temperature processing could be allowed for the subsequent processing of Stratum-2. In some applications, such as image sensors, there may be no need for stratum-3 interconnection layers 3338. Thus Stratum-3 with interconnect on donor wafer structure 3350 may be formed.

Figure 16C:
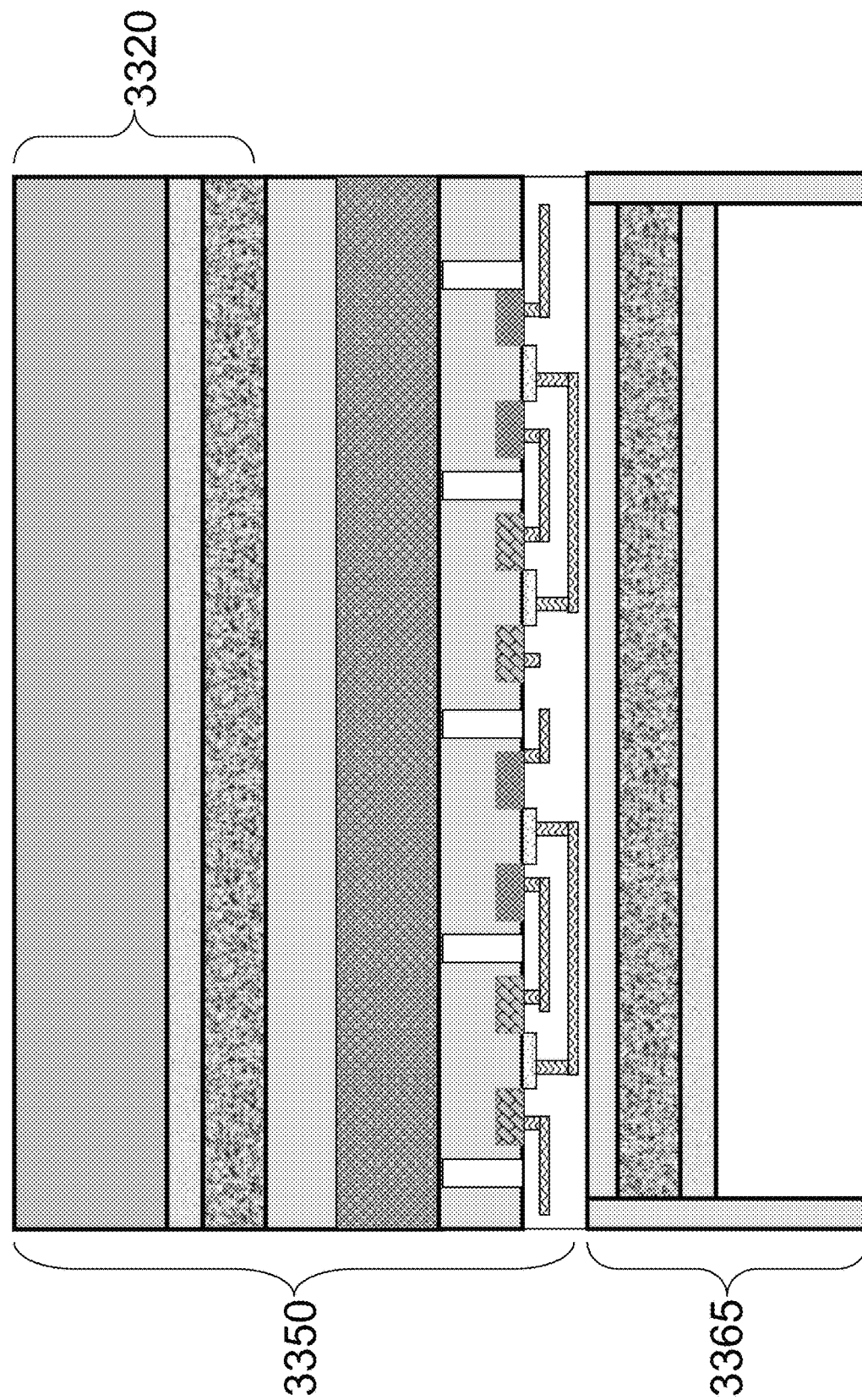

As illustrated in FIG. 16C, stratum-3 with interconnect on donor wafer structure 3350 may be flipped and bonded on top of carrier substrate 3365 (may be called carrier wafer). Shown in this embodiment of the flow carrier substrate 3365 is the final carrier wafer.

Figure 16D:
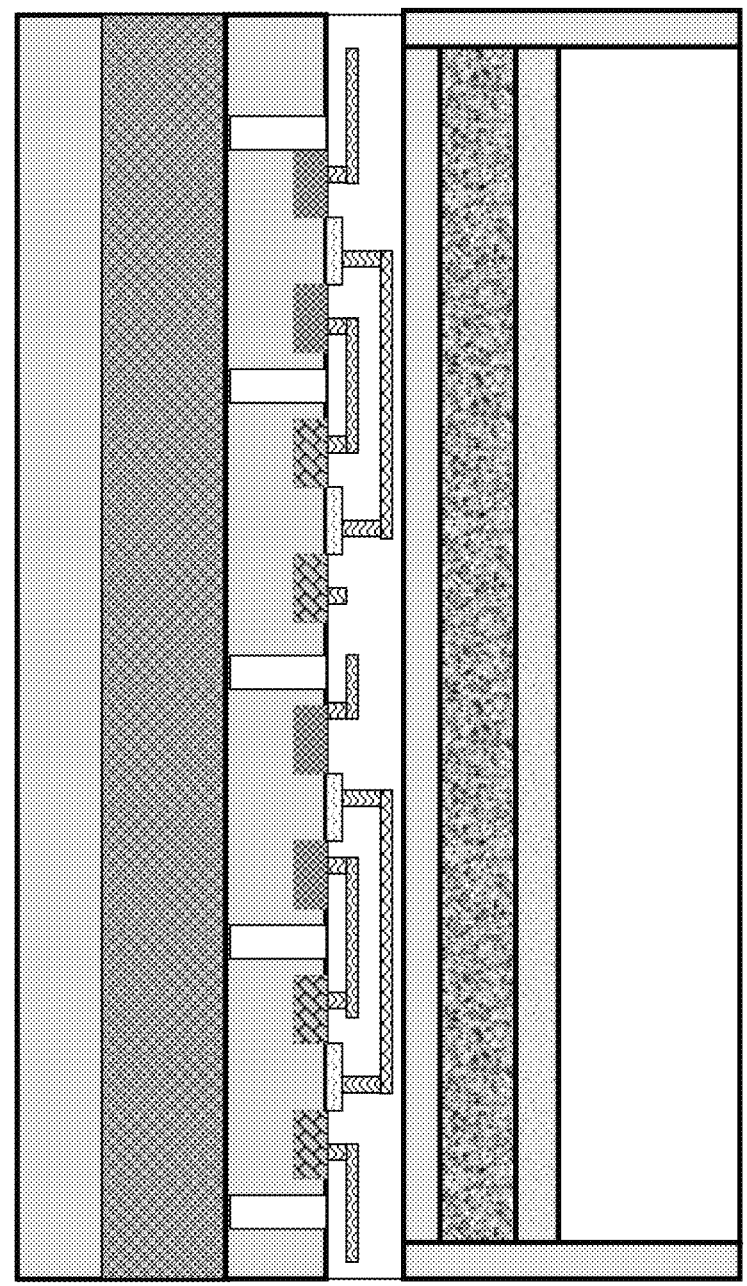

As illustrated in FIG. 16D, the structure of FIG. 33C may be formed after cutting off the donor layer structure 3320 and cleaning of the porous silicon residues.

Figure 16E:
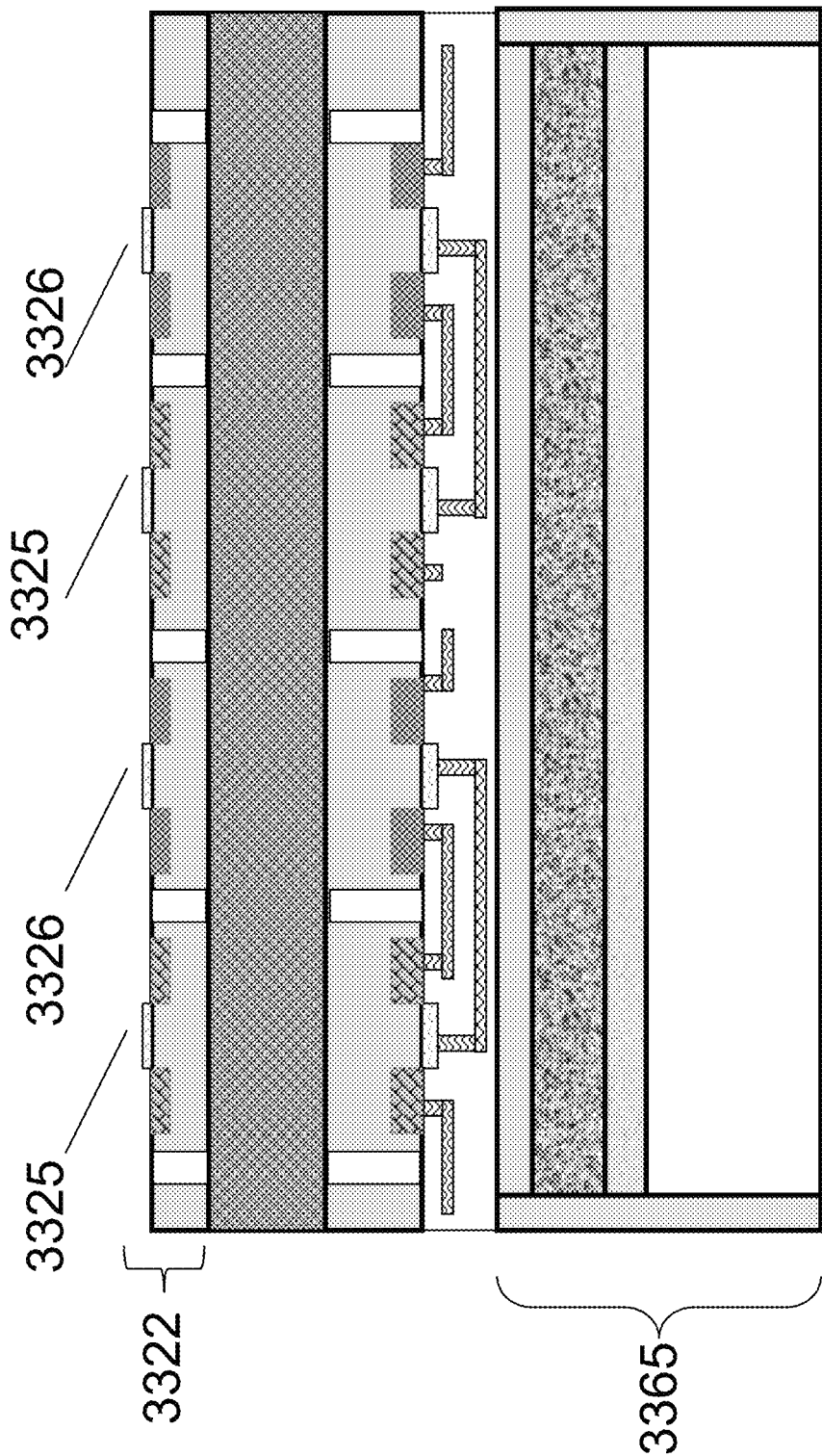

As illustrated in FIG. 16E, stratum-2 layer 3322 may be formed/processed and may include N type transistors 3326 and P type transistors 3325, as well as other types of devices, for example, resistors, capacitors, and so on.

Figure 16F:
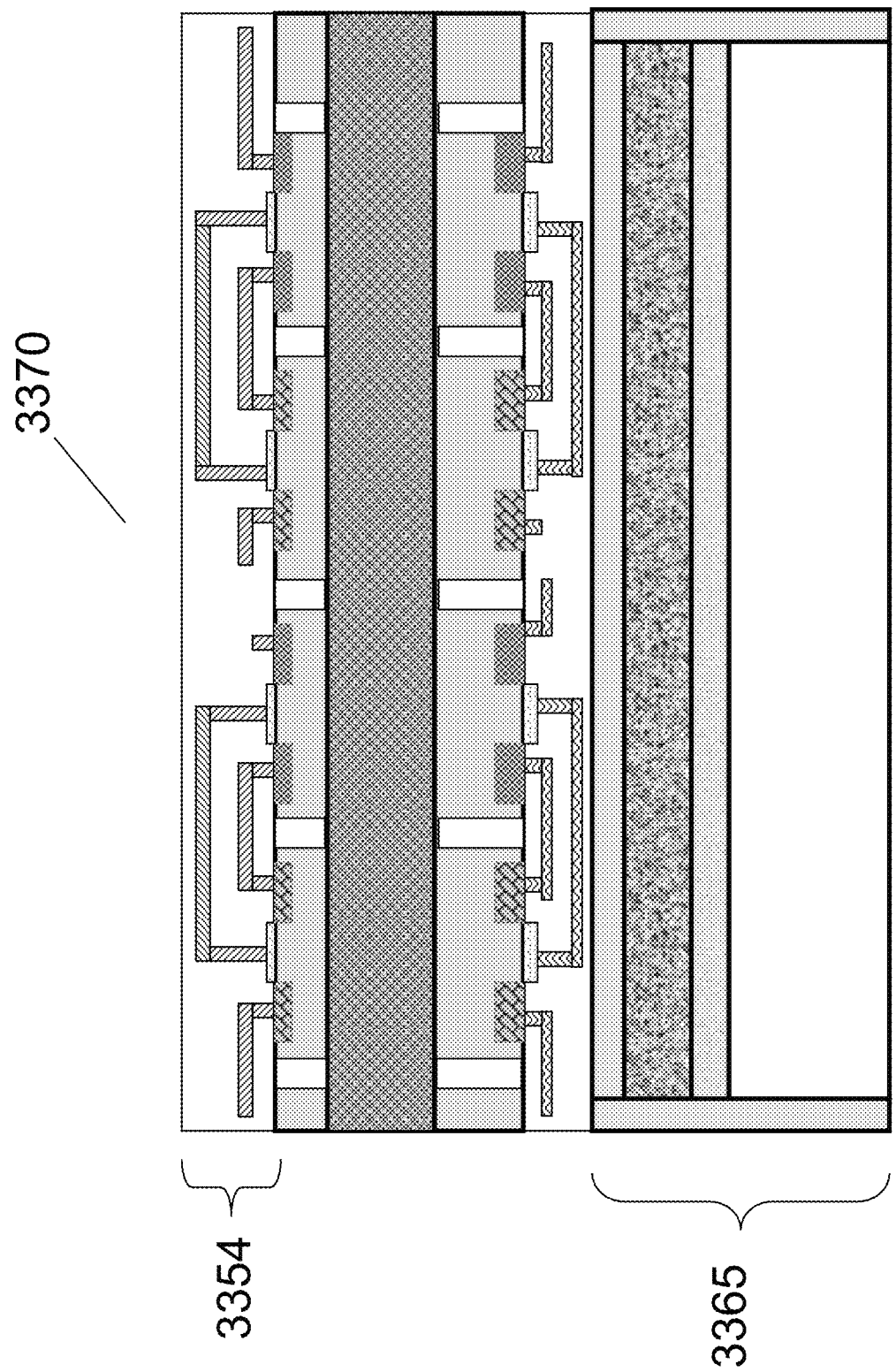

As illustrated in FIG. 16F, Stratum-2 interconnection layers 3354 may be formed/processed. At this point all the high temperature processing step should have been completed and Stratum-2 interconnection layers 3354 could comprise copper or aluminum. As layers, for example, remaining monocrystalline layer 3322, second porous layer 3324, and Stratum-2 layer 3322 are relatively thin as presented before, then the transistors/devices/structures of Stratum-2 could be made directly lithographically aligned to the transistors/devices/structures of Stratum-3. Thus transistors/devices built on Stratum-2 layer 3322 and interconnection on and through Stratum-2 layer 3322 could be lithographically aligned to the transistors of Stratum-3. These structures could be aligned to well below 40 nm to a precise alignment of a few nm or even less, being a 'direct' alignment that may be accomplished with short wavelength optical means. Accordingly the structure 3370 of FIG. 16F illustrates a wafer of two circuit strata tightly aligned. The structure could be then finished with conventional processing of adding I/O pads, testing, dicing and bonding to be provided as integrated circuit device.

The stratum-3 interconnection 3338 of structure 3370 may be relatively less effective due to the use of refractory metal, due, for example, by the higher resistivity of tungsten than the resistivity of aluminum or copper. Yet, for many functions that could be built on Stratum-3 this will be very acceptable. These applications may include: image sensor, device input output circuitry, SerDes (Serializer and Deserializer device to device interconnect circuitry), local interconnection including support circuits for stratum-2 such as buffer and repeaters.

In many applications it is desired to thin the finished wafer prior to dicing. A process called back grinding could be used to thin the finished structure 3370; for example, about 700 μm thinned to about 200 μm or to 50 μm.

The use of a final carrier provides an attractive alternative to the conventional technique. FIG. 17 illustrates such special final carrier 3465. The structure 3470 is similar to the structure 3370 of FIG. 16F. The main difference is having on top of the porous layer designed for cut 3404 a relatively thick final substrate layer 3406. The final substrate layer 3406 thickness could be in the range of 50 μm to 200 μm according to the packaging choice. Bonded on top of it is the isolated two strata structure 3408 which could be formed as presented before. Now instead of back grinding, the porous layers could be used to cut off the isolated two strata structure 3408 bonded to the final substrate layer 3406 from the bulk carrier 3402. The bulk carrier could be recycled further reducing this flow's cost compared to the back grinding alternative.

The final substrate layer 3406 could be formed by an epitaxial process, or by CVD or by other techniques of deposition or layer transfer, for example, ion-cut, SOI, porous layer.

The final substrate layer 3406 could be designed to provide functions other than mechanical support to the two strata structure 3408. The following are some of these optional functions:
A. When Stratum-3 layer 3332 is an image sensor then it could be advantageous to have a very thin and optically transparent final substrate layer 3406.
B. The final substrate layer 3406 could carry the pads for external connection and through layer 3406 vias to connect these pads to the device I/O (input/output) circuitry.
C. The final substrate layer 3406 could be made to have a very good thermal connectivity to provide operational a heat removal path for the circuits/devices on the two strata structure 3408.

These flows where the multiple strata structure such as two strata structure 3408 could be transferred to a final carrier or final substrate opens up additional flexibilities. There are strict requirements for material thickness and heat tolerance for the carrier wafer to support conventional semiconductor processing of these device layers and their interconnections. In some situations it might be advantageous that once done with these wafer processing steps the strata structure would be transfer to a final carrier or final substrate that is not design to support semiconductor processing but rather to support device performance, for example, for heat removal, frequency stabilization, emf/emi shielding, or connectivity to external devices. An additional advantage of this approach is the ability to allow the processing of these functional final carrier or final substrate to be independent from the processing of the semiconductor devices, thus allowing for far better flexibility, efficiency, costs and overall shorter processing or time-to-market.

Figure 18A:
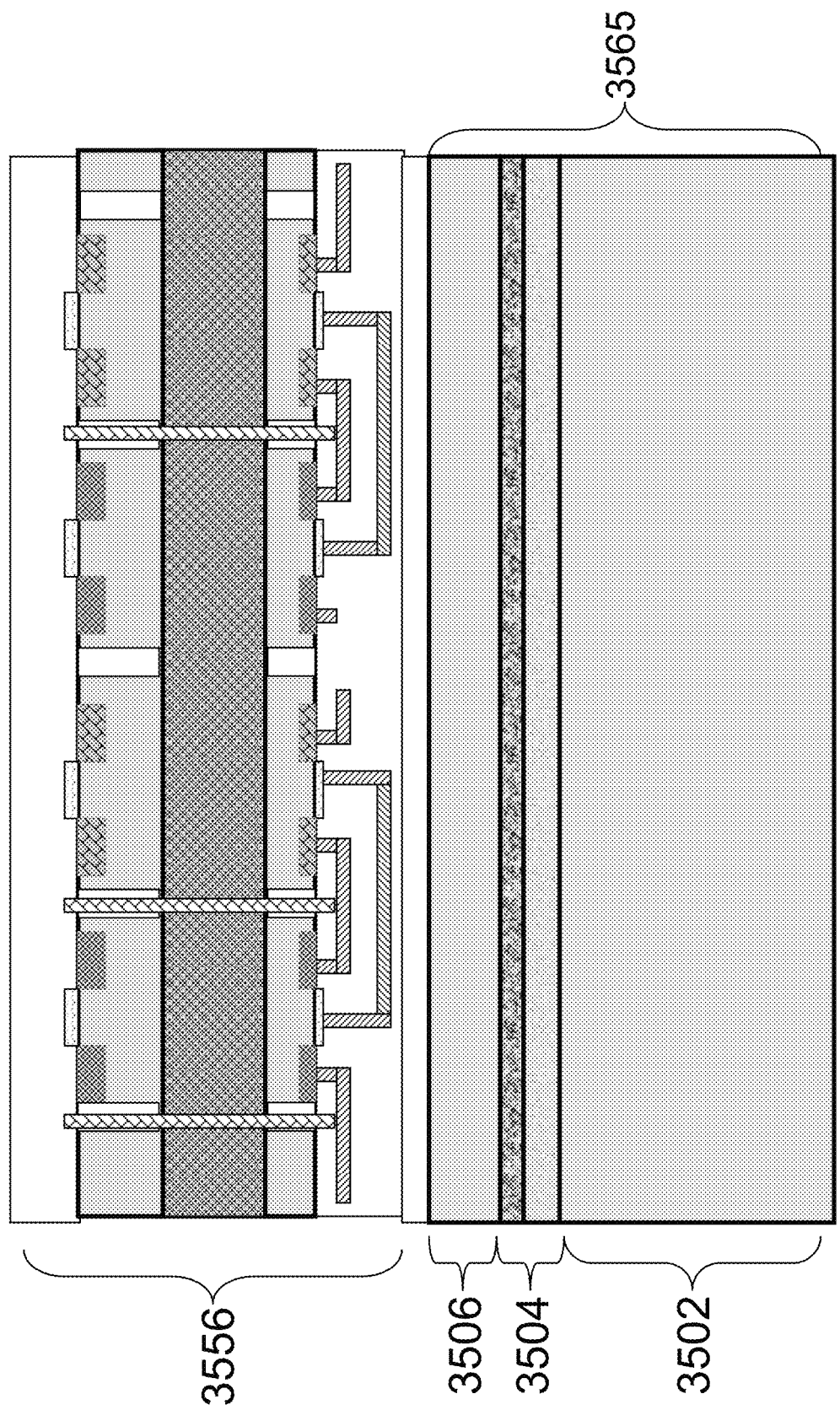
Figure 18B:
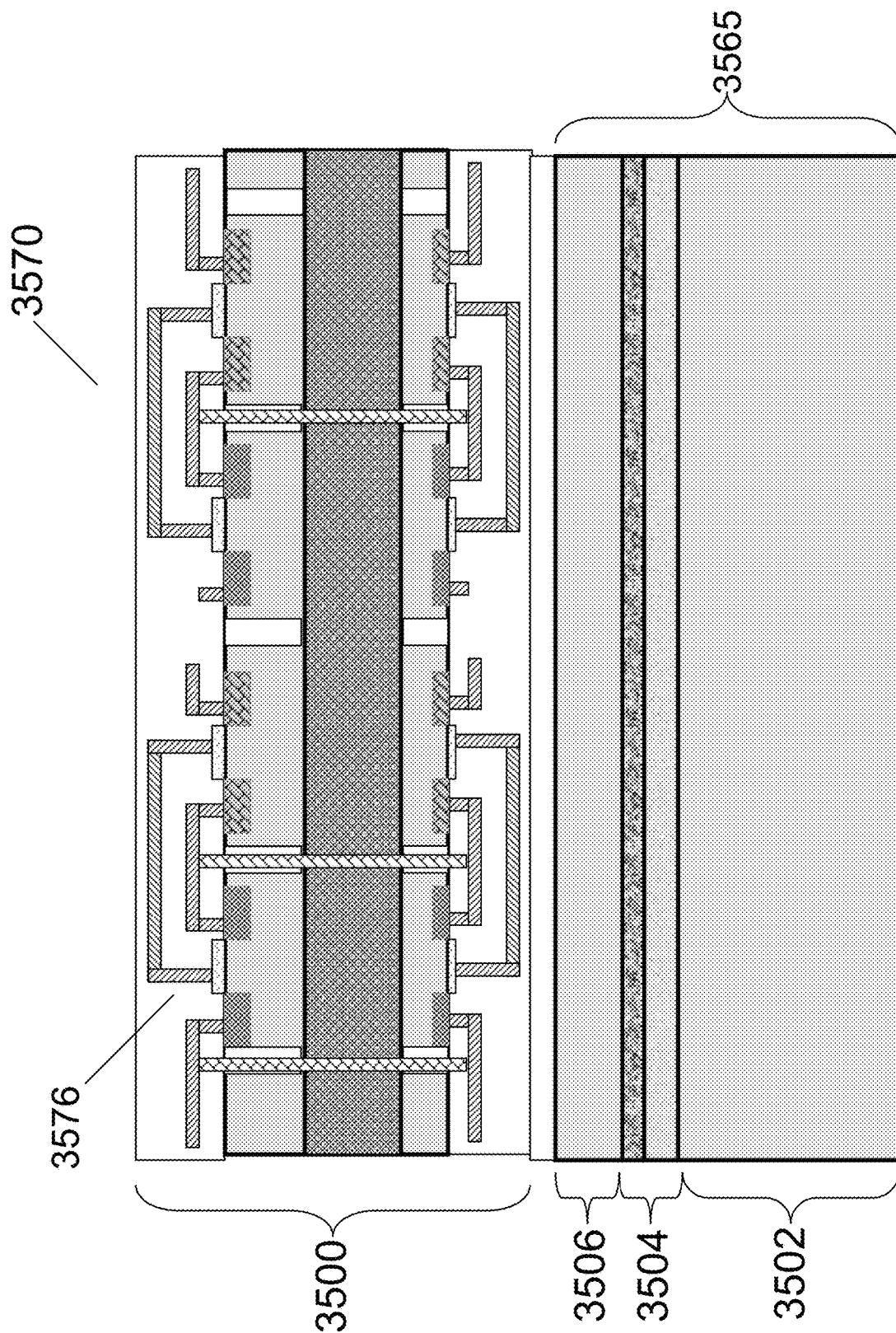

FIG. 18A to FIG. 18C illustrates an embodiment of this innovation. FIG. 18A is similar to FIG. 13M but instead of final carrier substrate 809, carrier 3565 is utilized. Carrier 3565 may include bulk carrier wafer/substrate 3502, porous cut structure 3504 and bonding layer 3506. Carrier 3565 could be about 700 μm thick and designed to withstand conventional semiconductor processing similar to previously described carrier. For example, carrier 3565 could be a conventional monocrystalline silicon wafer. Porous cut layer 3504 may include and be similar to previously described cut porous layers. Porous cut layer 3504 may include some protection to protect it from being cut prior to the time it is desirable to or has been designed to be cut, for example, such as side wall protection 3068 or other methods as had been described or designed by techniques known in the art. These protections could be removed once it is the time to do the cut. Stratum structure 3556 could be a two layer Stratum-2 and Stratum-3 and may include an isolation layer and additional layers in between such as back bias layers as was described before.

FIG. 18B illustrate the wafer structure 3570 after the addition of interconnect layers 3576. Interconnect layers 3576 may include many layers to support the required connectivity and power delivery and other required layers such as pads for connecting the device to external devices. These processes could be done in a conventional back of the line semiconductor processing line. Once the strata structure 3500 has completed all its semiconductor processing it could be then be transferred on top of a functional carrier that is independently designed and processed and is not limited to comply with the requirements of semiconductor processing.

FIG. 18C illustrates the flipping and bonding of the wafer structure 3570 onto a functional carrier 3585. Porous cut layer 3504 could then be used for the cut/cleave removing the bulk carrier wafer/substrate 3502 and thus leaving the top bonding layer 3506 or a portion of bonding layer 3506. Bonding layer 3506 may include a thin oxide layer or a thicker silicon layer that could even provide some mechanical support to strata structure 3500 to complement the mechanical support provided by functional carrier 3585. Strata structure 3500 may have a thickness less than 10 μm. It could include multiple layers of crystallized silicon, isolation and porous layers and many metal layers. Yet, most of these layers are very thin, on the order of few nm to hundreds of nm. Accordingly strata structure 3500 could be too thin to manage on its own and would not support by tens on micron support structure such as bonding layer 3506 and or functional carrier 3585.

The functional carrier 3585, being un-constrained by the need to support conventional semiconductor processes, opens the opportunity to construct it so to support other functions, such as:
A. High spectral transparency for special image detectors.
B. Color or other filters, or micro-lenses.
C. Phase change material to support special heat management function.
D. Special high thermal and/or electrical conductivity material such as graphene, diamond layer, carbon nanotubes structure etc.
E. Structures with build-in micro channels for liquid cooling.
F. Heat sink structures designed to support efficient air cooling.
G. Structures with pads and through layer vias to support connectivity.
H. Battery or high capacity capacitors ('super capacitors').
I. Flexible substrates This flexibility of the functional carrier could be advantageous to the multiple strata presented or to any structure developed on a wafer using semiconductor processing including simpler devices with a single Stratum or a far more complex device using many stratums of circuits.

Strata structure 3500 could utilize Stratum-2 and Stratum-3 for various electronic circuits and other functions. In some applications one of those stratums could be used to carry logic functions while the other could carry memory functions. In general, memory function may include arrays of bit cells with decoder circuits and other peripheral functions along the array sides. From a lithography point of view, manufacturing layers that are made of repeating functions are clearly easier and lower cost to process. In memory the bit cells are a repeating function while the decoders and other peripheral function are not part of these repeating structures. In U.S. Pat. No. 8,395,191, which is incorporated herein by reference, in respect to at least FIG. 84, a solution is presented to allow leveraging this repeating structure by allocating the bit cells to one of the strata and constructing the decoders and other peripheral function on the other stratum. Such could be attractive to apply to a strata structure such as strata structure 3500. In general, as presented in respect to FIG. 84 of U.S. Pat. No. 8,395,191, the output of the decoders are the bit-lines—8462 of FIG. 84G—and the word lines—8452 of FIG. 84F. These word lines and bit lines are high density lines for each row and column of the bit-cell array and would form a substantive connectivity blockage if they would be needed to be routed through an interconnect fabric. Accordingly, strata structure 3500 allows a designer/layout engineer to avoid such blockage by having the interconnect of Stratum-2 face down while the interconnects of Stratum-3 are facing up. Thus, if, for example, Stratum-3 is used for the bit-cell array and Stratum-2 is used for the logic and the decoders, then the connection from the decoders of Stratum-2 to the bit cell array on Stratum-3 could utilize the through strata connections TLVs 3076 sparing the blockage to the routing fabric of Stratum-2.

Figure 19A:
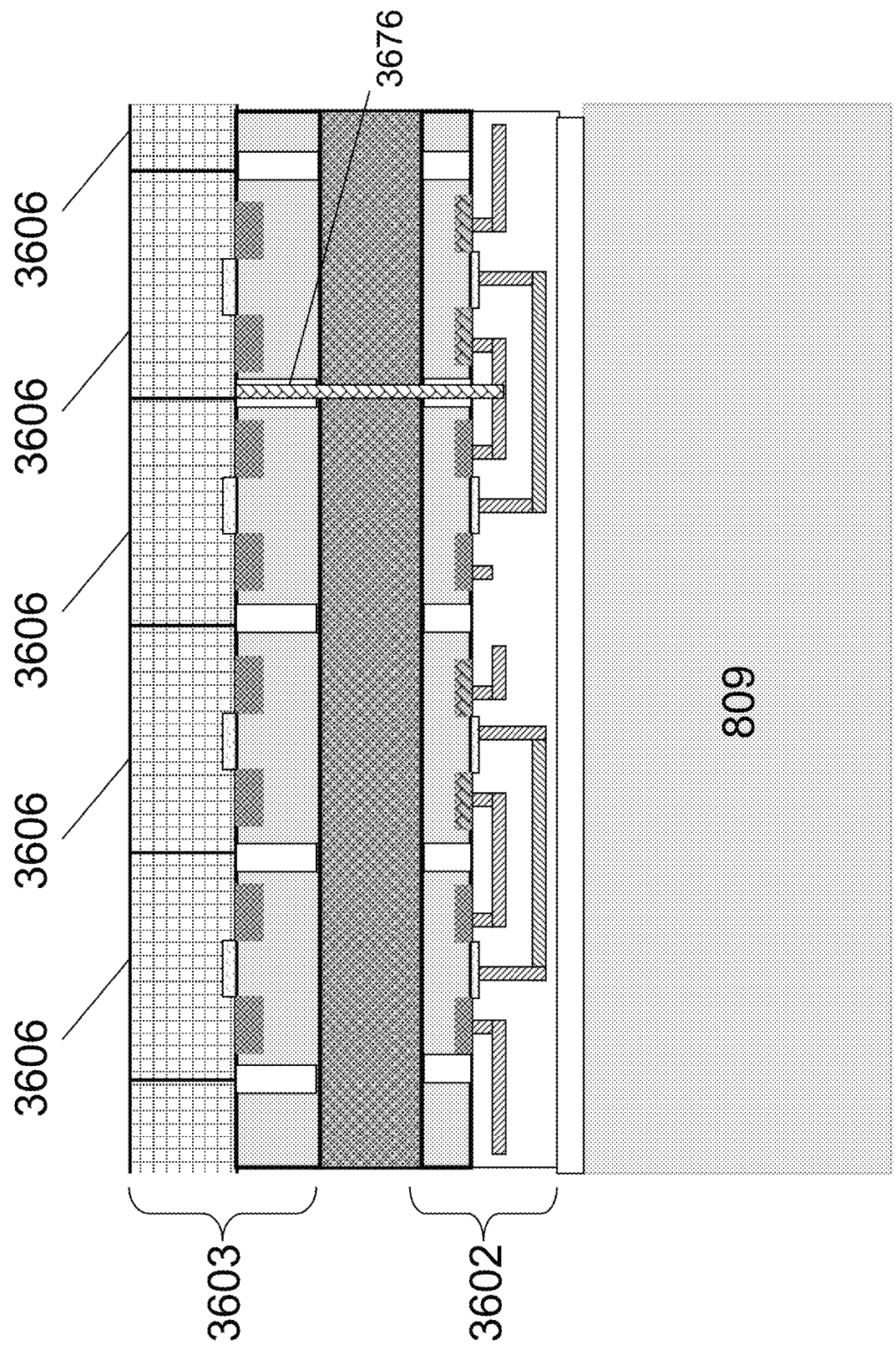
Figure 19B:
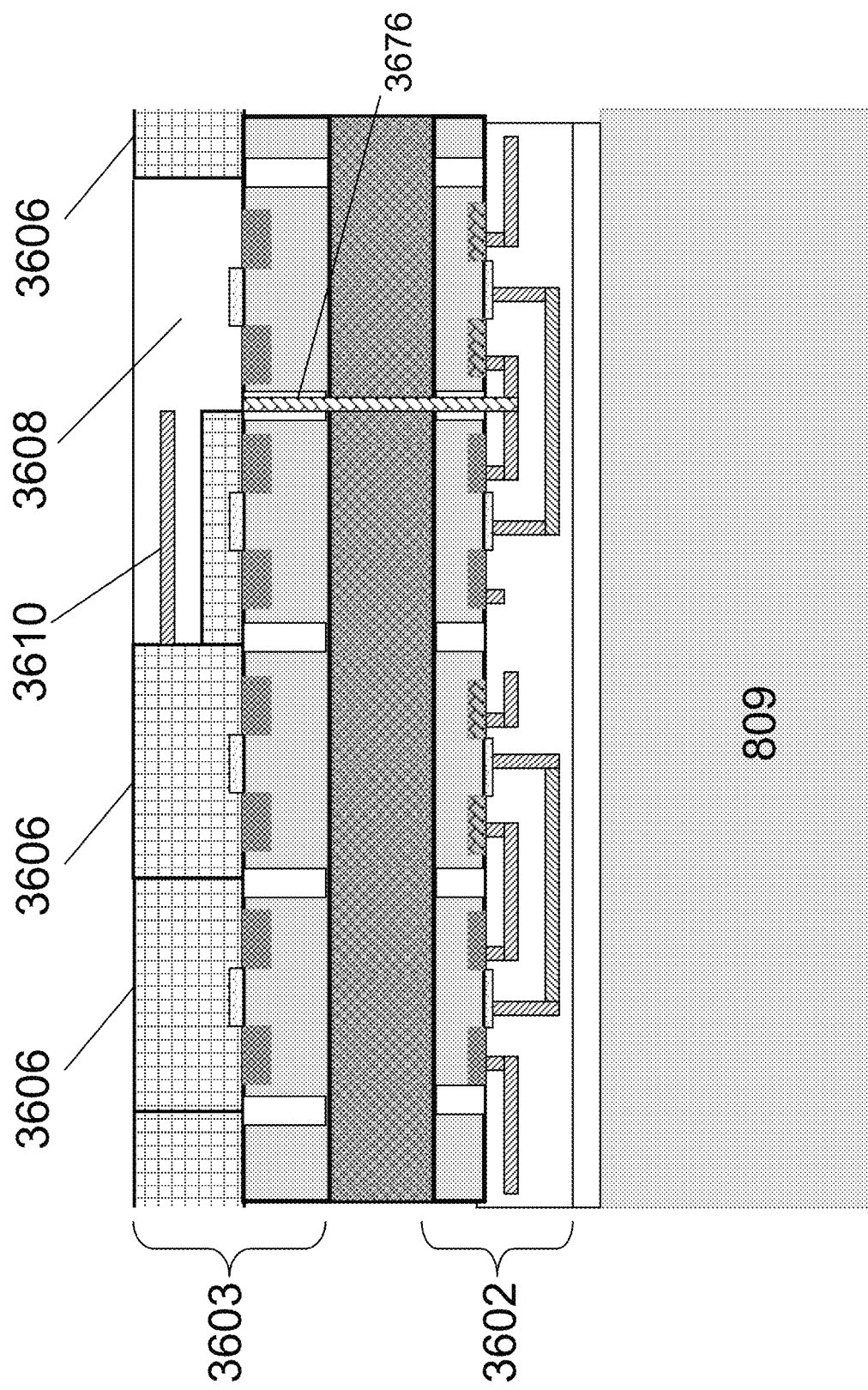

FIG. 19A to FIG. 19C are illustrating this concept. FIG. 19A illustrates a similar structure to the one illustrated in FIG. 13M. A strata structure may be bonded on top of a carrier substrate 809. The strata structure may include stratum-2 3602 which may be used for the logic and the decoders, through strata via 3676 to bring the decoded bit lines and word lines to stratum-3, and stratum-3 3603 carrying the bit cell 3606 array. FIG. 19B illustrates Stratum 3 after re-processing to form isolation region 3608 within the bit cell 3606 array, and form access to the memory control lines—bit lines and the word lines 3610. Processing may include a lithographically defined etching step using lithography that could be done at far larger resolution than that required for the formation of Stratum-3 devices. FIG. 19C illustrates the connection 3612 made from the through strata via 3676 to the memory control line.

Another effective use of strata structure 3500 could be for programmable logic fabrics. In U.S. Pat. No. 8,395,191 a programmable logic fabric is presented such as in at least FIG. 8A with two stratum of programming transistors, one 814 that is named Foundation to program the logic fabric 804, and multiple layers above additional programming stratum 810 named Attic for the programming of the routing fabric 807.

The unique form of strata structure 3500 could allow having the programmable logic built in stratum-2 to be programmed by programming transistors which may reside in stratum-3. Stratum-3 may also include the routing programming transistors which would program the configurable interconnect fabric built in the routing fabric of stratum-3.

In some applications it might be desired not even to construct a stratum-2 but rather leverage a derivative of the presented flow to construct interconnection both underneath the transistor layer and on top of it in order to further improve the overall transistor connectivity.

In some applications there might be a preference to use an ion cut technique to form the monocrystalline layer on top of the porous layer rather than use the epitaxial process. Since the structure could withstand high temperature processes, such flow could provide a high quality thin monocrystalline layer on top of the porous layer after performing high temperature annealing to repair damages caused from the ion cut process.

Many of the multiple strata porous based process flows may require that the structure comprising porous layers would withstand semiconductor processing temperatures and physical/mechanical stresses and that the cut step will affect only the target porous layer and not other porous layers that might be included in the structure. The presented flows did attend to this issue and the following additional alternatives are presented to provide additional alternatives for such. To simplify the description we may use the term 'porous layer to be cut' while actually referring to a dual porous layer structure such as upper porous layer 2642 together with lower porous layer 2644 or lower layer of porous silicon 3012 together with upper layer of porous silicon 3014.

Another alternative process for forming the dual cut porous layers lower layer of porous silicon 3012 and upper layer of porous silicon 3014 has been proposed in IBM patent application Ser. No. 10/685,636, incorporated herein by reference. In this alternative the two layers would have two different doping levels formed by processes such as ion implant and activation prior to the anodization step.

FIG. 20 is illustrating an exemplary wafer structure 3700 for these processes. Wafer structure 3700 may include typical wafer diameters of 150 mm to 300 mm and some expect to see 450 mm wafer in the future. Wafer structure 3700 may include a thickness of about 600 to about 800 micrometer (µm), while the thickness of the porous layer 3706, epitaxial layer 3704 and bonding oxide (not shown) may include, for example, a range of about 10 nm to about 40 µm.

Accordingly in respect to the wafer diameter, these processed layers are extremely small. The following description of some of these alternatives will use an illustration of a very small part of the wafer structure 3700—indicated by the 'bubble' 3710.

Figure 21A:
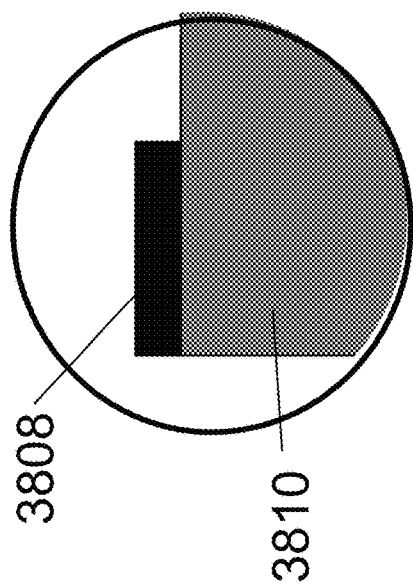
FIGS. 21A and 21B are exemplary illustrations of sidewall protection schemes for porous layers.

FIG. 21A illustrates the use of lithographically patterning to form surface protection ring 3808 on the outer ring of the wafer 3810.

Figure 21B:
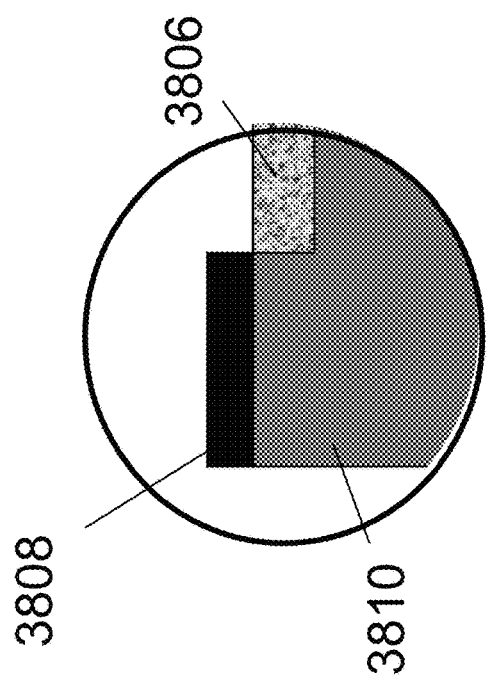

FIG. 21B illustrates one alternative for the formation of porous layer 3806. The protection ring 3808 needs to be at least three times wider than the thickness of the porous layer 3806 so it will preserve the integrity of the wafer side edge. In this way, after the step of epitaxial growth of crystallized silicon, the porous layer 3806 would be fully protected by crystallized silicon all around. If these porous layer(s) are to be used later for cut, then the side wall protection could be removed to assist with targeting of such cut as is presented later. Accordingly the outer ring 3808 might not be useful for circuit function but in respect to the wafer diameter this loss is insignificant.

Figure 22A:
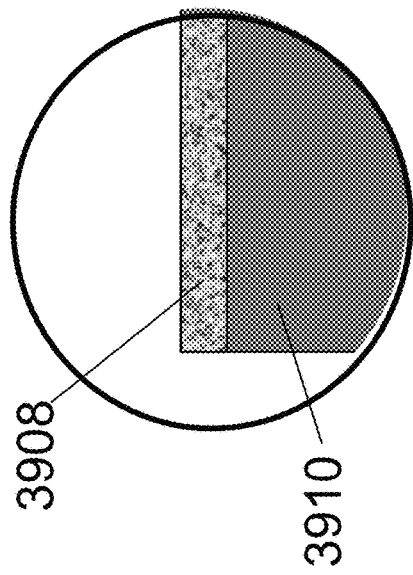
FIGS. 22A and 22B are exemplary illustrations of additional sidewall protection schemes for porous layers.

FIG. 22A illustrates wafer 3910 with top porous layer 3908.

Figure 22B:
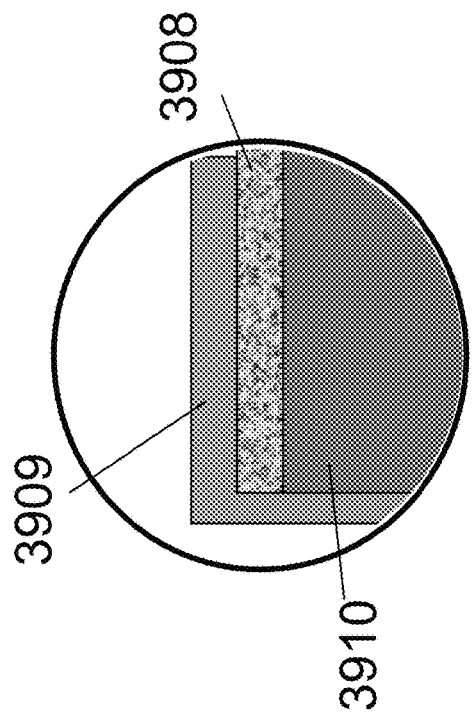

FIG. 22B illustrates the addition of an epitaxial layer 3909. The epitaxial 3909 could be made to grow all around the wafer 3910 or on the top and partially down the sides providing side wall protection to the porous layer 3908. Accordingly providing another porous protection alternative.

Another alternative is illustrated by FIG. 23A and FIG. 23B.

FIG. 23A illustrates wafer 4010 with top porous layer 4002 and epitaxial layer 4008. Then the structure may be covered by a protection material 4006, such as polysilicon, silicon oxide or silicon nitride or other semiconductor compatible material. This protection may be deposited in a non-directional method which may then cover both the top surface of the wafer and its sides.

FIG. 23B illustrates the structure after directional etching—etch back—of the top layer of protection material 4006. This will remove the protection from the top surface of the epitaxial layer 4008 and will leave the side wall 4007 protection in place.

These methods could be used to protect a single porous layer or multiple of porous and epitaxial layers such as one illustrated in FIG. 15C—first porous layer 3204 (which may include two porous layers—shown).

This protection could be strengthened if required by either a thicker side wall or the addition of strengthening posts in a non-functional area of the wafer surface such as the dicing streets. Since in some of the presented flows the porous layers are used to form isolation, such as second porous layer 3024, between mono-crystalline layers, such as remaining monocrystalline layer 3022 and second epitaxial layer 3032, and are not planned to be cut but rather be part of the device structure, in these cases such extra mechanical strengthening might be a useful option.

In other cases or variations of these flows, a porous layer may be designed for providing a cut/cleave and such cut might be done while the structure includes at least one additional porous layer that should be protected from an accidental cut. Accordingly it would be desired to remove the side wall protection only from the porous layer to be cut while still keeping side wall protection for the other porous layer.

One way to achieve such is by constructing different material composition of side wall protection to these different potential porous cut layers. The formation of side walls as presented before including in FIG. 21A to FIG. 23B could include protection materials and in some case sacrificial materials for lift-off to allow a selective removal of such protection to allow cut in other cases. These are well known techniques in the art.

To illustrate such optional technique we refer to the flow illustrated in FIG. 13A to FIG. 13L. Following the formation of the structure illustrated in FIG. 13B including the porous cut layers lower layer of porous silicon 3012 and upper layer of porous silicon 3014 and the first epitaxial layer 3020 a side wall layer may be formed on the structure designed to be used later for a lift-off step. The top surface of first epitaxial layer 3020 could be cleaned of any residue of this lift-off material to allow the following steps of porous and epitaxial growth. Then the structure as illustrated in FIG. 13D could be covered with side wall protection that would be designed to protect the isolation layer second porous layer 3024. Then after the lift-off step could be used to remove this new protection from the side of the cut porous layers lower layer of porous silicon 3012 and upper layer of porous silicon 3014. This would allow proper cut to be performed as illustrated in FIG. 13G to FIG. 13H. FIG. 13G also illustrates the pre-formation off side wall protection 3068 as part of the formation of the carrier wafer 3065. The side wall protection 3068 of the carrier wafer 3065 could be done with very different material than the side wall made for the isolation layer second porous layer 3024, and could be removed for the cut step illustrated in FIG. 13K to FIG. 13L. Having these side walls from different material could allow the removal of side wall protection 3068 without removing the protection of the isolation layer second porous layer 3024. Alternatively a different thickness of side wall could be used with side wall protection 3068 being thinner so its removal will keep side wall protection to isolation layer second porous layer 3024.

Many other variations of these steps of deposition and removals could be used to support proper implementation of these process flows.

Alternatively special equipment could be constructed to support selective removal of the cut layers side wall protection. Such equipment could be integrated to support the following cut process so it would function as a complete selective side wall removal and porous cut. Such equipment could use a focused laser beam. Laser beams are already being used for scribing and dicing application and there is good industrial knowledge of focused laser cut techniques for semiconductor materials such as silicon, poly silicon, silicon oxide and silicon nitride and other materials useful for side wall protection.

Alternative technique to assist the porous cut is presented in IBM U.S. Pat. No. 6,774,010, incorporated herein by reference. The technique is called freeze-thaw technique in which a fluid, such as water, is introduced into the pores and expanded by freezing. A fluid which expands in volume upon freezing (or solidifying) is then introduced into the pores of porous layer. The fluid may be introduced in liquid form (by immersing the bonded assembly in the fluid) or in gaseous form (by exposing the bonded assembly to vapors of the fluid). A preferable fluid is liquid water (1120). The structure is then cooled to freeze (or solidify) and expand the fluid in porous layer, thus fracturing the porous cut layers.

Additional alternative to help directing the cut to the desired porous layer while avoiding the cut off porous layer that either are not to be cut at all or to be cut at later step of the process is to adjust these layer thickness. The porous formation process is very flexible and allows an order of magnitude difference in thickness. For example, the layers that are not to be cut could be processed to have thickness in the range of 10-400 nm, the layer that should be cut first could be processed to have a thickness in the range of 6-20 µm, and the layer to be cut afterward could be processed to have a thickness in the range of 1-4 µm.

Additional alternatives for the formation of structures like the one illustrated in FIG. 15C could leverage the good control of the level of porosity in different depths of the wafer and save some of the epitaxial steps presented in respect to the formation of the structure of FIG. 15C.

Figure 24B:
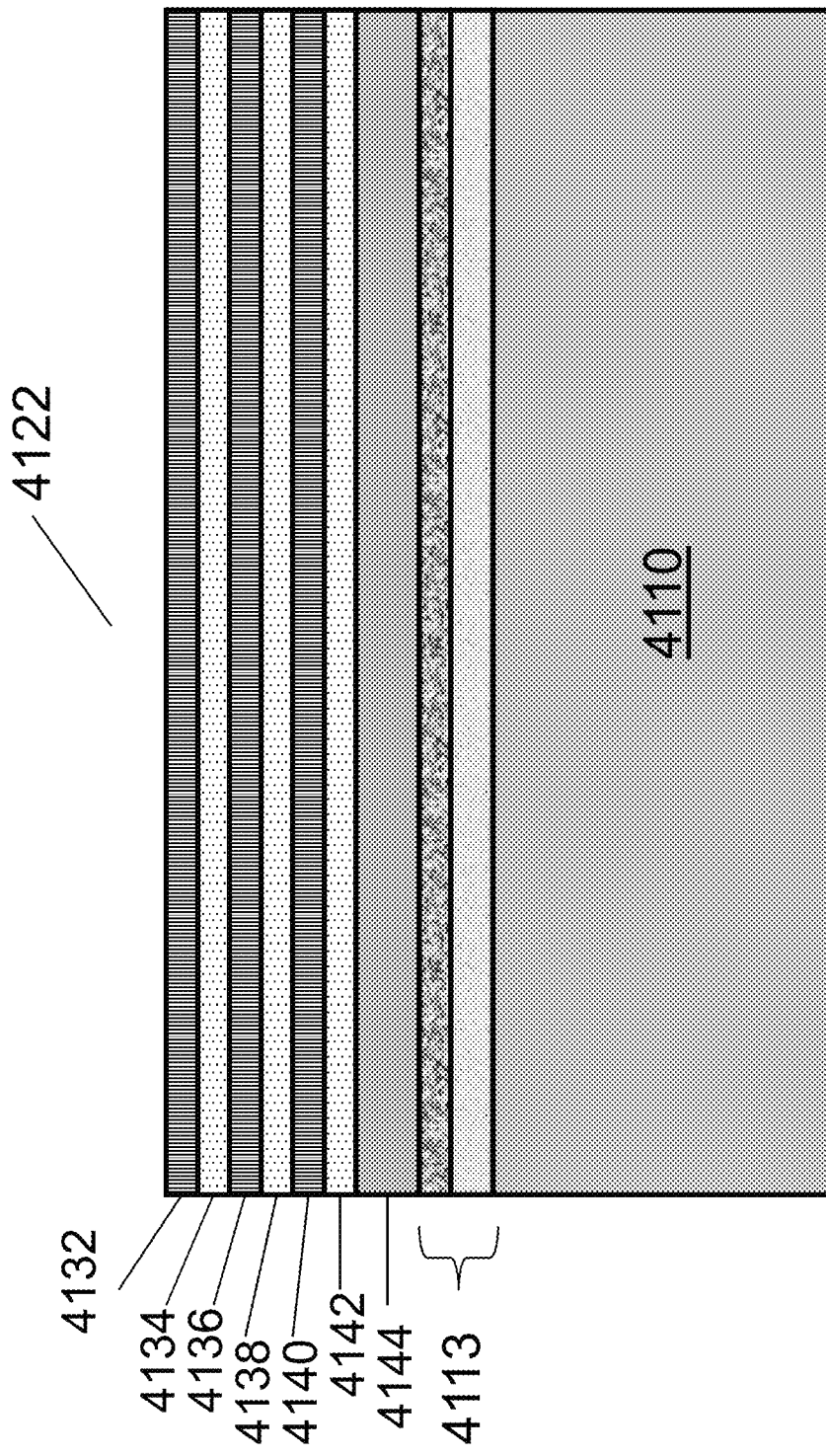

FIG. 24A illustrates a structure similar to the one illustrated in FIG. 13B. A base donor substrate 4110 is used to form a dual porous layer for future cut 4113 on which an epitaxial process is used to form relatively thick crystalline layer 4120. The epitaxial formation of relatively thick crystalline layer could include successively altering the addition of dopants to further support the following steps. It is well known that the dopant type and amount of crystalline silicon has a high impact on the rate of porous formation process. Use of alternating dopant and/or anodizing current could be effective in formation of the multi-layer structure illustrated in FIG. 24B. As relatively thick crystalline layer 4120 is formed by epitaxial process alternating dopant during the process could be an effective approach for the following phase of forming alternating porosity layer structure as in FIG. 24B. Alternating between P– and P+ could allow easier porous formation. Alternating between N– and N+ could also be used. For N type silicon the anodizing process might need some additional hole generating support such as back side illumination.

Another alternative to construct multilayer porous structure alternating the level of porosity is by altering the level of illumination especially for N type silicon.

And is some applications those techniques to form different level of porosity could even be combined to achieve even higher porosity variation or for other reasons. It should be obvious to people in the art that while one method is been suggested in respect to formation of a multilayer structure other method or mixing between these techniques could be preferable in some cases. There many possible variation for these process flows.

FIG. 24B illustrates relatively thick crystalline layer 4120 after going through a porous formation process which successively alternates the anodizing current to form multilayer structure 4122. First using a relatively lower anodizing current low porosity layer 4132 is formed having less than about 40% porosity. Layer 4132 will be used later for the epitaxial step for stratum-3. Then a higher current would be used to form layer 4134 underneath with porosity of over 60%. Layer 4134 could utilized as an isolation layer. Then layer 4136 of lower than 40% porosity is formed underneath. Layer 4136 could be used for back-bias for stratum-3, or an alternative substrate function such as presented earlier. Then a higher current would be used to form layer 4138 underneath with a porosity of over 60%. Layer 4138 could be utilized as an isolation layer. Then layer 4140 of lower than 40% porosity is formed underneath. Layer 4140 could be used for back-bias for stratum-2, or electromagnetic shielding or alternative substrate functions such as presented earlier. Then a higher current would be used to form layer 4142 underneath with a porosity of over 60%. Layer 4142 could be utilized as an isolation layer. Layer 4144 could be the portion of layer 4120 that is left unmodified to be used for stratum-2. In some cases it may be desired to construct a high resistivity layer to support RF (Radio Frequency) circuits on stratum-3. It might be preferable to defer the high resistivity formation to be done after the completion of the anodizing porous formation process, as the anodizing current might be negatively impacted by the high resistivity. For example, after the completion of the anodizing process, an implant step for the formation of the resistivity of layer 4136 could be done prior to epitaxial step of layer 4180. In addition to modifying layer 4136 so it will have high resistivity, an additional process could be used to form on top of it a trap rich layer. The trap rich layer could also be formed prior to the formation of the epitaxial layer 4180. There are multiple techniques known in the art for the formation of trap rich layer. For example silicon-into-silicon implantation could be used together with hydrogen implant and RF plasma to cause platelet nucleation. For the formation of such trap-rich layer it might be advantageous to form a layer in-between layer 4134 and layer 4136 in a similar way to layer 3233 of FIG. 15B-1.

Alternatively a top layer of high resistivity may be formed by implant or any other method presented herein before or known in the art to be followed by forming oxide layer on top and then transferring an additional layer on top using an ion-cut technique or other layer transfer method. Combining some of the porous base structures with an ion-cut based layer transfer could be applied to any of the presented structures as an alternative way to construct stratum-2 or stratum-3.

Alternatively, the alternating layers could have alternating porosities of other levels such as layers 4132, 4136, 4140 with porosity of less than 30% while layers 4134, 4138, 4142 with porosity over 50%, or layers 4132, 4136, 4140 with a porosity of less than 55% while layers 4134, 4138, 4142 with porosity over 65%, or other alternating level of porosity based on the target application and process choices.

Figure 24C:
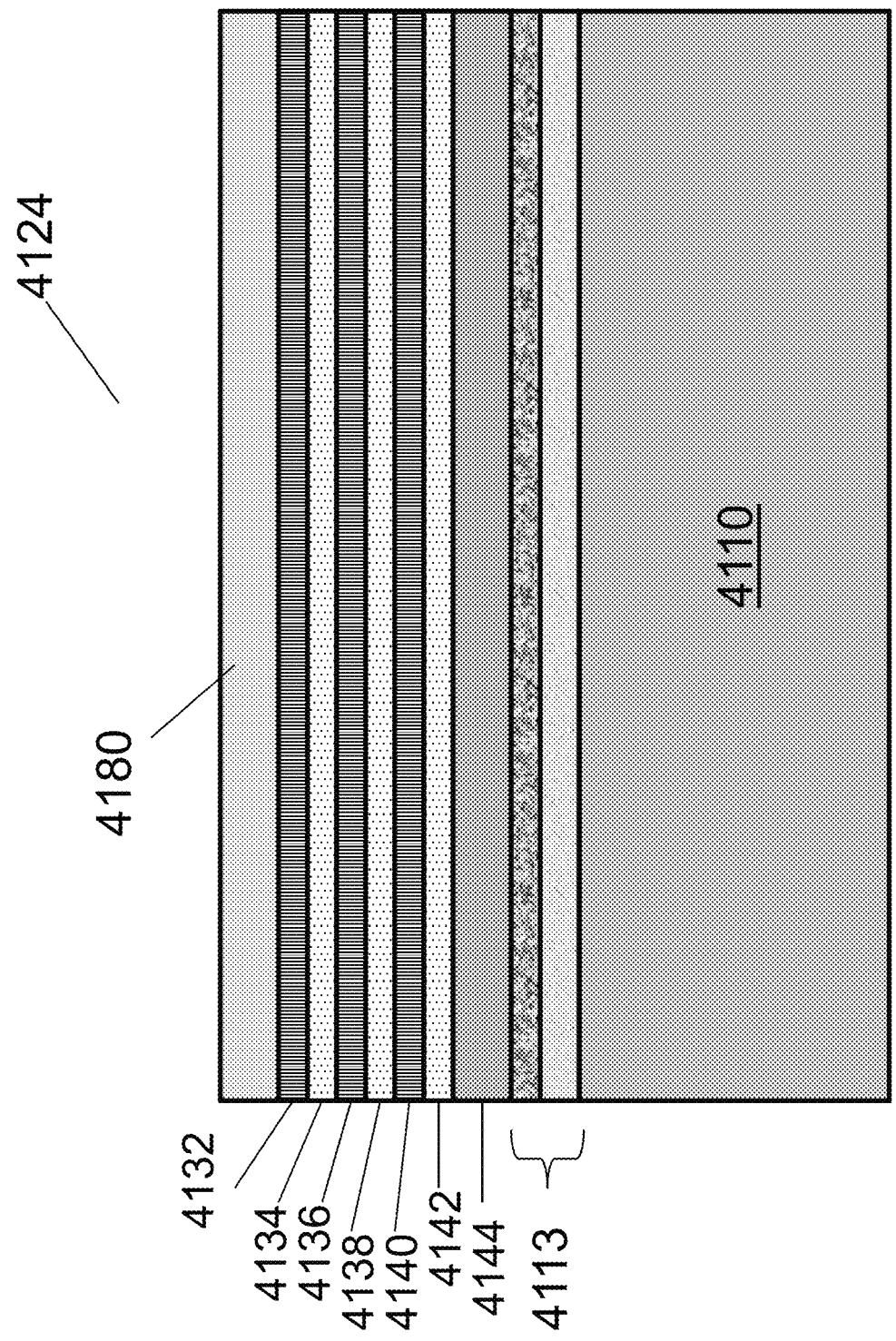

FIG. 24C illustrates the structure 4122 after a step of epitaxial growth forming crystalline layer 4180 which may be used for stratum-3 similar to what has been presented herein before.

The high temperature step used for the epitaxy of layer 4140 or an additional annealing step or the use of laser assisted annealing step would further reduce the porosity of the low porosity layers 4132, 4136, 4140. The laser could be made to focus on individual layers to further enhance the multilayer structure.

The structure 4124 could further processed to further improve the isolation of the isolation layer 4136, 4138 and 4142. Such could be done by etching holes in the structure for future lateral isolation or through structure vias and then further oxidized or etch the isolation layers. The large difference in porosity could enable control the isolation without losing the functionally of the layers 4132, 4136, 4140. Such holes could also be used to further enhance the layer functionality by heating and use of the proper gas materials.

Similar formation of such a multilayer structure could also be used for 3D memories in line of what was presented in U.S. Patent Application Publication No. 2017/0229174. For memory applications it could be desired to open a side etch window which could be part of the process for side gate formation, and then etch some of the porous layers and follow with epitaxial step for further improving the 3D memory future transistor channels.

These flows include first forming a multilayer structure and then processing the multilayer structure to construct multilayer IC (Integrated Circuit) devices. The multilayer structure could be formed by a vendor who is in the business of providing semiconductor substrates and/or raw wafers, while the processing of the various strata could be done by a fab (fabrication facility) which specializes in semiconductor integrated circuit manufacturing.

It could be preferred not to form the upper epitaxial layer 4180, but rather to leave it to the fab. At the fab instead of forming a generic epitaxial layer 4180, a pattern could be used to perform the epitaxial only in locations targeting transistors or other specific devices. This could be attractive, especially for fin-type transistors, since the conventional FinFET process includes an epitaxial step. An additional benefit could the fact that an epitaxial formation of the fin may naturally form a defect free fin, as defects prorogate at 45 degrees such that above the height of the fin width substantially all of the defects have already propagated to the wall, thereby leaving the upper part defect free. Such could help further reduce the cost of the multilayer structure.

Figure 25:
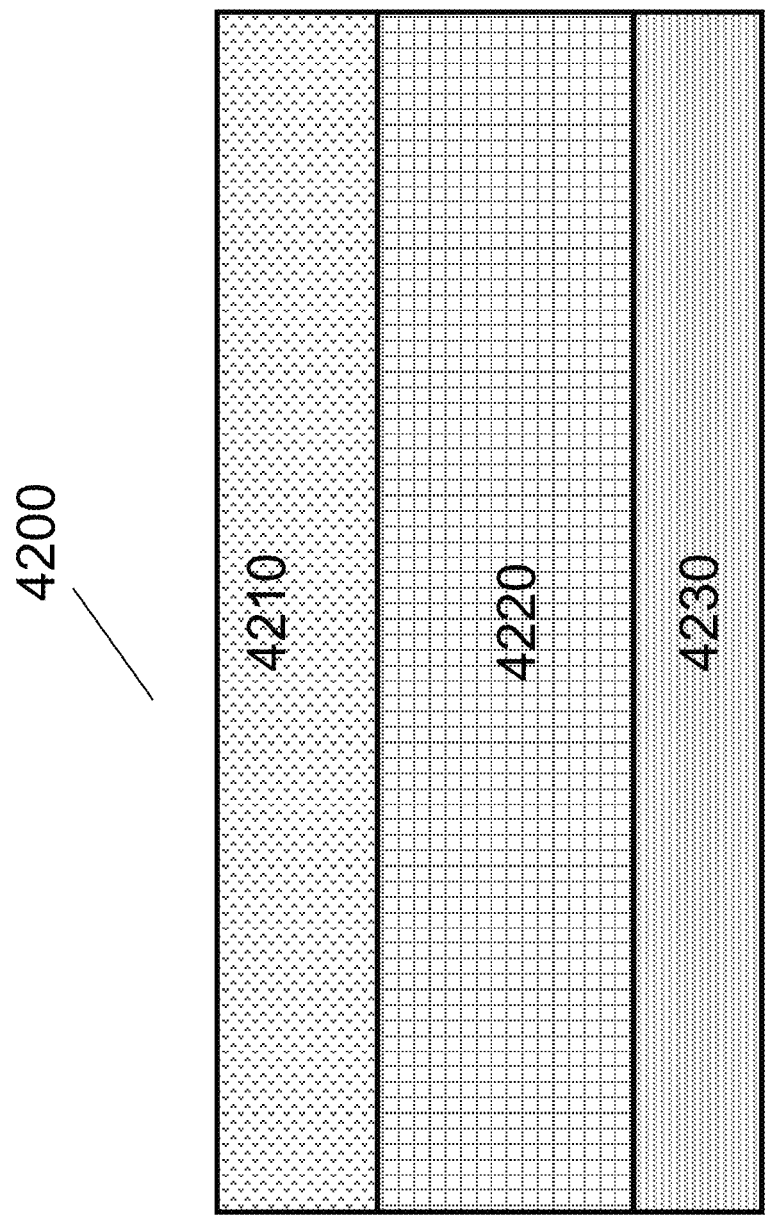
FIG. 25 is an exemplary illustration of a multi strata FPGA.

In U.S. Pat. No. 8,273,610 as related to at least FIG. 8A, a multi-strata FPGA device is illustrated. It has a first stratum called 'Foundation' 814 which may carry the programming transistors for the logic function 804 of the FPGA called 'house' and high above the 'Attic'—the programming transistors for the interconnect 810. A variation of such multi strata FPGA 4200 is illustrated in FIG. 25. The foundation logic programming 4230 could be stratum-3 such as has been described before such as stratum-3 2996 of FIG. 12E. The House 4220 could be stratum-2 such as has been described before such as stratum-2 2998, and the Attic 4210 could be stratum-1 such as has been described before such as target wafer 2995. There are multiple programming technologies which may be used for FPGA. SRAM and look up table are the most popular. Stratum-3 could carry the SRAM for the look-up tables and for the other logic function and stratum-1 could carry the programming transistors for antifuses that could be used for the programming of the routing as was described in U.S. Pat. No. 8,273,610. Many other variations are possible as well.

The transistors required for antifuse programming are relatively large and would not require the most leading edge process and stratum-1 could use some of the other techniques for 3D device such as the one described as RCAT, Junction-less devices.

Stratum-3 could also carry all the functions associated with the bit-stream interface for loading in the logic function, while stratum-1 could also carry all the functions associated with the bit-stream interface for loading in the routing function.

An attractive advantage of a multi-strata FPGA is the ability to reduce cost in volume production with minimal change to the functional device 4220—the House. Thus, stratum 3 could be removed by having planned in the House, so each SRAM programming signal coming from stratum-1 could have a pre-built replacement option such as a custom via connecting it to 'high' (Vdd) or to 'low' (Vss) instead. By having a custom layer such as a Via-1 layer, the function of stratum-3 could be replaced for high volume production giving up the field programmability or at least some of it.

In a similar way, stratum-1 could be replaced by replacing the antifuses with a custom via layer such as a via-6 layer.

In such case both the field programmable device and the volume device could be very much the same in respect to the House stratum-2 4220 portion but the volume device would be at a far lower cost to produce as it would not have either a stratum-1 and/or a stratum-3. So the field programmable device would have more than 8 layers that are just as the volume device but would not have the same amount of active transistors layers by not having stratum-1 and/or Stratum-3, their associated transistor and interconnect layers.

While this approach keeps the user function 4220 almost the same for the programmable version and the volume lower cost version, there might be some minor differences either since the on resistance of a via is less than the antifuse, and/or since the drive of via is better than that of an SRAM cell output. Those differences could be modeled and appropriate library and routing models could be provided so a designer can use his design tool (EDA) to validate correctness of the design for both implementations.

A paper presented at IEDM 2014 (paper #8.2) by D. S. Gardner at al., "Integrated On-Chip Energy Storage Using Porous-Silicon Electrochemical Capacitors," incorporated herein by reference, the authors teach the use of porous silicon for the formation of high capacity capacitors. Quoting: "In this work, electrochemical (EC) capacitors based on porous-silicon (P-Si) nanostructures with channel sizes 20 nm to 100 nm were synthesized and coated with atomic layer deposited (ALD) films or chemical vapor deposited (CVD) carbon." . . . "The pores can be formed in localized regions on the front side of a Si die or utilizing the backside bulk Si of integrated circuits". This type of capacitor could be integrated to one or more of the porous layer presented herein. Such could be integrated in the functional carrier 3585 to provide an alternative to the trench capacitor presented before in respect to FIG. 8 or to one of the porous layer presented in respect stratum-2 or stratum-3 such as layers second porous layer 3224 or third porous layer 3234. These capacitors could be used to help stabilize the supply lines such as Vdd and Vss, or to be part of supply voltage generation circuit such as charge pump, or even help store energy as part of on-chip energy harvesting circuits and networks.

Another use of capacitors constructed utilizing such porous layers could be for capacitor based DRAM. This could be an alternative to trench capacitors by forming it under the DRAM select transistor or as an alternative to place the capacitor utilizing porous layer(s) overlaying the DRAM select transistor. Or as a side capacitor by forming the porous area in a selected area assisted by lithography and structure and modified flow of those presented in U.S. Pat. No. 8,687,399, incorporated herein by reference. Such as presented in respect to FIG. 6A-J and FIG. 19.

Figure 26:
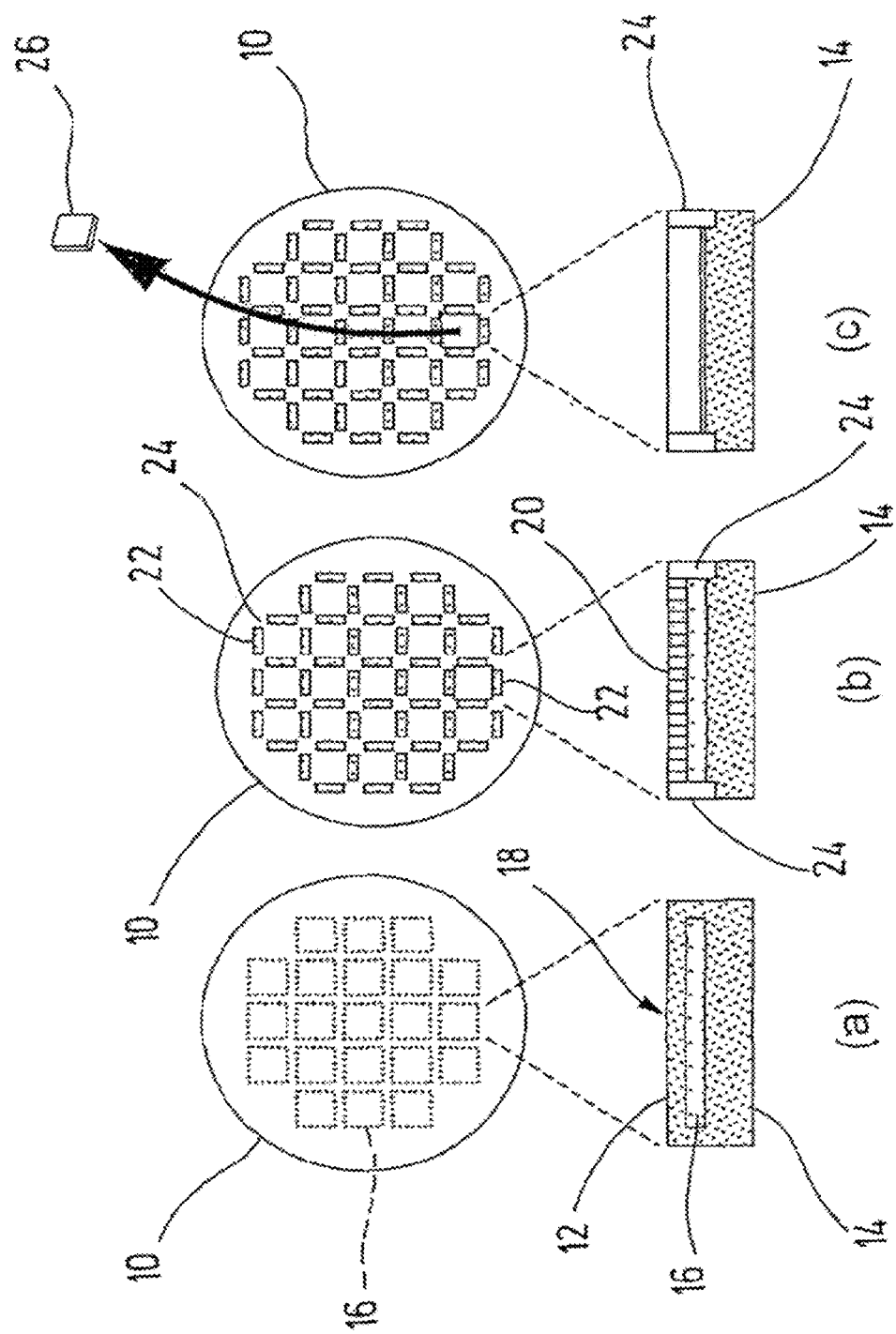
FIG. 26 is an illustration referring to an alternative technique for porous layer cut.

In U.S. Pat. Nos. 7,951,691 and 8,466,037, incorporated herein by reference, an alternative technique for porous layer cut is presented. FIG. 26 is the first figure of the prior art. In one embodiment of the prior art a wafer structure 10 having top surface 12 bottom surface 14. The prior art suggests to use mask step to form porous layer 16 only in the target die area and keeping the dicing streets 24 non porous. Having a porous on top of the porous layer an epitaxial layer is formed similar to what had been presented herein. On the epitaxial layer a circuit structure 20 is to be processed using semiconductor processing steps. When the circuits have been fully processed, a unique singulation is to be used. Instead of dicing along the dicing streets, an etch step to the porous layer could be used. This will allow pulling out a single die 26 out of the wafer dice at a time.

This type of 'cut per die' could be implemented for many of the structures presented herein. As etch to the porous layer would make allow it to free the die. This could be also be assisted by etching the underlying porous through the opening made in the 'streets'—dicing lanes. The porous layer could be etched at a rate of over 10,000× faster than the solid silicon—provide very good etch selectivity. A non-directional etch step could be used after the dicing lanes have been etched to the porous layer to further assist the release of each individual die. For example instead of flipping over and bonding the structure 3350 on top of a carrier wafer 3365 as was described before, the dicing lanes could be etched all the way to the porous layers 3304 of FIG. 16B. And then each die off the structure could be released on its own and then follow the desired process which could include:

A. Clean the porous residues underneath layer 3322.
B. Coat with protective coating.
C. Packaged as a final product or assembled into other structure.

Such could be attractive for many products including the described image sensor. The Carrier wafer could further be cleaned for reuse. A key aspect of this flow is that while a full wafer structure would be too thin to be handled without being bonded to some type of carrier, individual die could be small enough to be handled even if it is only few microns thick.

In general the semiconductor processes are done at wafer level to keep the cost down and only at the end the wafer is being diced and the individual dies are packaged to be integrated into the electronic system. Yet, the multi strata device could be a complex system where integrating individual dies could provide some important advantages such as:

A. Each die could be tested and then only the good dies would be picked to be integrated to the multi strata system.
B. The individual die could be smaller than the underlying dies it is being integrated into. If a whole wafer needs to be bonded for the integration then a part of that wafer might be wasted as the die size is defined by the underlying die and not by the required function area of the specific stratum.
C. The wafer from which a die is being picked might have different size than the wafer structure it is being integrated to. Today there multiple wafer sizes used by the industry ranging from 50 mm to 300 mm (2" to 12") with 450 mm being considered for the future. In addition, some materials such as non-silicon wafers (GaAs, GaN) are not available at the larger wafer size. The ability to pick and integrate individual dies into a multi strata wafer structure could extend the heterogeneous integration of 3D IC way beyond what would be available if only wafer level integration is used.

While the above description is about individual dies, an alternative approach could be some group of dies. Especially when the objective is to bond them into a multi-strata 3D wafer structure. By grouping dice, some cost saving could be achieved for the process of pick and place die to wafer. And some benefit would be achieved in respect to potential lithography steps that might take place for further interconnect and follow-up processing. Such groups of dice could be 4 dies at a time or reticle (as used in stepper base lithography) at a time. Each 'semiconductor unit' whether a die or group of dies that is designed to be individually picked and bonded could have its own alignment marks to support precise placement and bonding and precise alignment of successive lithography steps or other processes to it. This successive lithography step could be conventional mask based or may include direct write e-beam which provides a better per die flexibility. The use of an e-beam could be effective as the per die connection between strata could be constructed to be limited type of pattern such as via, horizontal fixed size strips and/or vertical fix size strips. Such a limited set of pattern could be made as a fixed pattern of the e-beam machine thereby reducing the number of shots using a shaped beam and thus increase throughput and reduce costs.

Also dies from different wafers could be bonded into one layer of the multi strata structure similar to the illustration of FIG. 12E of U.S. Pat. No. 8,273,610.

Die to wafer picking and bonding equipment do exist today. In most cases they are designed to handle die that are being cut from a regular wafer of about 700 micron thick or from wafer that has thinned down to about 50 micron. For the multi strata application described herein the die to wafer bonder should be designed to handle die that is thinned to about a micron or even less. Such thin die is more flexible and the equipment should be designed accordingly. The thin die would be easier to align to the target wafer as it thin enough for the alignment marks of the target wafer to be detected through it. Keeping good temperature control and matching the temperature of the 'semiconductor unit' and the target wafer could allow very precise placing and bonding to the level of less than one micron or even less than 0.1 micron.

For avoiding use of bad dies, testing of the dies could be done prior to the pick and bond phase. It could be preferred to do such wafer probing without physically contacting the die under test as presented in respect to FIG. 86C of U.S. Pat. No. 8,273,610, and FIG. 24C of U.S. Pat. No. 8,669,778. The concept of high efficiency contactless wafer probing is also presented in U.S. patent application Ser. Nos. 13/465, 142, 14/006,020 incorporated herein by reference and other similar disclosures know in the art. In general, test signals are exchanged with the wafer under test using a probe card or a probing wafer, wherein a wireless contact may be achieved by utilizing capacitive coupling, inductive coupling or even electro-optical coupling. To power the wafer under test, a contact could be made with special power pads integrated within each die or in the other area of the wafer, for example, such as the dicing streets, to provide power to a device under test. In addition, contactless powering could be used as was described earlier herein utilizing energy coupling and harvesting such as capacitive coupling, inductive coupling or even electro-optical coupling. In this alternative the picked die could resemble the structure of FIG. 16D.

Figure 27A:
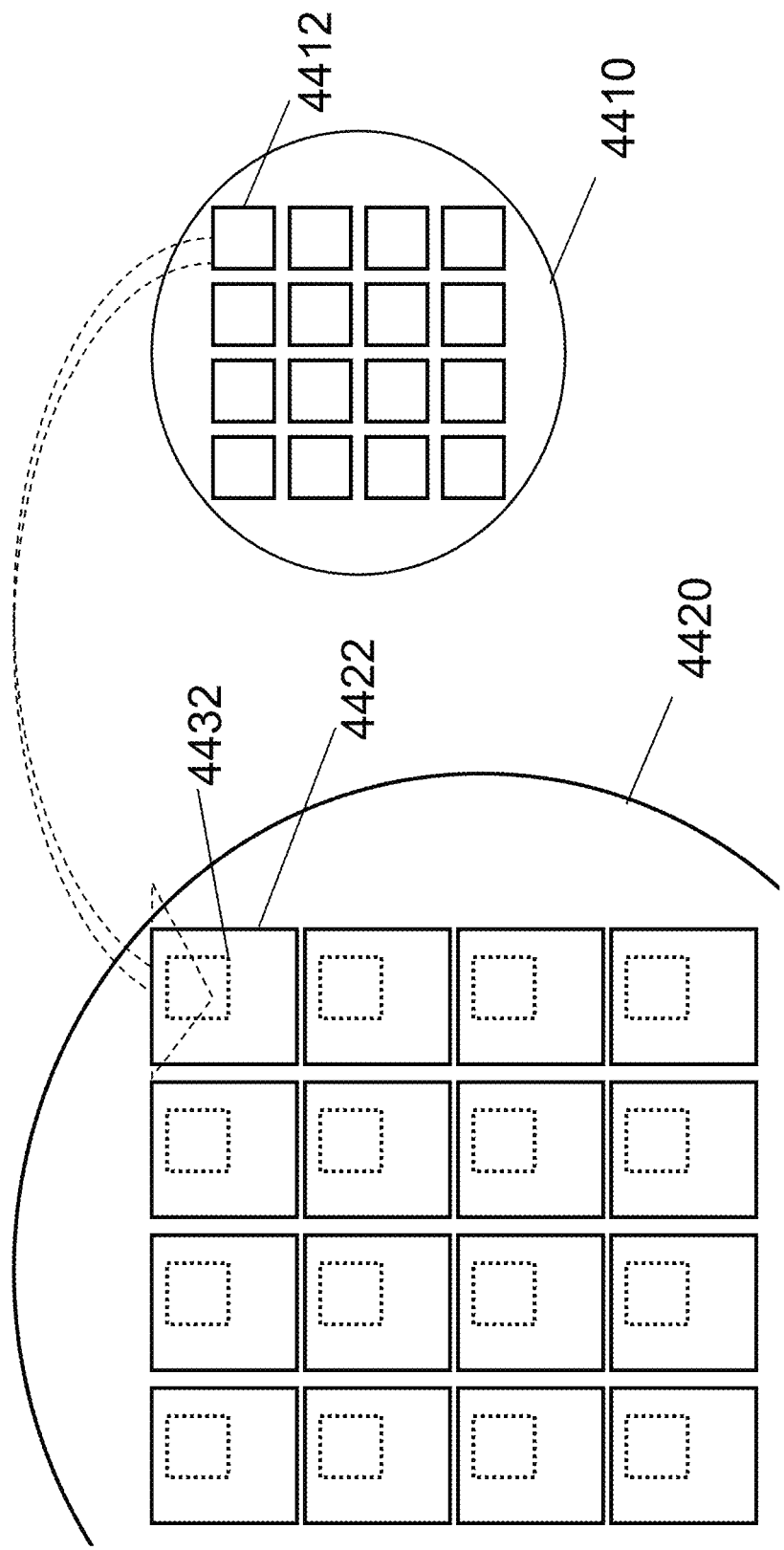
FIGS. 27A and 27B are exemplary illustrations of picking and placing dies.

FIG. 27A illustrates picking dies 4412 from a smaller size wafer 4410 and placing them onto a larger wafer 4420 onto a larger die 4422 at a designated location 4432. The picked die could be a structure formed with stratum-2, stratum-3 and their interconnections as illustrated in FIG. 18B. The porous residues could be cleaned for each die after it was picked up. Alternatively the machine could flip the die and bond it face down to the target wafer and the cleaning could be done after all dies been placed for the fully populated target wafer. The designated location could be formed by a lithography base step of the target wafer as a preparation step. The bonding of the dies to the target wafer could be oxide to oxide to be followed up by steps to form the proper interconnects. Alternatively the bonding could be metal to metal or hybrid bonding forming the connection together with the bonding steps. Face to face bonding is well known in the art and by preparing the target wafer and to bonded structure the proper bonding pads could facilitate die to target wafer interconnects. The target wafer could already comprise multi strata as part of even more complex 3D IC fabrication. Following the full population of the target wafer an oxide or other layer such as high density polymers could be deposited on it to seal the structure and then it could be prepared for further 3D integration by planarization and connection layer processing including forming layers of redistribution of these connection for the next dies or wafer.

Another alternative is to have the detached die relatively thicker to assist with its improved mechanical strength. Then after placing and bonding, subsequently thin these dies to assist with vertical connectivity. Such post-bonding thinning could leverage a porous layer in a similar way to what has been presented before herein.

Figure 27B:
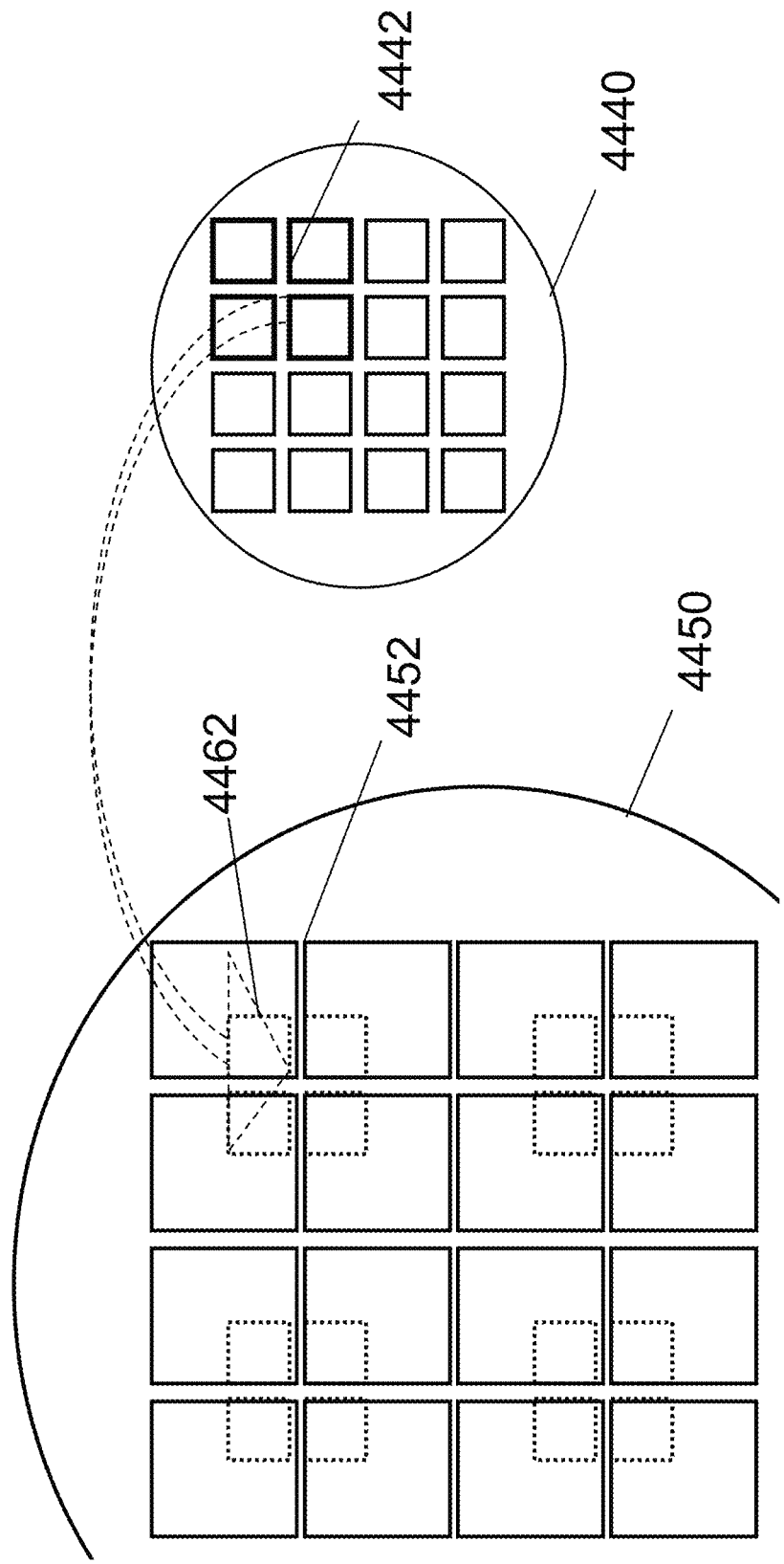

FIG. 27B illustrates picking a 4 dies semiconductor unit 4442 from a wafer 4440 to be placed onto a larger 4 die target 4452 of a target wafer 4450 into a designated location 4462. The illustration of FIG. 27B suggests how to accommodate transferring 4 smaller dies 4442 onto larger dies 4452. Rotating dies by 90° degrees might not be allowed in some advanced nodes due to lithography limitation which would limit this approach to just two dies. This approach would require additional complexity in testing and packaging that might reduce the gains to make it less practical. In general if the dies and the target wafer dies are designed to have the same size then picking multiple dies at time would far easier to implement. Semiconductor unit to be a reticle size could be a good choice.

Another alternative is to pick dies and place them into a carrier wafer and then move the carrier wafer onto the target wafer as is illustrated in FIG. 28A to FIG. 28C. FIG. 28A illustrates a carrier wafer constructed in a similar way to the wafer structure illustrated in FIG. 30B. The bulk wafer 4510 may be processed to form a cut layer including two porous layers lower 4512 and upper 4514 designed for a future cut. Layer 4520 could be epitaxial silicon or a deposited layer of oxide, poly silicon or other material or combination of more the one material. FIG. 28B illustrates the carrier wafer structure after an optional formation of cavities 4522 for future die placement. The cavities could be formed by lithography and etch steps. Care should be taken so the cavity depth is well controlled. This could be assisted by prior proper oxidation of layer 4514. Alternatively the upper layer 4520 could start as a thin layer which will be patterned for future cavities by oxide or other non-silicon layer, and then the epitaxial step could be done for all areas not covered by the patterned oxide forming the walls of the cavities. And another alternative is to not form cavities at all. It is advantageous to pattern alignment marks to assist precise placement and bonding of the dies or the group of dies. FIG. 28C illustrates the carrier wafer after being populated with dies 4532. The populated carrier wafer 4540 could now be processed to form interconnect distribution layers and flipped over to be bonded and potentially connected to a target wafer structure.

The bonding could be oxide to oxide which would be followed by via formation through the multi-layer die structure followed by interconnection layers formation or metal to metal or hybrid bonding. There are many techniques for the formation of this multi-strata 3D IC wafer. Some of those techniques have been presented in U.S. Pat. No. 8,273,610 as related to at least these figures: FIG. 30 to FIG. 33, FIG. 73 to FIG. 80, FIG. 93 to FIG. 94, and FIG. 155.

The 3D IC system processing and the ability to mix strata of wafer level and populated die level open multiple alternatives to manage one of the critical challenges in semiconductor manufacturing—yield. This could involve any or all of the following options:
  A. Test the target wafer and only bond dies to yielded target die.
  B. Use repair and redundancy only for target dies that tested to have defects.
  C. Use smaller than full die repair for target die with defects only in small sections.
  D. Use pass-through dies for target dies or their sections that do not need repair. The pass-through dies could assist the integration of additional strata.
  Methods for 3D enabled repair have been presented in U.S. Pat. No. 8,273,610 in respect to at least FIG. 41, FIG. 86A-D, FIG. 87, FIG. 114, FIG. 119-126, FIG. 184-188. And also in U.S. Pat. No. 8,669,778, incorporated herein by reference, in respect to at least FIG. 17, FIG. 24, FIG. 26, FIG. 27 and FIG. 31-38. This patent also presents contactless probing and testing with respect to at least FIG. 24C and FIG. 29-30. U.S. application Ser. No. 13/796,930, issued as a U.S. Pat. No. 8,994,404, and incorporated herein by reference, in respect to at least FIG. 26 and FIG. 31 teach the die to wafer repair option. The die to wafer scheme enables a repair alternative. For example, instead of using direct write eBeam as has been suggested in respect to FIG. 86A, multiple repair dies could be available for the repair of each layer (Layer 1, Layer 2, . . . Layer n) in the 3D device. Based on the defects found for a specific 3D die the correct repair die could be selected. Having the fine grain flexibility to bond different die or die portions to each location on the wafer could allow the use of a repair die bank instead of using direct write eBeam.

The teaching herein in respect to die or semiconductor unit is applicable just as well to any portion of a die or reticle defined pattern. These portions could be defined by having potential dice lines or defined by etch dice lines or isolation lines as presented in the patent incorporated by reference such as: U.S. Pat. No. 8,669,778, in at least FIG. 9-16 and FIG. 22-23; U.S. Pat. No. 8,687,399, incorporated herein by reference, in at least FIG. 29-30; U.S. Pat. No. 8,536,023, incorporated herein by reference; in at least FIG. 27A-F; and U.S. Pat. No. 8,273,610; in respect to at least FIG. 9-12, FIG. 84 A-G, FIG. 183A-C and FIG. 211-215. These techniques could be effective to any repeating circuits such as Gate-Array, FPGA, Memories, Image Sensor and multi core. The repeating structure could be built in high volume, and specific application could be cut off it the desired size allowing good fit to the application resulting in reduced development and NRE cost and benefiting from volume production of generic product. This allows what could be called 'Lego' construction of a specific product by leveraging pieces of standard products.

Similar concepts could be also called platform based design where there are base strata on which additional strata or die could be added to form custom 3D IC systems from some building blocks that could serve other application as well, such as presented in respect to at least FIG. 2 herein or FIG. 52 of U.S. application Ser. No. 13/796,930, and in U.S. Pat. No. 8,687,399 at least FIG. 16-17, FIG. 21 A-C and FIG. 29-30. The connection between these strata could leverage on-device computer bus or Network on Chip (NOC) for convenient modularity. Establishing standards and other system methodologies could be useful for these type of 3D devices.

Manufacturing wafers with advanced lithography and multiple metal layers is expensive. Manufacturing three-dimensional devices, including monolithic 3D devices, where multiple advanced lithography layers or strata each with multiple metal layers are stacked on top of each other is even more expensive. The vertical stacking process offers new degree of freedom that can be leveraged with appropriate Computer Aided Design ("CAD") tools to lower the manufacturing cost.

Most designs are made of blocks, but the characteristics of these block is frequently not uniform. Consequently, certain blocks may require fewer routing resources, while other blocks may require very dense routing resources. In two dimensional devices the block with the highest routing density demands dictates the number of metal layers for the whole device, even if some device regions may not need them. Three dimensional devices offer a new possibility of partitioning designs into multiple layers or strata based on the routing demands of the blocks assigned to each layer or strata.

Another variation on this invention is to partition designs into blocks that require a particular advanced process technology for reasons of density or speed, and blocks that have less demanding requirements for reasons of speed, area, voltage, power, or other technology parameters. Such partitioning may be carried into two or more partitions and consequently different process technologies or nodes may be used on different vertical layers or strata to provide optimized fit to the design's logic and cost demands. This is particularly important in mobile, mass-produced devices, where both cost and optimized power consumption are of paramount importance.

Synthesis CAD tools currently used in the industry for two-dimensional devices include a single target library. For three-dimensional designs these synthesis tools or design automation tools may need to be enhanced to support two or more target libraries to be able to support synthesis for disparate technology characteristics of vertical layers or strata. Such disparate layers or strata will allow better cost or power optimization of three-dimensional designs.

Figure 29:
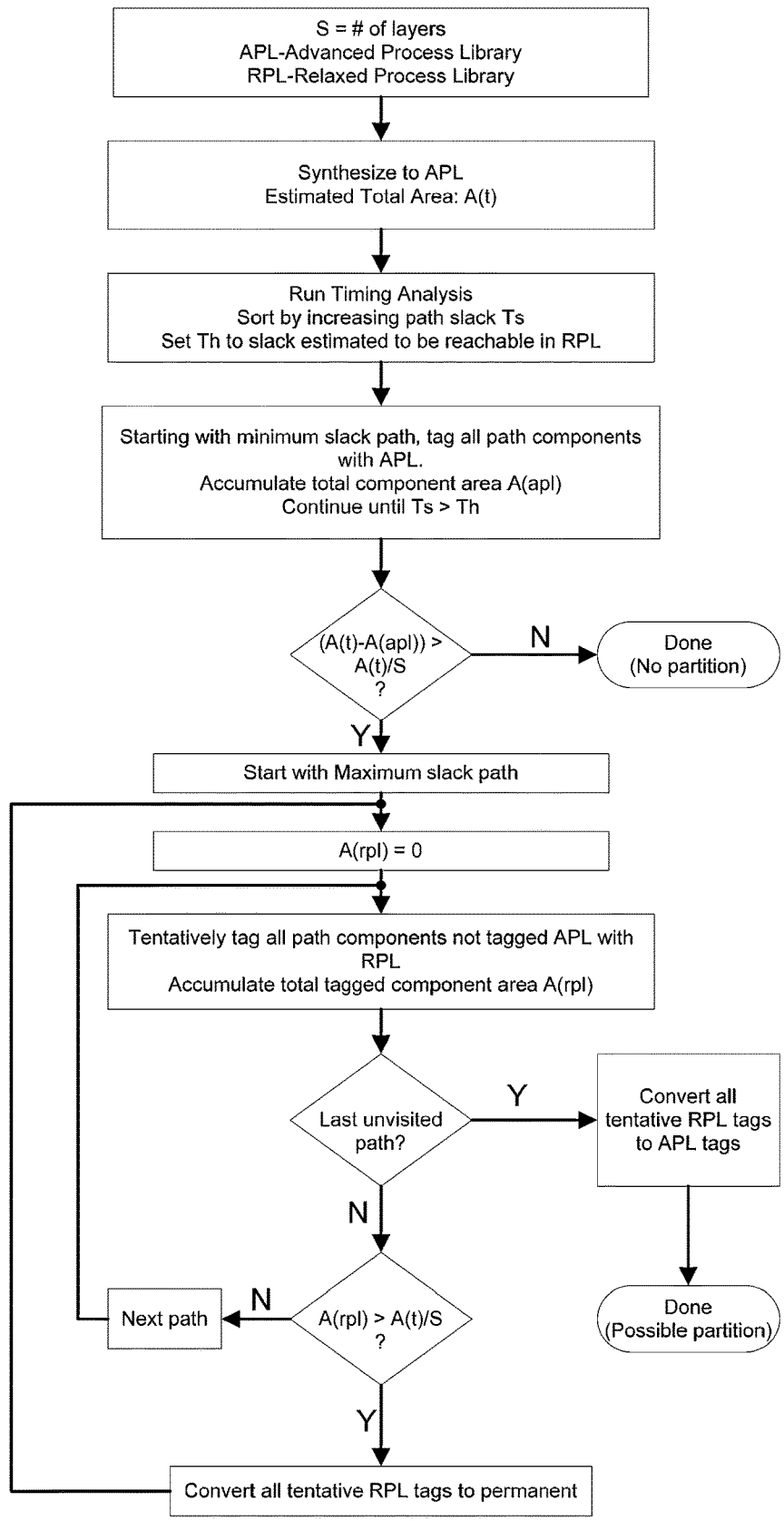
FIG. 29 illustrates a flowchart of partitioning a design into two disparate target technologies based on timing requirements.

FIG. 29 is a flowchart illustration for an algorithm partitioning a design into two target technologies, each to be placed on a separate layer or strata, when the synthesis tool or design automation tool does not support multiple target technologies. One technology, APL (Advanced Process Library), may be faster than the other, RPL (Relaxed Process Library), with concomitant higher power, higher manufacturing cost, or other differentiating design attributes. The two target technologies may be two different process nodes, wherein one process node, such as the APL, may be more advanced in technology than the other process node, such as the RPL. The RPL process node may employ much lower cost lithography tools and have lower manufacturing costs than the APL.

The partitioning starts with synthesis into APL with a target performance. Once complete, timing analysis may be done on the design and paths may be sorted by timing slack. The total estimated chip area A(t) may be computed and reasonable margins may be added as usual in anticipation of routing congestion and buffer insertion. The number of vertical layers S may be selected and the overall footprint A(t)/S may be computed.

In the first phase components belonging to paths estimated to require APL, based on timing slack below selected threshold Th, may be set aside (tagged APL). The area of these component may be computed to be A(apl). If A(apl) represents a fraction of total area A(t) greater than (S−1)/S then the process terminates and no partitioning into APL and RPL is possible—the whole design needs to be in the APL.

If the fraction of the design that requires APL is smaller than (S−1)/S then it is possible to have at least one layer of RPL. The partitioning process now starts from the largest slack path and towards lower slack paths. It tentatively tags all components of those paths that are not tagged APL with RPL, while accumulating the area of the marked components as A(rpl). When A(rpl) exceeds the area of a complete layer, A(t)/S, the components tentatively marked RPL may be permanently tagged RPL and the process continues after resetting A(rpl) to zero. If all paths are revisited and the components tentatively tagged RPL do not make for an area of a complete layer or strata, their tagging may be reversed back to APL and the process is terminated. The reason is that we want to err on the side of caution and a layer or stratum should be an APL layer if it contains a mix of APL and RPL components.

The process as described assumes the availability of equivalent components in both APL and RPL technology. Ordinary persons skilled in the art will recognize that variations on this process can be done to accommodate non-equivalent technology libraries through remapping of the RPL-tagged components in a subsequent synthesis pass to an RPL target library, while marking all the APL-tagged components as untouchable. Similarly, different area requirements between APL and RPL can be accommodated through scaling and de-rating factors at the decision making points of the flow. Moreover, the term layer, when used in the context of layers of mono-crystalline silicon and associated transistors, interconnect, and other associated device structures in a 3D device, such as, for example, uncommitted repair layer 2432 (found in FIG. 24 of parents Ser. Nos. 15/477,106 and 14/642,724), may also be referred to as stratum or strata.

The partitioning process described above can be re-applied to the resulting partitions to produce multi-way partitioning and further optimize the design to minimize cost and power while meeting performance objectives.

The challenge of aligning preformed or partially preformed planar transistors to the underlying layers and substrates may be overcome by the use of repeating structures on the donor wafer or substrate and the use of metal connect landing strips either on the acceptor wafer only or on both the donor and acceptor wafers. The metal connect landing strips may be formed with metals, such as, for example, copper or aluminum, and may include barrier metals, such as, for example, TiN or WCo. Repeating patterns in one direction, for example, North to South repeats of preformed structures may be accomplished with the alignment scheme and metal landing strips as described previously with reference to the FIG. 33 of incorporated reference U.S. Pat. No. 8,273,610. The gate last HKMG process may be utilized to create a pre-processed donor wafer that builds not just one transistor type but both types by utilizing alternating parallel strips or rows that may be the die width plus maximum donor wafer to acceptor wafer misalignment in length.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3D IC technology described herein may be found at least in FIG. 156 of U.S. Pat. No. 8,273,610, the contents of which are incorporated by reference.

Furthermore, some embodiments of the invention may include alternative techniques to build systems based on integrated 3D devices including techniques and methods to construct 3D IC based systems that communicate with other 3DIC based systems. Some embodiments of the invention may enable system solutions with far less power consumption and intercommunication abilities at lower power than prior art. These systems may be called 'Internet of Things", or IoT, systems, wherein the system enabler is a 3DIC device which may provide at least three functions: a sensing capability, a digital and signal processing capability, and communication capability. For example, the sensing capability may include a region or regions, layer or layers within the 3DIC device which may include, for example, a MEMS accelerometer (single or multi-axis), gas sensor, electric or magnetic field sensor, microphone or sound sensing (air pressure changes), image sensor of one or many wavelengths (for example, as disclosed in at least U.S. Pat. Nos. 8,283,215 and 8,163,581, incorporated herein by reference), chemical sensing, gyroscopes, resonant structures, cantilever structures, ultrasonic transducers (capacitive & piezoelectric). Digital and signal processing capability may include a region or regions, layer or layers within the 3D IC device which may include, for example, a microprocessor, digital signal processor, micro-controller, FPGA, and other digital land/or analog logic circuits, devices, and subsystems. Communication capability, such as communication from at least one 3D IC of IoT system to another, or to a host controller/nexus node, may include a region or regions, layer or layers within the 3D IC device which may include, for example, an RF circuit and antenna or antennas for wireless communication which might utilize standard wireless communication protocols such as G4, WiFi or Bluetooth, I/O buffers and either mechanical bond pads/wires and/or optical devices/transistors for optical communication, transmitters, receivers, codecs, DACs, digital or analog filters, modulators.

Energy harvesting, device cooling and other capabilities may also be included in the system. The 3DIC inventions disclosed herein and in the incorporated referenced documents enable the IoT system to closely integrate different crystal devices, for example a layer or layers of devices/transistors formed on and/or within mono or poly crystalline silicon combined with a layer or layers of devices/transistors formed on and/or within Ge, or a layer of layers of GaAs, InP, differing silicon crystal orientations, and so on. For example, incorporating the 3D IC semiconductor devices according to some embodiments of the invention as or within the IoT systems and mobile systems could provide superior IoT or mobile systems that could operate much more efficiently and for a much longer time than with prior art technology. The 3D IC technology herein disclosed provides a most efficient path for heterogeneous integration with very effective integration reducing cost and operating power with the ability to support redundancy for long field life and other advantages which could make such an IoT System commercially successful.

Alignment is a basic step in semiconductor processing. For most cases it is part of the overall process flow that every successive layer is patterned when it is aligned to the layer below it. These alignments could all be done to one common alignment mark, or to some other alignment mark or marks that are embedded in a layer underneath. In today's equipment such alignment would be precise to below a few nanometers and better than 40 nm or better than 20 nm and even better than 10 nm. In general such alignment could be observed by comparing two devices processed using the same mask set. If two layers in one device maintain their relative relationship in both devices—to few nanometers—it is clear indication that these layers are aligned each to the other. This could be achieved by either aligning to the same alignment mark (sometimes called a zero mark alignment scheme), or one layer is using an alignment mark embedded in the other layer (sometimes called a direct alignment), or using different alignment marks of layers that are aligned to each other (sometimes called an indirect alignment).

In this document, the connection made between layers of, generally, single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate. Similarly, donor wafers herein may be substantially comprised of a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

While mono-crystalline silicon has been mentioned as a transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may or may not be stacked in a substantially vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. First silicon layers or transistor channels and second silicon layers or transistor channels may be may be substantially absent of semiconductor dopants to form an undoped silicon region or layer, or doped, such as, for example, with elemental or compound species that form a p+, or p, or p−, or n+, or n, or n− silicon layer or region. A heat removal apparatus may include an external surface from which heat transfer may take place by methods such as air cooling, liquid cooling, or attachment to another heat sink or heat spreader structure. Furthermore, raised source and drain contact structures, such as etch and epi SiGe and SiC, and implanted S/Ds (such as C) may be utilized for strain control of transistor channel to enhance carrier mobility and may provide contact resistance improvements. Damage from the processes may be optically annealed. Strain on a transistor channel to enhance carrier mobility may be accomplished by a stressor layer or layers as well.

In this specification the terms stratum, tier or layer might be used for the same structure and they may refer to transistors or other device structures (such as capacitors, resistors, inductors) that may lie substantially in a plane format and in most cases such stratum, tier or layer may include the interconnection layers used to interconnect the transistors on each. In a 3D device as herein described there may at least two such planes called tier, or stratum or layer.

In a 3D IC system stack, each layer/stratum may include a different operating voltage than other layers/stratum, for example, one stratum may have Vcc of 1.0 v and another may have a Vcc of 0.7 v. For example, one stratum may be designed for logic and have the appropriate Vcc for that process/device node, and another stratum in the stack may be designed for analog devices, and have a different Vcc, likely substantially higher in value—for example, greater than 3 volts, greater than 5 volts, greater than 8 volts, greater than 10 volts. In a 3D IC system stack, each layer/stratum may include a different gate dielectric thickness than other layers/stratum. For example, one stratum may include a gate dielectric thickness of 2 nm and another 10 nm. The definition of dielectric thickness may include both a physical definition of material thickness and an electrically 'effective' thickness of the material, given differing permittivity of the materials. In a 3D IC system stack, each layer/stratum may include different gate stack materials than other layers/stratum. For example, one stratum may include a HKMG (High k metal gate) stack and another stratum may include a polycide/silicon oxide gate stack. In a 3D IC system stack, each layer/stratum may include a different junction depth than other layers/stratum. For example, the depth of the junctions may include a FET transistor source or drain, bipolar emitter and contact junctions, vertical device junctions, resistor or capacitor junctions, and so on. For example, one stratum may include junctions of a fully depleted MOSFET, thus its junction depth may be defined by the thickness of the stratum device silicon to the vertical isolation, and the other stratum may also be fully depleted devices with a junction depth defined similarly, but one stratum has a thicker silicon layer than the other with respect to the respective edges of the vertical isolation. In a 3D IC system stack, each layer/stratum may include a different junction composition and/or structure than other layers/stratum. For example, one stratum may include raised source drains that may be constructed from an etch and epitaxial deposition processing, another stratum in the stack may have implanted and annealed junctions or may employ dopant segregation techniques, such as those utilized to form DSS Schottky transistors.

Some 3D device flows presented herein suggest the use of the ELTRAN or modified ELTRAN techniques and in other time a flow is presented using the ion-cut technique. It would be obvious for someone skilled in the art to suggest an alternative process flow by exchanging one layer transfer technique with another. Just as in some steps one could exchange these layer transfer techniques with others presented herein or in other publication such as the bonding of SOI wafer and etch back. These would be variations for the described and illustrated 3D process flows presented herein.

In various places here or in the incorporated by reference disclosures of heat removal techniques have been presented and illustrated. It would be obvious to person skilled in the art to apply these techniques to any of the other variations of 3D devices presented herein.

In various places here or in the incorporated by reference disclosures of repair and redundancy techniques have been presented and illustrated. It would be obvious to person skilled in the art to apply these techniques to any of the other variations of 3D devices presented herein.

In various places here or in the incorporated by reference disclosures memories and other circuit and techniques of customizing and integrating these structures have been presented and illustrated. It would be obvious to person skilled in the art to apply these techniques and structures to any of the other variations of 3D devices presented herein.

It should be noted that one of the design requirements for a monolithic 3D IC design may be that substantially all of the stacked layers and the base or substrate would have their respective dice lines (may be called scribe-lines) aligned. As the base wafer or substrate is processed and multiple circuits may be constructed on semiconductor layers that overlay each other, the overall device may be designed wherein each overlaying layer would have its respective dice lines overlying the dice lines of the layer underneath, thus at the end of processing the entire layer stacked wafer/substrate could be diced in a single dicing step. There may be test structures in the streets between dice lines, which overall may be called scribe-lanes or dice-lanes. These scribe-lanes or dice-lanes may be 10 um wide, 20 um wide, 50 um wide 100 um wide, or greater than 100 um wide depending on design choice and die singulation process capability. The scribe-lanes or dice-lanes may include guard-ring structures and/or other die border structures. In a monolithic 3D design each layer test structure could be connected through each of the overlying layers and then to the top surface to allow access to these 'buried' test structure before dicing the wafer. Accordingly the design may include these vertical connections and may offset the layer test structures to enable such connection. In many cases the die borders comprise a protection structure, such as, for example, a guard-ring structure, die seal structure, ESD structure, and others elements. Accordingly in a monolithic 3D device these structures, such as guard rings, would be designed to overlay each other and may be aligned to each other during the course of processing. The die edges may be sealed by a process and structure such as, for example, described in relation to FIG. 183C of incorporated U.S. Pat. No. 8,273,610, and may include aspects as described in relation to FIGS. 183A and 183B of same reference. One skilled in the art would recognize that the die seal can be passive or electrically active. On each 3D stack layer, or stratum, the electronic circuits within one die, that may be circumscribed by a dice-lane, may not be connected to the electronic circuits of a second die on that same wafer, that second die also may be circumscribed by a dice-lane. Further, the dice-lane/scribe-lane of one stratum in the 3D stack may be aligned to the dice-lane/scribe-lane of another stratum in the 3D stack, thus providing a direct die singulation vector for the 3D stack of strata/layers.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Moreover, epitaxial regrow of source and drains may utilize processes such as liquid phase epitaxial regrowth or solid phase epitaxial regrowth, and may utilize flash or laser processes to freeze dopant profiles in place and may also permit non-equilibrium enhanced activation (superactivation). Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus the invention is to be limited only by the appended claims.

We claim:

1. A 3D semiconductor device, the device comprising:
   a first level,
      wherein said first level comprises a first layer, said first layer comprising first transistors, and wherein said first level comprises a second layer, said second layer comprising first interconnections;
a second level overlaying said first level,
wherein said second level comprises a plurality of second transistors,
wherein said second level comprises a third layer, said third layer comprising first conductive lines;
a third level overlaying said second level,
wherein said third level comprises a plurality of third transistors,
wherein said third level comprises a fourth layer, said fourth layer comprising second conductive lines; and
a plurality of connection paths,
wherein said plurality of connection paths provides electrical connections at least from a plurality of said first transistors to said plurality of third transistors, and
wherein said first level comprises at least one voltage regulator.

2. The device according to claim 1,
wherein said first level comprises at least one PLL circuit.

3. The device according to claim 1,
wherein said first level comprises at least one SerDes circuit.

4. The device according to claim 1,
wherein said second level is bonded to said first level,
wherein said bonded comprises oxide-to-oxide bond regions,
wherein said bonded additionally comprises metal-to-metal bond regions made on a same level as said oxide-to-oxide bond regions.

5. The device according to claim 1,
wherein said first level comprises a first data bus,
wherein said third level comprises a second data bus, and
wherein at least one of said connection paths comprises an electrical connection between said first data bus and said second data bus.

6. The device according to claim 1,
wherein said first level comprises a first die area,
wherein said second level comprises a second die area, and
wherein said first die area is greater than said second die area.

7. The device according to claim 1,
wherein said first level comprises at least one control circuit,
wherein said second level comprises at least one memory array, and
wherein said control circuit controls data written to said at least one memory array.

8. A 3D semiconductor device, the device comprising:
a first level,
wherein said first level comprises a first layer, said first layer comprising first transistors, and
wherein said first level comprises a second layer, said second layer comprising first interconnections;
a second level overlaying said first level,
wherein said second level comprises a plurality of second transistors,
wherein said second level comprises a third layer, said third layer comprising first conductive lines;
a third level overlaying said second level,
wherein said third level comprises a plurality of third transistors,
wherein said third level comprises a fourth layer, said fourth layer comprising second conductive lines; and
a plurality of connection paths,
wherein said plurality of connection paths provides electrical connections from a plurality of said first transistors to said plurality of third transistors, and
wherein said first level comprises at least one PLL circuit.

9. The device according to claim 8,
wherein said first level comprises at least one voltage regulator.

10. The device according to claim 8,
wherein said first level comprises at least one SerDes circuit.

11. The device according to claim 8,
wherein said second level is bonded to said first level,
wherein said bonded comprises oxide-to-oxide bond regions, and
wherein said bonded additionally comprises metal-to-metal bond regions made on a same level as said oxide-to-oxide bonds.

12. The device according to claim 8,
wherein said first level comprises a first data bus,
wherein said third level comprises a second data bus, and
wherein at least one of said connection paths comprises an electrical connection between said first data bus and said second data bus.

13. The device according to claim 8,
wherein said first level comprises a first die area,
wherein said second level comprises a second die area, and
wherein said first die area is greater than said second die area.

14. The device according to claim 8,
wherein said first level comprises at least one control circuit,
wherein said second level comprises at least one memory array, and
wherein said control circuit controls data written to said at least one memory array.

15. A 3D semiconductor device, the device comprising:
a first level,
wherein said first level comprises a first layer, said first layer comprising first transistors, and
wherein said first level comprises a second layer, said second layer comprising first interconnections;
a second level overlaying said first level,
wherein said second level comprises a plurality of second transistors,
wherein said second level comprises a third layer, said third layer comprising first conductive lines;
a third level overlaying said second level,
wherein said third level comprises a plurality of third transistors,
wherein said third level comprises a fourth layer, said fourth layer comprising second conductive lines; and
a plurality of connection paths,
wherein said plurality of connection paths provides electrical connections from a plurality of said first transistors to said plurality of third transistors, and
wherein said first level comprises at least one SerDes circuit.

16. The device according to claim 15,
wherein said first level comprises at least one PLL circuit.

17. The device according to claim 15,
wherein said first level comprises at least one voltage regulator.

18. The device according to claim 15,
wherein said second level is bonded to said first level, wherein said bonded comprises oxide-to-oxide bond regions, wherein said bonded additionally comprises metal-to-metal bond regions made on a same level as said oxide-to-oxide bonds.

19. The device according to claim 15, wherein said first level comprises a first die area, wherein said second level comprises a second die area, and wherein said first die area is greater than said second die area.

20. The device according to claim 15, wherein said first level comprises at least one control circuit, wherein said second level comprises at least one memory array, and wherein said control circuit controls data written to said at least one memory array.

\* \* \* \* \*